US010546960B2

(12) United States Patent
Yamazaki

(10) Patent No.: US 10,546,960 B2
(45) Date of Patent: Jan. 28, 2020

(54) METAL OXIDE FILM, SEMICONDUCTOR DEVICE, AND MANUFACTURING METHOD OF SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 16/072,019

(22) PCT Filed: May 19, 2016

(86) PCT No.: PCT/IB2016/052925
§ 371 (c)(1),
(2) Date: Jul. 23, 2018

(87) PCT Pub. No.: WO2017/134495
PCT Pub. Date: Aug. 10, 2017

(65) Prior Publication Data
US 2019/0035939 A1 Jan. 31, 2019

(30) Foreign Application Priority Data
Feb. 5, 2016 (JP) .................. 2016-021172

(51) Int. Cl.
*H01L 29/786* (2006.01)
*H01L 21/02* (2006.01)
(Continued)

(52) U.S. Cl.
CPC .. *H01L 29/78693* (2013.01); *H01L 21/02164* (2013.01); *H01L 29/04* (2013.01); *H01L 29/221* (2013.01); *H01L 29/2206* (2013.01)

(58) Field of Classification Search
CPC ......... H01L 29/78693; H01L 21/02554; H01L 29/2206; H01L 29/04; H01L 21/02164; H01L 29/221; H01L 29/786
See application file for complete search history.

(56) References Cited

U.S. PATENT DOCUMENTS 8,021,917 B2  9/2011  Akimoto et al.
8,440,502 B2  5/2013  Akimoto et al.
(Continued)

FOREIGN PATENT DOCUMENTS

CN  101740398 A  6/2010
CN  102376583 A  3/2012
(Continued)

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
(Continued)

*Primary Examiner* — David Vu
(74) *Attorney, Agent, or Firm* — Robinson Intellectual Property Law Office; Eric J. Robinson

(57) ABSTRACT

A semiconductor device which includes a metal oxide film including a crystal part is provided. A semiconductor device which has a metal oxide film and high field-effect mobility is provided. A highly reliable semiconductor device including a metal oxide film is provided. The semiconductor device includes a first insulator, a first conductor formed over the first insulator, a second insulator formed over the first conductor, an oxide formed over the second insulator, a third insulator formed over the oxide, a second conductor formed over the third insulator, a fourth insulator formed over the third insulator and the second conductor, and a fifth insulator formed over the fourth insulator. The oxide contains In, M (M is Al, Ga, Y, or Sn), and Zn. The oxide
(Continued)

includes a first crystal part and a second crystal part. The first crystal part has c-axis alignment. The second crystal part does not have c-axis alignment.

18 Claims, 78 Drawing Sheets

(51) Int. Cl.
 *H01L 29/04* (2006.01)
 *H01L 29/22* (2006.01)
 *H01L 29/221* (2006.01)

(56) References Cited

U.S. PATENT DOCUMENTS

| | | | |
|---|---|---|---|
| 8,748,224 B2 | 6/2014 | Noda et al. | |
| 8,790,960 B2 | 7/2014 | Yamazaki | |
| 9,087,726 B2 | 7/2015 | Sato et al. | |
| 9,184,298 B2 | 11/2015 | Morita et al. | |
| 9,287,390 B2 | 3/2016 | Noda et al. | |
| 9,287,411 B2 | 3/2016 | Koezuka et al. | |
| 9,382,611 B2 | 7/2016 | Yamazaki et al. | |
| 9,449,852 B2 | 9/2016 | Yamazaki | |
| 9,455,337 B2 | 9/2016 | Hodo et al. | |
| 9,496,330 B2 | 11/2016 | Yamazaki et al. | |
| 9,496,408 B2 | 11/2016 | Yamazaki et al. | |
| 9,590,050 B2 | 3/2017 | Hitora et al. | |
| 9,793,383 B2 | 10/2017 | Noda et al. | |
| 9,806,198 B2 | 10/2017 | Suzawa | |
| 10,096,684 B2 | 10/2018 | Hosaka et al. | |
| 2010/0117086 A1 | 5/2010 | Akimoto et al. | |
| 2011/0269266 A1 | 11/2011 | Yamazaki | |
| 2012/0040495 A1 | 2/2012 | Noda et al. | |
| 2012/0312681 A1 | 12/2012 | Yamazaki et al. | |
| 2013/0088468 A1* | 4/2013 | Sakakura | G11C 19/184 345/204 |
| 2014/0361289 A1 | 12/2014 | Suzawa | |
| 2015/0034475 A1 | 2/2015 | Yamazaki | |
| 2015/0144948 A1 | 5/2015 | Kurokawa | |
| 2015/0187575 A1 | 7/2015 | Yamazaki et al. | |
| 2015/0325660 A1 | 11/2015 | Hitora et al. | |
| 2015/0372122 A1 | 12/2015 | Hodo et al. | |
| 2017/0005182 A1 | 1/2017 | Yamazaki | |
| 2019/0024227 A1 | 1/2019 | Yamazaki et al. | |

FOREIGN PATENT DOCUMENTS

| | | |
|---|---|---|
| CN | 105097896 A | 11/2015 |
| EP | 2421031 A | 2/2012 |
| EP | 2942804 A | 11/2015 |
| JP | 2012-064929 A | 3/2012 |
| JP | 2014-007399 | 1/2014 |
| JP | 2014-096606 A | 5/2014 |
| JP | 2015-015458 A | 1/2015 |
| JP | 2015-111697 A | 6/2015 |
| JP | 2015-227279 A | 12/2015 |
| JP | 2016-021562 A | 2/2016 |
| KR | 2010-0051547 A | 5/2010 |
| KR | 2012-0016586 A | 2/2012 |
| TW | 201027632 | 7/2010 |
| TW | 201205684 | 2/2012 |
| TW | 201227830 | 7/2012 |
| TW | 201543547 | 11/2015 |
| WO | WO-2011/135987 | 11/2011 |
| WO | WO-2014/021334 | 2/2014 |

OTHER PUBLICATIONS

Tsubuku.M et al., "CAAC-Oxide Semiconductor Material and its Applications", IDW '15 : Proceedings of the 22nd International Display Workshops, Dec. 10, 2015, vol. 22, pp. 179-182.

Chung.C et al., "High mobility, dual layer, c-axis aligned crystalline/amorphous IGZO thin film transistor", Appl. Phys. Lett. (Applied Physics Letters ) , Nov. 2, 2015, vol. 107, No. 18, pp. 183503-1-183503-5.

International Search Report (Application No. PCT/IB2016/052925) dated Aug. 9, 2016.

Written Opinion (Application No. PCT/IB2016/052925) dated Aug. 9, 2016.

* cited by examiner

Sample A1 : 170°C, O₂=30%

Sample A1 : 170°C, O₂=30%

Sample A1 : 170°C, O₂=30%

Sample A2: 130°C, O₂=10%

Sample A2: 130°C, O₂=10%

Sample A2: 130°C, O₂=10%

Sample A3:R.T.,O₂=10%

Sample A3:R.T.,O₂=10%

Sample A3:R.T.,O₂=10%

FIG. 9

| | Line Profile | | $R = \dfrac{A - A'}{B - B', C - C'}$ | FWHM |
|---|---|---|---|---|
| | A-A' | B-B', C-C' | | |
| Single Crystal | (00$\bar{l}$), (00$l$) peaks | single peak | $R \gg 1$ | Small |
| only CAAC | (00$\bar{l}$), (00$l$) peaks | single peak | $R \gg 1$ | Relatively Small |
| CAAC + Nano-crystal | (00$\bar{l}$), (00$l$) peaks | nc, nc peaks | $R > 1$ | Middle |
| Nano-crystal | nc, nc peaks | nc, nc peaks | $R = 1$ | Relatively Large |
| Amorphous | halo, halo | halo, halo | $R = 1$ or low intensity | Large |

FIG. 10A1
Sample A1:170°C,O₂=30%
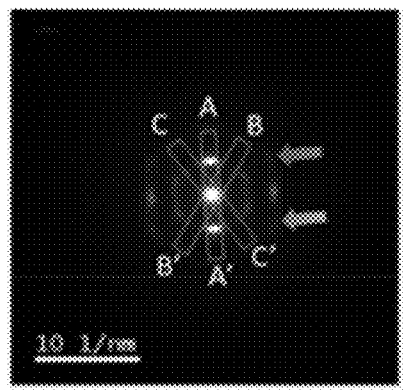
FIG. 10A2
Sample A1:170°C,O₂=30%
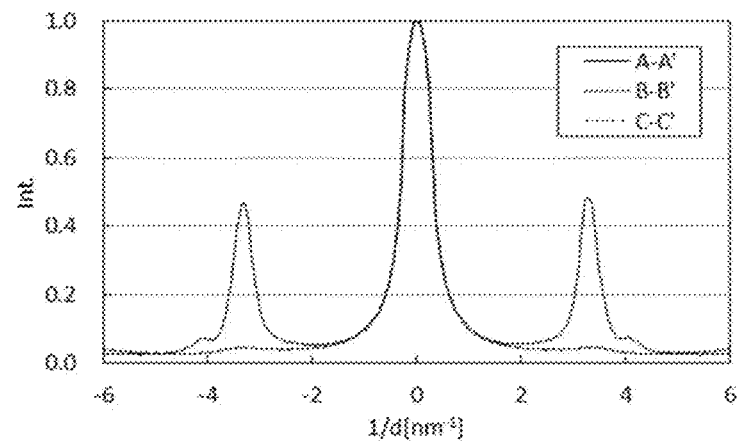
FIG. 10B1
Sample A2:130°C,O₂=10%
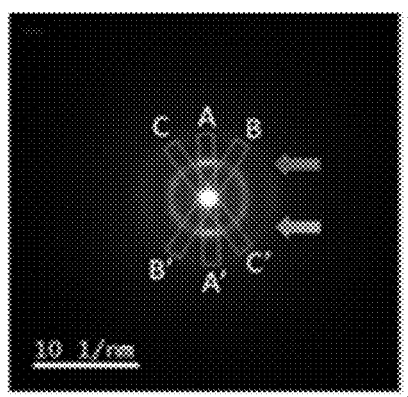
FIG. 10B2
Sample A2:130°C,O₂=10%
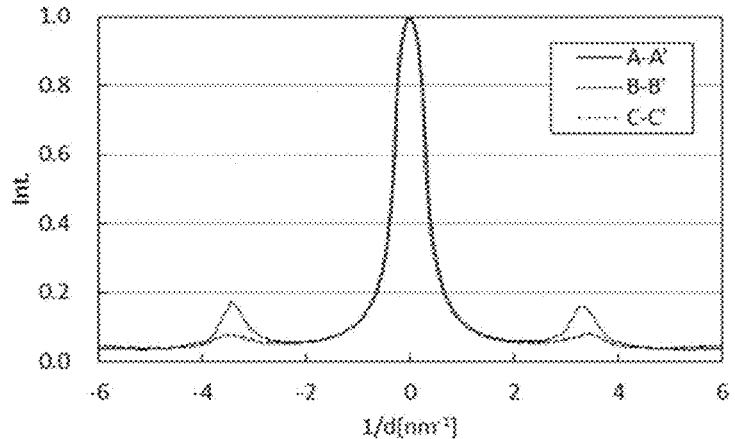

FIG. 11A1
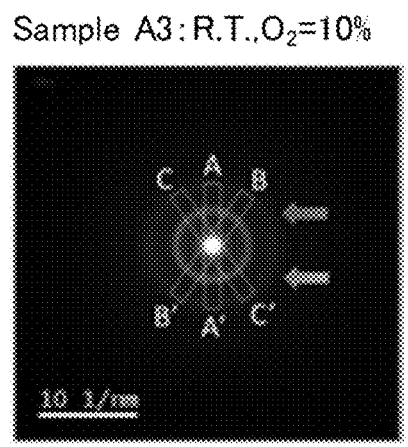
Sample A3: R.T., O₂=10%
FIG. 11A2
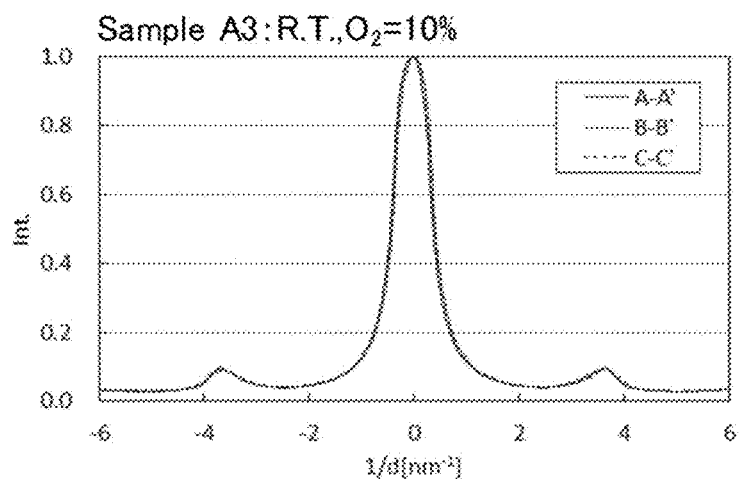
Sample A3: R.T., O₂=10%

FIG. 13A  Sample A1: 170°C, O₂=30%
FIG. 13B  Sample A1: 170°C, O₂=30%
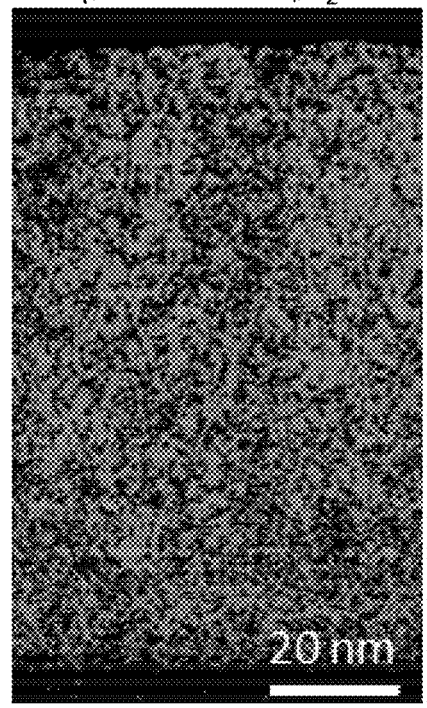

FIG. 14A  Sample A2: 130°C, $O_2$=10%
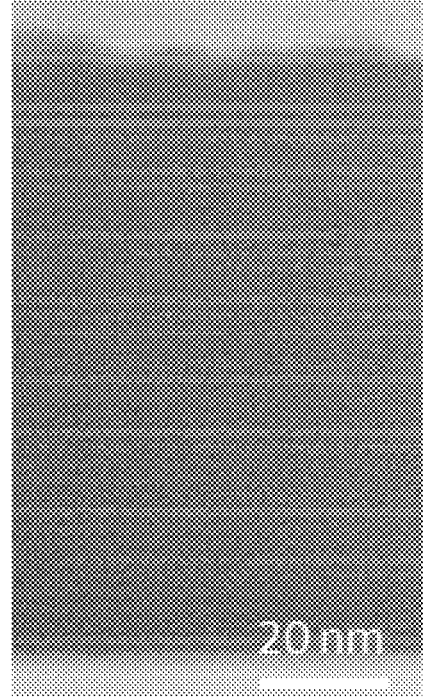
FIG. 14B  Sample A2: 130°C, $O_2$=10%
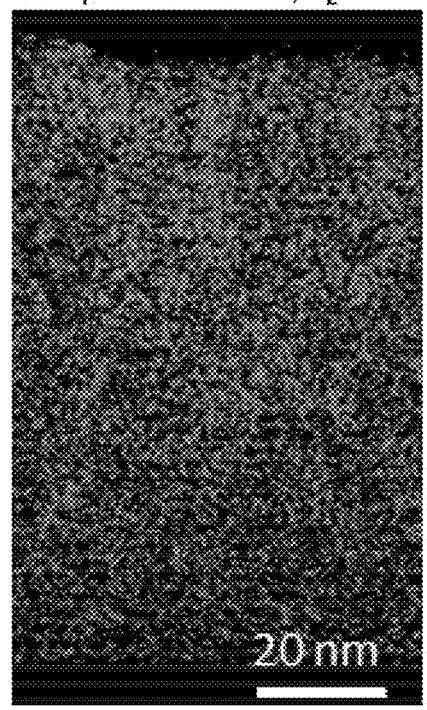

Sample D1 urbach tail : 68.70[meV]
absorption due to defect states : 1.21E-3[cm⁻¹]

Sample D2 urbach tail : 64.46[meV]
absorption due to defect states : 1.36E-3[cm$^{-1}$]

Sample D3 urbach tail : 65.83[meV]
absorption due to defect states : 1.04E-3[cm$^{-1}$]

Crystal structure of $InMZnO_4$ 240a    240b 296  260A  250  230c        260A 250  230c  294

260                              260

FIG. 49A
FIG. 49B
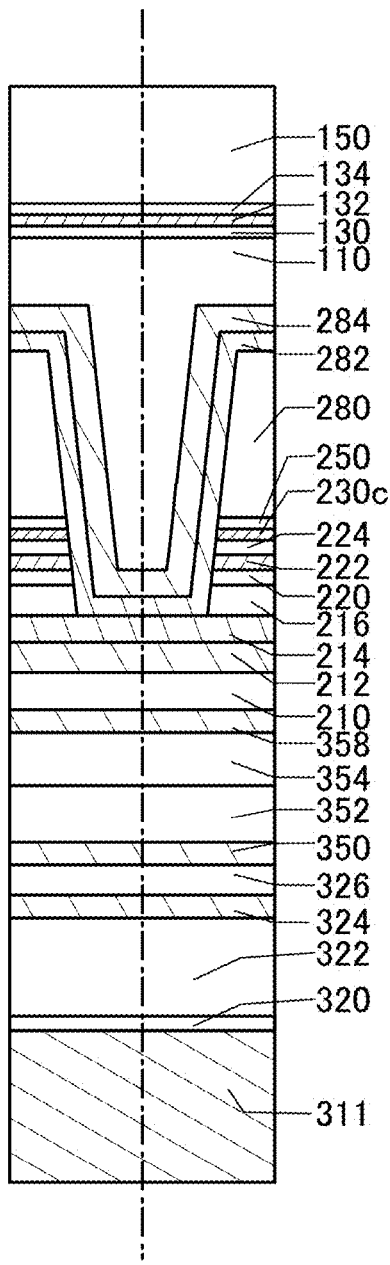
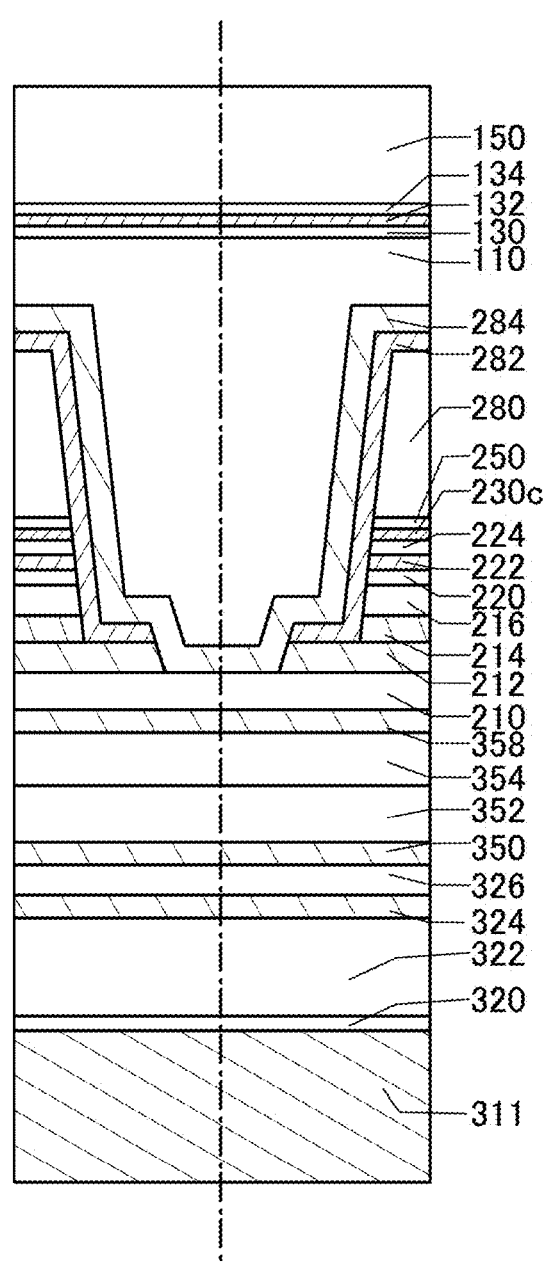

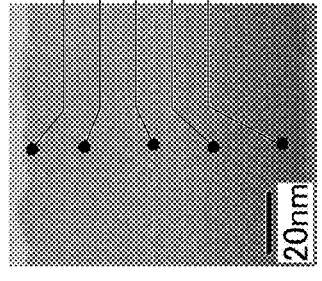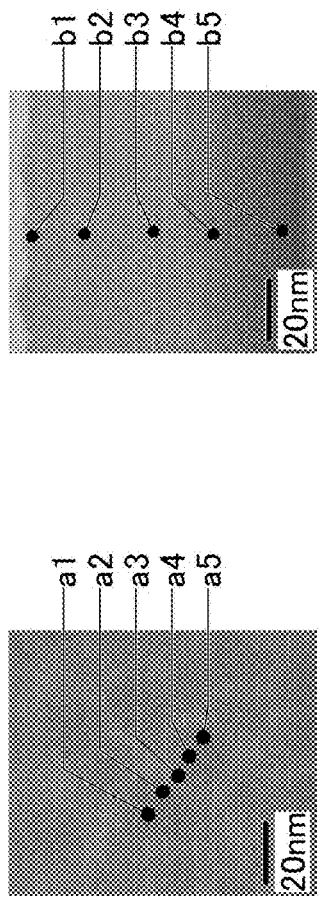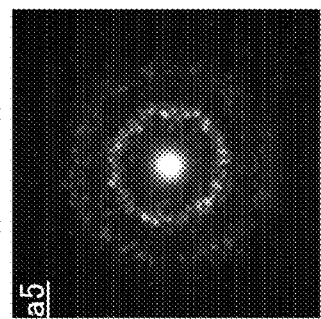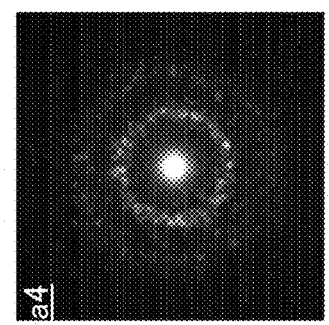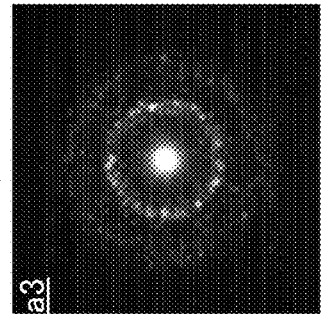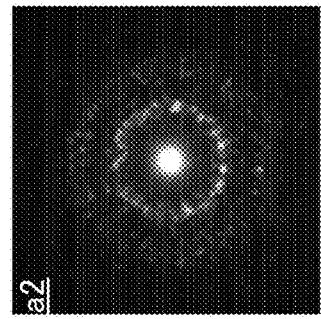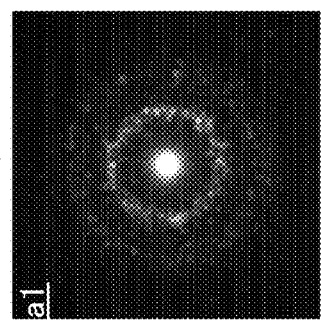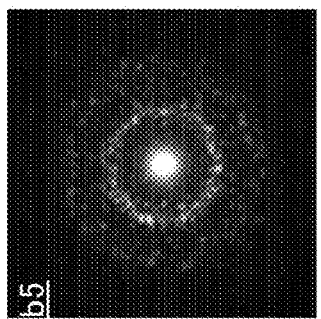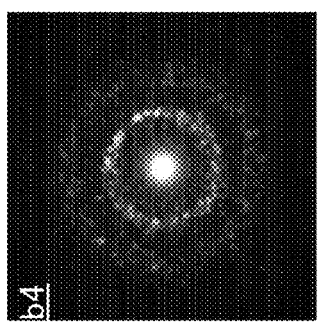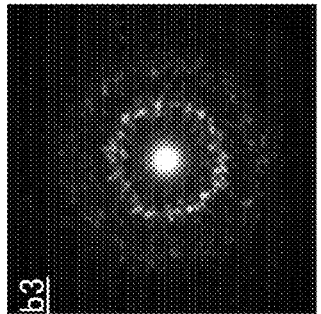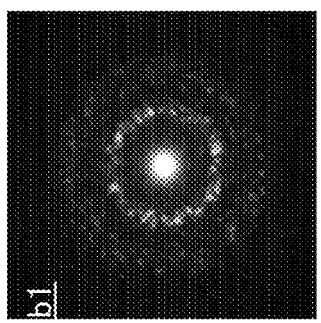

METAL OXIDE FILM, SEMICONDUCTOR DEVICE, AND MANUFACTURING METHOD OF SEMICONDUCTOR DEVICE

TECHNICAL FIELD

One embodiment of the present invention relates to a metal oxide film and a manufacturing method thereof. Another embodiment of the present invention relates to a semiconductor device including the metal oxide film and a manufacturing method thereof.

The present invention relates to, for example, an oxide, a transistor, a semiconductor device, and manufacturing methods thereof. The present invention relates to, for example, an oxide, a display device, a light-emitting device, a lighting device, a power storage device, a memory device, an imaging device, a processor, and an electronic device. The present invention relates to manufacturing methods of an oxide, a display device, a liquid crystal display device, a light-emitting device, a memory device, and an electronic device. The present invention relates to driving methods of a semiconductor device, a display device, a liquid crystal display device, a light-emitting device, a memory device, and an electronic device.

Note that one embodiment of the present invention is not limited to the above-mentioned technical field. The technical field of one embodiment of the invention disclosed in this specification and the like relates to an object, a method, or a manufacturing method. One embodiment of the present invention relates to a process, a machine, manufacture, or a composition of matter.

Note that in this specification and the like, a semiconductor device generally refers to a device that can function by utilizing semiconductor characteristics. A display device, a light-emitting device, a lighting device, an imaging device, an electro-optical device, a semiconductor circuit, and an electronic device include the semiconductor device in some cases.

BACKGROUND ART

As a semiconductor material that can be used in a transistor, an oxide semiconductor has been attracting attention. For example, Patent Document 1 discloses a semiconductor device achieving high field-effect mobility (simply referred to as mobility or µFE in some cases) with a structure where a plurality of oxide semiconductor layers are stacked, and among the plurality of oxide semiconductor layers, an oxide semiconductor layer serving as a channel contains indium and gallium and has a higher indium content than a gallium content.

Non-Patent Document 1 discloses that an oxide semiconductor containing indium, gallium, and zinc has a homologous series represented by $In_{1-x}Ga_{1+x}O_3(ZnO)_m$ (x is a number which satisfies $-1 \leq x \leq 1$, and m is a natural number). Furthermore, Non-Patent Document 1 discloses a solid solution range (solid solution range) of a homologous series. For example, in the solid solution range of the homologous series in the case where m=1, x ranges from −0.33 to 0.08, and in the solid solution range of the homologous series in the case where m=2, x ranges from −0.68 to 0.32.

REFERENCES

Patent Document

[Patent Document 1] Japanese Published Patent Application No. 2014-7399

Non-Patent Document

[Non-Patent Document 1] M. Nakamura, N. Kimizuka, and T. Mohri, "The Phase Relations in the $In_2O_3$—$Ga_2ZnO_4$—ZnO System at 1350° C.," *J. Solid State Chem.*, 1991, Vol. 93, pp. 298-315.

SUMMARY OF THE INVENTION

Problems to be Solved by the Invention

One object of one embodiment of the present invention is to provide a semiconductor device which includes a metal oxide film including a crystal part. Another object is to provide a semiconductor device which includes a metal oxide film and has high field-effect mobility. Another object is to provide a highly reliable semiconductor device including a metal oxide film.

Another object is to provide a semiconductor device using an oxide as a semiconductor. Another object is to provide a module which includes a semiconductor device using an oxide as a semiconductor. Another object is to provide an electronic device which includes a semiconductor device using an oxide as a semiconductor, or an electronic device which includes a module including a semiconductor device using an oxide as a semiconductor.

Note that the descriptions of these objects do not disturb the existence of other objects. In one embodiment of the present invention, there is no need to achieve all the objects. Other objects can be derived from the description of the specification, the drawings, the claims, and the like.

Means for Solving the Problems

One embodiment of the present invention is a semiconductor device characterized by comprising a first insulator, a first conductor formed over the first insulator, a second insulator formed over the first conductor, an oxide formed over the second insulator, a third insulator formed over the oxide, a second conductor formed over the third insulator, a fourth insulator formed over the third insulator and the second conductor, and a fifth insulator formed over the fourth insulator. The oxide contains In, M (M is Al, Ga, Y, or Sn), and Zn. An atomic ratio between the In, the M, and the Zn is In:M:Zn=4:2:3 and a neighborhood thereof. An atomic ratio of the M is, when an atomic ratio of the In is 4, higher than or equal to 1.5 and lower than or equal to 2.5 and an atomic ratio of the Zn is higher than or equal to 2 and lower than or equal to 4. The oxide comprises a first crystal part and a second crystal part. The first crystal part has c-axis alignment. The second crystal part does not have c-axis alignment. The second insulator, the third insulator, and the fourth insulator contain oxygen and silicon. The first insulator and the fifth insulator contain oxygen and aluminum.

In the above, it is preferable that an electron diffraction pattern of a cross section of the oxide subjected to electron diffraction measurement include a first region including a diffraction spot derived from the first crystal part and a second region including a diffraction spot derived from the second crystal part, and that an integrated intensity of luminance of the first region be larger than an integrated intensity of luminance of the second region.

In the above, the integrated intensity of luminance of the first region is preferably more than 1 time and less than or equal to 3 times the integrated intensity of luminance of the second region.

In the above, the oxide preferably includes a region where a peak value of density of shallow defect states is less than $2.5 \times 10^{12}$ cm$^{-2}$eV$^{-1}$.

In the above, it is preferable that a second oxide be included between the oxide and the third insulator, the second oxide contain In, M (M is Al, Ga, Y, or Sn), and Zn, the oxide include a first crystal part and a second crystal part, the first crystal part have c-axis alignment, the second crystal part do not have c-axis alignment, an electron diffraction pattern of a cross section of the oxide subjected to electron diffraction measurement include a first region including a diffraction spot derived from the first crystal part and a second region including a diffraction spot derived from the second crystal part, and an integrated intensity of luminance of the first region be more than 1 time and less than or equal to 10 times an integrated intensity of luminance of the second region.

Another embodiment of the present invention is a manufacturing method of a semiconductor device, characterized by comprising forming a first conductor containing oxygen and aluminum, over a first insulator; forming a second insulator containing oxygen and silicon, over the first conductor; forming an oxide over the second insulator by a sputtering method at an oxygen flow rate ratio lower than or equal to 20% and at a substrate temperature higher than or equal to room temperature and lower than or equal to 150° C.; performing a heat treatment at a temperature of lower than or equal to 450° C.; forming a third insulator containing oxygen and silicon, over the oxide; forming a second conductor over the third insulator; forming a fourth insulator containing oxygen and silicon, over the third insulator and the second conductor; and forming a fifth insulator containing oxygen and silicon, over the fourth insulator by a sputtering method while the substrate is heated at a temperature lower than or equal to 450° C.

Effect of the Invention

According to one embodiment of the present invention, a semiconductor device which includes a metal oxide film including a crystal part can be provided. A semiconductor device which has a metal oxide film and high field-effect mobility can be provided. A highly reliable semiconductor device including a metal oxide film can be provided.

A semiconductor device using an oxide as a semiconductor can be provided. A module including a semiconductor device using an oxide as a semiconductor can be provided. An electronic device that includes a semiconductor device using an oxide as a semiconductor, or an electronic device that includes a module including a semiconductor device using an oxide as a semiconductor can be provided.

BRIEF DESCRIPTION OF DRAWINGS

Best Mode for Carrying out the Invention

Figure 1A:
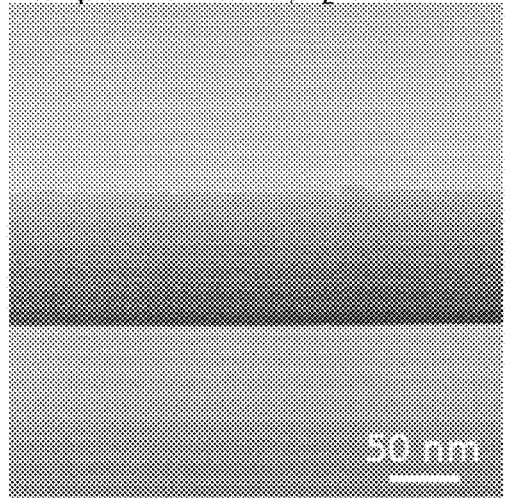
FIGS. 1A to 1C Cross-sectional TEM images and an HR-TEM image of a metal oxide film FIGS. 2A to 2C Cross-sectional TEM images and an HR-TEM image of a metal oxide film FIGS. 3A to 3C Cross-sectional TEM images and an HR-TEM image of a metal oxide film FIGS. 4A to 4C XRD measurement results and electron diffraction patterns of a metal oxide film FIGS. 5A to 5C XRD measurement results and electron diffraction patterns of a metal oxide film FIGS. 6A to 6C XRD measurement results and electron diffraction patterns of a metal oxide FIGS. 7A and 7B Electron diffraction patterns FIG. 8 A line profile of an electron diffraction pattern FIG. 9 Conceptual views of line profiles of electron diffraction patterns, relative luminance R of the line profiles, and half widths of the line profiles FIGS. 10A1, 10A2, 10B1, and 10B2 Electron diffraction patterns and luminance profiles FIGS. 11A1 and 11A2 An electron diffraction pattern and a luminance profile FIG. 12 Relative luminance estimated from electron diffraction patterns of metal oxide films FIGS. 13A and 13B Cross-sectional TEM images of metal oxide films and cross-sectional TEM images after image analysis FIGS. 14A and 14B Cross-sectional TEM images of metal oxide films and cross-sectional TEM images after image analysis FIGS. 15A and 15B Cross-sectional TEM images of metal oxide films and cross-sectional TEM images after image analysis FIGS. 16A to 16C Graphs showing SIMS measurement results of metal oxide films FIG. 17 A graph showing $I_d$-$V_g$ characteristics FIG. 18 A graph showing $I_d$-$V_g$ characteristics FIG. 19 A graph showing calculation results of a density of interface states FIGS. 20A and 20B A graph showing $I_d$-$V_g$ characteristics FIG. 21 A graph showing calculation results of a density of defect states FIG. 22 A graph showing results of CPM measurement FIG. 23 A graph showing results of CPM measurement FIG. 24 A graph showing results of CPM measurement FIGS. 25A and 25D Diagrams showing deposition mechanism of an oxide semiconductor film FIGS. 26A and 26C Diagrams showing atomic ratio of an oxide semiconductor film FIG. 27 A diagram showing an InMZnO$_4$ crystal FIG. 28 An energy band diagram of a transistor including an oxide semiconductor film in a channel region FIGS. 29A and 29B Diagrams showing a structure of nanocluster FIGS. 30A to 30C A top view and cross-sectional structures of a transistor of one embodiment FIGS. 31A to 31C Band diagrams FIGS. 32A to 32C A top view and cross-sectional structures of a transistor of one embodiment FIGS. 33A to 33C A top view and cross-sectional structures of a transistor of one embodiment FIGS. 34A to 34C A top view and cross-sectional structures of a transistor of one embodiment FIGS. 35A to 35C A top view and cross-sectional structures of a transistor of one embodiment FIGS. 36A to 36C A top view and cross-sectional structures of a transistor of one embodiment FIGS. 37A to 37C A top view and cross-sectional structures of a transistor of one embodiment FIGS. 38A to 38C A top view and cross-sectional structures of a transistor of one embodiment FIGS. 39A to 39E An example of a method for manufacturing a transistor of one embodiment FIGS. 40A to 40D An example of a method for manufacturing a transistor of one embodiment FIGS. 41A to 41D An example of a method for manufacturing a transistor of one embodiment FIGS. 42A and 42B An example of a method for manufacturing a transistor of one embodiment FIGS. 43A and 43B Circuit diagrams of a semiconductor device of one embodiment FIG. 44 A diagram showing a cross-sectional structure of a semiconductor device of one embodiment FIG. 45 A diagram showing a cross-sectional structure of a semiconductor device of one embodiment FIG. 46 A diagram showing a cross-sectional structure of a semiconductor device of one embodiment FIG. 47 A diagram showing a cross-sectional structure of a semiconductor device of one embodiment FIGS. 48A and 48B Diagrams showing a cross-sectional structure of a semiconductor device of one embodiment FIGS. 49A and 49B Diagrams showing a cross-sectional structure of a semiconductor device of one embodiment FIGS. 50A and 50B Diagrams showing a cross-sectional structure of a semiconductor device of one embodiment FIG. 51 A diagram showing a cross-sectional structure of a semiconductor device of one embodiment FIGS. 52A and 52B A circuit diagram and a cross-sectional structure of a semiconductor device of one embodiment FIG. 53 A diagram showing a cross-sectional structure of a semiconductor device of one embodiment FIG. 54 A circuit diagram illustrating a memory device of one embodiment of the present invention FIG. 55 A circuit diagram illustrating a memory device of one embodiment of the present invention FIGS. 56A to 56C Circuit diagrams and a timing chart of one embodiment of the present invention FIGS. 57A to 57C A graph and circuit diagrams of one embodiment of the present invention FIGS. 58A and 58B A circuit diagram and a timing chart of one embodiment of the present invention FIGS. 59A and 59B A circuit diagram and a timing chart of one embodiment of the present invention FIGS. 60A to 60E A block diagram, circuit diagrams, and waveform diagrams illustrating one embodiment of the present invention FIGS. 61A and 61B A circuit diagram and a timing chart of one embodiment of the present invention FIGS. 62A and 62B circuit diagrams illustrating one embodiment of the present invention FIGS. 63A to 63C circuit diagrams illustrating one embodiment of the present invention FIGS. 64A and 64B circuit diagrams illustrating one embodiment of the present invention FIGS. 65A and 65C circuit diagrams illustrating one embodiment of the present invention FIGS. 66A and 66B circuit diagrams illustrating one embodiment of the present invention FIG. 67 A block diagram illustrating a semiconductor device of one embodiment of the present invention FIG. 68 A circuit diagram illustrating a semiconductor device of one embodiment of the present invention FIGS. 69A and 69B Top views illustrating a semiconductor device of one embodiment of the present invention FIGS. 70A and 70B Block diagrams illustrating a semiconductor device of one embodiment of the present invention FIGS. 71A and 71B Cross-sectional views illustrating a semiconductor device of one embodiment of the present invention FIG. 72 A cross-sectional view illustrating a semiconductor device of one embodiment of the present invention FIGS. 73A and 73B Top views illustrating a semiconductor device of one embodiment of the present invention FIGS. 74A and 74B A flow chart and a perspective view of a semiconductor device of one embodiment of the present invention FIGS. 75A to 75F Perspective views illustrating electronic device of one embodiment of the present invention FIG. 76 Measurement results of XRD spectra of samples FIGS. 77A to 77L TEM images and electron diffraction patterns of samples FIGS. 78A to 78C EDX mapping images of a sample Embodiments will be described below with reference to the accompanying drawings. Note that embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.
Figure 1B:
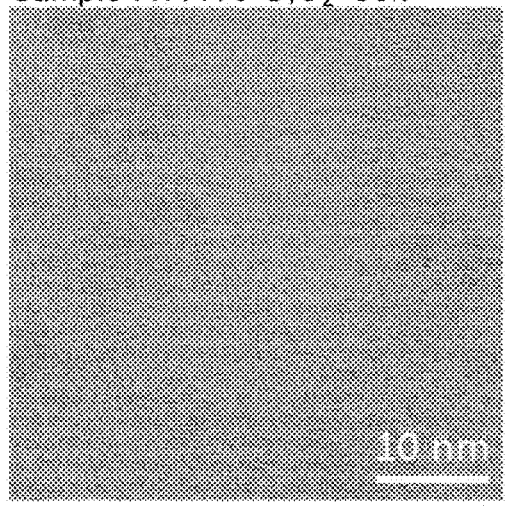

In the drawings, the size, the layer thickness, or the region is exaggerated for clarity in some cases and is not limited to the illustrated scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

In this specification, terms for describing arrangement, such as "over", "above", "under", and "below", are used for convenience in describing a positional relation between components with reference to drawings. The positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow through the drain, the channel region, and the source. Note that in this specification and the like, a channel region indicates a region through which current mainly flows.

Functions of a source and a drain might be switched when a transistor of different polarity is employed or a direction of current flow is changed in circuit operation, for example. Therefore, the terms "source" and "drain" can be switched in this specification and the like.

In this specification and the like, the term "electrically connected" includes the case where components are connected through an object having any electric function. There is no particular limitation on the "object having any electric function" as long as electric signals can be transmitted and received between components that are connected through the object. Examples of the "object having any electric function" are a switching element such as a transistor, a resistor, an inductor, a capacitor, and an element with a variety of functions as well as an electrode and a wiring.

In this specification and the like, the term "parallel" indicates that the angle formed between two straight lines is greater than or equal to −10° and less than or equal to 10°. Thus, the case where the angle is greater than or equal to −5° and less than or equal to 5° is also included. The term "perpendicular" indicates that the angle formed between two straight lines is greater than or equal to 80° and less than or equal to 100°. Thus, the case where the angle is greater than or equal to 85° and less than or equal to 95° is also included.

In this specification and the like, the terms "film" and "layer" can be interchanged with each other depending on the case or circumstances. For example, the term "conductive layer" can be changed into the term "conductive film" in some cases. The term "insulating film" can be changed into the term "insulating layer" in some cases.

Unless otherwise specified, off-state current in this specification and the like indicates drain current of a transistor in an off state (also referred to as a non-conducting state and a cutoff state). Unless otherwise specified, the off state of an n-channel transistor refers to that the gate-source voltage $V_{gs}$ is lower than the threshold voltage $V_{th}$, and the off state of a p-channel transistor refers to that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may refer to "there is $V_{gs}$ with which the off-state current of the transistor becomes lower than or equal to I". The off-state current of a transistor refers to, in some cases, the off-state current in an off state at predetermined $V_{gs}$, in an off state at $V_{gs}$ in a predetermined range, in an off state at $V_{gs}$ with which sufficiently reduced off-state current is obtained, or the like.

As an example, the assumption is made of an n-channel transistor where the threshold voltage $V_{th}$ is 0.5 V and the drain current is $1\times10^{-9}$ A at a voltage $V_{gs}$ of 0.5 V, $1\times10^{-13}$ A at a voltage $V_{gs}$ of 0.1 V, $1\times10^{-19}$ A at a voltage $V_{gs}$ of $-0.5$ V, and $1\times10^{-22}$ A at a voltage $V_{gs}$ of $-0.8$ V. The drain current of the transistor is $1\times10^{-19}$ A or lower at $V_{gs}$ of $-0.5$ V or at $V_{gs}$ in the range of $-0.8$ V to $-0.5$ V; therefore, it can be said that the off-state current of the transistor is $1\times10^{-19}$ A or lower. Since there is $V_{gs}$ at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value per channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the a semiconductor device or the like including the transistor maintains its reliability, or a temperature at which the semiconductor device or the like including the transistor is used (e.g., temperature in the range of 5° C. to 35° C.). The description "an off-state current of a transistor is lower than or equal to I" may refer to a situation where there is $V_{gs}$ at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ at which a semiconductor device or the like including the transistor maintains its reliability, or an off-state current at $V_{ds}$ at which the semiconductor device or the like including the transistor is used. The description "an off-state current of a transistor is lower than or equal to I" may refer to a situation where there is $V_{gs}$ at which the off-state current of a transistor is lower than or equal to I at $V_{ds}$ of 0.1 V, 0.8 V, 1 V, 1.2 V, 1.8 V, 2.5 V, 3 V, 3.3 V, 10 V, 12 V, 16 V, or 20 V, $V_{ds}$ at which a semiconductor device or the like including the transistor maintains its reliability, or an off-state current at $V_{ds}$ at which in the semiconductor device or the like including the transistor is used.

In the above description of off-state current, a drain may be replaced with a source. That is, the off-state current sometimes refers to a current that flows through a source of a transistor in the off state.

In this specification and the like, leakage current may have the same meaning as off-state current. In this specification and the like, off-state current may refer to current that flows between a source and a drain of a transistor in the off state, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of 0 ($I_d$=0 A) and an extrapolated straight line that is tangent with the highest inclination to a plotted curve ($V_g$–$\sqrt{I_d}$ characteristics). Alternatively, the threshold voltage of a transistor may refer to a gate voltage ($V_g$) at which the value of $I_d$ [A]×L [μm]/W [μm] is $1\times10^{-9}$ [A] where L is channel length and W is channel width.

A voltage usually refers to a potential difference between a given potential and a reference potential (e.g., a ground potential (GND) or a source potential). Thus, voltage can also be referred to as potential. In general, a potential (a voltage) is relative and is determined depending on the amount relative to a certain potential. Therefore, a potential which is represented as a "ground potential" or the like is not always 0 V. For example, the lowest potential in a circuit may be a "ground potential". Alternatively, a substantially intermediate potential in a circuit may be a "ground potential". In these cases, a positive potential and a negative potential are set using the potential as a reference.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. Note that in one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that in some transistor structures, a channel width in a region where a channel is actually formed (hereinafter referred to as effective channel width) is different from a channel width shown in a top view of a transistor (hereinafter referred to as apparent channel width). For example, in a transistor having a three-dimensional structure, an effective channel width is larger than an apparent channel width shown in a top view of the transistor, and its influence cannot be ignored in some cases. For example, in a miniaturized transistor having a three-dimensional structure, the proportion of a channel region formed on a side surface of a semiconductor is sometimes high. In that case, an effective channel width obtained when a channel is actually formed is larger than an apparent channel width shown in the top view.

In a transistor having a three-dimensional structure, an effective channel width is difficult to measure in some cases. For example, estimation of an effective channel width from a design value requires an assumption that the shape of a semiconductor is known. Accordingly, in the case where the shape of a semiconductor is not known accurately, it is difficult to measure the effective channel width accurately.

Therefore, in this specification, in a top view of a transistor, an apparent channel width that is a length of a portion where a source and a drain face each other in a region where a semiconductor and a gate electrode overlap with each other is referred to as a "surrounded channel width (SCW: Surrounded Channel Width)" in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from a value obtained by using an effective channel width for the calculation in some cases.

In this specification and the like, a "semiconductor" includes characteristics of an "insulator" in some cases when the conductivity is sufficiently low, for example. A "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. An "insulator" in this specification and the like can be called a "semi-insulator" in some cases.

In this specification and the like, a "semiconductor" includes characteristics of a "conductor" in some cases when the conductivity is sufficiently high, for example. A "semiconductor" and a "conductor" cannot be strictly distinguished from each other in some cases because a border between the "semiconductor" and the "conductor" is not clear. Accordingly, a "semiconductor" in this specification can be replaced with a "conductor" in some cases. Similarly, a "conductor" in this specification and the like can be replaced with a "semiconductor" in some cases.

In this specification and the like, an impurity in a semiconductor refers to an element that is not a main component of a semiconductor film. For example, an element with a concentration of lower than 0.1 atomic % is an impurity. If a semiconductor contains an impurity, the DOS (Density of State) may be formed therein, the carrier mobility may be decreased, or the crystallinity may be decreased, for example. In the case where the semiconductor includes an oxide semiconductor, examples of the impurity which changes the characteristics of the semiconductor include Group 1 elements, Group 2 elements, Group 13 elements, Group 14 elements, Group 15 elements, and transition metals other than the main components; specific examples include hydrogen (also included in water), lithium, sodium, silicon, boron, phosphorus, carbon, and nitrogen. In the case of an oxide semiconductor, oxygen vacancies may be formed by entry of impurities such as hydrogen. In the case where the semiconductor includes silicon, examples of the impurity which changes the characteristics of the semiconductor include oxygen, Group 1 elements except hydrogen, Group 2 elements, Group 13 elements, and Group 15 elements.

In this specification and the like, the term "oxide" can be replaced with a "metal oxide", an "oxide semiconductor," an "oxide insulator," or an "oxide conductor."

(Embodiment 1)

<1-1. Structure of Metal Oxide Film>

One embodiment of the present invention is a metal oxide film including two kinds of crystal parts. One is a crystal part (also referred to as a first crystal part) which having orientation in the thickness direction (also referred to as a film-plane direction, or a direction perpendicular to a formation surface or a film surface), i.e., a crystal part having c-axis alignment. The other is a crystal part (also referred to as a second crystal part) having not c-axis alignment but random orientation. These two kinds of crystal parts are mixed together in the metal oxide film of one embodiment of the present invention.

In the description below, crystal parts are classified into, for simplicity, the first crystal part having c-axis alignment and the second crystal part having no c-axis alignment. Note that these crystal parts cannot be distinguished from each other in some cases because there is not much difference therebetween in crystallinity, crystal size, and the like. That is, the metal oxide film of one embodiment of the present invention can be described without a distinction between them.

For example, the metal oxide film of one embodiment of the present invention includes a plurality of crystal parts, and at least one of the crystal parts may have c-axis alignment. In the crystal parts existing in the film, the proportion of crystal parts having no c-axis alignment may be higher than that of crystal parts having c-axis alignment. For example, in a transmission electron microscope image of a cross section in the thickness direction of the metal oxide film which is one embodiment of the present invention, a plurality of crystal parts are observed and the second crystal parts having no c-axis alignment are observed at a higher proportion than the first crystal parts having c-axis alignment in some cases. In other words, the metal oxide film of one embodiment of the present invention has a high proportion of second crystal parts having no c-axis alignment.

When the metal oxide film has a high proportion of second crystal parts having no c-axis alignment, the following effects can be obtained.

In the case where there is a source which supplies sufficient oxygen in the vicinity of the metal oxide film, the second crystal part having no c-axis alignment can serve as an oxygen-diffusion path. Thus, in the case where there is a source which supplies sufficient oxygen in the vicinity of the metal oxide film, oxygen can be supplied to the first crystal part having c-axis alignment through the second crystal part having no c-axis alignment. Accordingly, the amount of oxygen vacancy in the metal oxide film can be reduced. When such a metal oxide film is used as a semiconductor film of a transistor, high reliability and high field-effect mobility can be obtained. Since the second crystal part having no c-axis alignment can serve as an oxygen-diffusion path for supplying oxygen to the first crystal part having c-axis alignment, the metal oxide film including the first crystal part having c-axis alignment and the second crystal part having no c-axis alignment is referred to as an oxygen-deficient metal oxide film or an oxygen-deficient oxide semiconductor film in some cases.

In the first crystal part, particular crystal planes are aligned in the thickness direction. Accordingly, when an X-ray diffraction (XRD: X-ray Diffraction) measurement is performed in a direction substantially perpendicular to the top surface of the metal oxide film including the first crystal parts, a diffraction peak derived from the first crystal parts is observed at a predetermined diffraction angle (2θ). However, even when the metal oxide film includes the first crystal parts, a diffraction peak is not sufficiently observed in some cases because of x-rays scattering or increase in background due to a support substrate. Note that the higher the proportion of the first crystal parts in the metal oxide film is, the higher the diffraction peak becomes; thus, the height (intensity) of the diffraction peak can be an indicator of crystallinity of the metal oxide film.

As an example of a method for evaluating crystallinity of the metal oxide film, electron diffraction can be given. For example, in the case where an electron diffraction measurement is performed on a cross section of the metal oxide film of one embodiment of the present invention and an electron diffraction pattern thereof is observed, first regions including diffraction spots derived from the first crystal parts and second regions including diffraction spots derived from the second crystal parts are observed.

The first regions including diffraction spots derived from the first crystal parts are derived from crystal parts having c-axis alignment. The second regions including diffraction spots derived from the second crystal parts are derived from crystal parts having no orientation or crystal parts having random orientation. Therefore, different patterns might be observed in accordance with the diameter of an electron beam, i.e., the area of an observed region. Note that in this specification and the like, electron diffraction with an electron beam having a diameter of 1 nmφ to 100 nmφ inclusive is referred to as nanobeam electron diffraction (NBED: Nano Beam Electron Diffraction).

Note that the crystallinity of the metal oxide film of one embodiment of the present invention may be evaluated by a method different from NBED. As examples of a method for evaluating crystallinity of the metal oxide film, electron diffraction, x-ray diffraction, neutron diffraction, and the like can be given. Electron diffractions other than NBED, such as transmission electron microscopy (TEM: Transmission Electron Microscopy), scanning electron microscopy (SEM: Scanning Electron Microscopy), convergent beam electron diffraction (CBED: Convergent Beam Electron Diffraction), and selected-area electron diffraction (SAED: Selected Area Electron Diffraction) can be preferably used.

A ring-like pattern is observed in a nanobeam electron diffraction (NBED) pattern obtained by using an electron beam having a large diameter (e.g., greater than or equal to 25 nmφ and less than or equal to 100 nmφ, or greater than or equal to 50 nmφ and less than or equal to 100 nmφ). The ring-like pattern has luminance distribution in a radial direction in some cases. On the other hand, in an electron diffraction (NBED) pattern obtained by using an electron beam having a sufficiently small diameter (e.g., greater than or equal to 1 nmφ and less than or equal to 10 nmφ), a plurality of spots distributed in a circumferential direction (also referred to as θ direction) might be observed at the position of the ring-like pattern. That is, the ring-like pattern obtained by using an electron beam having a large diameter is formed from an aggregate of the plurality of spots.

<1-2. Crystallinity Evaluation of Metal Oxide Film>

Three samples (Samples A1 to A3) each including a metal oxide film were fabricated in different conditions and subjected to crystallinity evaluation. Three kinds of oxide semiconductor films were fabricated. First, methods for fabricating Samples A1 to A3 are described.

[Sample A1]

Sample A1 is a sample in which an approximately 100-nm-thick metal oxide film is fabricated over a glass substrate. The metal oxide film contains indium, gallium, and zinc. The metal oxide film used for Sample A1 was fabricated under the following conditions: the substrate temperature was 170° C.; an argon gas with a flow rate of 140 sccm and an oxygen gas with a flow rate of 60 sccm were introduced into a chamber of the sputtering apparatus; the pressure was set to 0.6 Pa; and an AC power of 2.5 kW was applied to a metal oxide target containing indium, gallium, and zinc (In:Ga:Zn=4:2:4.1 [atomic ratio]). The proportion of oxygen flow rate ratio with respect to the total gas flow rate is referred to as an oxygen flow rate ratio in some cases. Note that the oxygen flow rate ratio under the fabrication conditions for Sample A1 was 30%.

[Sample A2]

Sample A2 is a sample in which an approximately 100-nm-thick metal oxide film is fabricated over a glass substrate. The metal oxide film used for Sample A2 was fabricated under the following conditions: the substrate temperature was 130° C.; and an argon gas with a flow rate of 180 sccm and an oxygen gas with a flow rate of 20 sccm were introduced into a chamber of the sputtering apparatus. The oxygen flow rate ratio under the fabrication conditions for Sample A2 was 10%. Note that the conditions other than the substrate temperature and the oxygen flow rate ratio are the same as those for Sample A1.

[Sample A3]

Sample A3 is a sample in which an approximately 100-nm-thick metal oxide film is fabricated over a glass substrate. The oxide semiconductor film used for Sample A3 was fabricated under the following conditions: the substrate temperature was room temperature (referred to as R.T. in Table 1, e.g., 20° C. or higher and 30° C. or lower); an argon gas with a flow rate of 180 sccm and an oxygen gas with a flow rate of 20 sccm were introduced into a chamber of the sputtering apparatus. The oxygen flow rate ratio under the fabrication conditions for Sample A3 was 10%. Note that the conditions other than the substrate temperature and the oxygen flow rate ratio are the same as those for Sample A1.

Table 1 shows the fabrication conditions of Samples A1 to A3.

TABLE 1

|  | Target [atomic ratio] | Substrate temperature [° C.] | Pressure [Pa] | Oxygen flow rate [%] |
| --- | --- | --- | --- | --- |
| Sample A1 | In:Ga:Zn = 4:2:4.1 | 170 | 0.6 | 30 |
| Sample A2 | In:Ga:Zn = 4:2:4.1 | 130 | 0.6 | 10 |
| Sample A3 | In:Ga:Zn = 4:2:4.1 | R.T. | 0.6 | 10 |

Next, Samples A1 to A3 were subjected to crystallinity evaluation. In this embodiment, cross-sectional TEM observation, XRD measurement, and electron diffraction were performed to evaluate crystallinity.

[Cross-sectional TEM Observation]

FIGS. 1A to 3C show cross-sectional TEM observation results of Samples A1 to A3. Note that FIGS. 1A and 1B are cross-sectional TEM images of Sample A1, FIGS. 2A and 2B are cross-sectional TEM images of Sample A2, and FIGS. 3A and 3B are cross-sectional TEM images of Sample A3.

Figure 1C:
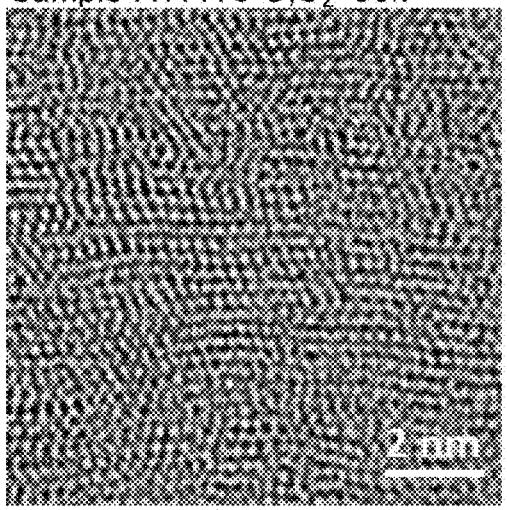
Figure 2A:
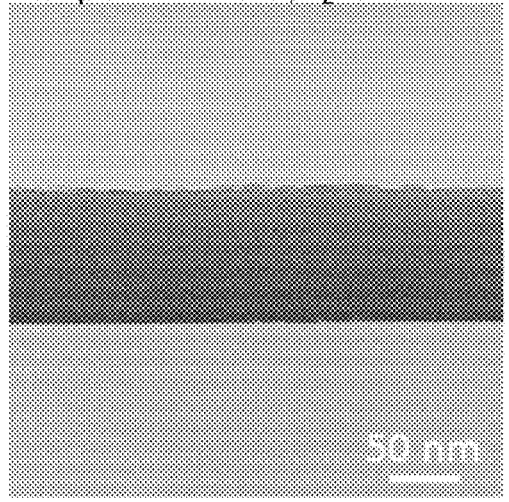
Figure 2B:
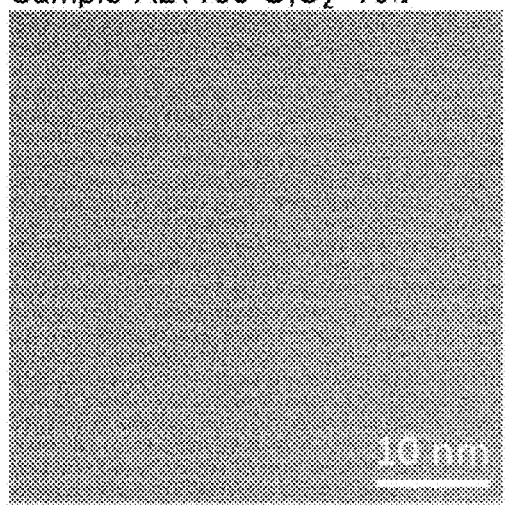
Figure 2C:
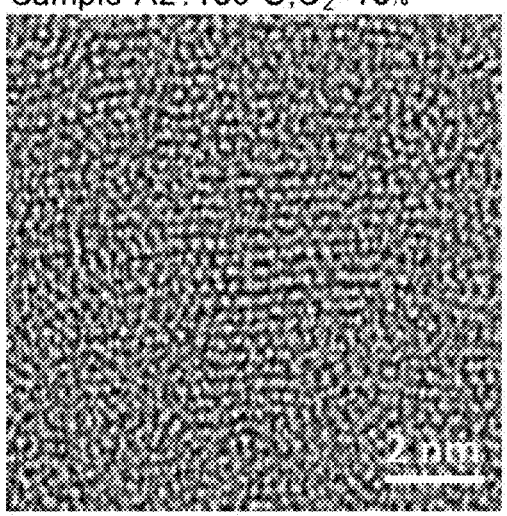
Figure 3A:
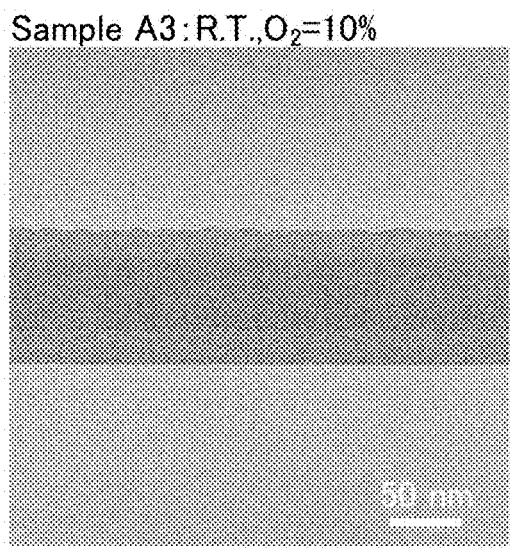
Figure 3B:
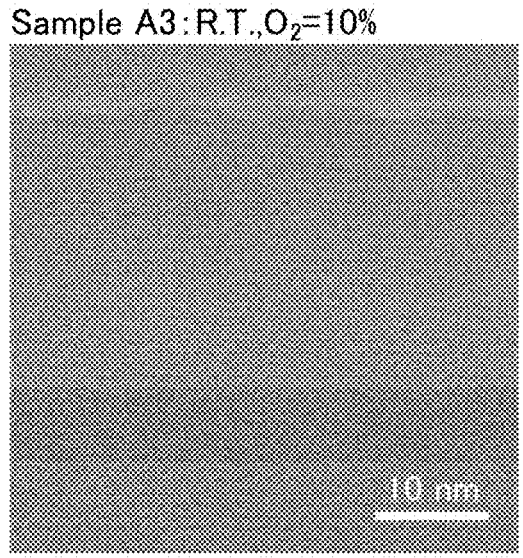
Figure 3C:
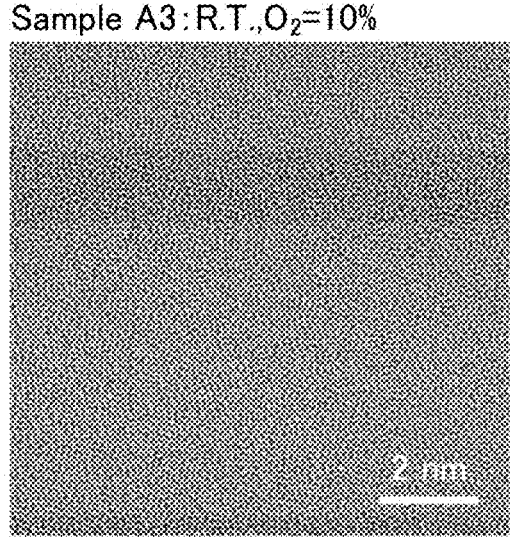

FIG. 1C, FIG. 2C, and FIG. 3C are cross-sectional high resolution transmission electron microscope (HR-TEM: High Resolution-TEM) images of Sample A1, Sample A2, and Sample A3, respectively. Note that the cross-sectional HR-TEM images may be obtained with a spherical aberration corrector (Spherical Aberration Corrector) function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

As shown in FIGS. 1A to 2C, crystal parts in which atoms are aligned in a layered manner in the thickness direction are observed in Samples A1 and A2. In particular, in HR-TEM images, crystal parts in which atoms are aligned in a layered manner are easily observed. As shown in FIGS. 3A to 3C, the state where atoms are aligned in a layered manner in the thickness direction is unlikely to be observed in Sample A3. Note that the proportion of regions where atoms are arranged in the thickness direction of Sample A1 appears to be larger than that of Sample A2.

[XRD Measurement]

Next, XRD measurement results of the samples will be described.

Figure 4A:
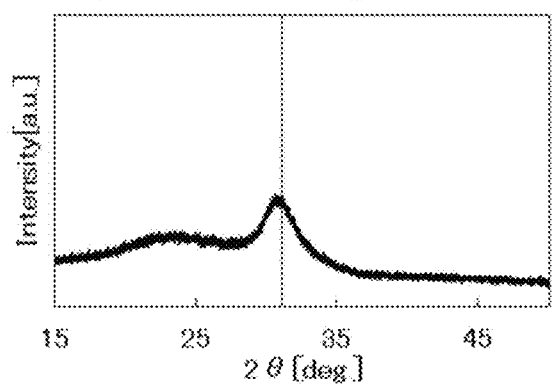
Figure 5A:
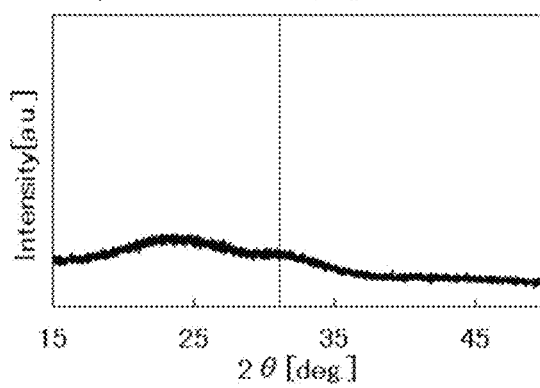
Figure 6A:
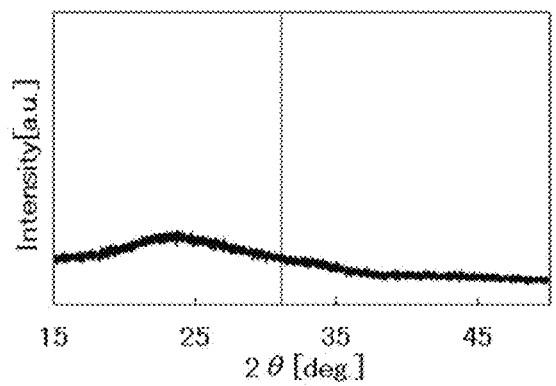

FIG. 4A, FIG. 5A, and FIG. 6A show XRD measurement results of Sample A1, Sample A2, and Sample A3, respectively.

The XRD measurement was conducted by a powder method (also referred to as a θ-2θ method) which is a kind of an out-of-plane method. In the θ-2θ method, X-ray diffraction intensity is measured while an incident angle of an X-ray is changed and the angle of a detector facing an X-ray source is equal to the incident angle. Note that a GIXRD (Grazing-Incidence XRD) method (also referred to as a thin film method or a Seemann-Bohlin method) may be used. The GIXRD method is a kind of an out-of-plane method for measuring X-ray diffraction intensity in which X-ray is incident at an angle approximately 0.40° from a film surface with use of a variable-angle detector. In FIG. 4A, FIG. 5A, and FIG. 6A, the vertical axis represents diffraction intensity in an arbitrary unit, and the horizontal axis represents angle 2θ.

As shown in FIG. 4A and FIG. 5A, a peak of diffraction intensity is observed at around 2θ=31° in each of Sample A1 and Sample A2. In contrast, as shown in FIG. 6A, a peak of diffraction intensity at around 2θ=31° is unlikely to be observed in Sample A3, extremely small, or does not exist.

The diffraction angle (at around 2θ=31°) at which the peak of the diffraction intensity was observed corresponds to a diffraction angle on the (009) plane of the structure model of single crystal $InGaZnO_4$. Accordingly, the above peaks indicate that each of Samples A1 and A2 includes a crystal part where the c-axes are aligned in the thickness direction (hereinafter also referred to as a crystal part having c-axis alignment or a first crystal part). The comparison of the intensities shows that Sample A1 has higher proportion of crystal parts having c-axis alignment than that of Sample A2. Note that it is difficult to determine, by XRD measurement, whether a crystal part having c-axis alignment is included in Sample A3.

The results show that there is a tendency that the higher the substrate temperature at the deposition time and the oxygen flow rate ratio are, the larger the proportion of crystal parts having c-axis alignment is.

[Electron Diffraction]

Next, electron diffraction measurement results of Samples A1 to A3 are described below. In the electron diffraction measurement, an electron diffraction pattern was obtained in such a manner that each of the samples is irradiated with an electron beam incident in a direction perpendicular to its cross section. The electron-beam diameters were set to 1 nmφ and 100 nmφ.

In electron diffraction, as the diameter of an incident electron beam is larger and the thickness of sample is larger, information of the sample in the depth direction is likely to be shown in the electron diffraction pattern. Therefore, the information of local regions can be obtained by reducing not only the diameter of the electron beam but also the thickness of the sample in the depth direction. In contrast, when the thickness of the sample in the depth direction is too small (e.g., the thickness of the sample in the depth direction is less than or equal to 5 nm), information of only submicroscopic region is obtained. Thus, an electron diffraction pattern obtained when a crystal exists in the submicroscopic region is similar to an electron diffraction pattern of a single crystal in some cases. When the aim is not to analyze the submicroscopic region, the thickness of the sample in the depth direction is preferably greater than or equal to 10 nm and less than or equal to 100 nm, typically greater than or equal to 10 nm and less than or equal to 50 nm.

Figure 4B:
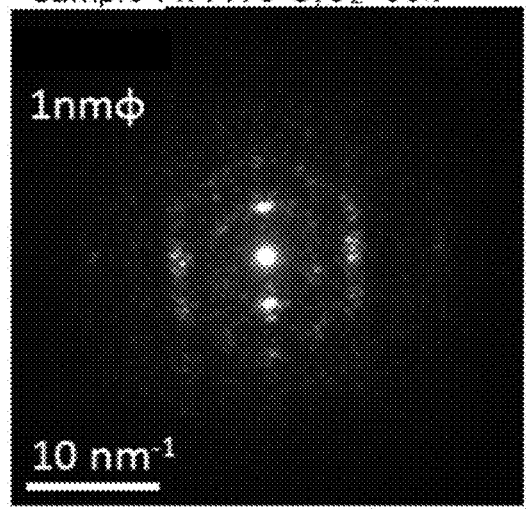
Figure 4C:
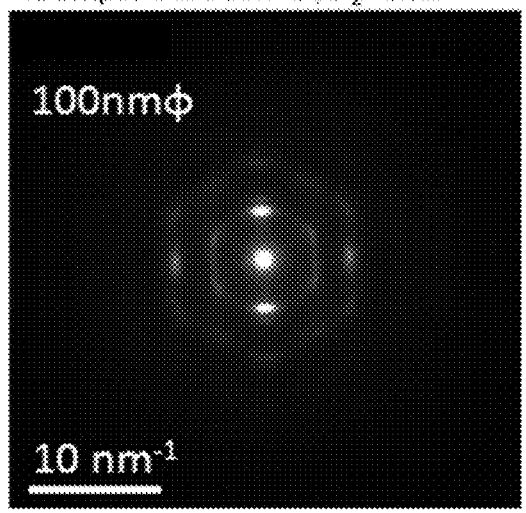
Figure 5B:
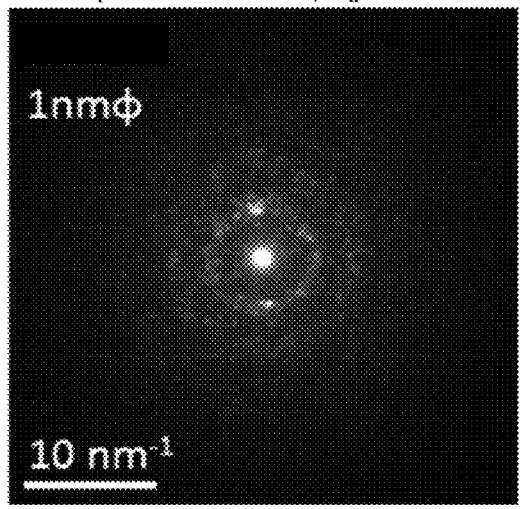
Figure 5C:
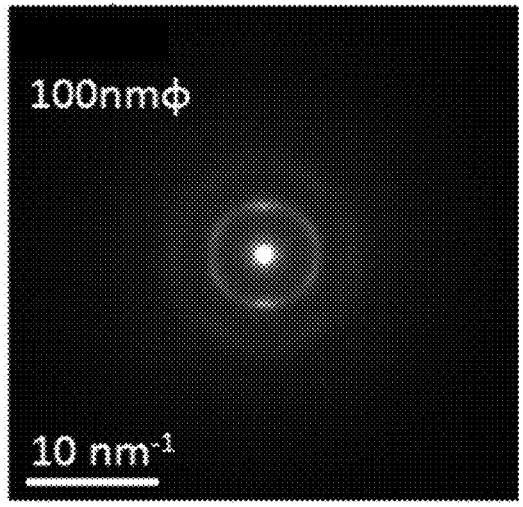
Figure 6B:
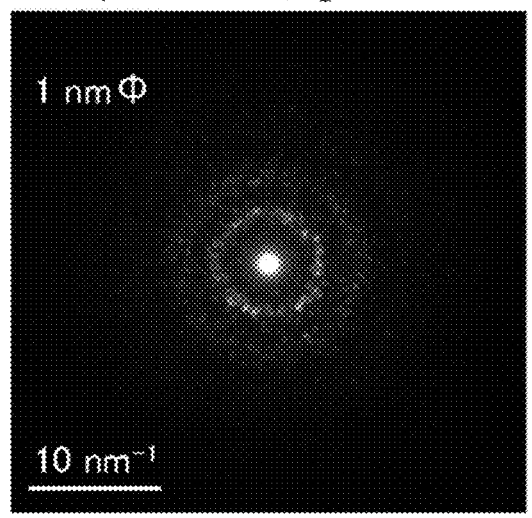
Figure 6C:
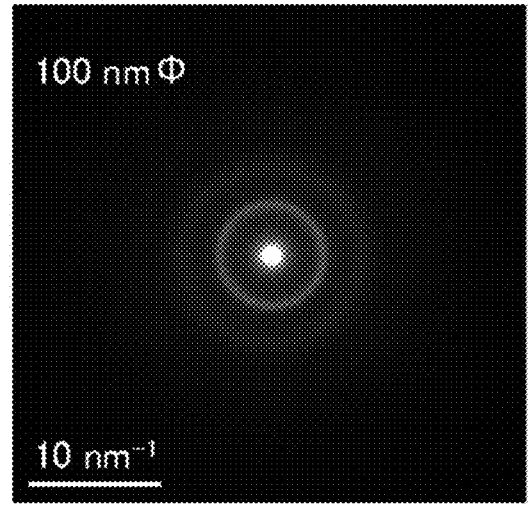

FIGS. 4B and 4C show electron diffraction patterns of Sample A1. FIGS. 5B and 5C show electron diffraction patterns of Sample A2. FIGS. 6B and 6C show electron diffraction patterns of Sample A3.

Note that the electron diffraction patterns of FIGS. 4B and 4C, FIGS. 5B and 5C, and FIGS. 6B and 6C are image data whose contrasts were adjusted to make the electron diffraction patterns clear. In FIGS. 4B and 4C, FIGS. 5B and 5C, and FIGS. 6B and 6C, the brightest luminescent spot at the center of the pattern is derived from the incident electron beam and is the center of the electron diffraction pattern (also referred to as a direct spot or a transmitted wave).

As shown in FIG. 4B, when the diameter of the incident electron beam is set to 1 nmφ, a plurality of spots circumferentially distributed can be observed. This indicates that the metal oxide film contains a plurality of submicroscopic crystal parts having random surface orientation. As shown in FIG. 4C, when the diameter of the incident electron beam is set to 100 nmφ, the luminances of a sequence of a plurality of diffraction spots derived from these plurality of crystal parts are averaged to be a ring-like diffraction pattern. Two ring-like diffraction patterns with different radii are observed in FIG. 4C. The rings are referred to as a first ring and a second ring in ascending order of radius of a diffraction pattern. It is observed that the luminance of the first ring is higher than that of the second ring. In addition, two spots (referred to as first regions) with high luminance are observed at a position overlapping with the first ring.

The distance from the center to the first ring in a radial direction substantially corresponds to the distance from the center to a diffraction spot on the (009) plane of the structure model of single crystal InGaZnO$_4$ in a radical direction. The first regions are diffraction spots derived from c-axis alignment.

As shown in FIG. 4C, the observations of the ring-like diffraction patterns indicate that crystal parts having random orientation (hereinafter also referred to as crystal parts having no c-axis alignment or as second crystal parts) exist in the metal oxide film.

Two first regions are presumed to have two-fold symmetry because the regions are disposed symmetrically with respect to the center point of the electron diffraction pattern and the luminance of the regions are substantially equal to each other. As described above, since the two first regions are diffraction spots which are derived from the c-axis alignment, the orientation of a straight line which passes through the two first regions and the center is aligned with that of the c-axis of the crystal part. The thickness direction is the vertical direction of FIG. 4C, which suggest the presence of crystal part in which the c-axis is oriented in the thickness direction in the metal oxide film.

As described above, the metal oxide film of Sample A1 is confirmed to be a film including both crystal parts having c-axis alignment and crystal parts having no c-axis alignment.

The results of the electron diffraction patterns shown in FIGS. 5B and 5C and FIGS. 6B and 6C are substantially the same as those of the electron diffraction patterns shown in FIGS. 4B and 4C. Note that the luminance of the two spots (first regions) derived from c-axis alignment is high in the order of Sample A1, Sample A2, and Sample A3. This indicates that the proportion of crystal parts having c-axis alignment is high in the order of Sample A1, Sample A2, and Sample A3.

[Quantification Method of Crystallinity of Metal Oxide Film]

Next, an example of a quantification method of crystallinity of an oxide semiconductor film is described with reference to FIGS. 7A to 9.

Figure 7A:
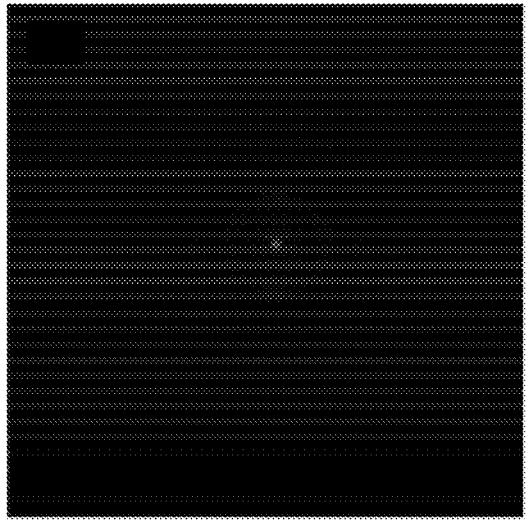

First, an electron diffraction pattern is prepared (see FIG. 7A).

Figure 7B:
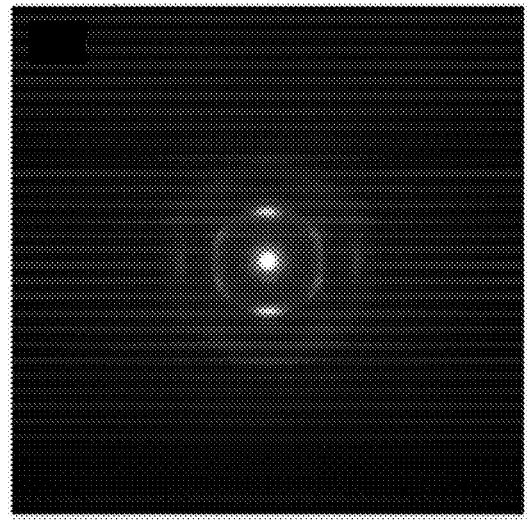

Note that FIG. 7A shows an electron diffraction pattern obtained by measuring a 100-nm-thick oxide semiconductor film using an electron beam with a diameter of 100 nm. FIG. 7B shows an electron diffraction pattern obtained by adjusting contrast of the electron diffraction pattern shown in FIG. 7A.

In FIG. 7B, two clear spots (first regions) are observed over and under a direct spot. The two spots (first regions) are derived from diffraction spots corresponding to (001) in a structure model of InGaZnO$_4$, that is, crystal parts having c-axis alignment. In addition to the first regions, a ring-like pattern (second regions) with a low luminance positioned on an approximately concentric circle of the first region is observed. The ring-like pattern is obtained when the luminance of spots derived from structures of crystal parts having no c-axis alignment (second crystal parts) are averaged by using the electron beam with a diameter of 100 nm.

Here, in the electron diffraction pattern, the first regions including diffraction spots derived from the crystal parts having c-axis alignment and the second regions including diffraction spots derived from the second crystal parts are observed to overlap with each other. Thus, a line profile including the first regions and line profiles including the second regions are obtained and compared with each other, whereby the crystallinity of the metal oxide film can be quantified.

First, the line profile including the first regions and the line profiles including the second regions are described with reference to FIG. 8.

Figure 8:
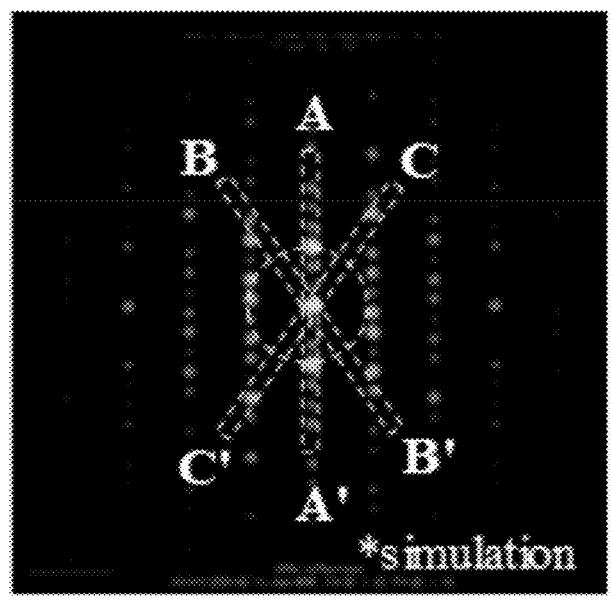

FIG. 8 shows a simulation pattern of electron diffraction that is obtained when an electron beam is emitted to the (100) plane of the structure model of InGaZnO$_4$. In the simulation pattern, auxiliary lines of a region A-A', a region B-B', and a region C-C' are drawn.

The region A-A' in FIG. 8 includes a straight line passing through two diffraction spots derived from the first crystal parts having c-axis alignment and a direct spot. The regions B-B' and C-C' in FIG. 8 each include a straight line passing through regions where no diffraction spot derived from the first crystal part having c-axis alignment is observed and a direct spot. Note that an angle between the region A-A' and the region B-B' or C-C' is approximately 34°, specifically, larger than or equal to 30° and smaller than or equal to 38°, preferably larger than or equal to 32° and smaller than or equal to 36°, further preferably larger than or equal to 33° and smaller than or equal to 35°.

Note that the line profiles have the tendencies shown in FIG. 9 in accordance with the structure of the metal oxide film. FIG. 9 shows image diagrams of line profiles, relative luminance R, and a half width (FWHM: full width at half maximum) of a spectrum derived from c-axis alignment that is obtained from an electron diffraction pattern of each structure.

Note that relative luminance R in FIG. 9 is obtained by dividing the integrated intensity of luminance of the region A-A' by the integrated intensity of luminance of the region B-B' or the integrated intensity of luminance of the region C-C'. Note that the integrated intensity of the luminance of each of the regions A-A', B-B', and C-C' is obtained by removing a direct spot which appears at the center and the luminance of background derived from the direct spot.

When the relative luminance R is calculated, the intensity of c-axis alignment can be quantitatively defined. For example, as shown in FIG. 9, in a single-crystal metal oxide film, the peak intensity of diffraction spots derived from the first crystal parts having c-axis alignment in the region A-A' is high and there is no diffraction spot derived from the first crystal part having c-axis alignment in the regions B-B' and C-C'; thus, the relative luminance R is much larger than 1. The relative luminance R decreases in the order of single-crystal metal oxide film, only CAAC (details of CAAC will be described later), CAAC+nanocrystal, nanocrystal, and an amorphous metal oxide film. In nanocrystal and an amorphous metal oxide film, which have no particular orientation, the relative luminance R is equal to 1.

As the periodicity of the crystal is higher, the intensity of the spectrum derived from the first crystal part having c-axis alignment becomes high and the half width of the spectrum becomes small. Thus, the half width of a single-crystal metal oxide film is the smallest, and the half width is increased in the order of only CAAC, CAAC+nanocrystal, and a nanocrystal metal oxide film. The half width of an amorphous metal oxide film is extremely large and the profile is called a "halo".

[Analysis with Line Profiles]

As described above, the ratio of the integrated intensity of luminance of the first regions to the integrated intensity of luminance of the second regions is important information to presume the proportion of crystal parts having orientation.

From electron diffraction patterns of Samples A1 to A3, which are described above, analysis with line profiles was performed.

FIGS. 10A1 and 10A2 show results of analysis with line profiles of Sample A1. FIGS. 10B1 and 10B2 show results of analysis with line profiles of Sample A2. FIGS. 11A1 and 11A2 show results of analysis with line profiles of Sample A3.

FIG. 10A1 shows the electron diffraction pattern in FIG. 4C in which the regions A-A', B-B', and C-C' are drawn. FIG. 10B1 shows the electron diffraction pattern in FIG. 5C in which the regions A-A', B-B', and C-C' are drawn. FIG. 11C1 shows the electron diffraction pattern in FIG. 6C in which the regions A-A', B-B', and C-C' are drawn.

The regions A-A', B-B', and C-C' can each be obtained by normalizing line profiles using the luminance of the direct spot as a reference. Note that the direct spot appears at the center of an electron diffraction pattern. The samples can thus be relatively compared with one another.

When the profile of the luminance is calculated, a component of the luminance derived from inelastic scatterings and the like from Sample is subtracted as the background, in which case comparison with higher accuracy can be performed. Because the component of the luminance derived from inelastic scatterings shows an extremely broad profile in a radial direction, the luminance of the background may be obtained by a linear approximation. For example, a straight line is drawn along the tails of a target peak, and a region positioned on the luminance side lower than the straight line can be subtracted as the background.

Here, the integrated intensity of the luminance of each of the regions A-A', B-B', and C-C' was calculated from data in which the background is subtracted by the method described above. Then, the relative luminance R was obtained by dividing the integrated intensity of the luminance of the region A-A' by the integrated intensity of the luminance of the region B-B' or the integrated intensity of the luminance of the region C-C'.

Figure 12:
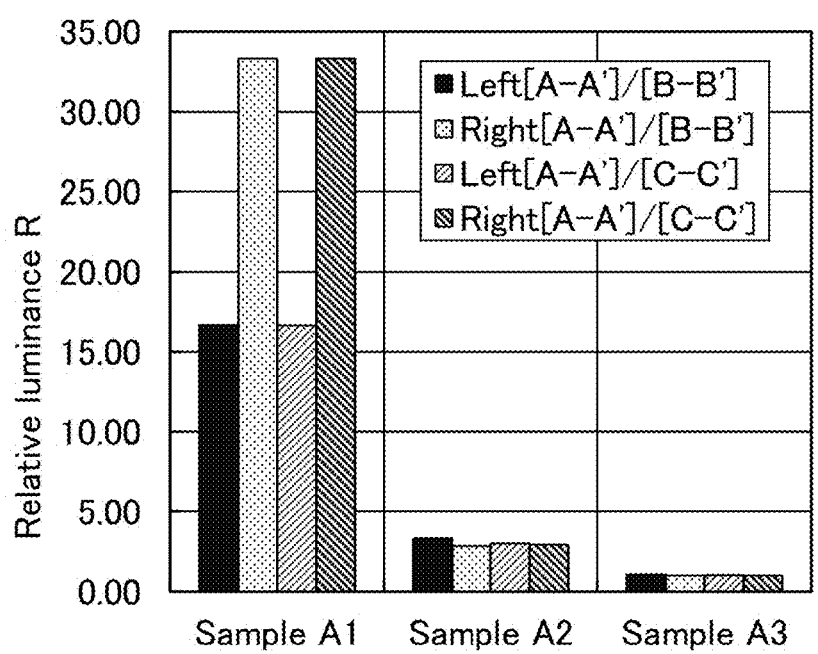

FIG. 12 shows the relative luminance R of Samples A1 to A3. Note that the values shown in FIG. 12 were obtained by dividing the integrated intensity of the luminance of the region A-A' by the integrated intensity of the luminance of the region B-B' and the values obtained by dividing the integrated intensity of the luminance of the region A-A' by the integrated intensity of the luminance of the region C-C' at the peaks on the left side and the right side of the direct spot in the luminance profiles shown in FIGS. 10A2, 10B2, and 11A2.

As shown in FIG. 12, the relative luminance of Samples A1 to A3 is as follows.

The relative luminance R of Sample A1=25.00
The relative luminance R of Sample A2=3.04
The relative luminance R of Sample A3=1.05

Note that the relative luminance R was an average value of relative luminance at four points. As described above, the relative luminance R is high in the order of Sample A1, Sample A2, and Sample A3.

When the metal oxide film of one embodiment of the present invention is used as a semiconductor film in which a channel of a transistor is formed, the relative luminance R is preferably greater than 1 and less than or equal to 40, further preferably greater than 1 and less than or equal to 10, still further preferably greater than 1 and less than or equal to 3. With use of such a metal oxide film as a semiconductor film, both high stability of electrical characteristics and high field-effect mobility in a low-gate-voltage region can be achieved.

<1-3. Proportion of Crystal Part>

The proportion of crystal parts in a metal oxide film can be estimated by analyzing its cross-sectional TEM image.

A method for analyzing the image is described. First, a high-resolution TEM image is subjected to two-dimensional fast Fourier transform (FFT), whereby an FFT image is obtained. The obtained FFT image is subjected to a mask processing so that a region other than a region having a periodic structure is removed. After the mask processing, the FFT image is subjected to two-dimensional inverse fast Fourier transform (IFFT), whereby an FFT filtering image is obtained.

In this manner, a real-space image in which only crystal parts are extracted can be obtained. The proportion of crystal parts can be estimated from the proportion of area of the remaining image. Moreover, the proportion of area other than the crystal parts can be estimated by subtracting the remaining region from the area of the region used for calculation (also referred to as the area of the original image).

Figure 15A:
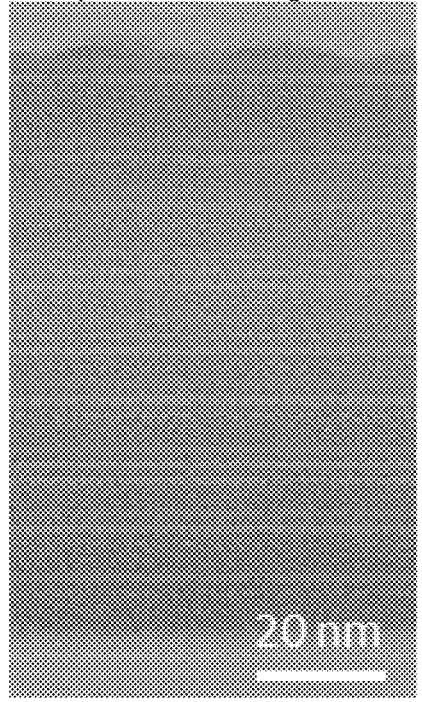
Figure 15B:
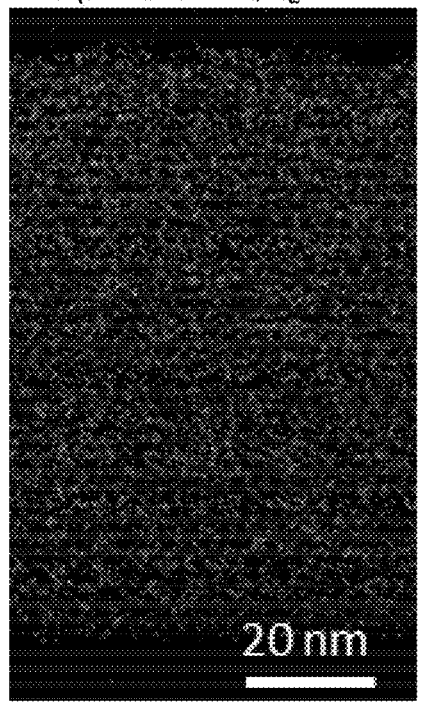

FIG. 13A shows a cross-sectional TEM image of Sample A1. FIG. 13B shows an image obtained through the analysis of the cross-sectional TEM image of Sample A1. FIG. 14A shows a cross-sectional TEM image of Sample A2. FIG. 14B shows an image obtained through the analysis of the cross-sectional TEM image of Sample A2. FIG. 15A shows a cross-sectional TEM image of Sample A3. FIG. 15B shows an image obtained through the analysis of the cross-sectional TEM image of Sample A3.

White regions in the metal oxide film in the images obtained through the analysis correspond to regions including crystal parts having orientation. Black regions correspond to regions including crystal parts having no orientation or crystal parts having random orientation.

From the result shown in FIG. 13B, the proportion of the area other than the region including crystal parts having orientation is approximately 43.1% in Sample A1. From the result shown in FIG. 14B, the proportion of the area other than the region including crystal parts having orientation is approximately 61.7% in Sample A2. From the result shown in FIG. 15B, the proportion of the area other than the region including crystal parts having orientation is approximately 89.5% in Sample A3.

The proportion of the region other than crystal parts having orientation in a metal oxide film, which is estimated in the above manner, is preferably greater than or equal to 5% and less than 40% because the metal oxide film has extremely high crystallinity and extremely high stability of electrical characteristics and hardly generates oxygen vacancies. In contrast, when the proportion of the region other than crystal parts having orientation in an metal oxide film is higher than or equal to 40% and lower than 100%, preferably higher than or equal to 60% and lower than or equal to 90%, the metal oxide film includes both the crystal parts having orientation and the crystal parts having no orientation at an appropriate ratio and thus can achieve both high stability of electrical characteristics and high mobility.

Here, a region other than the crystal parts that can be easily observed in a cross-sectional TEM image or a cross-sectional TEM image obtained through analysis can be referred to as a lateral growth buffer region (LGBR).

<1-4. Oxygen Diffusion to Metal Oxide Film>

The evaluation results of ease of oxygen diffusion to metal oxide films are described below.

The following three samples (Samples B1 to B3) were fabricated.

[Sample B1]

First, an approximately 50-nm-thick metal oxide film was formed over a glass substrate in a manner similar to that of Sample A1. Next, an approximately 30-nm-thick silicon oxynitride film, an approximately 100-nm-thick silicon oxynitride film, and an approximately 20-nm-thick silicon oxynitride film were stacked over the metal oxide film by a plasma CVD method. Note that in the following description, a metal oxide film and a silicon oxynitride film are referred to as OS and GI, respectively, in some cases.

Then, heat treatment was performed at 350° C. for one hour in a nitrogen atmosphere.

Next, a 5-nm-thick In-Sn-Si oxide film was formed by a sputtering method.

Next, oxygen was added to the silicon oxynitride film. The oxygen addition treatment was performed with an ashing apparatus under the conditions where the substrate temperature was 40° C., an oxygen gas ($^{16}$O) at a flow rate of 150 sccm and an oxygen gas ($^{18}$O) at a flow rate of 100 sccm were introduced into a chamber, the pressure was 15 Pa, and an RF power of 4500 W was supplied for 600 sec. between parallel-plate electrodes provided in the ashing apparatus so that a bias would be applied to the substrate side. Note that since the silicon oxynitride film contained oxygen ($^{16}$O) at a main component level, an oxygen gas ($^{18}$O) was used to exactly measure the amount of oxygen added by the oxygen addition treatment.

Then, an approximately 100-nm-thick silicon nitride film was formed by a plasma CVD method.

[Sample B2]

Sample B2 is a sample whose metal oxide film was manufactured in different conditions from those of Sample B1. In Sample B2, an approximately 50-nm-thick metal oxide film was formed in a manner similar to that of Sample A2.

[Sample B3]

Sample B3 is a sample whose metal oxide film was manufactured in different conditions from those of Sample B1. In Sample B3, an approximately 50-nm-thick metal oxide film was formed in a manner similar to that of Sample A3.

Through the above-described steps, Samples B1 to B3 were manufactured.

[SIMS Analysis]

The concentration of $^{18}$O in Samples B1 to B3 was measured by secondary ion mass spectrometry (SIMS) analysis. Note that the SIMS analysis was performed under three conditions: a condition in which Samples B1 to B3 were not subjected to heat treatment; a condition in which Samples B1 to B3 were subjected to heat treatment at 350° C. for one hour in a nitrogen atmosphere; and a condition in which Samples B1 to B3 were subjected to heat treatment at 450° C. for one hour in a nitrogen atmosphere.

Figure 16A:
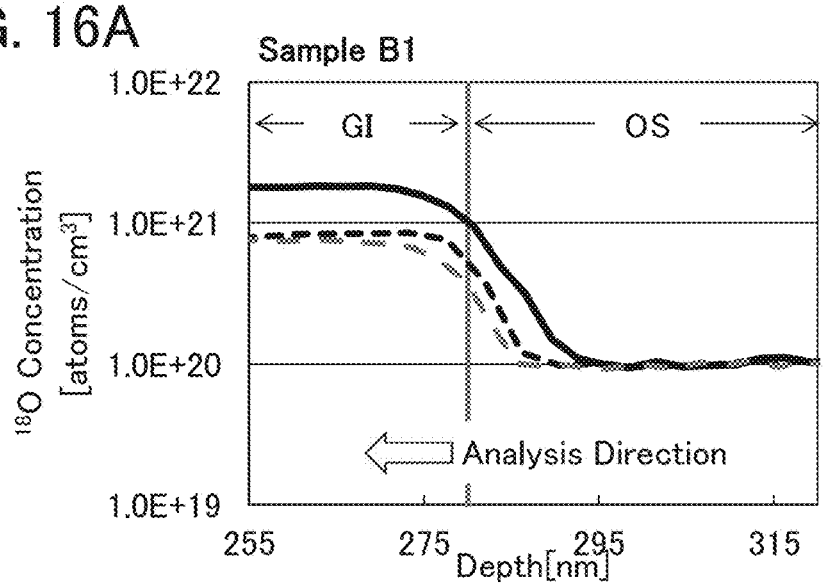
Figure 16B:
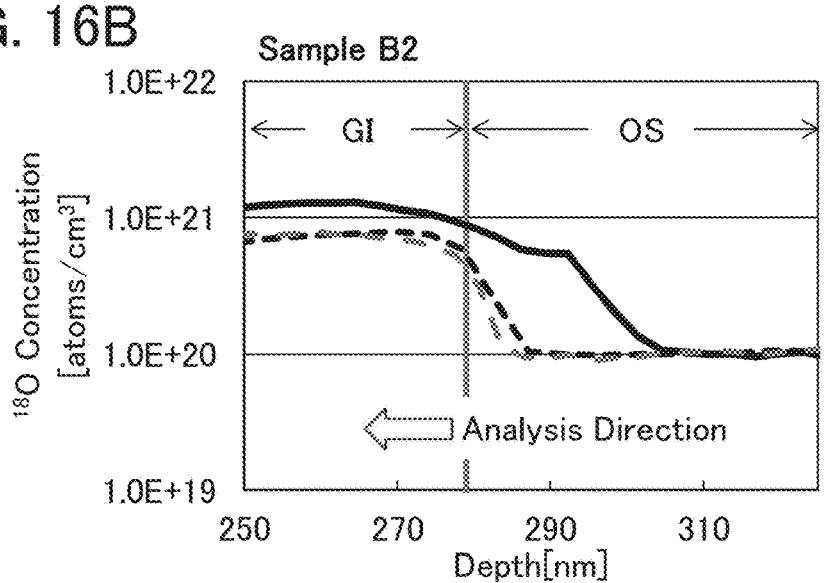
Figure 16C:
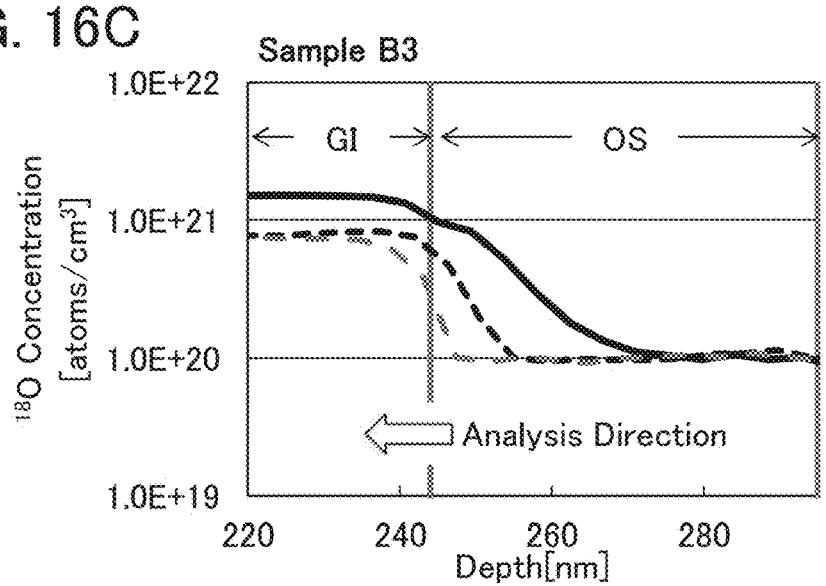

FIGS. 16A to 16C show SIMS measurement results. FIGS. 16A to 16C show the analysis results of a region including GI and OS. Note that FIGS. 16A to 16C show the results analyzed from the substrate side (also referred to as SSDP (Substrate Side Depth Profile)-SIMS).

In FIGS. 16A to 16C, a gray dashed line indicates a profile under a condition in which heat treatment was not performed, a black dashed line indicates a profile under a condition in which heat treatment was performed at 350° C., and a black solid line indicates a profile under a condition in which heat treatment was performed at 450° C.

In each of Samples B1 to B3, it is found that $^{18}$O was diffused to GI and also to OS. Furthermore, $^{18}$O of Sample B3 is diffused at the deepest position, and the position where $^{18}$O is diffused is found to be shallower in the order of Sample B2 and Sample B1. It is also found that $^{18}$O is more deeply diffused by heat treatment at 350° C. or 450° C.

From the above results, it is found that a metal oxide film including both crystal parts having orientation and crystal parts having no orientation and a low proportion of crystal parts having orientation is a film which easily transmits oxygen, in other words, a film in which oxygen is easily diffused. It is also found that oxygen in a GI film is diffused to OS by heat treatment at 350° C. or 450° C.

The above results show that the higher the proportion (density) of crystal parts having orientation is, the more difficult it is for oxygen to be diffused in the thickness direction, and that the lower the density is, the easier it is for oxygen to be diffused in the thickness direction. The ease of oxygen diffusion to the metal oxide film can be considered as follows.

In a metal oxide film containing both crystal parts having orientation and submicroscopic crystal parts having no orientation, a region other than the crystal parts which can be obviously observed in a cross-sectional observation image (LGBR) can be a region in which oxygen is easily diffused, that is, can serve as an oxygen diffusion path. As a result, in the case where a source which supplies sufficient oxygen is provided in the vicinity of the metal oxide film, oxygen can be easily supplied through the LGBR to the crystal parts having orientation, and the amount of oxygen vacancy in the film can be reduced.

For example, an oxide film which easily releases oxygen is formed to be in contact with the metal oxide film and heat treatment is performed, so that oxygen released from the oxide film is diffused to the metal oxide film in the thickness direction through the LGBR. Through the LGBR, oxygen can be supplied laterally to crystal parts having orientation. Accordingly, oxygen is easily supplied sufficiently to the crystal parts with a particular orientation and a region other than the crystal parts in the metal oxide film, which leads to an effective reduction of oxygen vacancy in the film.

For example, when an oxide film including In, M (M is Al, Ga, Y, or Sn), and Zn is used as a metal oxide film, active oxygen (atomic oxygen) is bonded to the side surface of a crystal part having orientation. In addition, metal such as In, M, or Zn is bonded to the bonded active oxygen. It can be assumed that the repetitive bonding between active oxygen and metal such as In, M, or Zn in the above manner leads to solid-phase growth in a lateral direction from the side surface of the crystal part having orientation. Such a lateral growth of a crystal part having orientation can be referred to as self-organization.

For example, when a hydrogen atom which is not bonded to a metal atom exists in the metal oxide film, an oxygen atom is bonded to the hydrogen atom, and then OH is formed and fixed in some cases. The state in which a certain amount (e.g., approximately $1\times10^{17}$ cm$^3$) of hydrogen trapped in oxygen vacancy (Vo) in the metal oxide film (referred to as VoH) is formed in the deposition at low temperature, whereby formation of OH is inhibited. A certain amount of carrier exists in the metal oxide film because VoH generates a carrier. Thus, the metal oxide film with an increased carrier concentration can be formed. Although oxygen vacancy is formed concurrently with the deposition, the oxygen vacancy can be reduced by introducing oxygen through the LGBR as described above. In this manner, the metal oxide film with a relatively high carrier concentration and a sufficiently reduced oxygen vacancy can be formed.

A clear grain boundary cannot be observed in the metal oxide film because submicroscopic crystal parts with a random orientation at the time of the deposition is formed in a region other than crystal parts with a particular orientation. The submicroscopic crystal part is positioned between a plurality of crystal parts having orientation. The submicroscopic crystal part is bonded to an adjacent crystal part having orientation by growing in the lateral direction with heat at the time of the deposition. The submicroscopic crystal part functions as a region where a carrier is generated. The metal oxide film with such a structure is expected to improve field-effect mobility when applied to a transistor.

In addition, it is found that the oxygen-transmitting property is improved when the metal oxide film is formed at a low temperature and a low oxygen flow ratio. Thus, it is supposed that for example, the amount of diffused oxygen in the transistor fabrication process is increased, whereby defects such as oxygen vacancies in the metal oxide film and at the interface between the metal oxide film and an insulating film is reduced. It is suggested that the density of defect states is reduced owing to such an effect, so that the on-state current of the transistor is largely increased.

A transistor with such improved on-state current is suitably used for a switch that can be used for rapid charging and discharging of a capacity. As a typical example, the transistor is suitably used for a demultiplexer circuit.

In addition, plasma treatment in an oxygen atmosphere is preferably performed after the metal oxide film is formed and an oxide insulating film such as a silicon oxide film is formed over the metal oxide film. The treatment can supply oxygen to the film and reduce the hydrogen concentration. For example, during plasma treatment, fluorine which remains in the chamber is doped at the same time to the metal oxide film in some cases. Fluorine exists as a fluorine atom with negative charges and is bonded to a hydrogen atom with positive charges by Coulomb force, and then HF is generated. HF is released to the outside of the metal oxide film during plasma treatment, and as a result, the hydrogen concentration in the metal oxide film can be reduced. In plasma treatment, $H_2O$ in which an oxygen atom and a hydrogen atom are bonded is released to the outside of the film in some case.

A structure in which a silicon oxide film (or a silicon oxynitride film) is stacked over the metal oxide film is considered. Fluorine in the silicon oxide film does not affect electrical characteristics of the metal oxide film because fluorine is bonded to hydrogen in the film and can exist as HF which is electrically neutral. Note that Si—F bond is generated in some cases, which is also electrically neutral. Furthermore, HF in the silicon oxide film does not affect the diffusion of oxygen.

According to the above mechanism, oxygen vacancy in the metal oxide film can be reduced and hydrogen which is not bonded to a metal atom in the film can be reduced, which leads to the improvement of reliability. The electrical characteristics are expected to be improved because the carrier density of the metal oxide film is greater than or equal to a certain amount.

<1-5. Measurement of Shallow Defect States Using Transistor Characteristics>

Results of formation of transistors using the above-mentioned metal oxide films of Samples A1 to A3 and measurement of the density of defect states are described below.

A couple of each Samples C1 to C3 whose semiconductor films were formed in different conditions were fabricated. Note that Samples C1 to C3 are transistors in which the channel length L is 6 μm and the channel width W is 50 μm.

<Formation of Transistor>

First, a 10-nm-thick titanium film and a 100-nm-thick copper film were formed over a glass substrate with a sputtering apparatus. Next, the conductive film was processed by a photolithography method.

Four insulating films was formed and stacked over the substrate and the conductive film. The insulating films were formed in succession in a vacuum with a plasma-enhanced chemical vapor deposition (PECVD) apparatus. As the insulating films, a 50-nm-thick silicon nitride film, a 300-nm-thick silicon nitride film, a 50-nm-thick silicon nitride film, and a 50-nm-thick silicon oxynitride film were stacked in this order.

Next, an oxide semiconductor film was formed over the insulating films and was processed into an island shape, whereby a semiconductor layer was formed. A 40-nm-thick oxide semiconductor film was formed as the oxide semiconductor film.

The formation conditions of a metal oxide film for Sample C1 which was used for an oxide semiconductor film were similar to those for Sample A1. In other words, the substrate temperature was 170° C., an argon gas with a flow rate of 140 sccm and an oxygen gas with a flow rate of 60 sccm were introduced into a chamber of the sputtering apparatus, the pressure was set to 0.6 Pa, and an AC power of 2.5 kW was applied to a metal oxide target containing indium, gallium, and zinc (In:Ga:Zn=4:2:4.1 [atomic ratio]). Note that the oxygen flow rate ratio was 30%. The thickness was approximately 40 nm.

The formation conditions of a metal oxide film for Sample C2 which was used for an oxide semiconductor film were similar to those for Sample A2. In other words, the substrate temperature was 130° C., an argon gas with a flow rate of 180 sccm and an oxygen gas with a flow rate of 20 sccm were introduced into a chamber of the sputtering apparatus, the pressure was set to 0.6 Pa, and an AC power of 2.5 kW was applied to a metal oxide target containing indium, gallium, and zinc (In:Ga:Zn=4:2:4.1 [atomic ratio]). Note that the oxygen flow rate ratio was 10%. The thickness was approximately 40 nm.

The formation conditions of a metal oxide film for Sample C3 which was used for an oxide semiconductor film were similar to those for Sample A3. That is, the substrate temperature was room temperature (R.T.), an argon gas with a flow rate of 180 sccm and an oxygen gas with a flow rate of 20 sccm were introduced into a chamber of the sputtering apparatus, the pressure was set to 0.6 Pa, and an AC power of 2.5 kW was applied to a metal oxide target containing indium, gallium, and zinc (In:Ga:Zn=4:2:4.1 [atomic ratio]). Note that the oxygen flow rate ratio was 10%. The thickness was approximately 40 nm.

Next, an insulating film was formed over the insulating films and the semiconductor layer. As the insulating film, a 150-nm-thick silicon oxynitride film was formed with a PECVD apparatus.

Next, heat treatment was performed. The heat treatment was performed at 350° C. for one hour in a mixed gas atmosphere of nitrogen and oxygen.

After that, an opening was formed in a desired region of the insulating film. The opening was formed by a dry etching method.

Then, a conductive film was formed over the insulating film and in the opening, and the conductive film was processed into an island shape. After the formation of the island-shaped conductive film, the insulating film in contact with the bottom surface of the conductive film was processed in succession, whereby an island-shaped insulating film was formed.

As the conductive film, a 10-nm-thick oxide semiconductor film, a 50-nm-thick titanium nitride film, and a 100-nm-thick copper film were formed in this order. Note that the oxide semiconductor film was formed under the following conditions: the substrate temperature was 170° C.; an oxygen gas with a flow rate of 200 sccm was introduced into a chamber of the sputtering apparatus; the pressure was set to 0.6 Pa; and an AC power of 2.5 kw was applied to a metal oxide target containing indium, gallium, and zinc (In:Ga:Zn=4:2:4.1 [atomic ratio]). The titanium nitride film and the copper film were each formed using a sputtering apparatus.

Then, plasma treatment was performed from above the oxide semiconductor film, the insulating film, and the conductive film. The plasma treatment was performed with a PECVD apparatus at a substrate temperature of 220° C. in a mixed gas atmosphere containing an argon gas and a nitrogen gas.

Then, an insulating film was formed over the oxide semiconductor film, the insulating film, and the conductive film. The insulating film was formed by stacking a 100-nm-thick silicon nitride film and a 300-nm-thick silicon oxynitride film with a PECVD apparatus.

Then, a mask was formed over the formed insulating film and an opening was formed in the insulating film with use of the mask.

A conductive film was formed to fill the opening and was processed into an island shape, whereby the conductive film serving as a source electrode and a drain electrode was formed. For the conductive films, a 10-nm-thick titanium film and a 100-nm-thick copper film were formed with a sputtering apparatus.

After that, an insulating film was formed over the insulating film and the conductive film. A 1.5-μm-thick acrylic photosensitive resin film was used for the insulating film.

In the above manner, Samples C1 to C3 were fabricated.

[Measurement Method of Density of Shallow Defect States]

Shallow defect states (hereinafter, also referred to as sDOS) of a metal oxide film can be estimated from electrical characteristics of a transistor in which the metal oxide film was used as a semiconductor film. In the following description, the density of interface states of the transistor was measured. In addition, a method for estimating subthreshold leakage current in consideration of the density of interface states and the number of electrons trapped by the interface states, $N_{trap}$ is described.

The number of electrons trapped by the interface states, $N_{trap}$, can be measured by comparing drain current-gate voltage ($I_d$-$V_g$) characteristics of the transistor that was actually measured and drain current-gate voltage ($I_d$-$V_g$) characteristics that was calculated.

Figure 17:
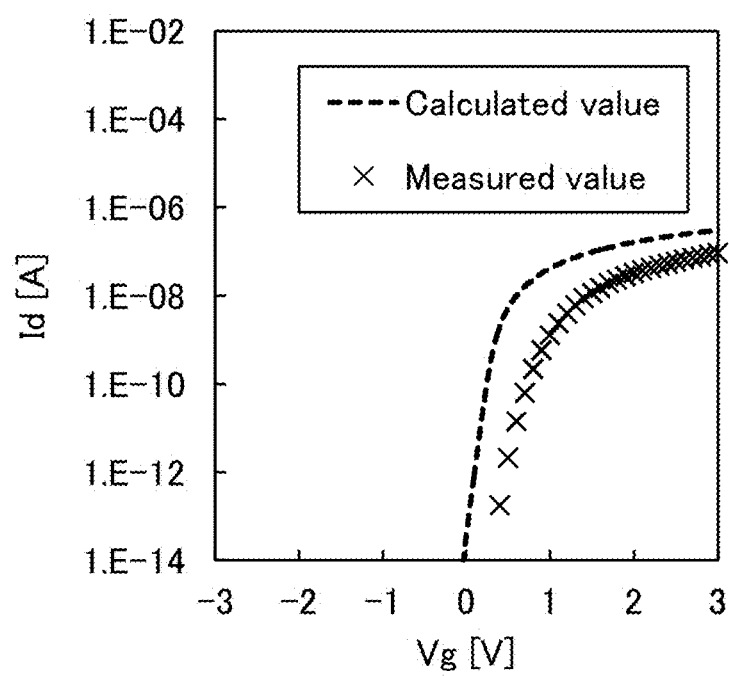

FIG. 17 illustrates ideal $I_d$-$V_g$ characteristics obtained by calculation and the actually measured $I_d$-$V_g$ characteristics of the transistor when a source voltage $V_s$=0 V and a drain voltage $V_d$=0.1 V. Note that among the measurement results of the transistor, only values more than or equal to $1 \times 10^{-13}$ A at which drain current $I_d$ can be easily measured were plotted.

A change of the drain current $I_d$ with respect to the gate voltage $V_g$ is more gradual in the actually measured $I_d$-$V_g$ characteristics than in the ideal $I_d$-$V_g$ characteristics obtained by calculation. This is probably because an electron is trapped by a shallow interface state positioned near energy at the conduction band minimum (represented as Ec). In this measurement, the density of interface states $N_{it}$ can be estimated more accurately in consideration of the number of electrons (per unit area and unit energy) trapped by shallow interface states, $N_{trap}$, with use of the Fermi distribution function.

Figure 18:
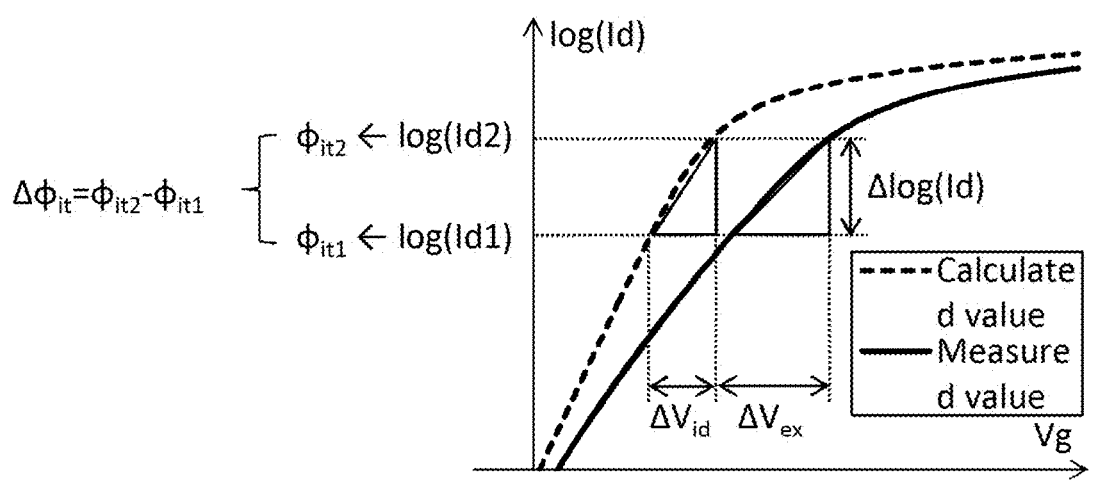

First, a method for evaluating the number of electrons trapped by an interface trap state, $N_{trap}$, by using schematic $I_d$-$V_g$ characteristics illustrated in FIG. 18 is described. The dashed line indicates ideal $I_d$-$V_g$ characteristics without trap state which are obtained by the calculation. On the dashed line, a change in gate voltage $V_g$ when the drain current changes from $I_d1$ to $I_d2$ is represented by $\Delta V_{id}$. The solid line indicates the actually measured $I_d$-$V_g$ characteristics. On the solid line, a change in gate voltage $V_g$ when the drain current changes from $I_d1$ to $I_d2$ is represented by $\Delta V_{ex}$. The potential at the target interface when the drain current is $I_d1$, the potential at the target interface when the drain current is $I_d^2$, and the amount of change are represented by $\phi_{it1}$, $\phi_{it2}$, and $\Delta\phi_{it}$, respectively.

The slope of the actually measured values is smaller than that of the calculated values in FIG. 18, which indicates that $\Delta V_{ex}$ is always larger than $\Delta V_{id}$. Here, a difference between $\Delta V_{ex}$ and $\Delta V_{id}$ corresponds to a potential difference that is needed for trapping of an electron in a shallow interface state. Therefore, the amount of change in charge due to trapped electrons, $\Delta Q_{trap}$, can be expressed by Formula (1) shown below.

[Formula 1]

$$\Delta Q_{trap} = -C_{tg}(\Delta V_{ex} - \Delta V_{id}) \quad (1)$$

$C_{tg}$ is combined capacitance of an insulator and a semiconductor per unit area. In addition, $\Delta Q_{trap}$ can be expressed by Formula (2) by using the number of trapped electrons $N_{trap}$ (per unit area and per unit energy). Note that q represents elementary charge.

[Formula 2]

$$\Delta Q_{trap} = -q N_{trap} \Delta\phi_{it} \quad (2)$$

Simultaneously solving Formula (1) and Formula (2) gives Formula (3).

[Formula 3]

$$-C_{tg}(\Delta V_{ex} - \Delta V_{id}) = -q N_{trap} \Delta\phi_{it} \quad (3)$$

Then, taking the limit $\Delta\phi_{it} \to 0$ in Formula (3) gives Formula (4).

[Formula 4]

$$N_{trap} = \frac{C_{tg}}{q} \lim_{\Delta\phi_{it} \to 0}\left(\frac{\Delta V_{ex}}{\Delta\phi_{it}} - \frac{\Delta V_{id}}{\Delta\phi_{it}}\right) = C_{tg}\left(\frac{\partial V_{ex}}{\partial \phi_{it}} - \frac{\partial V_{id}}{\partial \phi_{it}}\right) \quad (4)$$

In other words, the number of electrons trapped by an interface surface, $N_{trap}$, can be estimated by using the ideal $I_d$-$V_g$ characteristics, the actually measured $I_d$-$V_g$ characteristics, and Formula (4). Note that the relationship between the drain current and the potential at the interface can be obtained by the above calculations.

The relationship between the number of electrons $N_{trap}$ per unit area and per unit energy and the density of interface states $N_{it}$ is expressed by Formula (5).

[Formula 5]

$$N_{trap} = \frac{\partial}{\partial \phi_{it}} \int_{-\infty}^{\infty} N_{it}(E) f(E) dE \quad (5)$$

Here, f(E) is Fermi distribution function. The $N_{trap}$ obtained from Formula (4) is fitted with Formula (5) to determine $N_{it}$. The conduction characteristics including $I_d$<0.1 pA can be obtained by the device simulator to which the $N_{it}$ is set.

Figure 19:
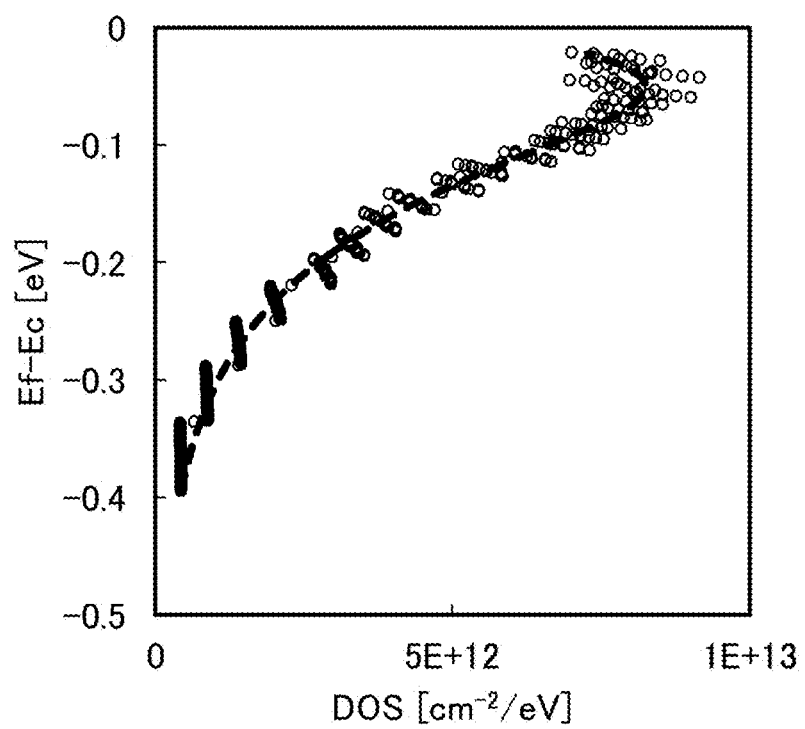

The actually measured $I_d$-$V_g$ characteristics in FIG. 17 are applied to Formula 4 and the results of extracting $N_{trap}$ are plotted as white circles in FIG. 19. The vertical axis in FIG. 19 represents Fermi energy Ef at the bottom of the conduction band Ec of a semiconductor. The maximum value is positioned on the dashed line just under Ec. When tail distribution of Formula (6) is assumed as $N_{it}$ of Formula (5), $N_{trap}$ can be fitted well like the dashed line in FIG. 19. As a result, the trap density at an end of the conduction band $N_{ta}$=1.67×10$^{13}$ cm$^{-2}$ eV and the characteristic decay energy $W_{ta}$=0.105 eV are obtained as the fitting parameters.

[Formula 6]

$$N_{it}(E) = N_{ta} \exp\left[\frac{E - E_c}{W_{ta}}\right] \quad (6)$$

Figure 20A:
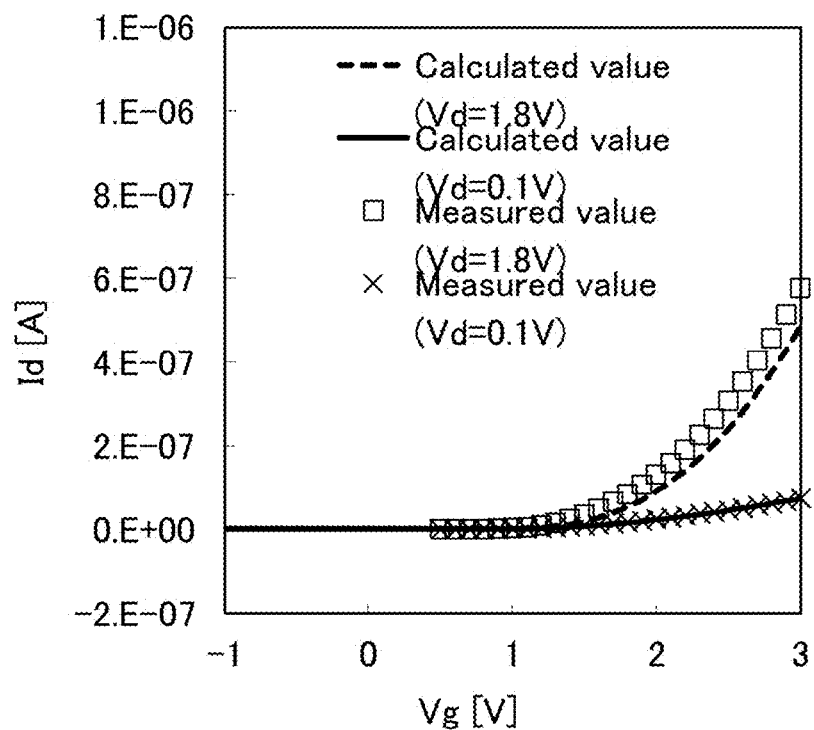
Figure 20B:
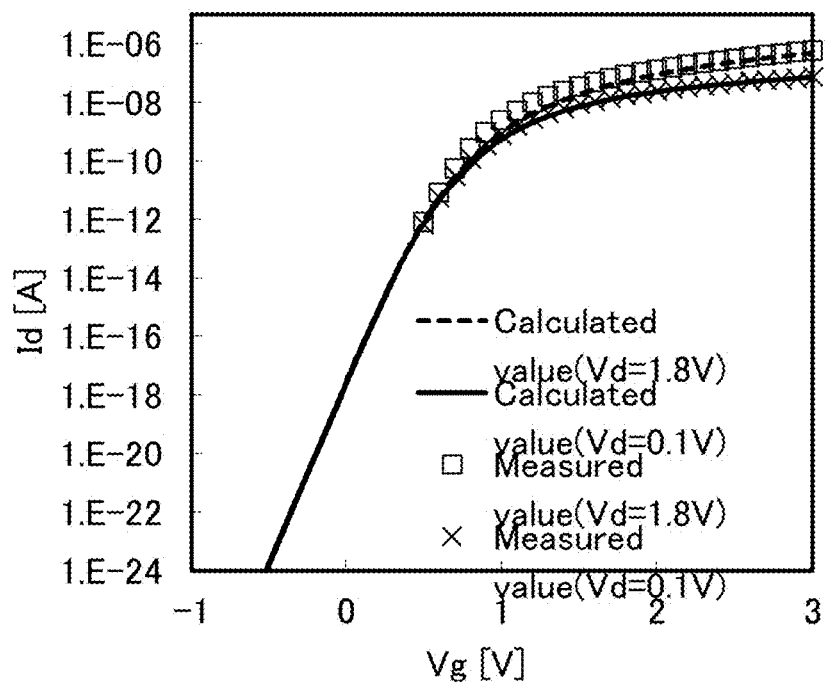

FIGS. 20A and 20B show the inverse calculation results of Id-Vg characteristics by feeding back the obtained fitting curve of interface state to the calculation using the device simulator. FIG. 20A shows the calculated $I_d$-$V_g$ characteristics when the drain voltage $V_d$ is 0.1 V and 1.8V and the actually measured $I_d$-$V_g$ characteristics when the drain voltage $V_d$ is 0.1 V and 1.8V. FIG. 20B is a graph in which the drain current $I_d$ is a logarithm in FIG. 20A.

The curve obtained by the calculation substantially matches with the plot of the actually measured values, which suggests that the calculated values and the measured values are highly reproducible. Thus, the above method is quite appropriate as a method for calculating the density of shallow defect states.

[Measurement Results of Density of Shallow Defect States]

Next, the density of shallow defect states of a couple of each Samples C1 to C3 were measured by comparing measured electrical characteristics with ideal calculation values according to the above-described method.

Figure 21:
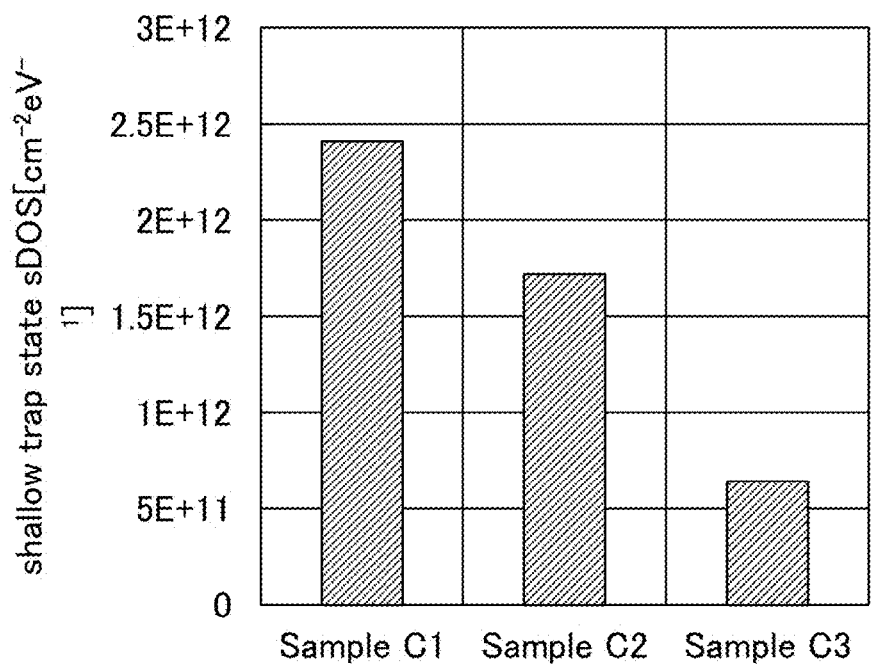

FIG. 21 shows calculation results of average density of shallow defect states of a couple of each Samples C1 to C3. In each Samples C1 to C3, the peak value of the density of shallow defect states is lower than 2.5×10$^{12}$ cm$^{-2}$eV$^{-1}$, which indicates that Samples have extremely low density of shallow defect states. Note that the peak value of the density of shallow defect states in the metal oxide film is lower than 2.5×10$^{12}$ cm$^{-2}$eV$^{-1}$, preferably lower than 1.75×10$^{12}$ cm$^{-2}$eV$^{-1}$, further preferably lower than 1.5×10$^{12}$ cm$^{-2}$eV$^{-1}$, and still further preferably lower than 7.5×10$^{11}$ cm$^{-2}$eV$^{-1}$.

As described above, Samples C1 to C3 are found to be transistors each including a metal oxide film with a low density of defect states. It is inferred that the oxygen-transmitting property is improved because the metal oxide film is formed at a low temperature and a low oxygen flow rate ratio, and that the amount of diffused oxygen in the fabrication process of the transistor is increased, whereby the amount of defects such as oxygen vacancies in the metal oxide film and at the interface between the metal oxide film and the insulating film is reduced.

<1-6. Measurement of Deep Defect States in Metal Oxide Film by CPM>

Deep defect states (hereinafter also referred to as dDOS) in the metal oxide film were measured below by a constant photocurrent method (CPM: Constant Photocurrent Method).

In CPM measurement, the amount of light with which a surface of a sample between terminals is irradiated is adjusted in the state where voltage is applied between two electrodes included in the sample so that a photocurrent value is kept constant, and then an absorption coefficient is derived from the amount of the irradiation light in each wavelength. In the CPM measurement, when the sample has a defect, the absorption coefficient of energy which corresponds to a level at which the defect exists (calculated from a wavelength) is increased. The increase in the absorption coefficient is multiplied by a constant, whereby the dDOS of the sample can be obtained.

A part of the absorption coefficient which is referred to as an urbach tail due to the band tail is removed from a curve of the absorption coefficient obtained by the CPM measurement, whereby the absorption coefficient due to the defect levels can be calculated from the following formula. Note that a(E) indicates the absorption coefficient at each energy level and an indicates the absorption coefficient due to the urbach tail.

[Formula 7]

$$\int \frac{\alpha(E) - \alpha_u}{E} dE$$

[Fabrication of Samples for CPM Evaluation]

Three samples (Samples D1 to D3) were fabricated and subjected to CPM evaluation below.

A metal oxide film was formed over a glass substrate. In Sample D1, an approximately 100-nm-thick metal oxide film was formed in a manner similar to that in Sample A1. In Sample D2, an approximately 100-nm-thick metal oxide film was formed in a manner similar to that in Sample A2. In Sample D3, an approximately 100-nm-thick metal oxide film was formed in a manner similar to that in Sample A3.

Next, an approximately 30-nm-thick silicon oxynitride film, an approximately 100-nm-thick silicon oxynitride film, and an approximately 20-nm-thick silicon oxynitride film were stacked over the metal oxide film by a plasma CVD method.

After that, heat treatment was performed at 350° C. for one hour in a nitrogen atmosphere.

Next, a 100-nm-thick oxide semiconductor film was formed. Note that the oxide semiconductor film had a stacked-layer structure including two layers. A first layer of the oxide semiconductor film was formed to have thickness of 10 nm under the following conditions: the substrate temperature was 170° C.; an oxygen gas with a flow rate of 200 sccm was introduced into a chamber of the sputtering apparatus; the pressure was set to 0.6 Pa; and an AC power of 2.5 kW was applied to a metal oxide target containing indium, gallium, and zinc (In:Ga:Zn=4:2:4.1 [atomic ratio]). A second layer of the oxide semiconductor film was formed to have a thickness of 90 nm under the following conditions: the substrate temperature was 170° C.; an argon gas with a flow rate of 180 sccm and an oxygen gas with a flow rate of 20 sccm introduced into a chamber of the sputtering apparatus; the pressure was set to 0.6 Pa; and an AC power of 2.5 kW was applied to a metal oxide target containing indium, gallium, and zinc (In:Ga:Zn=4:2:4.1 [atomic ratio]).

The heat treatment was then performed at 350° C. for one hour in a mixed gas atmosphere of nitrogen and oxygen.

Then, the oxide semiconductor film was removed by a wet etching method.

A silicon oxynitride film was formed. The silicon oxide film was formed under the following conditions: a mixed gas of $SiH_4$ at a flow rate of 160 sccm and $N_2O$ at a flow rate of 4000 sccm was used as a deposition gas; the pressure was 200 Pa; the power was 1500 W; the substrate temperature was 220° C.; and a plasma CVD method was used. The thickness of the silicon oxynitride film was approximately 400 nm.

An opening was formed in the silicon oxynitride film by a photolithography method.

A stacked film including an approximately 50-nm-thick Ti film, an approximately 400-nm-thick Al film, and an approximately 100-nm-thick Ti film was formed by a sputtering method. Then, the stacked film was processed by a photolithography method, whereby an electrode was formed.

After that, heat treatment was performed at 250° C. for one hour in a nitrogen atmosphere.

Through the above process, Samples D1 to D3 were formed.

[CPM Evaluation Results]

Figure 22:
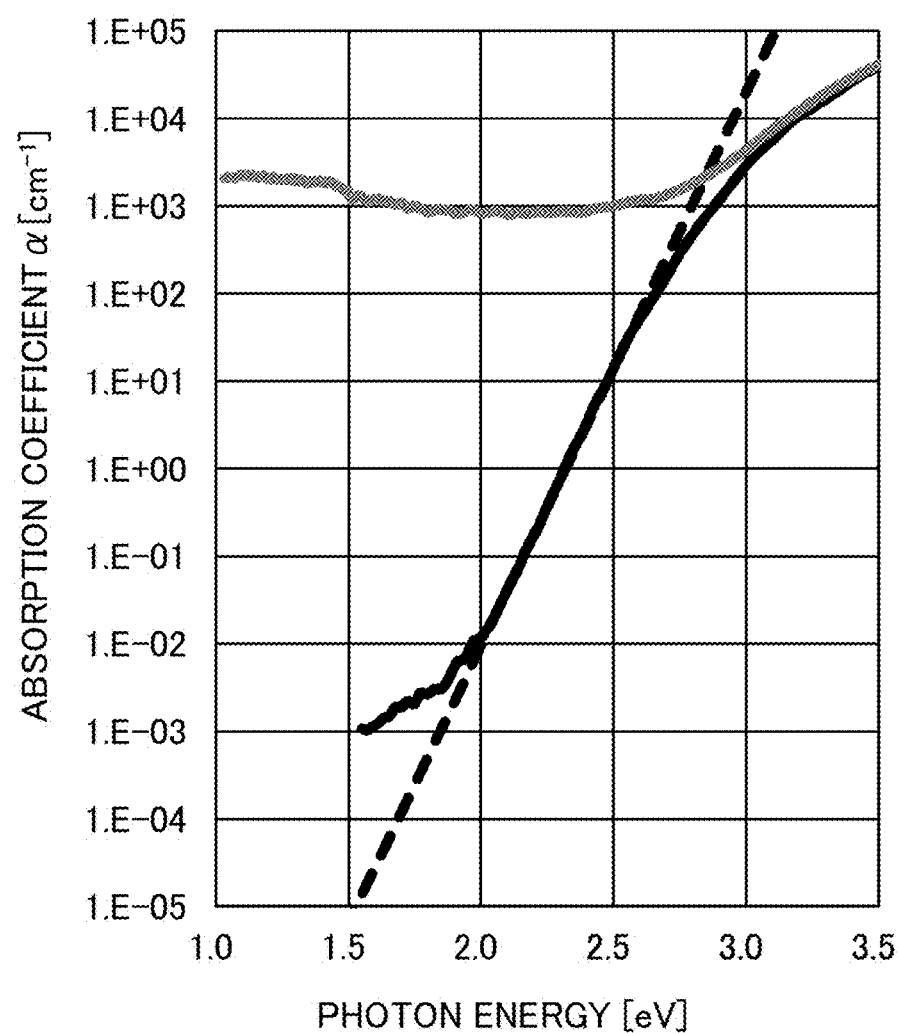
Figure 23:
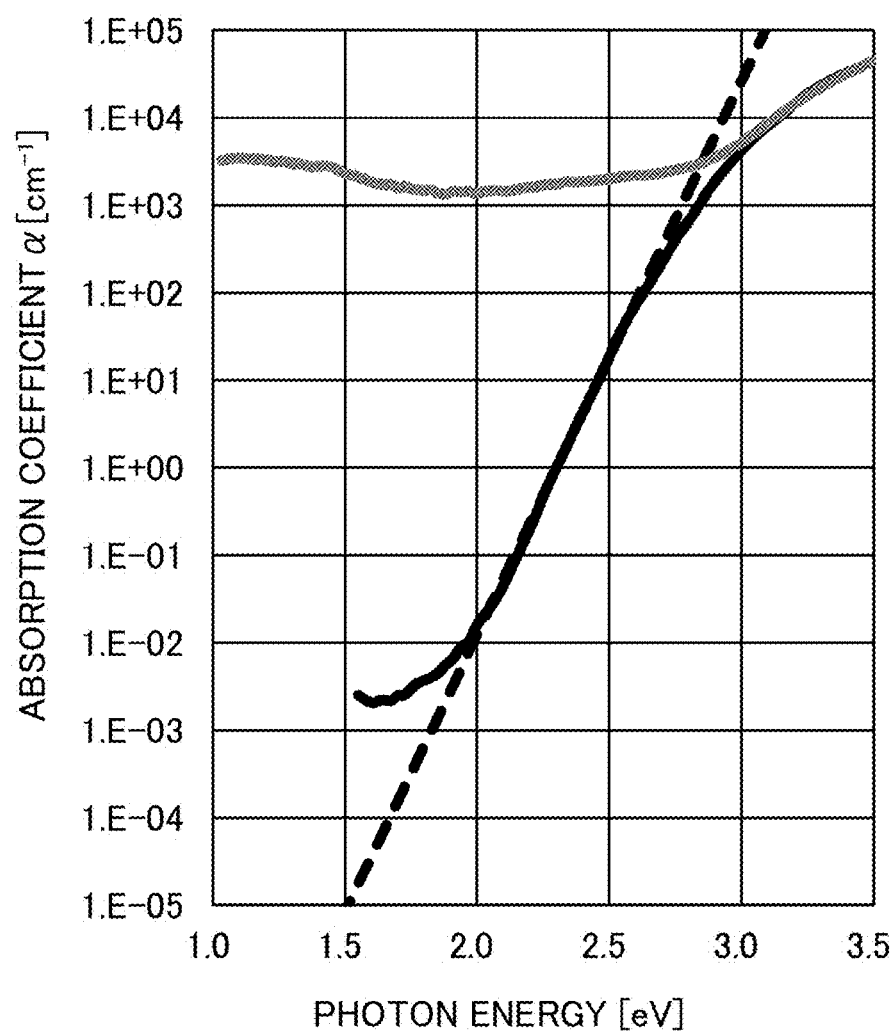
Figure 24:
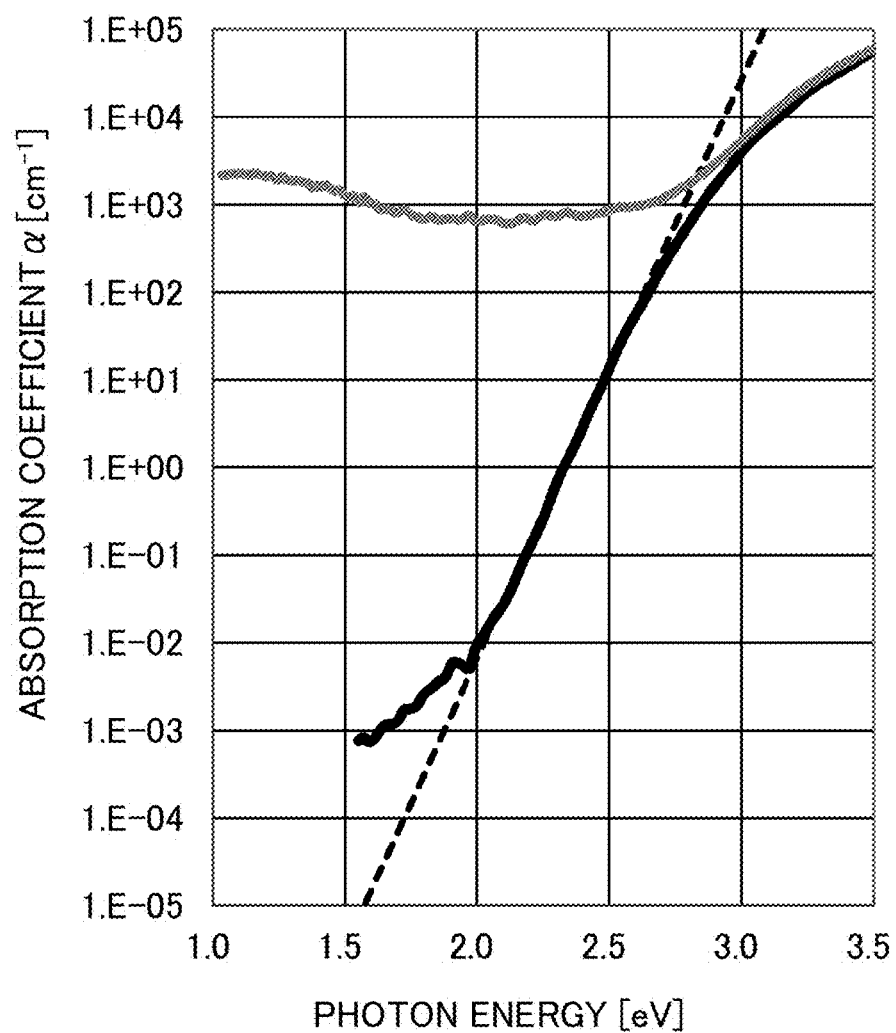

FIG. 22, FIG. 23, and FIG. 24 show XRD measurement results of Sample D1, Sample D2, and Sample D3, respectively. In FIG. 22, FIG. 23, and FIG. 24, the horizontal axis indicates absorption coefficient, and the vertical axis indicates photon energy. In FIG. 22, FIG. 23, and FIG. 24, a thick line is a curve of the absorption coefficient of each sample, a dotted line is a tangent line, and a thin line indicates the absorption coefficient optically measured.

The value of the urbach tail of Sample D1 was estimated at 68.70 meV from FIG. 22. The absorption coefficient obtained by removing the absorption coefficient due to the urbach tail from the curve of the absorption coefficient, that is, the value of the absorption coefficient due to deep defect states was $1.21 \times 10^{-3}$ $cm^1$. The value of the urbach tail of Sample E2 was estimated at 64.46 meV from FIG. 23 and the value of the absorption coefficient due to deep defect states was $1.36 \times 10^{-3}$ $cm^1$. The value of the urbach tail of Sample D3 was estimated at 65.83 meV from FIG. 24 and the value of the absorption coefficient due to deep defect states was $1.04 \times 10^{-3}$ $cm^1$.

The above results show that there is no clear difference in deep defect states between the metal oxide films of Samples D1 to D3. It is suggested that the reason why there is no difference in deep defect states between Samples D1 to D3 is that oxygen vacancies in the metal oxide film are filled by supplying sufficient oxygen from the oxide insulating film that is formed to be in contact with the metal oxide film to the metal oxide film.

<1-7. Method for Forming Metal Oxide Film>

A deposition method of the metal oxide film which is one embodiment of the present invention is described below.

The metal oxide film of one embodiment of the present invention can be formed by a sputtering method under an atmosphere containing oxygen.

The substrate temperature during the deposition is higher than or equal to room temperature and lower than or equal to 150° C., preferably higher than or equal to 50° C. and lower than or equal to 150° C., further preferably higher than or equal to 100° C. and lower than or equal to 150° C., typified by 130° C. The substrate temperature within the above range can control the proportion of crystal parts having orientation to crystal parts having no orientation.

The oxygen flow rate ratio (partial pressure of oxygen) during the deposition is preferably higher than or equal to 0% and lower than 50%, further preferably higher than or equal to 0% and lower than or equal to 30%, still further preferably higher than or equal to 0% and lower than or equal to 20%, and yet still further preferably higher than or equal to 0% and lower than or equal to 15%, typified by 10%. A decrease in oxygen flow rate ratio results in a larger number of crystal parts with no orientation in the film.

Accordingly, setting the substrate temperature and the oxygen flow rate ratio during the deposition within the above ranges can result in a metal oxide film containing both crystal parts with a particular orientation and crystal parts with a random orientation. Furthermore, the proportions of crystal parts having orientation and crystal parts having no orientation can be adjusted by setting the substrate temperature and the oxygen flow rate ratio within the above ranges.

An oxide target that can be used for forming the metal oxide film of this embodiment is not limited to an In—Ga—Zn-based oxide; for example, an In-M-Zn-based oxide (M is Al, Ga, Y, or Sn) can be used.

When a metal oxide film containing crystal parts is formed using a sputtering target containing a polycrystalline oxide having a plurality of crystal grains, a metal oxide film with crystallinity can be obtained easier than the case of using a sputtering target not containing a polycrystalline oxide.

Figure 27:
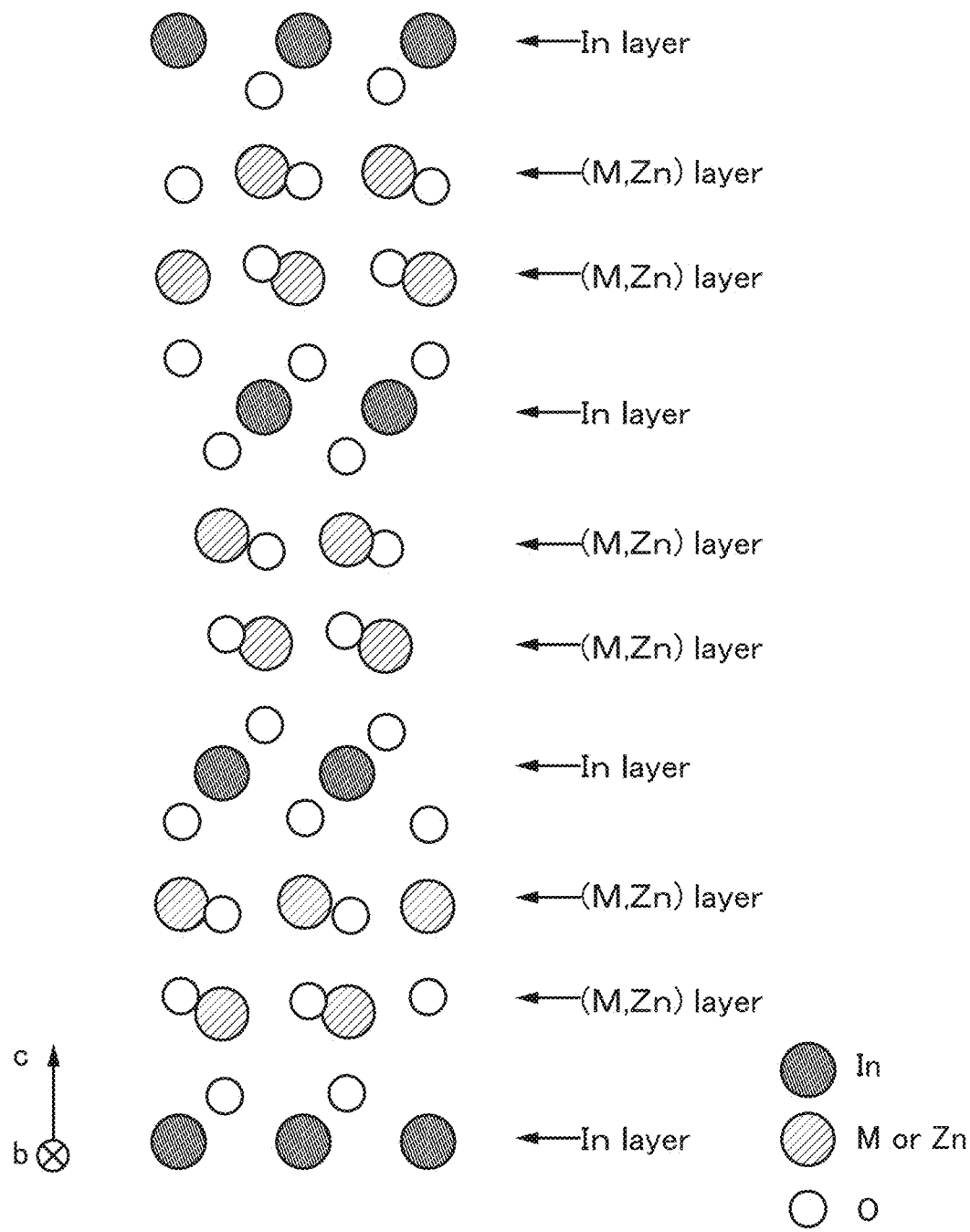

In the description below, the consideration of the deposition mechanism of the metal oxide film is made using FIGS. 25A to 25D. In the case where a sputtering target contains a plurality of crystal grains each of which has a layered structure and an interface at which the crystal grain is easily cleaved, ion collision with the sputtering target might cleave the crystal grains. The sputtering target here has a c-axis aligned layered structure including In, M (M is Al, Ga, Y, or Sn), and Zn as shown in FIG. 27 described later, for example. Note that the crystal grain is a flat-plate-like or pellet-like cluster and can be referred to as a nanocluster or pellet.

Figure 25A:
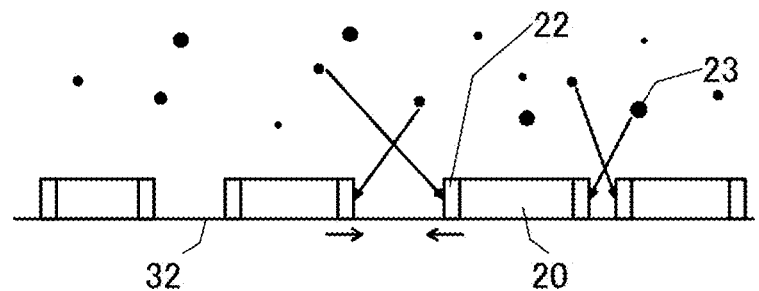
Figure 25B:
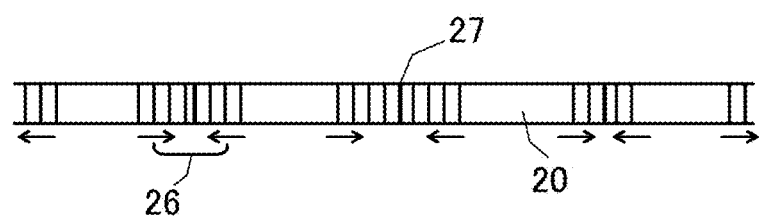
Figure 25C:
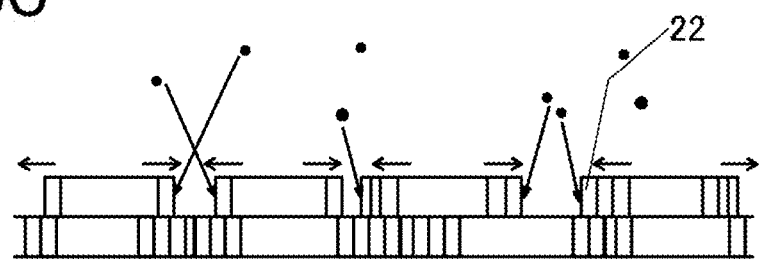
Figure 25D:
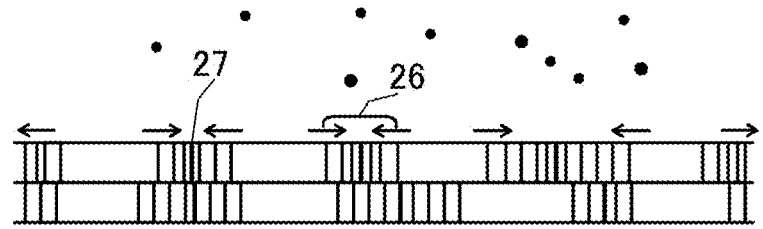

As shown in FIG. 25A, a nanocluster 20 cleaved from a target has a flat-plate-like shape; thus, it is easily deposited with its flat plane side facing the surface of a substrate 32. Note that in the case of having a c-axis aligned layered structure including In, M (M is Al, Ga, Y, or Sn), and Zn as shown in FIG. 27 described later, cleavage is likely to occur at the interface between an (M, Zn) layer and an (M, Zn) layer shown in FIG. 27.

Then, particles 23 ejected from the target reach the surface of the substrate 32. The particles 23 each have one atom or an aggregate of several atoms. Thus, the particles 23 can be referred to as atomic particles. In the case where the nanocluster has a c-axis aligned layered structure including In, M (M is Al, Ga, Y, or Sn), and Zn as illustrated in FIG. 27 described later, the particles 23 are more likely to be bonded to the side surface of the nanocluster 20 than to the top surface. Accordingly, the particles 23 are attached preferentially onto the side surface of the nanocluster 20 so as to fill a region where the nanocluster 20 is not formed. Bonds of the particles 23 are activated to be chemically coupled to the nanocluster 20, whereby lateral growth portions 22 are formed (see FIG. 25A). In other words, the particles 23 enter a region between the nanocluster 20 and the nanocluster 20.

The lateral growth portions 22 grow in a lateral direction (also referred to as lateral growth) so as to fill a region 26 between the nanocluster 20 and the nanocluster 20 (the region 26 can be also referred to as a Lateral Growth Buffer Region (LGBR)). Here, the lateral direction indicates a direction perpendicular to the c-axis in the nanocluster 20, for example.

Note that when substrate heating at lower than or equal to 450° C., preferably lower than or equal to approximately 400° C. is performed, a reaction is likely to occur in which the particle 23 is attached onto a lateral growth portion 22 of the nanocluster 20, oxygen diffused through the LGBR is attached onto the particle 23, and another particle 23 is attached similarly. It is assumed that solid-phase growth in the lateral direction occurs by the repetition of this. Such lateral growth of nanoclusters can also be referred to as self-organization.

When the lateral growth portions 22 further grow laterally, the lateral growth portions 22 collide with each other. A portion where the lateral growth portions 22 collide with each other serves as a connecting portion, and the adjacent nanoclusters 20 are connected to each other (see FIG. 25B). That is, a connection portion 27 is formed in the region 26. In other words, the particles 23 fill the region 26 between the nanoclusters 20 by forming the lateral growth portions 22 on the side surfaces of the nanoclusters 20 and causing lateral growth of the lateral growth portions 22. In this manner, the lateral growth portions 22 are formed until a region where the nanocluster 20 is not formed is filled.

Therefore, even when the nanoclusters 20 are formed to be oriented in different directions, a clear grain boundary is not formed because the particles 23 grow laterally to fill a gap between the nanocluster 20 and the nanocluster 20.

Here, the particles 23 are smoothly connected (anchored) between the nanoclusters 20, so that a crystal structure different from a single crystal and a polycrystal is formed in the connection portion 27. In other words, a crystal structure having distortion is formed in the connection portion 27 between the nanoclusters 20. Accordingly, for example, in the connection portion 27, the shape of a hexagonal top surface of a crystal structure is changed to a pentagonal or heptagonal shape in some cases.

Next, new nanoclusters 20 are formed with their flat planes facing the surface of the substrate 32. After that, the particles 23 are deposited so as to fill regions where no nanocluster 20 is formed, thereby forming the lateral growth portions 22 (see FIG. 25C). In such a manner, the particles 23 are attached to the side surfaces of the nanoclusters 20 and the lateral growth portions 22 grow laterally so that the nanoclusters 20 in the second layer are connected to each other (see FIG. 25D). Deposition continues until the m-th layer (m is an integer of two or more) is formed; as a result, a metal oxide film including a layered structure is formed.

A metal oxide film including a crystal part having particular orientation is likely to be formed when the substrate 32 is heated and the nanoclusters 20 are bonded to each other or rearranged at a substrate surface.

Note that as described in this embodiment, a sputtering method is preferably used to form a metal oxide film because the crystallinity can be easily adjusted. However, a formation method of the metal oxide film of one embodiment of the present invention is not limited thereto. For example, a pulsed laser deposition (PLD) method, a plasma-enhanced chemical vapor deposition (PECVD) method, a thermal CVD (Chemical Vapor Deposition) method, an atomic layer deposition (ALD) method, a vacuum evaporation method, or the like may be used. As an example of the thermal CVD method, a metal organic chemical vapor deposition (MOCVD) method can be given.

<1-8. Composition and Structure of Metal Oxide Film>

The metal oxide film of one embodiment of the present invention can be applied to a semiconductor device such as a transistor. A metal oxide film which particularly has semiconductor characteristics (hereinafter referred to as an oxide semiconductor film) will be described below.

First, composition of an oxide semiconductor film is described.

As described above, the oxide semiconductor film includes indium (In), M (M is Al, Ga, Y, or Sn), and zinc (Zn).

Note that the element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Two or more of the above elements may be used in combination as the element M.

Next, preferred ranges of the atomic ratio of indium, the element M, and zinc contained in the oxide semiconductor film of one embodiment of the present invention are described with reference to FIGS. 26A to 26C. Note that the proportion of oxygen atoms is not shown in FIGS. 26A to 26C. The terms of the atomic ratio of indium to the element M and zinc in the oxide semiconductor film are denoted by [In], [M], and [Zn], respectively.

Figure 26A:
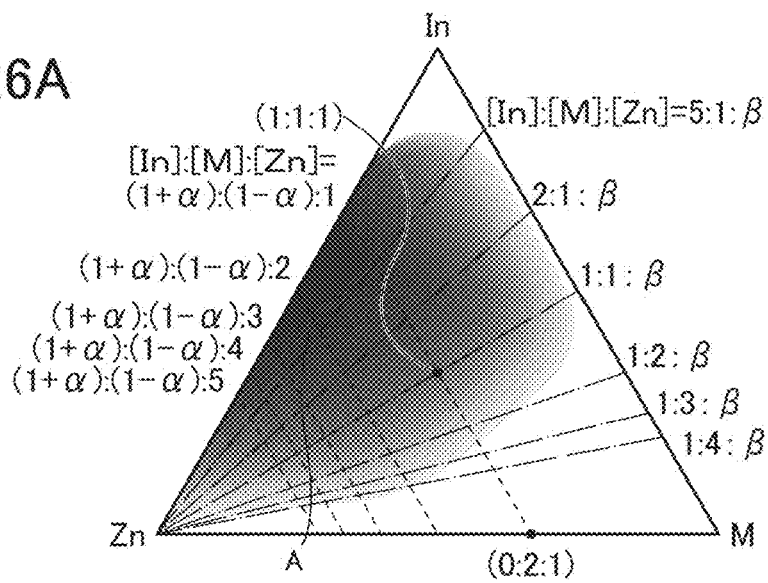
Figure 26B:
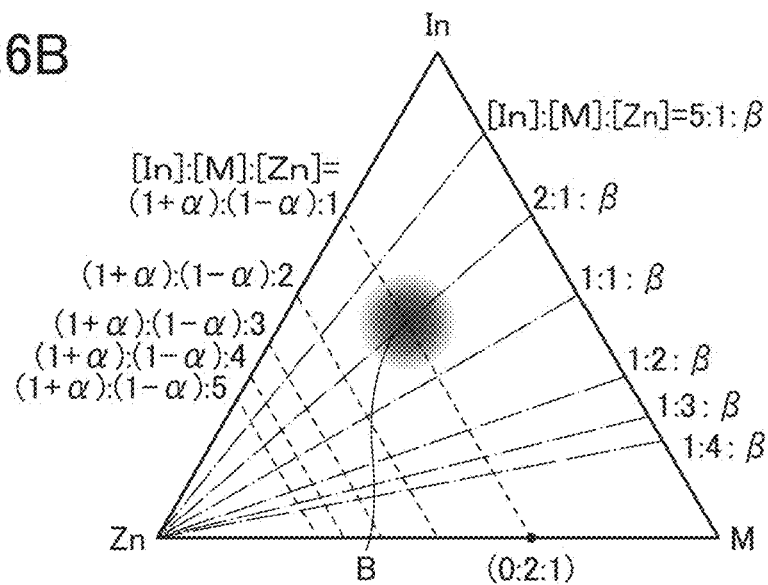
Figure 26C:
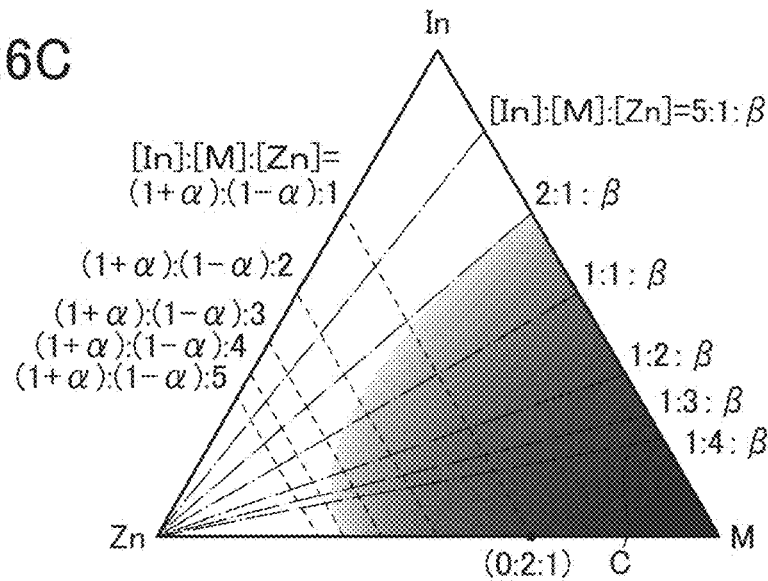

In FIGS. 26A to 26C, broken lines indicate a line where the atomic ratio $[In]:[M]:[Zn]=(1+\alpha):(1-\alpha):1$ $(-1 \leq \alpha \leq 1)$, a line where the atomic ratio $[In]:[M]:[Zn]=(1+\alpha):(1-\alpha):2$, a line where the atomic ratio $[In]:[M]:[Zn]=(1+\alpha):(1-\alpha):3$, a line where the atomic ratio $[In]:[M]:[Zn]=(1+\alpha):(1-\alpha):4$, and a line where the atomic ratio $[In]:[M]:[Zn]=(1+\alpha):(1-\alpha):5$.

Dashed-dotted lines indicate a line where the atomic ratio of $[In]:[M]:[Zn]=1:1:\beta$, $(\beta \geq 0)$, a line where the atomic ratio of $[In]:[M]:[Zn]=1:2:\beta$, a line where the atomic ratio of $[In]:[M]:[Zn]=1:3:\beta$, a line where the atomic ratio of $[In]:[M]:[Zn]=1:4:\beta$, a line where the atomic ratio of $[In]:[M]:[Zn]=2:1:\beta$, and a line where the atomic ratio of $[In]:[M]:[Zn]=5:1:\beta$.

An oxide semiconductor film having the atomic ratio of $[In]:[M]:[Zn]=0:2:1$ or a neighborhood thereof in FIGS. 26A to 26C tends to have a spinel crystal structure.

FIGS. 26A and 26B show examples of the preferred ranges of the atomic ratio of indium, the element M, and zinc contained in an oxide semiconductor film in one embodiment of the present invention.

FIG. 27 illustrates an example of the crystal structure of $InMZnO_4$ in which $[In]:[M]:[Zn]=1:1:1$. The crystal structure illustrated in FIG. 27 is $InMZnO_4$ observed from a direction parallel to the b-axis. Note that a metal element in a layer that contains M, Zn, and oxygen (hereinafter, (M, Zn) layer) in FIG. 27 represents the element M or zinc. In that case, the proportion of the element M is the same as the proportion of zinc. The element M and zinc can be replaced with each other, and their arrangement is random.

Indium and the element M can be replaced with each other. Therefore, when the element M in the (M, Zn) layer is replaced with indium, the layer can also be referred to as an (In, M, Zn) layer. In that case, a layered structure including two (In, M, Zn) layers with respect to one In layer is obtained.

Indium and the element M can be replaced with each other. Therefore, when the element M in the $MZnO_2$ layer is replaced with indium, the layer can also be referred to as an In$_\alpha$M$_{1-\alpha}$ZnO$_2$ layer (0<α≤1). In that case, a layered structure including two In$_\alpha$M$_{1-\alpha}$ZnO$_2$ 1 layers for every InO$_2$ layer is obtained. Also, when indium in the InO$_2$ layer is replaced with the element M, the layer can be referred to as an In$_{1-\alpha}$M$_\alpha$O$_2$ layer (0<α≤1). In that case, a layered structure including two MZnO$_2$ layers for every In$_{1-\alpha}$M$_\alpha$O$_2$ layer is obtained.

An oxide with an atomic ratio of [In]:[M]:[Zn]=1:1:2 has a layered structure that includes one In layer for every three (M, Zn) layers. In other words, if [Zn] is larger than [In] and [M], the proportion of the (M, Zn) layer to the In layer becomes higher when the oxide is crystallized.

Note that in the case where the number of (M, Zn) layers with respect to one In layer is not an integer in the oxide, the oxide might have a plurality of kinds of layered structures where the number of (M, Zn) layers with respect to one In layer is an integer. For example, in the case of [In]:[M]:[Zn]= 1:1:1.5, the oxide might have the following layered structures: a layered structure that includes one In layer for every two (M, Zn) layers and a layered structure that includes one In layer for every three (M, Zn) layers.

For example, in the case where the oxide semiconductor film is formed with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exists in the oxide semiconductor film in some cases. For example, with an atomic ratio of [In]:[M]:[Zn]=0:2:1 or a neighborhood thereof, two phases of a spinel crystal structure and a layered crystal structure are likely to exist. In addition, with an atomic ratio of [In]:[M]:[Zn]=1:0:0 or a neighborhood thereof, two phases of a bixbyite crystal structure and a layered crystal structure are likely to exist. In the case where a plurality of phases exists in the oxide semiconductor film, a grain boundary might be formed between different crystal structures.

In addition, the oxide semiconductor film containing indium in a higher proportion can have high carrier mobility (electron mobility). This is because in an oxide semiconductor film containing indium, the element M, and zinc, the s orbital of heavy metal mainly contributes to carrier transfer, and when the indium content in the oxide semiconductor film is increased, overlaps of the s orbitals of indium atoms are increased; therefore, an oxide semiconductor film having a high content of indium has higher carrier mobility than that of an oxide semiconductor film having a low content of indium.

In contrast, when the indium content and the zinc content in an oxide semiconductor film become lower, carrier mobility becomes lower. Thus, with atomic ratios of [In]:[M]:[Zn]= 0:1:0 and in the vicinity thereof (e.g., a region C shown in FIG. 26C), insulation performance becomes better.

Accordingly, the oxide semiconductor film of one embodiment of the present invention preferably has an atomic ratio represented by a region A in FIG. 26A with which a layered structure with high carrier mobility and a few grain boundaries is easily obtained.

A region B in FIG. 26B represents an atomic ratio of [In]:[M]:[Zn]=4:2:3 to 4.1 and the vicinity thereof. The vicinity includes an atomic ratio of [In]:[M]:[Zn]=5:3:4, for example. An oxide semiconductor film with an atomic ratio represented by the region B is an excellent oxide semiconductor film that has particularly high crystallinity and high carrier mobility.

Note that a condition where an oxide semiconductor film forms a layered structure is not uniquely determined by an atomic ratio. There is a difference in the degree of difficulty in forming a layered structure among atomic ratios. Even with the same atomic ratio, whether a layered structure is formed or not depends on a formation condition. Thus, the illustrated regions each represent an atomic ratio with which an oxide semiconductor film has a layered structure, and boundaries of the regions A to C are not clear.

<1-9. Structure of Metal Oxide Film>

Next, the structure of a metal oxide film (hereinafter referred to as an oxide semiconductor) is described.

An oxide semiconductor is classified into a single crystal oxide semiconductor and a non-single-crystal oxide semiconductor. Examples of a non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS: amorphous-like oxide semiconductor), and an amorphous oxide semiconductor.

From another perspective, oxide semiconductors are classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

In other words, a stable oxide semiconductor cannot be regarded as a completely amorphous oxide semiconductor. An oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

[CAAC-OS]

First, a CAAC-OS is described.

A CAAC-OS is one of oxide semiconductors and has a plurality of c-axis aligned crystal parts (also referred to as pellets).

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

Note that an impurity means an element other than the main components of an oxide semiconductor, such as hydrogen, carbon, silicon, or a transition metal element. For example, an element, such as silicon, having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

[nc-OS]

Next, an nc-OS is described.

Analysis of an nc-OS by XRD is described. For example, when the structure of an nc-OS is analyzed by an out-ofplane method, a peak indicating orientation does not appear. That is, a crystal of an nc-OS does not have orientation.

The nc-OS is an oxide semiconductor that has higher regularity than an amorphous oxide semiconductor. Thus, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS in some cases.

[a-like OS]

The a-like OS has a structure intermediate between those of the nc-OS and the amorphous oxide semiconductor.

The a-like OS has a void or a low-density region. The a-like OS has an unstable structure because it includes a void.

The a-like OS has a lower density than the nc-OS and the CAAC-OS because it includes a void. Specifically, the density of the a-like OS is higher than or equal to 78.6% and lower than 92.3% of the density of a single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor satisfying In:Ga:Zn=1:1:1 [atomic ratio], the density of single crystal $InGaZnO_4$ with a rhombohedral crystal structure is 6.357 g/cm$^3$. Accordingly, in the case of the oxide semiconductor satisfying In:Ga:Zn=1:1:1 [atomic ratio], the density of the a-like OS is higher than or equal to 5.0 g/cm$^3$ and lower than 5.9 g/cm$^3$, for example. In the case of the oxide semiconductor satisfying In:Ga:Zn=1:1:1 [atomic ratio], the density of the nc-OS and the density of the CAAC-OS are each higher than or equal to 5.9 g/cm$^3$ and lower than 6.3 g/cm$^3$, for example.

Note that in the case where an oxide semiconductor having a certain composition does not exist in a single crystal structure, single crystal oxide semiconductors with different compositions are combined at an adequate ratio, which makes it possible to calculate a density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stack including two or more of an amorphous oxide semiconductor, an a-like OS, an nc-OS, and a CAAC-OS, for example.

<1-10. Structure in which Metal Oxide Film is Used for Transistor>

Next, a structure in which a metal oxide film (hereinafter referred to as oxide semiconductor film) is used in a transistor is described.

Note that when the oxide semiconductor film is used for a transistor, carrier scattering or the like at a grain boundary can be lower than that in the case of a transistor using polycrystalline silicon in a channel region, for example; thus, the transistor can have high field-effect mobility. In addition, the transistor can have high reliability.

The oxide semiconductor film of one embodiment of the present invention is a film containing both crystal parts with a particular orientation and crystal parts with a random orientation. With the use of the oxide semiconductor film having such crystallinity, a transistor having both high field-effect mobility and high reliability can be fabricated.

<1-11. Carrier Density of Metal Oxide Film>

The carrier density of a metal oxide film (hereinafter referred to as oxide semiconductor film) will be described below.

Examples of a factor affecting the carrier density of an oxide semiconductor film include oxygen vacancy (Vo) and impurities in the oxide semiconductor film.

As the amount of oxygen vacancy in the oxide semiconductor film increases, the density of defect states increases when hydrogen is bonded to the oxygen vacancy (this state is also referred to as VoH). The density of defect states also increases with an increase in the amount of impurity in the oxide semiconductor film. Hence, the carrier density of an oxide semiconductor film can be controlled by controlling the density of defect states in the oxide semiconductor film.

A transistor using the oxide semiconductor film in a channel region will be described below.

The carrier density of the oxide semiconductor film is preferably reduced in order to inhibit the negative shift of the threshold voltage of the transistor or reduce the off-state current of the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor film is lower than $8 \times 10^{15}$ cm$^3$, preferably lower than $1 \times 10^{11}$ cm$^3$, and further preferably lower than $1 \times 10^{10}$ cm$^3$ and is higher than or equal to $1 \times 10^{-9}$ cm$^3$.

In contrast, the carrier density of the oxide semiconductor film is preferably increased in order to improve the on-state current of the transistor or improve the field-effect mobility of the transistor. In order to increase the carrier density of the oxide semiconductor film, the impurity concentration or the density of defect states in the oxide semiconductor film is slightly increased. Alternatively, the bandgap of the oxide semiconductor film is preferably narrowed. For example, an oxide semiconductor film that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor film that has a high electron affinity and thus has a narrow bandgap so as to increase the density of thermally excited electrons (carriers) can be regarded as substantially intrinsic. Note that a transistor using an oxide semiconductor film with higher electron affinity has lower threshold voltage.

The oxide semiconductor film with an increased carrier density has somewhat n-type conductivity. Thus, the oxide semiconductor film with an increased carrier density can be referred to as "Slightly-n".

The carrier density of a substantially intrinsic oxide semiconductor film is preferably higher than or equal to $1 \times 10^5$ cm$^3$ and lower than $1 \times 10^{18}$ cm$^3$, further preferably higher than or equal to $1 \times 10^7$ cm$^3$ and lower than or equal to $1 \times 10^{17}$ cm$^3$, still further preferably higher than or equal to $1 \times 10^9$ cm$^3$ and lower than or equal to $5 \times 10^{16}$ cm$^3$, yet further preferably higher than or equal to $1 \times 10^{10}$ cm$^3$ and lower than or equal to $1\times10^{16}$ cm$^3$, and yet still preferably higher than or equal to $1\times10^{11}$ cm$^3$ and lower than or equal to $1\times10^{15}$ cm$^3$.

Figure 28:
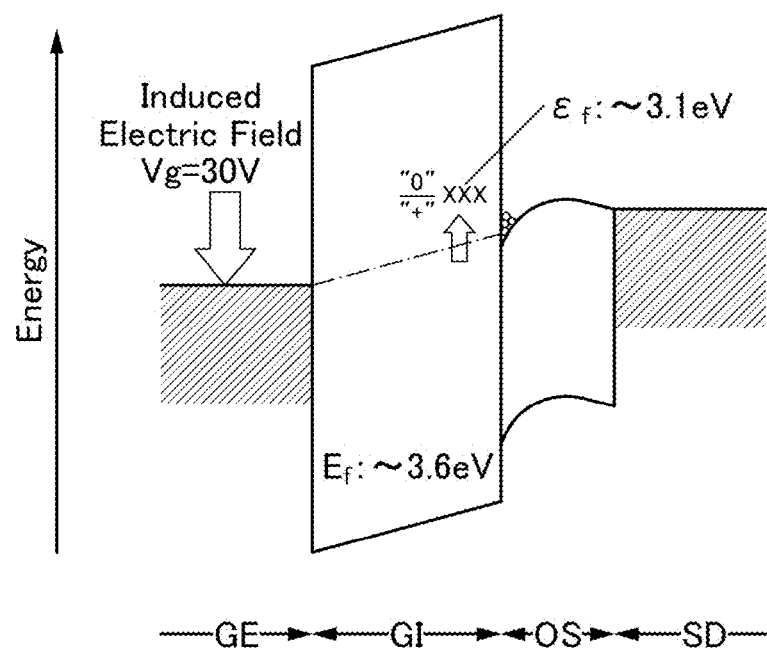

The use of the substantially intrinsic oxide semiconductor film may improve the reliability of a transistor. Here, the reason for the improvement in the reliability of a transistor which uses the oxide semiconductor film in its channel region is described with reference to FIG. 28. FIG. 28 is an energy band diagram of the transistor which uses the oxide semiconductor film in its channel region.

In FIG. 28, GE, GI, OS, and SD refer to a gate electrode, a gate insulating film, an oxide semiconductor film, and a source electrode or drain electrode, respectively. In other words, FIG. 28 shows an example of energy bands of the gate electrode, the gate insulating film, the oxide semiconductor film, and the source electrode or drain electrode in contact with the oxide semiconductor film.

In FIG. 28, a silicon oxide film and an In—Ga—Zn oxide are used as the gate insulating film and the oxide semiconductor film, respectively. In addition, it is assumed that the transition level εf of a defect that can be formed in the silicon oxide film is located approximately 3.1 eV apart from the conduction band of the gate insulating film, and the Fermi level Ef of the silicon oxide film at the interface between the oxide semiconductor film and the silicon oxide film when the gate voltage Vg is 30 V is located approximately 3.6 eV apart from the conduction band of the gate insulating film. Note that the Fermi level of the silicon oxide film varies depending on the gate voltage. For example, the Fermi level ($E_f$) of the silicon oxide film at the interface between the oxide semiconductor film and the silicon oxide film is lowered as the gate voltage is increased. A white circle and x in FIG. 28 represent an electron (carrier) and a defect state in the silicon oxide film, respectively.

As shown in FIG. 28, when thermal excitation of carriers occurs during the application of a gate voltage, the carriers are trapped by the defect states (x in the diagram) and the charge state of each of the defect states is changed from positive ("+") to neutral ("0"). Specifically, in the case where the value obtained by adding the thermal excitation energy to the Fermi level ($E_f$) of the silicon oxide film becomes greater than transition level ($\varepsilon_f$) of the defect, the charge state of the defect states in the silicon oxide film is changed from positive to neutral, and the threshold voltage of the transistor is positively shifted.

When an oxide semiconductor film with a different electron affinity is used, the Fermi level of the interface between the gate insulating film and the oxide semiconductor film might be changed. When an oxide semiconductor film with a higher electron affinity is used, the conduction band minimum of the gate insulating film moves upward at the interface between the gate insulating film and the oxide semiconductor film or in the vicinity of the interface. In that case, the defect state (X in FIG. 28) which might be formed in the gate insulating film also moves upward, so that the energy difference between the Fermi level of the gate insulating film and the Fermi level of the oxide semiconductor film is increased. The increased energy difference results in less charge trapped in the gate insulating film. For example, a change in the charge states of the defect states that can be formed in the silicon oxide film is smaller; thus, a change in the threshold voltage of the transistor due to gate bias temperature (Gate Bias Temperature: GBT) stress can be smaller.

Charge trapped by the defect states in the oxide semiconductor film takes a long time to be released and may behave like fixed charge. Thus, the transistor in which a channel region is formed in the oxide semiconductor film having a high density of defect states might have unstable electrical characteristics.

To obtain stable electrical characteristics of the transistor, it is effective to reduce the concentration of impurities in the oxide semiconductor film. In order to reduce the concentration of impurities in the oxide semiconductor film, the concentration of impurities in a film which is adjacent to the oxide semiconductor film is preferably reduced. As examples of the impurities, hydrogen, nitrogen, alkali metal, alkaline earth metal, iron, nickel, silicon, and the like are given.

Here, the influence of impurities in the oxide semiconductor film is described.

When silicon or carbon that is one of Group 14 elements is contained in the oxide semiconductor film, defect states are formed in the oxide semiconductor film. Thus, the concentration of silicon or carbon in the oxide semiconductor film and around an interface with the oxide semiconductor film (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor film contains alkali metal or alkaline earth metal, defect states are formed and carriers are generated, in some cases. Thus, a transistor including an oxide semiconductor film that contains alkali metal or alkaline earth metal is likely to be normally-on. Therefore, it is preferable to reduce the concentration of alkali metal or alkaline earth metal in the oxide semiconductor film. Specifically, the concentration of alkali metal or alkaline earth metal in the oxide semiconductor film measured by SIMS is set lower than or equal to $1\times10^{18}$ atoms/cm$^3$, and preferably lower than or equal to $2\times10^{16}$ atoms/cm$^3$.

When the oxide semiconductor film contains nitrogen, the oxide semiconductor film easily becomes n-type by generation of electrons serving as carriers and an increase of carrier density. Thus, a transistor including an oxide semiconductor film which contains nitrogen is likely to be normally-on. For this reason, nitrogen in the oxide semiconductor film is preferably reduced as much as possible; the nitrogen concentration in the oxide semiconductor film measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor film reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally-on. Accordingly, it is preferable that hydrogen in the oxide semiconductor film be reduced as much as possible. Specifically, the hydrogen concentration of the oxide semiconductor film measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor film with sufficiently reduced impurity concentration is used for a channel formation region in a transistor, the transistor can have stable electrical characteristics.

The energy gap of the oxide semiconductor film is preferably 2 eV or more or 2.5 eV or more.

The thickness of the oxide semiconductor film is greater than or equal to 3 nm and less than or equal to 200 nm, preferably greater than or equal to 3 nm and less than or equal to 100 nm, further preferably greater than or equal to 3 nm and less than or equal to 60 nm.

When the oxide semiconductor film is an In-M-Zn oxide, as the atomic ratio of metal elements in a sputtering target used for formation of the In-M-Zn oxide, In:M:Zn=1:1:0.5, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, In:M:Zn=5:1:7, or the like is preferable.

<1-12. Oxygen Diffusion to Metal Oxide Film>

Oxygen diffusion to a metal oxide film (hereinafter an oxide semiconductor film) is described below.

Figure 29A:
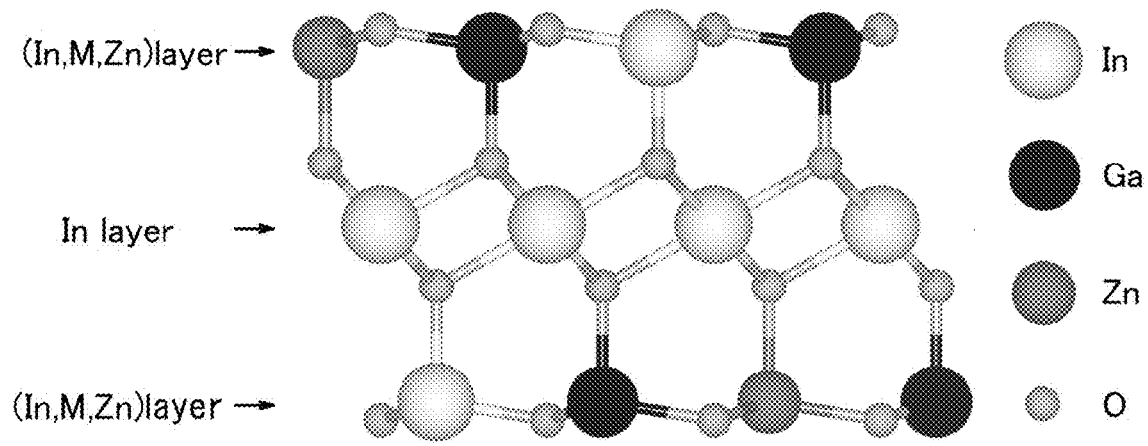
Figure 29B:
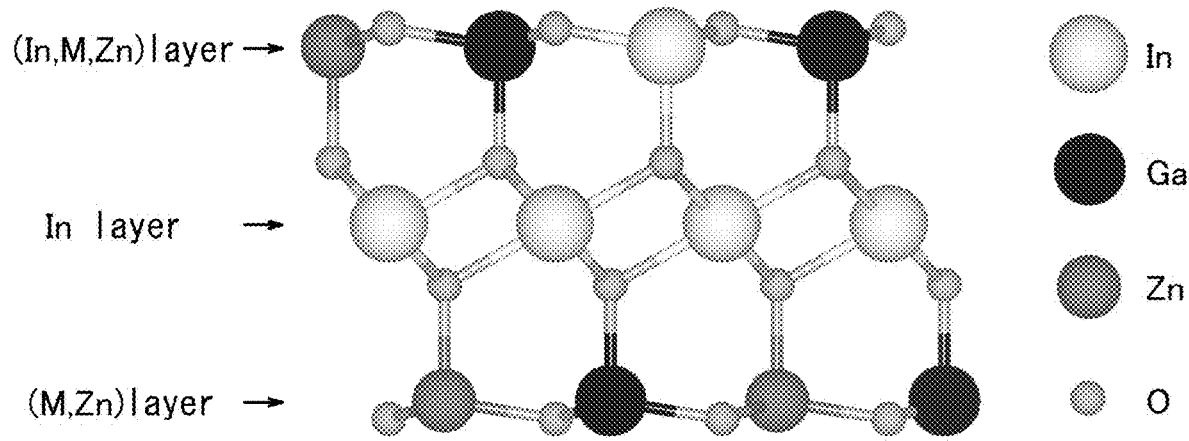

FIGS. 29A and 29B show structures of nanoclusters included in the oxide semiconductor film. The nanocluster (also referred to as a pellet) shown in FIG. 29A includes an In layer (a layer containing In and oxygen) between two (In, M, Zn) layers (layers each containing In, M (M is Al, Ga, Y, or Sn), Zn, and oxygen). In some cases, an (M, Zn) layer (a layer containing M, Zn, and oxygen) is formed instead of the (In, M, Zn) layer as shown in FIG. 29B.

For example, when [In]:[M]:[Zn]=1:1:1, an In layer is formed between two (M, Zn) layers in many cases, like the crystal structure shown in FIG. 27. For example, when the content of In is larger than [In]:[M]:[Zn]=1:1:1, such as [In]:[M]:[Zn]=4:2:3 to 4.1 and the vicinity thereof, part of the element M or Zn of the (M, Zn) layer in the crystal structure shown in FIG. 27 is replaced with In to form an (In, M, Zn) layer in many cases.

A crystal part in which a plurality of nanoclusters is aligned to have orientation in the film-thickness direction is the above-mentioned crystal part having c-axis alignment. A crystal part in which a plurality of nanoclusters has orientation not in the film-thickness direction but in various directions is the above-mentioned crystal part having no c-axis alignment.

When [In]:[M]:[Zn]=4:2:3 to 4.1 and the vicinity thereof, the content of zinc oxide is relatively large; thus, the proportion of crystal parts having c-axis alignment is large in the oxide semiconductor film.

When the oxide semiconductor film is formed by the above-mentioned deposition method, oxygen vacancies are likely to be formed in nanoclusters in the deposition. In addition, oxygen vacancies are more likely to be formed in nanoclusters in the deposition under the conditions to increase the proportion of crystal parts having no c-axis alignment in the oxide semiconductor film (for example, the deposition temperature is room temperature and the oxygen flow rate ratio is 10% or lower). Oxygen vacancies are formed in an (In, M, Zn) layer and an In layer. Particularly in an (In, M, Zn) layer formed when M or Zn in an (M, Zn) layer is replaced with In, oxygen vacancies are easily formed in the vicinity of In. The description that oxygen vacancies are formed means that oxygen between In, M, and Zn is gone. Thus, oxygen vacancies are formed, whereby a distortion is generated in a crystal structure of the (In, M, Zn) layer and the In layer consisting the nanocluster.

Here, an oxide film serving as a source which supplies sufficient oxygen is formed to be in contact with the oxide semiconductor film including oxygen vacancies is formed, so that oxygen can be supplied from the oxide film. As such an oxide film, an oxide semiconductor film or oxide insulating film containing excess oxygen can be used. As the oxide semiconductor film, for example, the above-mentioned metal oxide film can be used. For the oxide insulating film, silicon oxide, silicon oxynitride, or the like can be used, for example. Note that the oxide film serving as an oxygen supply source is not necessarily in contact with the oxide semiconductor film. For example, a film having an oxygen-transmitting property may be formed between the oxide film serving as an oxygen supply source and the oxide semiconductor film.

To form the oxide semiconductor film or oxide insulating film containing excess oxygen, for example, an excess-oxygen atmosphere (for example, the deposition gas contains oxygen at 100%.) is used as the deposition atmosphere. For another example, oxygen is added to the oxide semiconductor film or oxide insulating film by an ion implantation method, an ion doping method, or plasma treatment. For another example, a film is formed over the oxide semiconductor film or the oxide insulating film by a sputtering method in an oxygen-containing atmosphere to add oxygen.

Note that if impurities such as excess water or hydrogen are contained in the oxide semiconductor film to which oxygen is supplied from the oxide film serving as an oxygen-supply source, oxygen diffusion in the oxide semiconductor film might be inhibited. Thus, heat treatment for dehydration or dehydrogenation is preferably performed on the oxide semiconductor film before the oxide film serving as an oxygen-supply source is formed.

Owing to the oxide semiconductor film formed in contact with the oxide film serving as an oxygen-supply source and the heat treatment, excess oxygen (active oxygen) can be supplied from the oxide film to the oxide semiconductor film. Since the nanoclusters have distortion by oxygen vacancies, active oxygen is diffused to the inside of the oxide semiconductor film via the distortion by oxygen vacancies.

The diffused active oxygen fill oxygen vacancies on the surface or side surface of the nanocluster, for example in the (In, M, Zn) layer. This can reduce oxygen vacancies on the surface or side surface of the nanocluster and reduce sDOS derived from the oxygen vacancies formed in the (In, M, Zn) layer.

Since the oxygen vacancies on the surface or side surface of the nanocluster are filled, active oxygen is less likely to enter the inside of the nanocluster. In addition, hydrogen in the oxide semiconductor film is diffused by the heat treatment. Thus, hydrogen is trapped by oxygen vacancies formed inside the nanocluster, for example the In layer, so that VoH is easily formed inside the nanocluster. Since VoH generates carriers, the carrier density inside the nanocluster is increased.

The increase in the carrier density inside the nanocluster by forming a transistor using such an oxide semiconductor film can dramatically increase the on-state current of the transistor. In addition, sDOS on the surface and side surface of the nanocluster is reduced, whereby the subthreshold swing value of the transistor can be reduced.

In a transistor using the oxide semiconductor film, carries generated mainly in the In layer are considered to flow mainly the conduction band bottom of the (In, M, Zn) layer or (M, Zn) layer. Here, the conduction band bottom is assumed to be mainly composed of $InO_x$ (x>0) and $ZnO_x$ (x>0).

At least part of this embodiment can be implemented in combination with the other embodiments described in this specification as appropriate.

(Embodiment 2)

<Composition of CAC>

Described below is the composition of a CAC (Cloud Aligned Complementary)-OS that can be used as a metal oxide film (hereinafter also referred to as oxide semiconductor film) in one embodiment of the present invention.

The CAC is, for example, a material composition in which elements included in an oxide semiconductor are unevenly distributed in a size of greater than or equal to 0.5 nm and less than or equal to 10 nm, preferably greater than or equal to 1 nm and less than or equal to 2 nm, or a neighborhood thereof. Note that in the following description of an oxide semiconductor, a state in which one or more metal elements are unevenly distributed and regions including the metal element(s) are mixed in a size of greater than or equal to 0.5 nm and less than or equal to 10 nm, preferably greater than or equal to 1 nm and less than or equal to 2 nm, or a neighborhood thereof is referred to as a mosaic pattern or a patch-like pattern.

For example, of In—Ga—Zn oxides (hereinafter also referred to as IGZOs), a CAC-IGZO has a composition (hereinafter also referred to as a cloud-like composition) in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)), and gallium oxide (hereinafter, $GaO_{X3}$ (X3 is a real number greater than 0)), gallium zinc oxide (hereinafter, $Ga_{X4}Zn_{Y4}O_{Z4}$ (X4, Y4, and Z4 are real numbers greater than 0)), or the like, and a mosaic pattern is formed, and then, $InO_{X1}$ or $In_{X2}Zn_{Y2}O_{Z2}$ forming the mosaic pattern is evenly distributed in the film.

That is, the CAC-IGZO is a composite oxide semiconductor with a composition in which a region containing $GaO_{X3}$ as a main component and a region containing $In_{X2}Zn_{Y2}O_{Z2}$ or $InO_{X1}$ as a main component are mixed. Note that in this specification, for example, when the atomic ratio of In to an element M in a first region is greater than the atomic ratio of In to the element M in a second region, the first region has higher In concentration than the second region.

Note that the IGZO is a common name and refers to one compound including In, Ga, Zn, and O in some cases. As a typical example, a crystalline compound represented by $InGaO_3(ZnO)_{m1}$ (m1 is a natural number) or $In_{(1+x0)}Ga_{(1-x0)}O_3(ZnO)_{m0}$ (−1≤x0≤1; m0 is a given number) can be given.

The above crystalline compounds have a single crystal structure, a polycrystalline structure, or a CAAC structure. Note that the CAAC structure is a crystal structure in which a plurality of IGZO nanocrystals have c-axis alignment and are connected on the a-b plane without alignment.

On the other hand, the CAC relates to a material composition. Of material compositions containing In, Ga, Zn, and O, the CAC refers to a composition in which regions which contain Ga as a main component and are partly observed as nanoparticles and regions which contain In as a main component and are partly observed as nanoparticles are randomly dispersed to form a mosaic pattern. Therefore, the crystal structure is a secondary element for the CAC.

Note that in the CAC, a stacked-layer structure of two or more kinds of films with different compositions is not included. For example, a two-layer structure of a film containing In as a main component and a film containing Ga as a main component is not included.

Note that in some cases, a clear boundary is not observed between the region containing $GaO_{X3}$ as a main component and the region containing $In_{X2}Zn_{Y2}O_{Z2}$ or $InO_{X1}$ as a main component.

<Analysis of CAC-IGZO>

Then, measurement results of an oxide semiconductor formed over a substrate by a variety of measurement methods are described.

<<Structure and Fabrication Method of Samples>>

Nine samples according to one embodiment of the present invention are described below. The samples are fabricated under different conditions of substrate temperatures and oxygen gas flow rate percentages in film formation of the oxide semiconductor film. Note that the samples have a structure including a substrate and an oxide semiconductor film over the substrate.

A method for fabricating each sample is described.

First, a glass substrate is used as the substrate. Then, over the glass substrate, an In—Ga—Zn oxide with a thickness of 100 nm is formed as the oxide semiconductor film with a sputtering apparatus. As the film formation conditions, the pressure in a chamber is 0.6 Pa, and an oxide target (In:Ga:Zn=4:2:4.1 [atomic ratio]) is used as a target. In addition, the oxide target provided in the sputtering apparatus is supplied with an AC power of 2500 W.

Note that as the conditions for the film formation of the oxide, the substrate temperature was set to a temperature at which intentional heating is not performed (hereinafter also referred to as R.T.), 130° C., or 170° C. In addition, the flow rate percentage of an oxygen gas (hereinafter also referred to as an oxygen gas flow rate percentage) to a mixed gas of Ar and oxygen was set to 10%, 30%, or 100% to fabricate the nine samples.

<<Analysis by X-ray Diffraction>>

In this section, results of X-ray diffraction measurement performed on the nine samples are described. Note that as an XRD apparatus, D8 ADVANCE manufactured by Bruker was used. In addition, as the conditions for θ/2θ scanning by an Out-of-plane method, the scanning range was 15 deg. to 50 deg., the step width was 0.02 deg., and the scanning speed was 3.0 deg./min.

Figure 76:
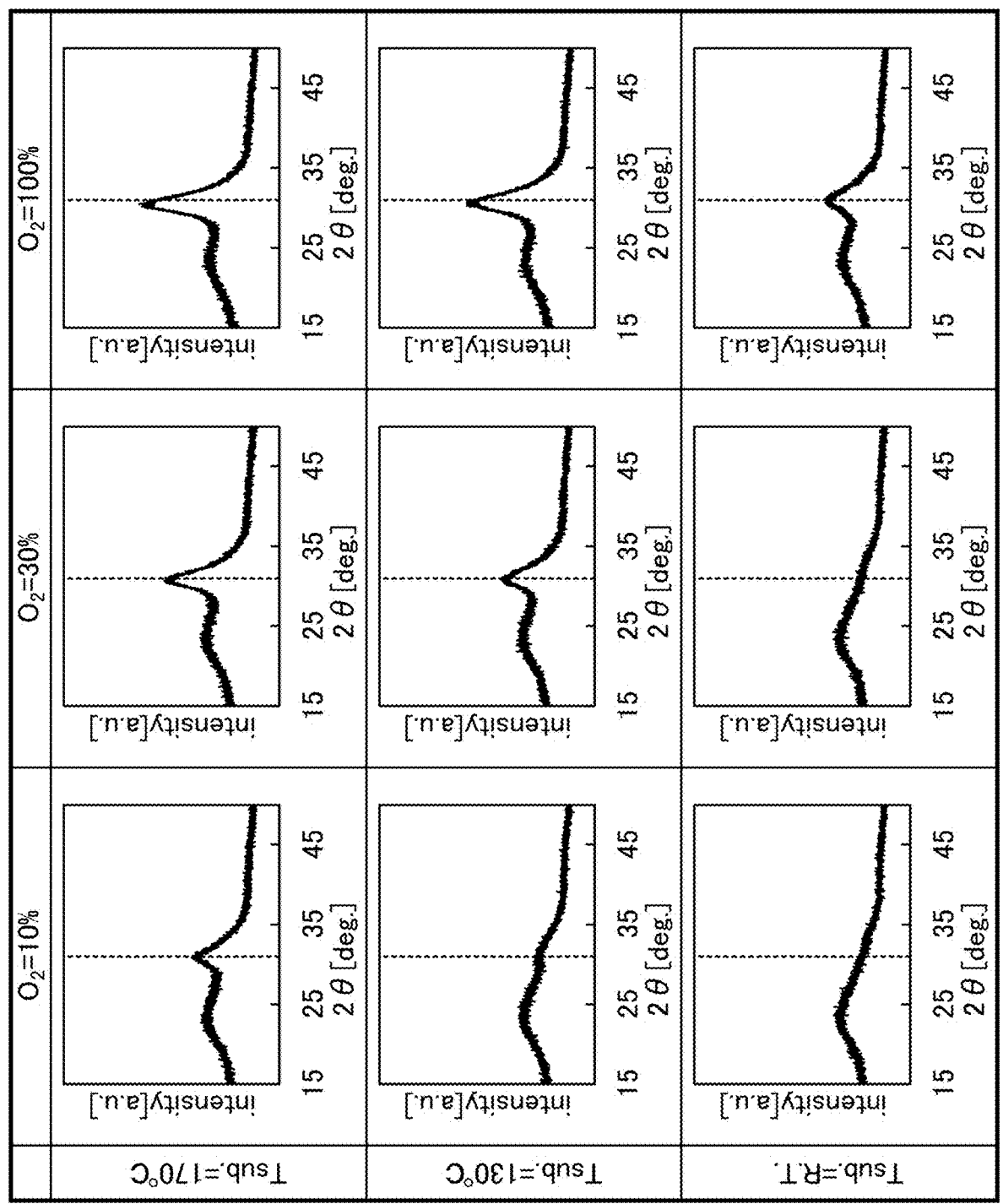

FIG. 76 shows results of measuring XRD spectra by an Out-of-plane method. Note that in FIG. 76, the top row shows the measurement results of the samples for which the substrate temperature condition at the time of film formation was 170° C.; the middle row shows the measurement results of the samples for which the substrate temperature condition at the time of film formation was 130° C.; the bottom row shows the measurement results of the samples for which the substrate temperature condition at the time of film formation was R.T. In addition, the left column shows the measurement results of the samples for which the oxygen gas flow rate percentage condition was 10%; the middle column shows the measurement results of the samples for which the oxygen gas flow rate percentage condition was 30%; the right column shows the measurement results of the samples for which the oxygen gas flow rate percentage condition was 100%.

In the XRD spectra shown in FIG. 76, the higher the substrate temperature at the time of film formation is or the higher the oxygen gas flow rate percentage at the time of film formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface (also referred to as CAAC-IGZO).

In addition, as the substrate temperature at the time of film formation is lower or the oxygen gas flow rate percentage is lower, the XRD spectra shown in FIG. 76 show a less clear peak. Accordingly, it is found that no alignment in the a-b plane direction and c-axis direction are observed in the samples with a lower substrate temperature at the time of film formation or with a lower oxygen gas flow rate percentage.

<<Analysis with Electron Microscope>>

In this section, the observation and analysis results of the samples fabricated at a substrate temperature of R.T. at the time of film formation and with an oxygen gas flow rate percentage of 10% with an HAADF (High-Angle Annular Dark Field)-STEM (Scanning Transmission Electron Microscope) are described (hereinafter, an image obtained with a HAADF-STEM is also referred to as a TEM image).

Described are the results of image analysis of plan-view images (hereinafter also referred to as plan-view TEM images) and cross-sectional images (hereinafter also referred to as cross-sectional TEM images) obtained with a HAADF-STEM. Note that the TEM images were observed with a spherical aberration corrector function. Note that the HAADF-STEM images were taken using an atomic resolution analytical electron microscope JEM-ARM200F manufactured by JEOL Ltd. by irradiation with an electron beam with a beam diameter of approximately 0.1 nmϕ at an acceleration voltage of 200 kV.

FIG. 89A is a plan-view TEM image of the sample fabricated at a substrate temperature of R.T. at the time of film formation and with an oxygen gas flow rate percentage of 10%. FIG. 89B is a cross-sectional TEM image of the sample fabricated at a substrate temperature of R.T. at the time of film formation and with an oxygen gas flow rate percentage of 10%.

<<Analysis of Electron Diffraction Patterns>>

In this section, results of obtaining electron diffraction patterns by irradiation of the sample fabricated at a substrate temperature of R.T. at the time of film formation and an oxygen gas flow rate percentage of 10% with an electron beam with a probe diameter of 1 nm (also referred to as a nanobeam) are described.

Electron diffraction patterns indicated by a black dot a1, a black dot a2, a black dot a3, a black dot a4, and a black dot a5 in the plan-view TEM image in FIG. 89A of the sample fabricated at a substrate temperature of R.T. at the time of film formation and an oxygen gas flow rate percentage of 10% are observed. Note that the electron diffraction patterns are observed while electron beam irradiation is performed and moved at a constant rate from a position of 0 seconds to a position of 35 seconds. FIG. 89C shows the results of the black point a1; FIG. 89D shows the results of the black dot a2; FIG. 89E shows the results of the black dot a3; FIG. 89F shows the results of the black dot a4; FIG. 89G shows the results of the black dot a5.

In FIG. 89C, FIG. 89D, FIG. 89E, FIG. 89F, and FIG. 89G, regions with high luminance can be observed like a circle (in a ring-like pattern). Furthermore, a plurality of spots can be observed in the ring-like regions.

In addition, electron diffraction patterns indicated by a black dot b1, a black dot b2, a black dot b3, a black dot b4, and a black dot b5 in the cross-sectional TEM image in FIG. 89B of the sample fabricated at a substrate temperature of R.T. at the time of film formation and an oxygen gas flow rate percentage of 10% are observed. FIG. 89H shows the results of the black point b1; FIG. 89I shows the results of the black dot b2; FIG. 89J shows the results of the black dot b3; FIG. 89K shows the results of the black dot b4; FIG. 89L shows the results of the black dot b5.

In FIG. 89H, FIG. 89I, FIG. 89J, FIG. 89K, and FIG. 89L, regions with high luminance can be observed in a ring-like pattern. Furthermore, a plurality of spots can be observed in the ring-like regions.

Here, for example, when an electron beam with a probe diameter of 300 nm is incident on a CAAC-OS including an InGaZnO$_4$ crystal in a direction parallel to the sample surface, a diffraction pattern including a spot derived from the (009) plane of the InGaZnO$_4$ crystal is seen. That is, the CAAC-OS has c-axis alignment and the c-axes are aligned in the direction substantially perpendicular to the formation surface or the top surface. Meanwhile, a ring-like diffraction pattern is observed when an electron beam with a probe diameter of 300 nm is incident in a direction perpendicular to the sample surface of the same sample. That is, it is found that the CAAC-OS has neither a-axis nor b-axis alignment.

Furthermore, a diffraction pattern like a halo pattern is observed when an oxide semiconductor including a nanocrystal (hereinafter referred to as nc-OS) is subjected to electron diffraction using an electron beam with a large probe diameter (e.g., 50 nm or larger). Meanwhile, bright points (spots) are observed when the nc-OS is subjected to nanobeam electron diffraction using an electron beam with a small probe diameter (e.g., smaller than 50 nm). Furthermore, when the nc-OS is subjected to nanobeam electron diffraction, regions with high luminance are observed like a circle (in a ring-like pattern) in some cases. Moreover, a plurality of bright points are observed in the ring-like regions in some cases.

The electron diffraction pattern of the sample fabricated at a substrate temperature of R.T. at the time of film formation and with an oxygen gas flow rate percentage of 10% has regions with high luminance in a ring-like pattern, and the ring regions include a plurality of bright points. Accordingly, the sample fabricated at a substrate temperature of R.T. at the time of film formation and with an oxygen gas flow rate percentage of 10% exhibits an electron diffraction pattern that is the nc-OS and does not have alignment in the plane direction and the cross-sectional direction.

According to the above, an oxide semiconductor film with a low substrate temperature at the time of film formation or with a low oxygen gas flow rate percentage can be presumed to have characteristics distinctly different from those of an oxide semiconductor film having an amorphous structure and an oxide semiconductor film having a single crystal structure.

<<Elementary Analysis>>

In this section, the analysis results of elements in the sample fabricated at a substrate temperature of R.T. at the time of film formation and with an oxygen gas flow rate percentage of 10% by obtaining and evaluating EDX mappings using energy dispersive X-ray spectroscopy (EDX: Energy Dispersive X-ray spectroscopy) are described. Note that an energy dispersive X-ray spectrometer JED-2300T manufactured by JEOL Ltd. is used as an elementary analysis apparatus in the EDX measurement. Note that a Si drift detector is used to detect an X-ray emitted from the sample.

In the EDX measurement, electron beam irradiation is performed on a point in an analysis target region of a sample, and the energy of characteristic X-ray of the sample generated by the irradiation and the generation frequency are measured, whereby an EDX spectrum corresponding to the point is obtained. In this embodiment, peaks of an EDX spectrum of the point are attributed to electron transition to the L shell in an In atom, electron transition to the K shell in a Ga atom, electron transition to the K shell in a Zn atom, and electron transition to the K shell in an O atom, and the proportions of the atoms in the point are calculated. Through this in an analysis target region of a sample, an EDX mapping indicating distributions of proportions of atoms can be obtained.

Figure 78A:
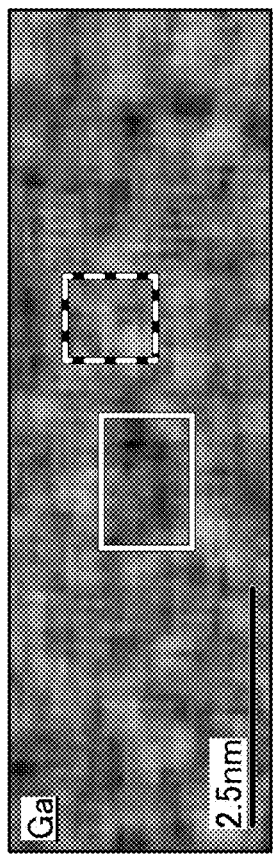
Figure 78B:
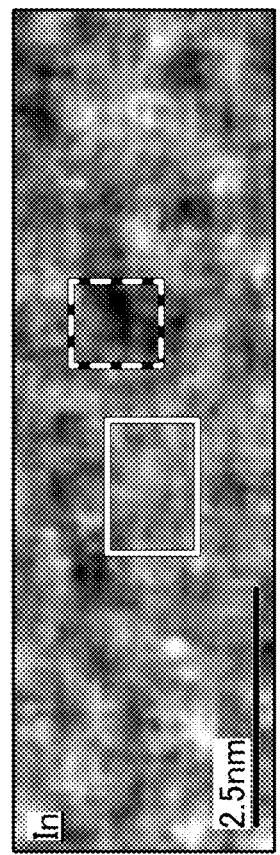
Figure 78C:
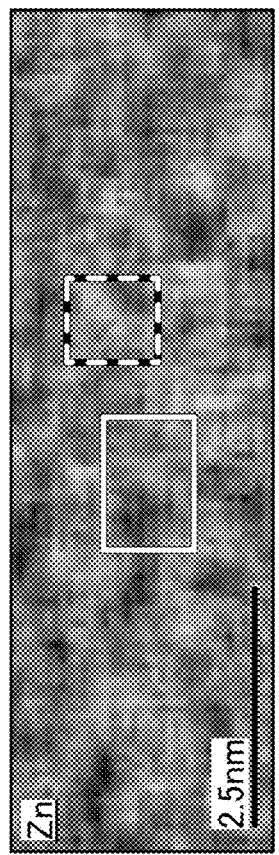

FIG. 78A, FIG. 78B, and FIG. 78C show EDX mappings in a cross section of the sample fabricated at a substrate temperature of R.T. at the time of film formation and with an oxygen gas flow rate percentage of 10%. FIG. 78A shows an EDX mapping of Ga atoms (the proportion of the Ga atoms in all the atoms is in the range of 1.18 to 18.64 [atomic %]). FIG. 78B shows an EDX mapping of In atoms (the proportion of the In atoms in all the atoms is in the range of 9.28 to 33.74 [atomic %]). FIG. 78C shows an EDX mapping of Zn atoms (the proportion of the Zn atoms in all the atoms is in the range of 6.69 to 24.99 [atomic %]). In addition, FIG. 78A, FIG. 78B, and FIG. 78C show the same region in the cross section of the sample fabricated at a substrate temperature of R.T. at the time of film formation and with an oxygen gas flow rate percentage of 10%. Note that in the EDX mappings, the proportion of an element is indicated by grayscale: the more the measured element is in a region, the brighter the region is; the less the measured element is in a region, the darker the region is. In addition, the magnification of the EDX mappings in FIG. 78A, FIG. 78B, and FIG. 78C is 7200000 times.

The EDX mapping images in FIG. 78A, FIG. 78B, and FIG. 78C show relative distribution of brightness indicating that each element exists with a distribution in the sample fabricated at a substrate temperature of R.T. at the time of film formation and with an oxygen gas flow rate percentage of 10%. Here, areas surrounded by solid lines and areas surrounded by dashed lines in FIG. 78A, FIG. 78B, and FIG. 78C are focused on.

In FIG. 78A, the area surrounded by the solid line includes a large, relatively dark region, while the area surrounded by the dashed line includes a large, relatively bright region. In addition, in FIG. 78B, the area surrounded by the solid line includes a large, relatively bright region, while the area surrounded by the dashed line includes a large, relatively dark region.

That is, the areas surrounded by the solid lines are regions including relatively many In atoms and the areas surrounded by the dashed lines are regions including relatively few In atoms. Here, in FIG. 78C, the right portion of the area surrounded by the solid line is a relatively bright region and the left portion thereof is a relatively dark region. Thus, the area surrounded by the solid line is a region containing $In_{X2}Zn_{Y2}O_{Z2}$, $InO_{X1}$, or the like as a main component.

In addition, the area surrounded by the solid line is a region including relatively few Ga atoms and the area surrounded by the dashed line is a region including relatively many Ga atoms. In FIG. 78C, the upper left region of the area surrounded by the dashed line is a relatively bright region and the lower right region thereof is a dark region. Thus, the area surrounded by the dashed line is a region containing $GaO_{X3}$, $Ga_{X4}Zn_{Y4}O_{Z4}$, or the like as a main component.

Furthermore, in FIG. 78A, FIG. 78B, and FIG. 78C, the In atoms are relatively more uniformly distributed than the Ga atoms, and regions containing $InO_{X1}$ as a main component are seemingly formed to be joined to each other through a region containing $In_{X2}Zn_{Y2}O_{Z2}$ as a main component. Thus, the regions containing $In_{X2}Zn_{Y2}O_{Z2}$ or $InO_{X1}$ as a main component are formed to extend like a cloud.

An In—Ga—Zn oxide having a structure in which the regions containing $GaO_{X3}$ as a main component and the regions containing $In_{X2}Zn_{Y2}O_{Z2}$ or $InO_{X1}$ as a main component are unevenly distributed and mixed can be referred to as a CAC-IGZO.

In addition, the crystal structure of the CAC includes an nc structure. In an electron diffraction pattern, the nc structure included in the CAC has several or more bright points (spots) in addition to bright points (sports) derived from IGZO including a single crystal, polycrystal, or CAAC structure. Alternatively, the crystal structure is defined as having high luminance regions appearing in a ring-like pattern in addition to the several or more bright points (spots).

In addition, in FIG. 78A, FIG. 78B, and FIG. 78C, the size of the regions containing $GaO_{X3}$ as a main component and the regions containing $In_{X2}Zn_{Y2}O_{Z2}$ or $InO_{X1}$ as a main component is observed to be greater than or equal to 0.5 nm and less than or equal to 10 nm, or greater than or equal to 1 nm and less than or equal to 3 nm. Note that it is preferable that the diameter of a region containing each metal element as a main component be greater than or equal to 1 nm and less than or equal to 2 nm in the EDX mappings.

According to the above, the CAC-IGZO has a structure different from that of an IGZO compound in which metal elements are evenly distributed, and has properties different from those of the IGZO compound. That is, the CAC-IGZO has a structure in which regions containing $GaO_{X3}$ or the like as a main component and regions containing $In_{X2}Zn_{Y2}O_{Z2}$ or $InO_{X1}$ as a main component are separated from each other and the regions containing each element as a main component form a mosaic pattern. Accordingly, in the case where a CAC-IGZO is used for a semiconductor element, the property derived from $GaO_{X3}$ or the like and the property derived from $In_{X2}Zn_{Y2}O_{Z2}$ or $InO_{X1}$ serve to complement each other, whereby high on-state current ($I_{on}$) and high field-effect mobility ($\mu$) can be achieved.

In addition, a semiconductor element using a CAC-IGZO has high reliability. Thus, the CAC-IGZO is most suitable for a variety of semiconductor devices typified by a display.

At least part of this embodiment can be implemented in combination with the other embodiments or the other examples described in this specification as appropriate.

(Embodiment 3)

In this embodiment, one embodiment of a semiconductor device using the metal oxide film described in the above embodiment is described using FIG. 30A to FIG. 53.

<Transistor Structure 1>

Figure 30A:
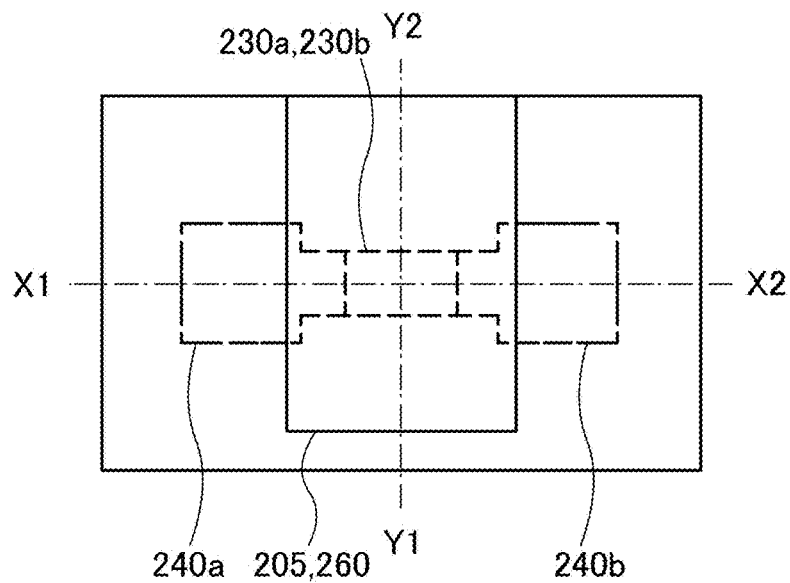
Figure 30B:
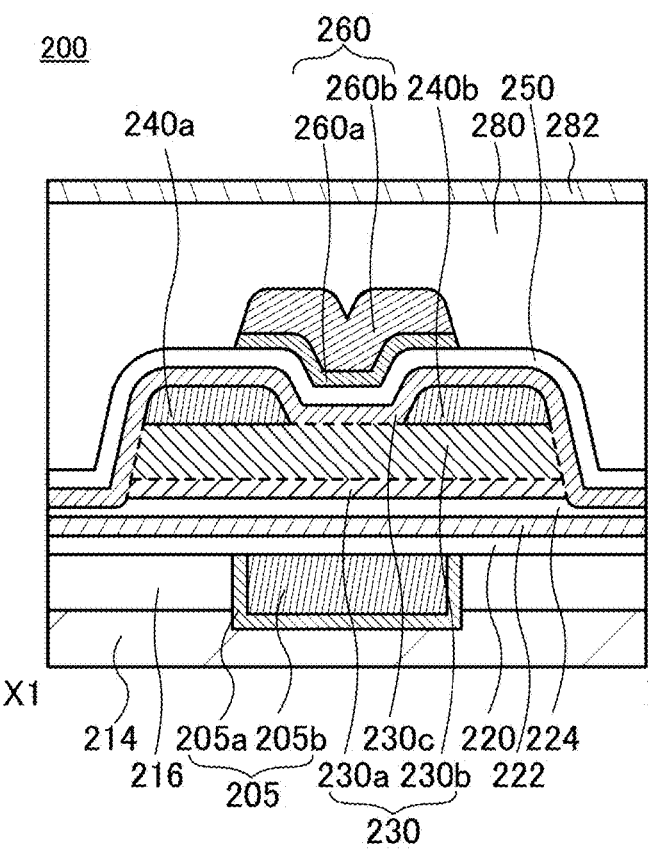
Figure 30C:
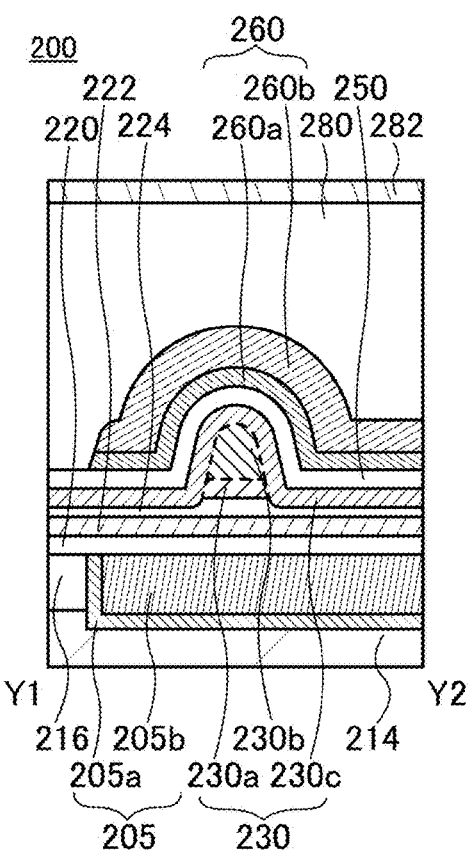

An example of a transistor of one embodiment of the present invention is described below. FIGS. 30A to 30C are a top view and cross-sectional views illustrating the transistor of one embodiment of the present invention. FIG. 30A is a top view, FIG. 30B is a cross-sectional view taken along the dashed-dotted line X1-X2 in FIG. 30A, and FIG. 30C is a cross-sectional view taken along the dashed-dotted line Y1-Y2 in FIG. 30A. Note that for simplification of the drawing, some components are not illustrated in the top view of FIG. 30A.

The transistor 200 includes the conductor 205 (a conductor 205a and a conductor 205b) and a conductor 260 (a conductor 260a and a conductor 260b) which function as gate electrodes; the insulator 220, the insulator 222, the insulator 224, and an insulator 250 which function as gate insulating layers; the oxide 230 which includes a region where a channel is formed; a conductor 240a which functions as one of a source and a drain; a conductor 240b which functions as the other of the source and the drain; the insulator 280 which contains excess oxygen; and the insulator 282 which has a barrier property.

The oxide 230 includes the oxide 230a, the oxide 230b over the oxide 230a, and the oxide 230c over the oxide 230b. When the transistor 200 is turned on, current flows (a channel is formed) mainly in the oxide 230b. Although current sometimes flows through a region in the vicinity of the interface (a mixed region in some cases) between the oxide 230b and each of the oxide 230a and the oxide 230c, the oxide 230a and the oxide 230c function as insulators at the other region.

As illustrated in FIGS. 30A to 30C, the oxide 230c is preferably provided to cover side surfaces of the oxide 230a and the oxide 230b. The oxide 230c, which is provided between the insulator 280 and the oxide 230b including the region where the channel is formed, can prevent impurities such as hydrogen, water, and halogen from diffusing from the insulator 280 into the oxide 230b.

A metal film containing an element selected from molybdenum, titanium, tantalum, tungsten, aluminum, copper, chromium, neodymium, and scandium; a metal nitride film containing any of the elements as its component (e.g., a tantalum nitride film, a titanium nitride film, a molybdenum nitride film, or a tungsten nitride film); or the like is used as the conductor 205. In particular, a metal nitride such as a tantalum nitride film is preferable because it has a barrier property against hydrogen or oxygen and is difficult to oxidize (has high oxidation resistance). Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

For example, a conductor having a barrier property against hydrogen, e.g., tantalum nitride, may be used as the conductor 205a, and tungsten, which has high conductivity, may be stacked thereover as the conductor 205b. The use of the combination of the materials can prevent diffusion of hydrogen into the oxide 230 while conductivity of a wiring is ensured. Note that a two-layer structure of the conductor 205a and the conductor 205b is illustrated in FIGS. 30A to 30C; however, one embodiment of the present invention is not limited thereto, and a single-layer structure or a stacked-layer structure of three or more layers may be used. For example, a structure where a conductor having a barrier property and a conductor which has high conductivity are provided with a conductor which is highly adhesive to the conductor having a barrier property and the conductor which has high conductivity located therebetween may be employed.

Each of the insulator 220 and the insulator 224 is preferably an insulator containing oxygen, such as a silicon oxide film or a silicon oxynitride film. In particular, the insulator 224 is preferably an insulator containing excess oxygen (containing oxygen in excess of that in the stoichiometric composition). In the case where such an insulator containing excess oxygen is provided in contact with an oxide in the transistor 200, oxygen vacancies in the oxide can be compensated. Note that the insulator 222 and the insulator 224 are not necessarily formed of the same material.

The insulator 222 preferably has a single-layer structure or a stacked-layer structure formed using an insulator containing a so-called high-k material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), (Ba,Sr)$TiO_3$ (BST), or the like. In particular, an insulating film having a barrier property against oxygen or hydrogen, e.g., an aluminum oxide film or a hafnium oxide film, is preferably used. The insulator 222 formed of such a material functions as a layer which prevents release of oxygen from the oxide 230 and entry of impurities such as hydrogen from the outside.

Alternatively, aluminum oxide, bismuth oxide, germanium oxide, niobium oxide, silicon oxide, titanium oxide, tungsten oxide, yttrium oxide, or zirconium oxide may be added to these insulators, for example. These insulators may be subjected to nitriding treatment. A layer of silicon oxide, silicon oxynitride, or silicon nitride may be stacked over the insulator.

Note that the insulator 220, the insulator 222, and the insulator 224 each may have a stacked-layer structure of two or more layers. In that case, the stacked layers are not necessarily formed of the same material but may be formed of different materials.

Since the insulator 222 including a high-k material is provided between the insulator 220 and the insulator 224, electrons can be trapped in the insulator 222 under specific conditions, and the threshold voltage can be increased. As a result, the insulator 222 is negatively charged in some cases.

For example, in the case where the insulator 220 and the insulator 224 are formed using silicon oxide and the insulator 222 is formed using a material having a lot of electron trap states such as hafnium oxide, aluminum oxide, or tantalum oxide, the state where the potential of the conductor 205 is higher than the potential of the source electrode and the drain electrode is kept at a temperature higher than the operating temperature or the storage temperature of the semiconductor device (e.g., at a temperature higher than or equal to 125° C. and lower than or equal to 450° C., typically a temperature higher than or equal to 150° C. and lower than or equal to 300° C.) for 10 milliseconds or longer, typically one minute or longer. Thus, electrons are moved from the oxide in the transistor 200 to the conductor 205. At this time, some of the moving electrons are trapped by the electron trap states of the insulator 222.

In the transistor in which a necessary amount of electrons is trapped by the electron trap states of the insulator 222, the threshold voltage is shifted in the positive direction. By controlling the voltage of the conductor 205, the amount of electrons to be trapped can be controlled, and thus the threshold voltage can be controlled. The transistor 200 having the structure is a normally-off transistor which is in a non-conduction state (also referred to as an off state) even when the gate voltage is 0 V.

The treatment for trapping the electrons may be performed in the manufacturing process of the transistor. For example, the treatment is preferably performed at any step before factory shipment, such as after the formation of a conductor connected to a source or a drain of the transistor, after the preceding process (wafer processing), after a wafer-dicing step, or after packaging.

The threshold voltages can be controlled by appropriate adjustment of the thicknesses of the insulator 220, the insulator 222, and the insulator 224. For example, when the total thickness of the insulator 220, the insulator 222, and the insulator 220 is reduced, a voltage is efficiently applied from the conductor 205, resulting in low power consumption of the transistor. The total thickness of the insulator 220, the insulator 222, and the insulator 224 is preferably less than or equal to 65 nm, further preferably less than or equal to 20 nm.

Accordingly, a transistor having stable electric characteristics can be provided. A transistor having a high on-state current can be provided. A transistor with a small subthreshold swing value can be provided. A highly reliable transistor can be provided. A transistor having a low leakage current in an off state can be provided.

An oxide 230a, an oxide 230b, and an oxide 230c are formed using a metal oxide such as an In-M-Zn oxide (M is Al, Ga, Y, or Sn). Here, the metal oxide film described in the above embodiment can be used for the oxide 230a, the oxide 230b, and the oxide 230c. In addition, In—Ga oxide, In—Zn oxide, or the like may be used as the oxide 230.

Next, band structures of the oxide which has a three-layer structure or a two-layer structure are described with reference to FIGS. 31A to 31C. Note that the insulator I1, the oxide S1, the oxide S2, the oxide S3, and the insulator I2 illustrated in FIGS. 31A to 31C respectively correspond to the insulator 224, the oxide 230a, the oxide 230b, the oxide 230c, and the insulator 250 in the transistor 200.

Figure 31A:
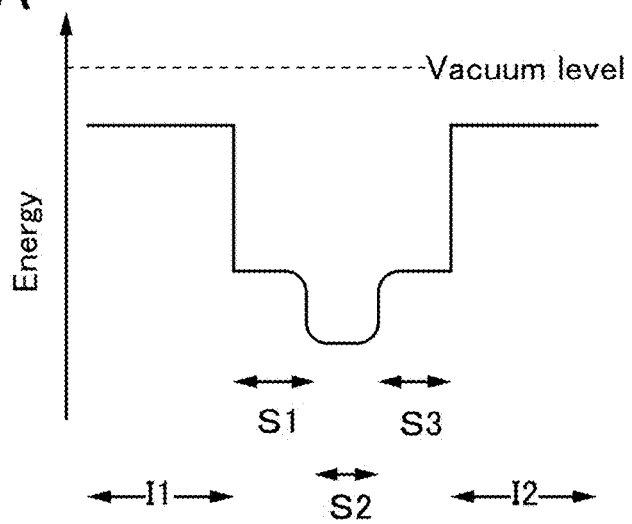

FIG. 31A is an example of a band diagram of a layered structure including an insulator I1, the oxide S1, the oxide S2, the oxide S3, and an insulator I2 in a thickness direction. FIG. 31B is an example of a band diagram of a layered structure including the insulator I1, the oxide S2, the oxide S3, and the insulator I2 in the thickness direction. FIG. 31C is an example of a band diagram of a layered structure including the insulator I1, the oxide S1, the oxide S2, and the insulator I2 in a thickness direction. Note that for easy understanding, the band diagrams show the energy level of the conduction band minimum (Ec) of each of the insulator I1, the oxide S1, the oxide S2, the oxide S3, and the insulator I2. FIG. 31A is a band diagram in which a silicon oxide film is used as each of the insulator I1 and I2, an oxide semiconductor film formed using a metal oxide target including metal elements having an atomic ratio of In:Ga:Zn=1:3:2 is used as the oxide Si, an oxide semiconductor film formed using a metal oxide target including metal elements having an atomic ratio of In:Ga:Zn=4:2:4.1 is used as the oxide S2, and a metal oxide target including metal elements having an atomic ratio of In:Ga:Zn=1:3:2 is used as the oxide S3.

Figure 31B:
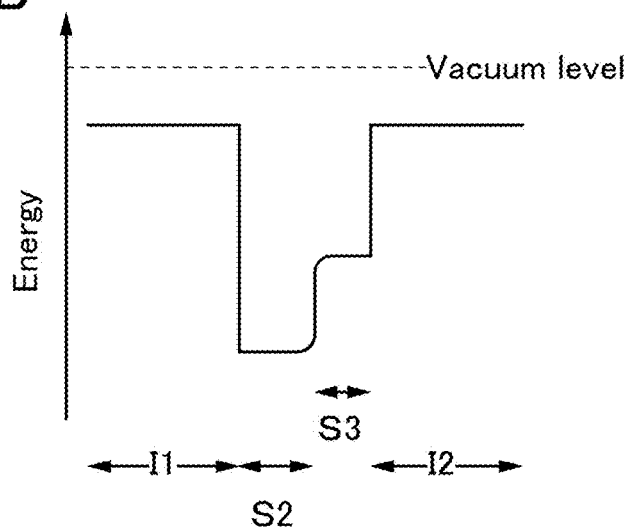

In the band structure of FIG. 31B, a silicon oxide film is used as each of the insulator I1 and the insulator I2, an oxide semiconductor film formed using a metal oxide target whose atomic ratio of In to Ga and Zn is 4:2:4.1 is used as the oxide semiconductor S2, and an oxide semiconductor film formed using a metal oxide target whose atomic ratio of In to Ga and Zn is 1:3:2 is used as the oxide semiconductor S2.

Figure 31C:
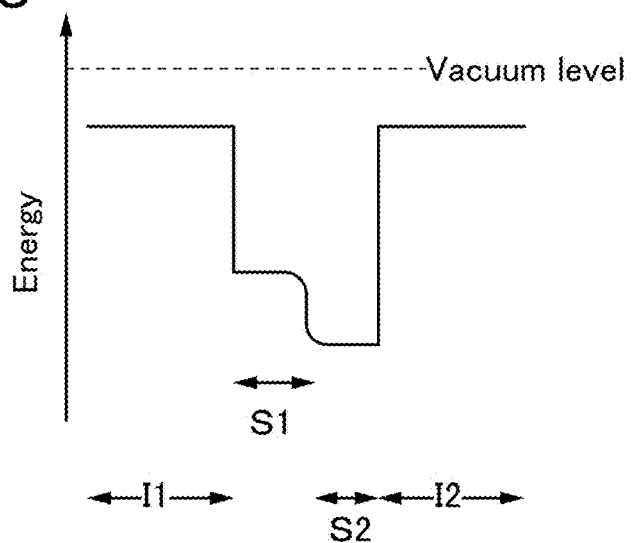

In the band structure of FIG. 31C, a silicon oxide film is used as each of the insulator I1 and the insulator I2, an oxide semiconductor film formed using a metal oxide target whose atomic ratio of In to Ga to Zn is 1:3:2 is used as the oxide semiconductor S1, and an oxide semiconductor film formed using a metal oxide target whose atomic ratio of In to Ga to Zn is 4:2:4.1 is used as the oxide semiconductor S2.

The energy level of the conduction band minimum of each of the oxide S1 and the oxide S3 is closer to the vacuum level than that of the oxide S2. Typically, a difference in the energy level between the conduction band minimum of the oxide S2 and the conduction band minimum of each of the oxide S1 and the oxide S3 is preferably greater than or equal to 0.15 eV or greater than or equal to 0.5 eV, and less than or equal to 2 eV or less than or equal to 1 eV. That is, a difference in the electron affinity between each of the oxide S1 and the oxide S3, and the oxide S2 is preferably greater than or equal to 0.15 eV or greater than or equal to 0.5 eV, and less than or equal to 2 eV or less than or equal to 1 eV.

As shown in FIGS. 31A to 31C, the energy level of the conduction band minimum of each of the oxide S1, the oxide S2, and the oxide S3 is gradually varied. In other words, the energy level of the conduction band minimum is continuously varied or continuously connected. In order to obtain such a band diagram, the density of defect states in a mixed layer formed at the interface between the oxide S1 and the oxide S2 or the interface between the oxide S2 and the oxide S3 is preferably made low.

Specifically, when the oxide S1 and the oxide S2 or the oxide S2 and the oxide S3 contain the same element (as a main component) in addition to oxygen, a mixed layer with a low density of defect states can be formed. For example, in the case where the oxide S2 is an In—Ga—Zn oxide, it is preferable to use an In—Ga—Zn oxide, a Ga—Zn oxide, gallium oxide, or the like as each of the oxide S1 and the oxide S3.

At this time, the oxide S2 serves as a main carrier path. Since the density of defect states at the interface between the oxide S1 and the oxide S2 and the interface between the oxide S2 and the oxide S3 can be made low, the influence of interface scattering on carrier conduction is small, and high on-state current can be obtained. In particular, as shown in the above embodiment, when the oxide S2 has a higher proportion of second crystal parts having no c-axis alignment than first crystal parts having c-axis alignment, higher on-state current can be obtained.

When an electron is trapped by a trap state, the trapped electron behaves like fixed charge; thus, the threshold voltage of a transistor is shifted in the positive direction. The oxides S1 and S3 can make the trap state apart from the oxide S2. This structure can prevent the positive shift of the threshold voltage of the transistor.

In addition, the defect states might be more distant from the vacuum level than the conduction band minimum (Ec) of the oxide semiconductor S2 functioning as a channel region, so that electrons are likely to be accumulated in the defect states. When the electrons are accumulated in the defect states, the electrons become negative fixed electric charge, so that the threshold voltage of the transistor is shifted in the positive direction. Therefore, it is preferable that the defect states be closer to the vacuum level than the conduction band minimum (Ec) of the oxide semiconductor film S2. Such a structure inhibits accumulation of electrons in the defect states, so that the on-state current and the field-effect mobility of the transistor can be increased.

A material whose conductivity is sufficiently lower than that of the oxide S2 is used for the oxide S1 and the oxide S3. In that case, the oxide S2, the interface between the oxide S1 and the oxide S2, and the interface between the oxide S2 and the oxide S3 mainly function as a channel region. For example, an oxide with high insulation performance and the atomic ratio represented by the region C in FIG. 26C may be used as each of the oxide S1 and the oxide S3. Note that the region C in FIG. 26C represents the atomic ratio of [In]:[M]:[Zn]=0:1:0 and the vicinity thereof.

In the case where an oxide with the atomic ratio represented by the region A is used as the oxide S2, it is particularly preferable to use an oxide with an atomic ratio where [M]/[In] is greater than or equal to 1, preferably greater than or equal to 2, as each of the oxide S1 and the oxide S3. In addition, it is suitable to use an oxide with sufficiently high insulation performance and an atomic ratio where [M]/([Zn]+[In]) is greater than or equal to 1 as the oxide S3.

Although the example where an oxide formed using a metal oxide target having metal elements at an atomic ratio of In:Ga:Zn=1:3:2 is used as each of the oxides S1 and S3 is described in this embodiment, one embodiment of the present invention is not limited thereto. For example, an oxide formed using a metal oxide target of In:Ga:Zn=1:1:1 [atomic ratio], In:Ga:Zn=1:1:1.2 [atomic ratio], In:Ga:Zn=1:

3:4 [atomic ratio], In:Ga:Zn=1:3:6 [atomic ratio], In:Ga:Zn=1:4:5 [atomic ratio], In:Ga:Zn=1:5:6 [atomic ratio], or In:Ga:Zn=1:10:1 [atomic ratio] may be used as each of the metal oxides S1 and S3. Alternatively, an oxide formed using a metal oxide target including metal elements at an atomic ratio of Ga:Zn=10:1 may be used as the oxides S1 and S3. In that case, it is suitable that an oxide formed using a metal oxide target including metal elements at an atomic ratio of In:Ga:Zn=1:1:1 is used as the oxide S2 and an oxide formed using a metal oxide target including metal elements at an atomic ratio of Ga:Zn=10:1 is used as each of the oxides S1 and S3 because the difference between the conduction band minimum of the oxide S2 and the conduction band minimum of the oxides S1 and S3 can be 0.6 eV or more.

When the oxides S1 and S3 are formed using a metal oxide target of In:Ga:Zn=1:1:1 [atomic ratio], the oxides S1 and S3 might have In:Ga:Zn=1:$\beta$1 (0<$\beta$1≤2):$\beta$2 (0<$\beta$2≤2). When the oxides S1 and S3 are formed using a metal oxide target of In:Ga:Zn=1:3:4 [atomic ratio], the oxides S1 and S3 might have In:Ga:Zn=1:$\beta$3 (1≤$\beta$3≤5):$\beta$4 (2≤$\beta$4≤6). When the oxides S1 and S3 are formed using a metal oxide target of In:Ga:Zn=1:3:6 [atomic ratio], the oxides S1 and S3 might have In—Ga—Zn=1:$\beta$5 (1≤$\beta$5≤5):$\beta$6 (4≤$\beta$6≤8).

Since oxygen diffusion is performed mainly from the insulator 280, the oxide S3 preferably has high oxygen permeability. For example, the metal oxide film of Sample A1 or Sample A2 described in the above embodiment is preferably used for the oxide S3.

The oxide S3 may be formed in an excess-oxygen atmosphere (e.g., the oxygen concentration of a deposition gas is 100%) so that oxygen is supplied from the oxide S3 to the oxide S2.

As the insulator 250, an insulator containing what is called a high-k material such as silicon oxynitride, silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST) can be used, for example. The insulator may have a single-layer structure or a stacked-layer structure. Alternatively, aluminum oxide, bismuth oxide, germanium oxide, niobium oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the above insulator.

Like the insulator 224, an oxide insulator containing oxygen in excess of the stoichiometric composition is preferably used as the insulator 250. When such an insulator containing excess oxygen is provided in contact with the oxide 230, oxygen vacancies in the oxide 230 can be reduced.

As the insulator 250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties against oxygen or hydrogen, can be used. The insulator 250 formed of such a material serves as a layer that prevents release of oxygen from the oxide 230 and entry of an impurity such as hydrogen from the outside.

Note that the insulator 250 may have a stacked-layer structure similar to that of the insulators 220, 222, and 224. When the insulator 250 includes an insulator in which a necessary amount of electrons is trapped by electron trap states, the threshold voltage of the transistor 200 can be shifted in the positive direction. The transistor 200 having the structure is a normally-off transistor which is in a non-conduction state (also referred to as an off state) even when the gate voltage is 0 V.

In addition to the insulator 250, a barrier film may be provided between the oxide 230 and the conductor 260 in the semiconductor device in FIGS. 30A to 30C. Alternatively, the oxide 230c may have a barrier property.

For example, an insulating film containing excess oxygen is provided in contact with the oxide 230 and enclosed with a barrier film, whereby the composition of the oxide can be substantially the same as the stoichiometric composition or can be in a supersaturated state containing more oxygen than that in the stoichiometric composition. It is also possible to prevent entry of impurities such as hydrogen into the oxide 230.

One of the conductors 240a and 240b functions as a source electrode, and the other thereof functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 240a and 240b. In particular, a metal nitride film such as a tantalum nitride film is preferable because it has a barrier property against hydrogen or oxygen and has a high oxidation resistance.

Although a single-layer structure is illustrated in the drawings, a stacked-layer structure of two or more layers may be used. For example, a tantalum nitride film and a tungsten film may be stacked. Alternatively, a titanium film and an aluminum film may be stacked. Other examples include a two-layer structure in which an aluminum film is stacked over a tungsten film, a two-layer structure in which a copper film is stacked over a copper-magnesium-aluminum alloy film, a two-layer structure in which a copper film is stacked over a titanium film, and a two-layer structure in which a copper film is stacked over a tungsten film.

In addition, there are a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like. Note that a transparent conductive material containing indium oxide, tin oxide, or zinc oxide may be used.

The conductor 260 functioning as a gate electrode can be formed using, for example, a metal selected from aluminum, chromium, copper, tantalum, titanium, molybdenum, and tungsten, an alloy containing any of these metals as its component, or an alloy containing any of these metals in combination. In particular, a metal nitride film such as a tantalum nitride film is preferable because it has a barrier property against hydrogen or oxygen and has a high oxidation resistance. Alternatively, one or both of manganese and zirconium may be used. Alternatively, a semiconductor typified by polycrystalline silicon doped with an impurity element such as phosphorus, or a silicide such as nickel silicide may be used. Although a two-layer structure is shown in the figures, a single-layer structure or a stacked-layer structure of three or more layers may be used.

The stacked two layers may be formed of the same material. For example, the conductor 260a is formed by a thermal CVD method, an MOCVD method, or an ALD method. In particular, an ALD (ALD: Atomic Layer Deposition) method is preferably used. By employing the ALD method or the like, damage to the insulator 250 at the time of the deposition can be reduced. In addition, the ALD method is preferable because coverage can be improved. Thus, the transistor 200 having high reliability can be provided.

Next, the conductor 260b is formed by a sputtering method. At that time, since the conductor 260a is provided over the insulator 250, damage caused during deposition of the conductor 260a can be prevented from affecting the insulator 250. Since the deposition rate in a sputtering method is higher than that in an ALD method, the productivity can be improved with a high yield.

A two-layer structure where a titanium film is stacked over an aluminum film may be used, for example. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Alternatively, a three-layer structure in which a titanium film, an aluminum film, and a titanium film are stacked in this order may be used. Alternatively, an alloy film or a nitride film in which aluminum is combined with one or more metals selected from titanium, tantalum, tungsten, molybdenum, chromium, neodymium, and scandium may be used.

Furthermore, for the conductor 260, a conductive material containing an element selected from indium, tin, zinc, gallium, silicon, and the like can be used. A conductive material having a light-transmitting property such as indium tin oxide, indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, or an In—Ga—Zn oxide. The conductive film can have a stacked structure containing any of the above light-transmitting conductive materials and any of the above metals.

Next, the insulator 280 and the insulator 282 are provided over the transistor 200.

It is preferable to use an oxide containing oxygen in excess of that in the stoichiometric composition for the insulator 280. That is, the insulator 280 preferably has a region containing oxygen in excess of that in the stoichiometric composition (hereinafter also referred to as an excess-oxygen region). In particular, in the case of using an oxide semiconductor in the transistor 200, when an insulator including an excess-oxygen region is provided as an interlayer film or the like in the vicinity of the transistor 200, oxygen vacancies in the transistor 200 are reduced, whereby the reliability can be improved.

As the insulator including the excess-oxygen region, specifically, an oxide material that releases part of oxygen by heating is preferably used. An oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS: Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, silicon oxynitride refers to a material that contains oxygen at a higher proportion than nitrogen, and silicon nitride oxide refers to a material that contains nitrogen at a higher proportion than oxygen.

The insulator 280 covering the transistor 200 may function as a planarization film that covers a roughness thereunder.

The insulator 282 is preferably formed using an insulating film having a barrier property against oxygen or hydrogen, e.g., an aluminum oxide film or a hafnium oxide film. The insulator that can be used as the insulator 222 may be used as the insulator 282. The insulator 282 formed of such a material serves as a layer that prevents release of oxygen from the oxide 230 and entry of an impurity such as hydrogen from the outside.

The above structure makes it possible to provide a transistor including an oxide semiconductor with high on-state current. A transistor including an oxide semiconductor with low off-state current can be provided. Furthermore, when the transistor with the above structure is used in a semiconductor device, variation in the electrical characteristics of the semiconductor device can be reduced, and the reliability thereof can be improved. A semiconductor device with low power consumption can be provided.

<Transistor structure 2>

Figure 32A:
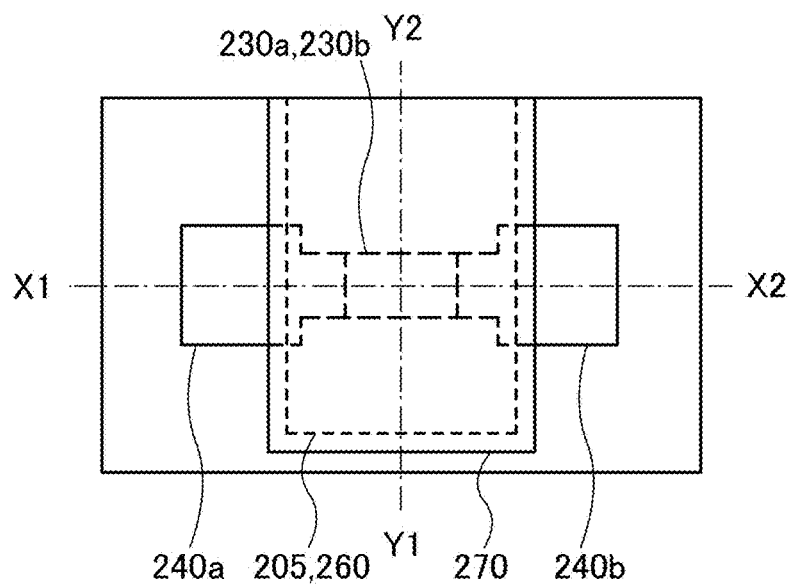
Figure 32B:
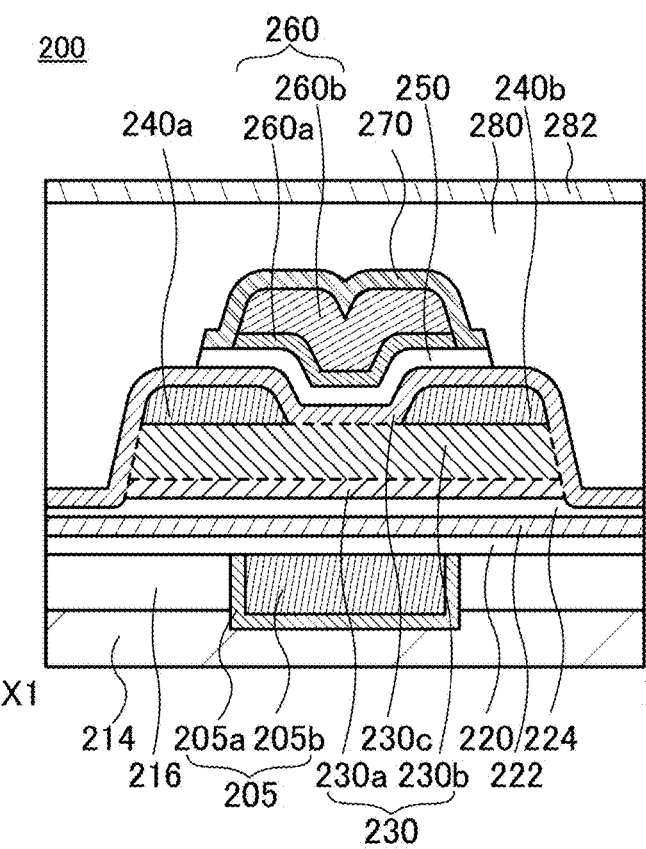
Figure 32C:
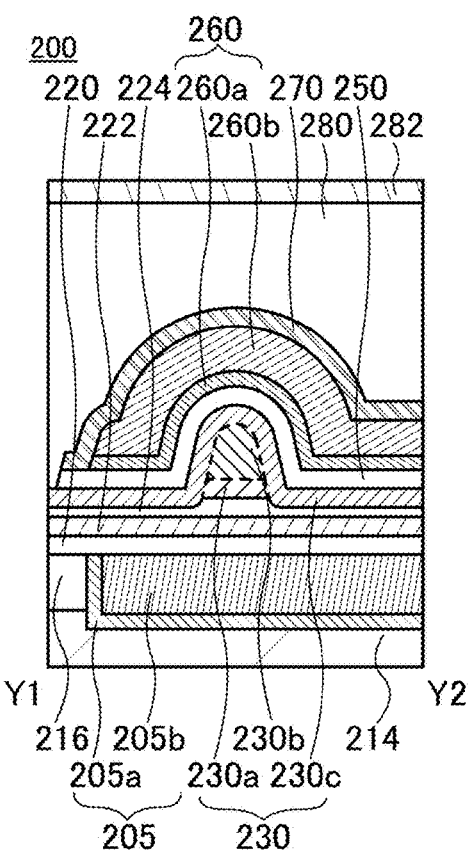

FIGS. 32A to 32C illustrate an example of a structure that can be used for the transistor 200. FIG. 32A illustrates a top surface of the transistor 200. Note that for simplification of the figure, some films are omitted in FIG. 32A. FIG. 32B is a cross-sectional view taken along the dashed-dotted line X1-X2 in FIG. 32A, and FIG. 32C is a cross-sectional view taken along the dashed-dotted line Y1-Y2.

Note that in the transistor 200 in FIGS. 32A to 32C, components having the same function as the components in the transistor 200 in FIGS. 30A to 30C are denoted by the same reference numerals.

In the structure illustrated in FIGS. 32A to 32C, an insulator 270 is provided to cover the conductor 260. When the insulator 280 is formed using an oxide material from which oxygen is released, the insulator 270 is formed using a material with a barrier property against oxygen to prevent the conductor 260 from being oxidized by the released oxygen. An insulator that can be used as the insulator 282 may be used as the insulator 270.

For example, the insulator 270 can be formed using a metal oxide such as aluminum oxide. The insulator 270 is formed to a thickness with which the oxidation of the conductor 260 is prevented. For example, the thickness of the insulator 270 is set greater than or equal to 1 nm and less than or equal to 10 nm, preferably greater than or equal to 3 nm and less than or equal to 7 nm.

This structure can expand the range of choices for materials of the conductor 260. For example, a material which has high conductivity while having low oxidation resistance, such as aluminum, can be used. Furthermore, a conductor that can be easily deposited or processed can be used, for example.

Thus, the oxidation of the conductor 260 can be prevented, and oxygen released from the insulator 280 can be supplied to the oxide 230 efficiently. Furthermore, a conductor that has high conductivity is used for the conductor 260, whereby the transistor 200 with low power consumption can be provided.

<Transistor Structure 3>

Figure 33A:
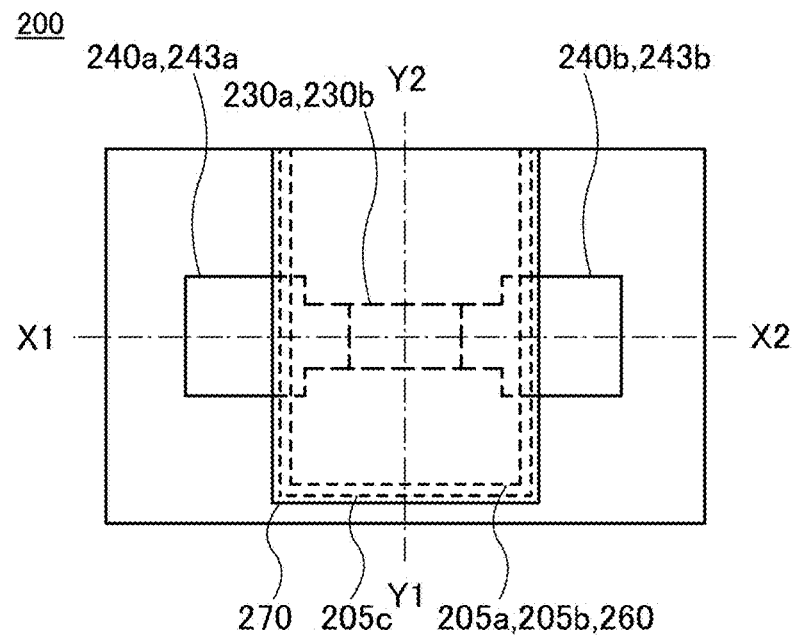
Figure 33B:
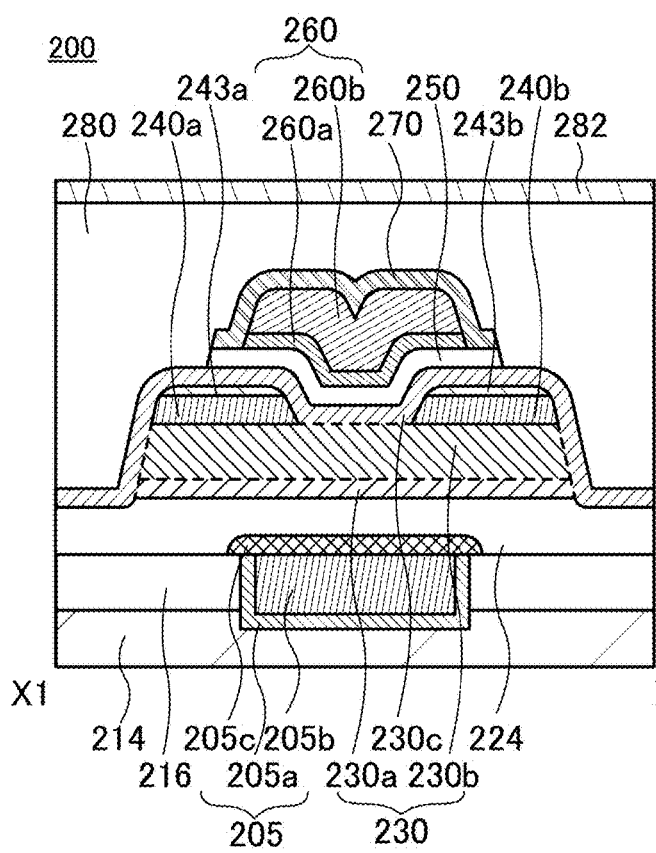
Figure 33C:
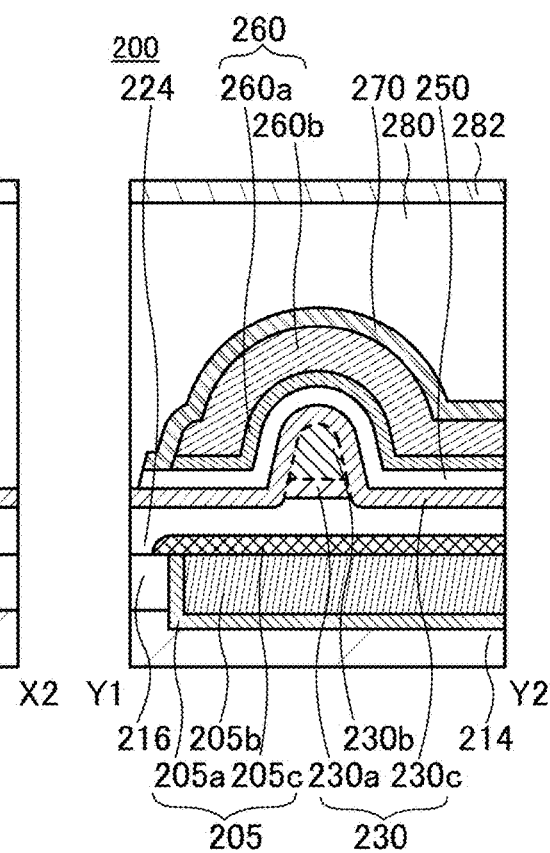

FIGS. 33A to 33C illustrate an example of a structure that can be used for the transistor 200. FIG. 33A illustrates a top surface of the transistor 200. Some films are omitted in FIG. 33A for simplification of the drawing. FIG. 33B is a cross-sectional view taken along dashed-dotted line X1-X2 in FIG. 33A, and FIG. 33C is a cross-sectional view taken along dashed-dotted line Y1-Y2 in FIG. 33A.

Note that in the transistor 200 illustrated in FIGS. 33A to 33C, components having the same function as the components in the transistor 200 in FIGS. 32A to 32C are denoted by the same reference numerals.

In the structure illustrated in FIGS. 33A to 33C, an insulator 243a is stacked over the conductor 240a, and an insulator 243b is stacked over the conductor 240b. In the case where the insulator 280 is formed using an oxide material from which oxygen is released, the insulator 243a and the insulator 243b are formed using a substance having a barrier property against oxygen to prevent the conductor 240a and the conductor 240b from being oxidized by the released oxygen.

For example, the insulator 243a and the insulator 243b can be formed using metal oxide such as aluminum oxide and gallium oxide. Alternatively, silicon nitride or the like may be used for the insulator 243a and the insulator 243b.

This structure can expand the range of choices for materials of the conductor 240a and the conductor 240b. For example, a material which has high conductivity while having low oxidation resistance, such as aluminum, can be used. Furthermore, a conductor that can be easily deposited or processed can be used, for example.

Thus, the oxidation of the conductor 240a and the conductor 240b can be prevented, and oxygen released from the insulator 280 can be supplied to the oxide 230 efficiently. Furthermore, a conductor that has high conductivity is used for the conductor 240a and the conductor 240b, whereby the transistor 200 with low power consumption can be provided.

In the transistor 200 shown in FIGS. 30A to 30C and the like, the insulator 220, the insulator 222, and the insulator 224 are stacked and serve as a gate insulator; however the transistor in this embodiment is not limited to this. For example, only the insulator 224 may be provided as shown in FIGS. 33A to 33C.

In the structures shown in FIGS. 33A to 33C, the conductor 205c is preferably provided to cover the top surface of the conductor 205a and 205b. Here, the conductors 205a to 205c may be referred to as conductor 205. In the case where the insulator 224 is formed using an oxide material from which oxygen is released, the conductor 205b can be prevented from being oxidized by the released oxygen; thus, the conductor used as the conductor 205a can be used as the conductor 205c. For example, a light-transmitting conductive material may be used.

This structure can expand the range of choices for materials of the conductor 205b. Furthermore, a conductor that can be easily deposited or processed can be used, for example.

Thus, the oxidation of the conductor 205b can be prevented, and oxygen released from the insulator 224 can be supplied to the oxide 230 efficiently. Furthermore, a conductor that has high conductivity is used for the conductor 205b, whereby the transistor 200 with low power consumption can be provided.

<Transistor Structure 4>

Figure 34A:
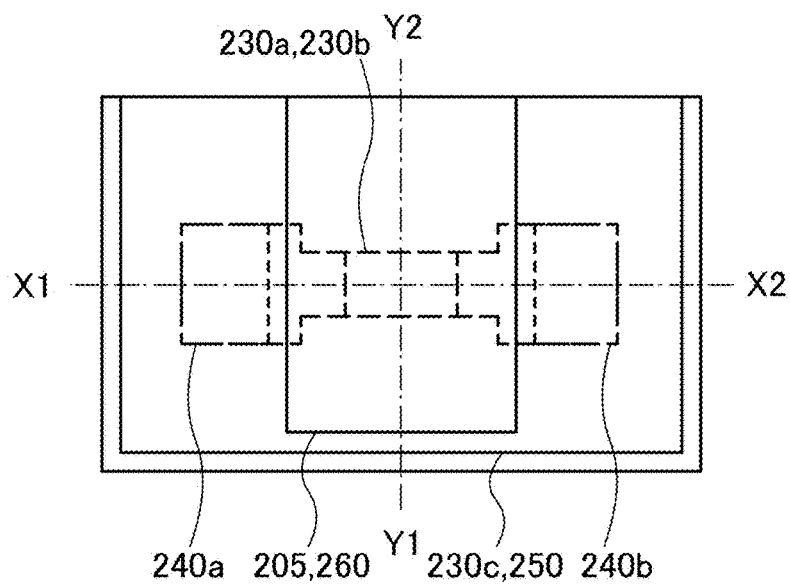
Figure 34B:
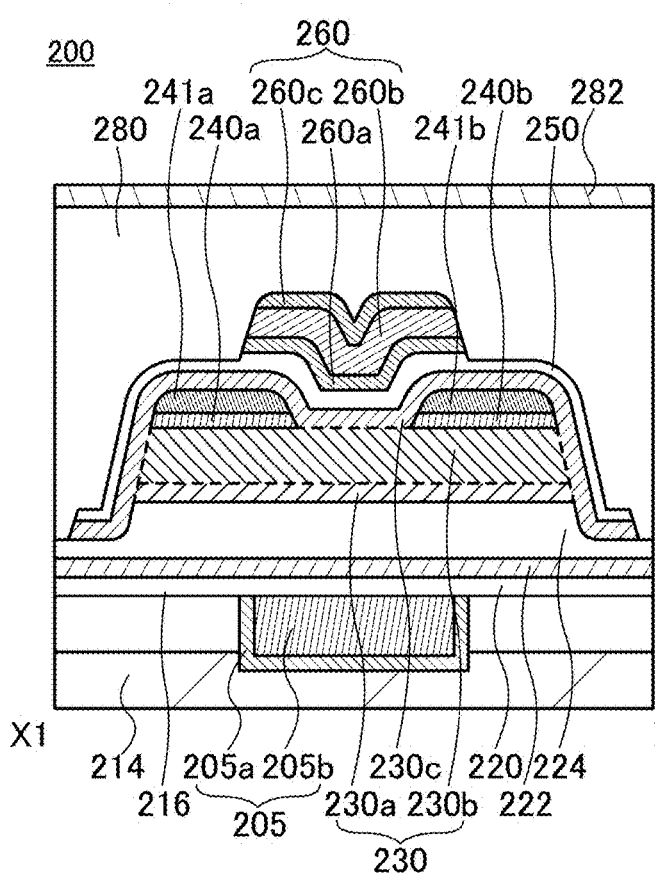
Figure 34C:
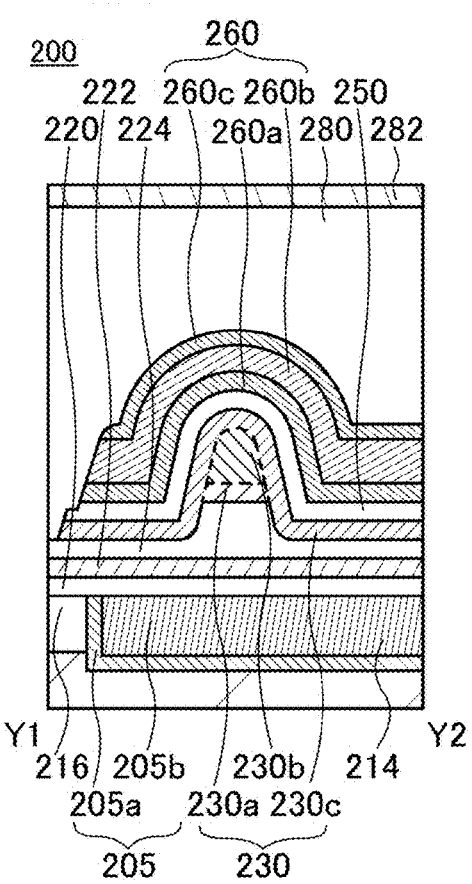

FIGS. 34A to 34C illustrate an example of a structure that can be used for the transistor 200. FIG. 34A illustrates a top surface of the transistor 200. For simplification of the figure, some films are not illustrated in FIG. 34A. FIG. 34B is a cross-sectional view taken along dashed-dotted line X1-X2 in FIG. 34A, and FIG. 34C is a cross-sectional view taken along dashed-dotted line Y1-Y2 in FIG. 34A.

Note that in the transistor 200 in FIGS. 34A to 34C, components having the same function as the components in the transistor 200 in FIGS. 30A to 30C are denoted by the same reference numerals.

In the structure shown in FIGS. 34A to 34C, the conductor 260 functioning as a gate electrode includes conductors 260a to 260c. The oxide 230c may be cut over the insulator 224 as long as the oxide 230c covers a side surface of the oxide 230b.

The conductor 260a is formed by a thermal CVD method, an MOCVD method, and an ALD method. In particular, an ALD method is preferably used. Plasma damage to the insulator 250 can be reduced by using an ALD method and the like. In addition, it is preferable because coverage of the conductor 260a can be improved. Thus, the transistor 200 having high reliability can be provided.

The conductor 260b is formed using a material having high conductivity such as tantalum, tungsten, copper, or aluminum. The conductor 260c formed over the conductor 260b is preferably formed using a conductor with a high oxidation resistance, such as tungsten nitride.

For example, in the case where an oxide material from which oxygen is released is used as the insulator 280, when a conductor with high oxidation resistance is used as the conductor 260c, a large area of which is in contact with the insulator 280 including the excess-oxygen region, oxygen released from the excess-oxygen region can be prevented from being absorbed by the conductor 260. In addition, the oxidation of the conductor 260 can be prevented, and oxygen released from the insulator 280 can be supplied to the oxide 230 efficiently. Furthermore, a conductor that has high conductivity is used for the conductor 260b, whereby the transistor 200 with low power consumption can be provided.

As illustrated in FIG. 34C, the oxide 230b is covered with the conductor 205 and the conductor 260 in the channel width direction of the transistor 200. The insulator 224 has a projection, whereby the side surface of the oxide 230b is also covered with the conductor 260. For example, at the side surfaces of the oxide 230b, the bottom surface of the conductor 260 is preferably located closer to the substrate than the bottom surface of the oxide 230b by adjusting the shape of the projection of the insulator 224. In other words, the transistor 200 has a structure where the oxide 230b can be electrically surrounded by electric fields of the conductor 205 and the conductor 260. A structure where the oxide 230b is electrically surrounded by the electric field of the conductor is referred to as a surrounded channel (s-channel) structure. In the transistor 200 having an s-channel structure, a channel can be formed in the whole of the oxide 230b (bulk). In the s-channel structure, the drain current of the transistor can be increased, so that a larger amount of on-state current (current that flows between the source and the drain when the transistor is on) can be obtained. Furthermore, the entire channel formation region of the oxide 230b can be depleted by the electric fields of the conductors 205 and 260. Accordingly, the off-state current of the transistor can be further reduced. When the channel width is shortened, the effects of the s-channel structure, such as an increase in on-state current and a reduction in off-state current, can be enhanced.

In the structure illustrated in FIGS. 34A to 34C, the conductors functioning as the source and the drain each have a stacked-layered structure. It is preferable that a conductor which is highly adhesive to the oxide 230b be used as the conductors 240a and 240b, and a material with high conductivity be used as conductors 241a and 241b. The conductors 240a and 240b are preferably formed by an ALD (ALD: Atomic Layer Deposition) method. When formed by an ALD method or the like, the coverage can be improved.

For example, when a metal oxide including indium is used as the oxide 230b, titanium nitride or the like may be used as the conductors 240a and 240b. When a material with high conductivity, such as tantalum, tungsten, copper, or aluminum, is used as the conductors 241a and 241b, the transistor 200 with high reliability and low power consumption can be provided. Alternatively, the conductor that can be used as the conductor 260 may be used as the conductor 241a and the conductor 241b, for example, a conductive material having a light-transmitting property may be used.

<Transistor Structure 5>

Figure 35A:
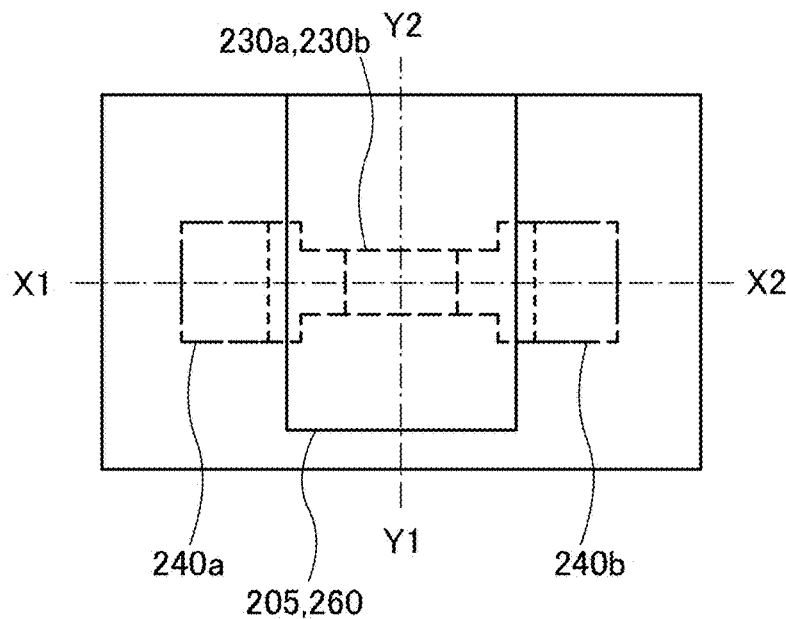
Figure 35B:
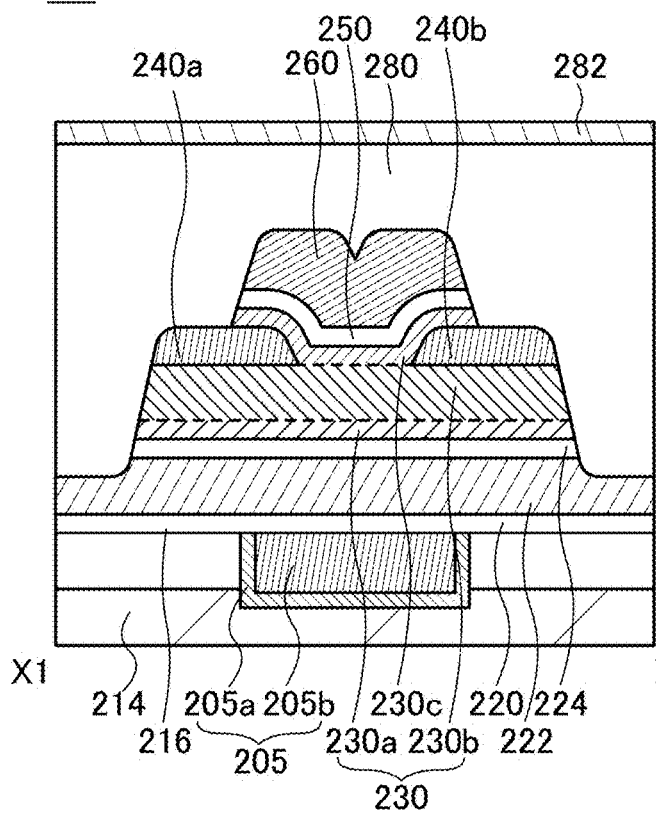
Figure 35C:
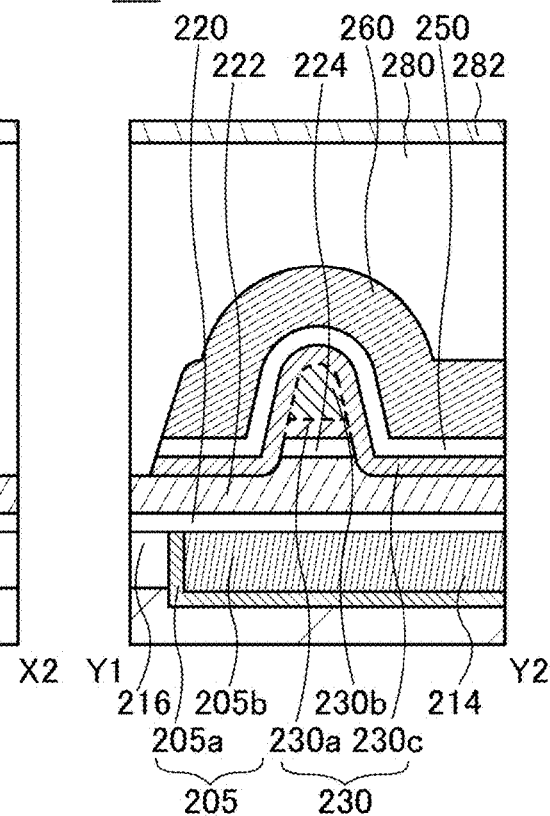

FIGS. 35A to 35C illustrate another example applicable to the transistor 200. FIG. 35A illustrates a top surface of the transistor 200. For simplification of the figure, some films are omitted in FIG. 35A. FIG. 35B is a cross-sectional view taken along dashed-dotted line X1-X2 in FIG. 35A, and FIG. 35C is a cross-sectional view taken along dashed-dotted line Y1-Y2 in FIG. 35A.

Note that in the transistor 200 in FIGS. 35A to 35C, components having the same function as the components in the transistor 200 in FIGS. 30A to 30C are denoted by the same reference numerals.

As illustrated in FIG. 35C, in the transistor 200, the oxide 230b is surrounded by the conductor 205 and the conductor 260 in the channel width direction. The insulator 222 has a projection, whereby the side surface of the oxide 230b is also covered with the conductor 260.

Here, when a high-k material such as hafnium oxide is used for the insulator 222, the equivalent oxide (SiO$_2$) thickness (EOT: Equivalent Oxide Thickness) of the insulator 222 can be small because the insulator 222 has a high relative permittivity. Accordingly, the distance between the conductor 205 and the oxide 230 can be increased owing to the physical thickness of the insulator 222, without a reduction in the influence of the electric field which is applied from the conductor 205 to the oxide 230. Thus, the distance between the conductor 205 and the oxide 230 can be adjusted by changing the thickness of the insulator 222.

For example, at the side surfaces of the oxide 230b, the bottom surface of the conductor 260 is preferably located closer to the substrate than the bottom surface of the oxide 230b by adjusting the shape of the projection of the insulator 224. In other words, the transistor 200 has a structure where the oxide 230b can be electrically surrounded by electric fields of the conductor 205 and the conductor 260. Such a structure where the oxide 230b is electrically surrounded by the electric field of the conductor is referred to as s-channel structure. In the transistor 200 having an s-channel structure, a channel can be formed in the whole of the oxide 230b (bulk). In the s-channel structure, the drain current of the transistor can be increased, so that a larger amount of on-state current (current that flows between the source and the drain when the transistor is on) can be obtained. Furthermore, the entire channel formation region of the oxide 230b can be depleted by the electric fields of the conductors 205 and 260. Accordingly, the off-state current of the transistor having an s-channel structure can be further reduced. When the channel width is shortened, the effects of the s-channel structure, such as an increase in on-state current and a reduction in off-state current, can be enhanced.

In addition, as shown in FIGS. 35B and 35C, the oxide 230c may be formed so that the side surface of the oxide 230c is substantially aligned with the side surfaces of the insulator 250 and the conductor 260. In this manner, the pattern formation of the oxide 230c, the insulator 250, and the conductor 260 can be performed at a time; thus, a process can be simplified. Here, as the conductor 240a and the conductor 240b, metal nitride such as tantalum nitride that has a barrier property against hydrogen or oxygen and is unlikely to be oxidized (has a high oxidation resistance) is used, so that oxidation of the conductor 240a and the conductor 240b can be prevented. Furthermore, excess oxygen can be easily supplied from the insulator 280 to the oxide 230b.

<Transistor Structure 6>

Figure 36A:
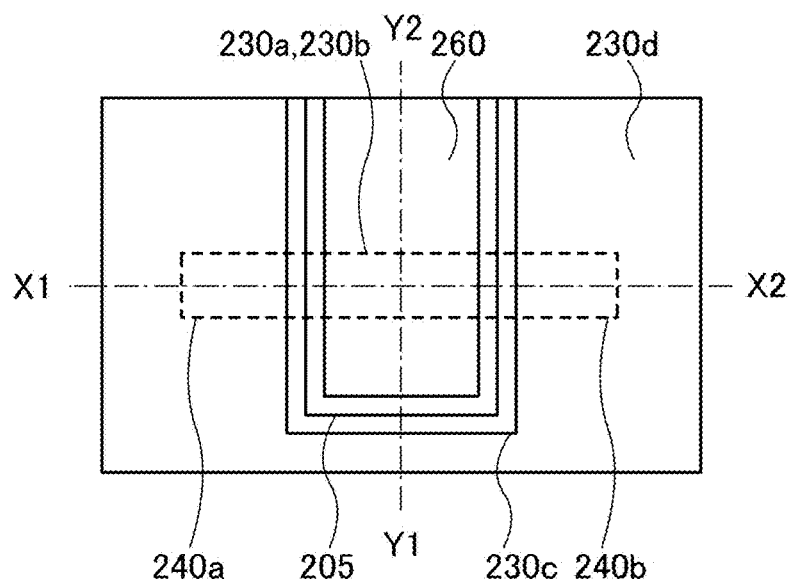
Figure 36B:
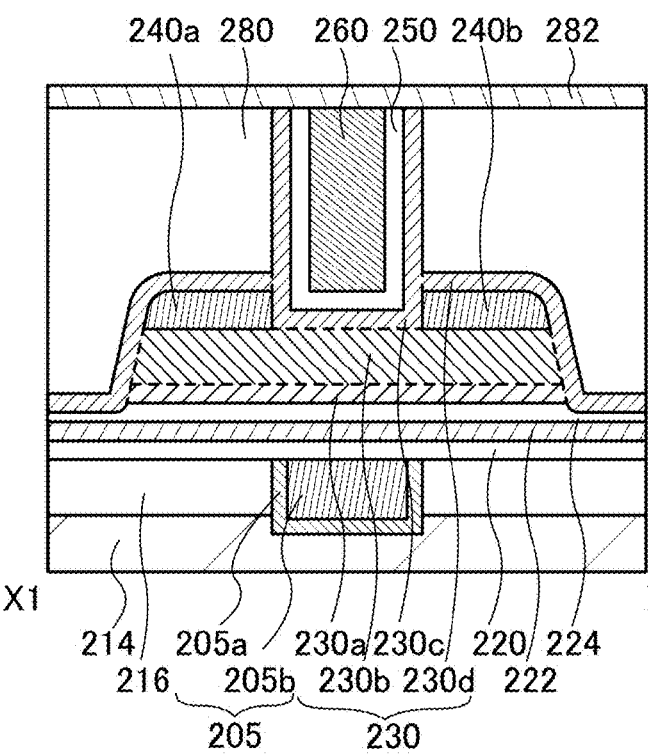
Figure 36C:
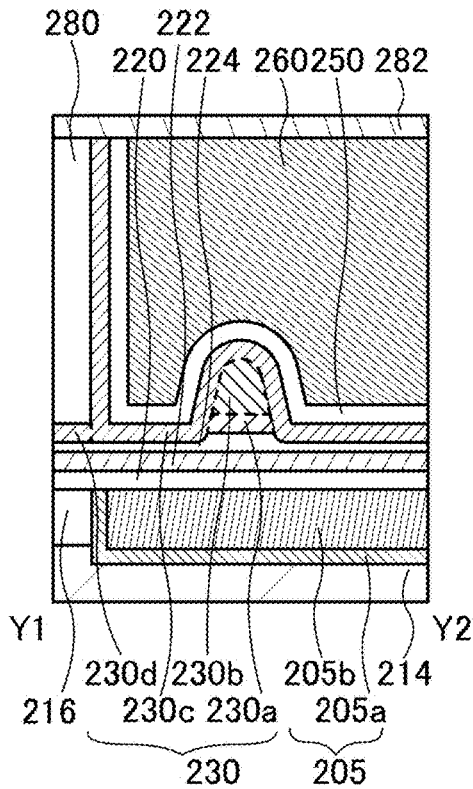

FIGS. 36A to 36C illustrate another example applicable to the transistor 200. FIG. 36A illustrates a top surface of the transistor 200. For simplification of the figure, some films are omitted in FIG. 36A. FIG. 36B is a cross-sectional view taken along dashed-dotted line X1-X2 in FIG. 36A, and FIG. 36C is a cross-sectional view taken along dashed-dotted line Y1-Y2 in FIG. 36A.

Note that in the transistor 200 illustrated in FIGS. 36A to 36C, components having the same function as the components in the transistor 200 in FIGS. 30A to 30C are denoted by the same reference numerals.

In the transistor 200 illustrated in FIGS. 36A to 36C, the oxide 230c, the insulator 250, and the conductor 260 are formed in an opening formed in the insulator 280. Furthermore, one end portion of each of the conductors 240a and 240b is aligned with an end portion of the opening formed in the insulator 280. Furthermore, three end portions of each of the conductors 240a and 240b are aligned with part of an end portion of the oxide 230. Therefore, the conductors 240a and 240b can be formed concurrently with the oxide 230 or the opening in the insulator 280. This leads to a reduction in the number of masks and steps. In addition, yield and productivity can be improved.

The conductor 240a, the conductor 240b, and the oxide 230b are in contact with the insulator 280 having the excess-oxygen region with an oxide 230d positioned therebetween. Thus, the oxide 230d, which is provided between the insulator 280 and the oxide 230b including the region where the channel is formed, can prevent impurities such as hydrogen, water, and halogen from diffusing from the insulator 280 into the oxide 230b.

Since the transistor 200 illustrated in FIGS. 36A to 36C has a structure in which the conductors 240a and 240b hardly overlap with the conductor 260, the parasitic capacitance added to the conductor 260 can be reduced. Thus, the transistor 200 with a high operation frequency can be provided.

<Transistor Structure 7>

Figure 37A:
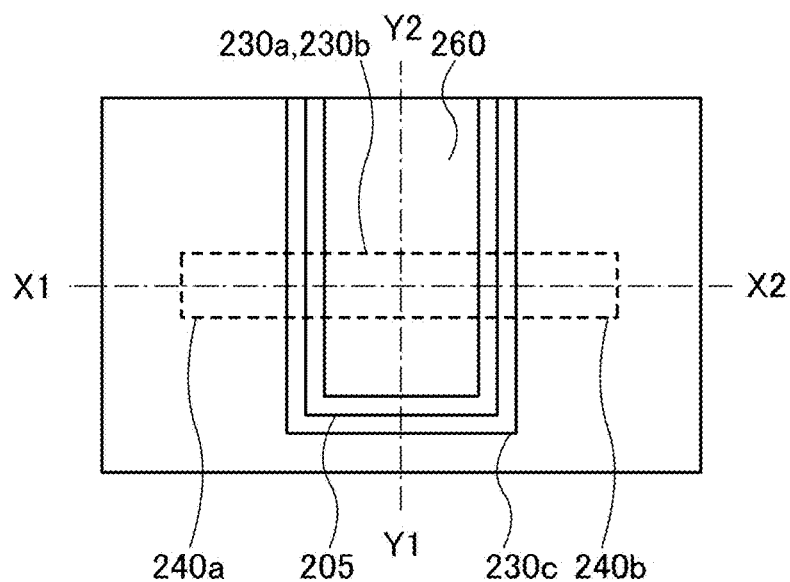
Figure 37B:
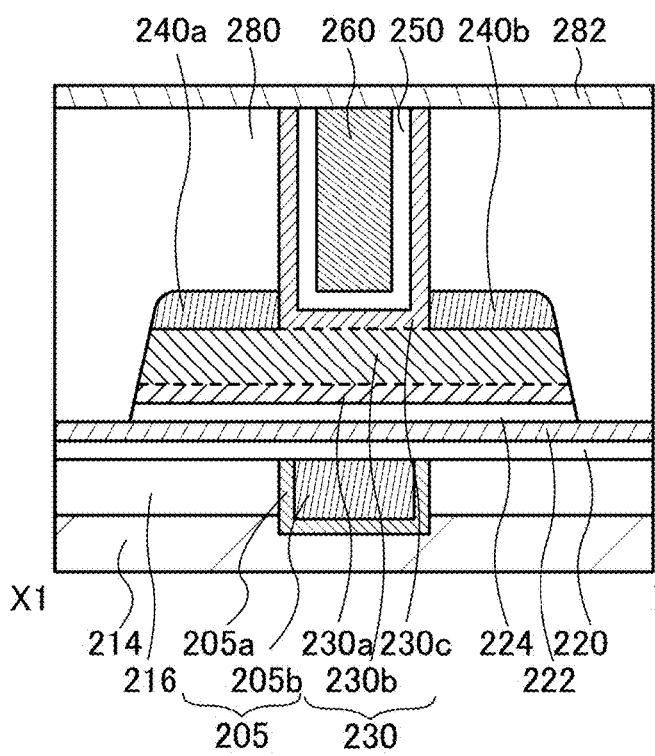
Figure 37C:
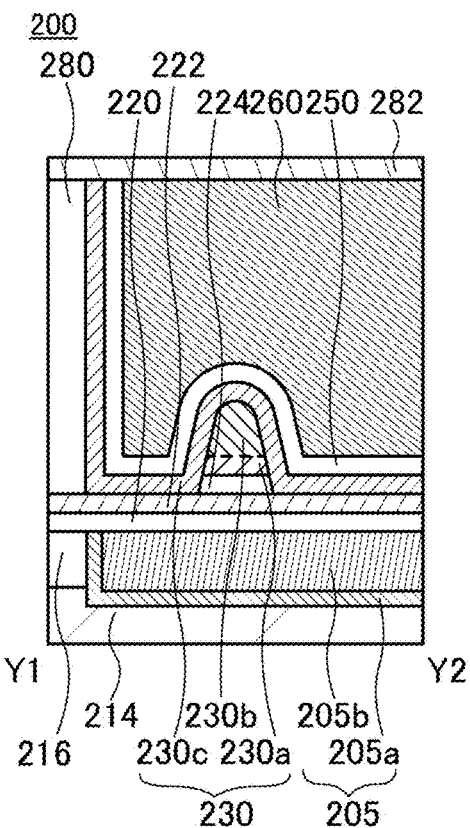

FIGS. 37A to 37C illustrate an example of a structure that can be used for the transistor 200. FIG. 37A illustrates a top surface of the transistor 200. For simplification of the figure, some films are omitted in FIG. 37A. FIG. 37B is a cross-sectional view taken along dashed-dotted line X1-X2 in FIG. 37A, and FIG. 37C is a cross-sectional view taken along dashed-dotted line Y1-Y2 in FIG. 37A.

Note that in the transistor 200 in FIGS. 37A to 37C, components having the same function as those in the transistor 200 in FIGS. 30A to 30C are denoted by the same reference numerals.

The transistor 200 illustrated in FIGS. 37A to 37C does not have the oxide 230d. For example, when the conductor 240a and the conductor 240b are formed using a conductor with a high oxidation resistance, the oxide 230d is not necessarily provided. This leads to a reduction in the number of masks and step. In addition, yield and productivity can be improved.

The insulator 224 may be provided in only the region overlapping with the oxide 230a and the oxide 230b. In that case, the oxide 230a, the oxide 230b, and the insulator 224 can be processed using the insulator 222 as an etching stopper. Accordingly, yield and productivity can be improved.

Since the transistor 200 illustrated in FIGS. 37A to 37C has a structure in which the conductors 240a and 240b hardly overlap with the conductor 260, the parasitic capacitance added to the conductor 260 can be reduced. Thus, the transistor 200 with a high operation frequency can be provided.

<Transistor Structure 8>

Figure 38A:
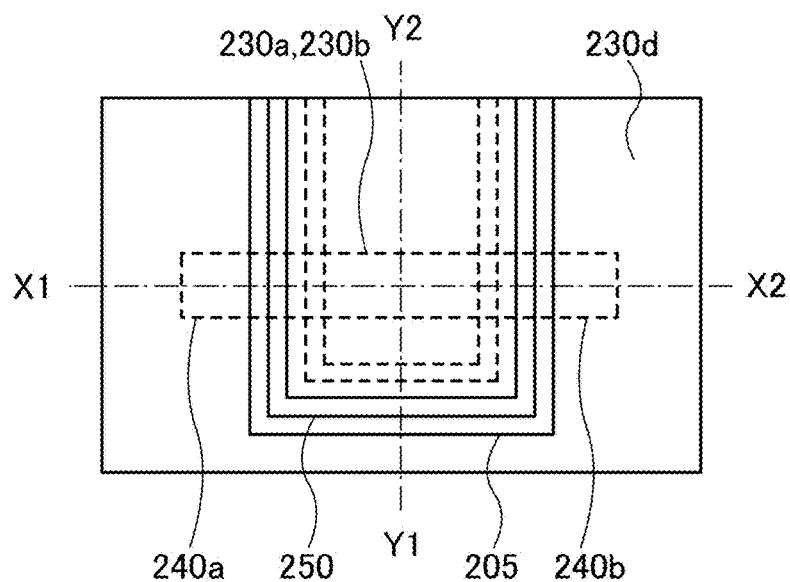
Figure 38B:
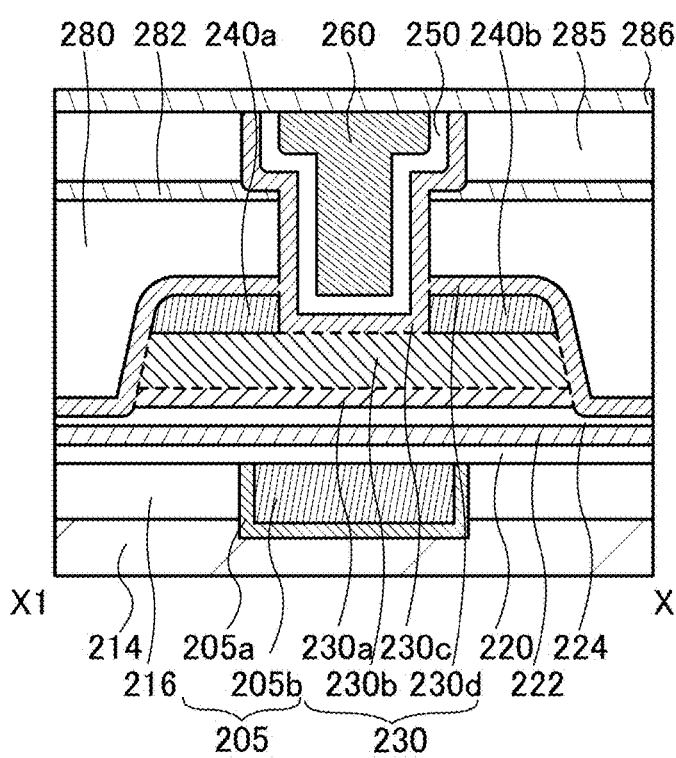
Figure 38C:
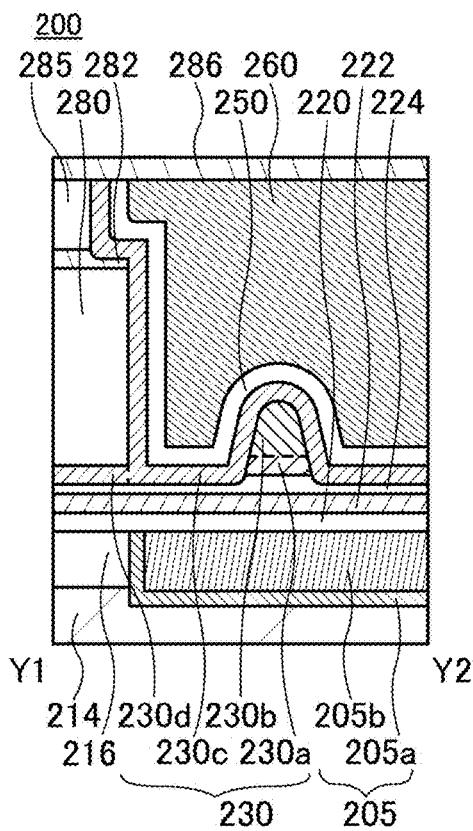

FIGS. 38A to 38C illustrate an example of a structure that can be used for the transistor 200. FIG. 38A illustrates a top surface of the transistor 200. For simplification of the figure, some films are omitted in FIG. 38A. FIG. 38B is a cross-sectional view taken along dashed-dotted line X1-X2 in FIG. 38A, and FIG. 38C is a cross-sectional view taken along dashed-dotted line Y1-Y2 in FIG. 38A.

Note that in the transistor 200 in FIGS. 38A to 38C, components having the same function as the components in the transistor 200 in FIGS. 36A to 36C are denoted by the same reference numerals.

An insulator 285 and an insulator 286 are formed over the insulator 282.

The oxide 230c, the insulator 250, and the conductor 260 are formed in an opening formed in the insulator 280, the insulator 282, and the insulator 285. Furthermore, one end portion of each of the conductors 240a and 240b is aligned with an end portion of the opening formed in the insulator 280. Furthermore, three end portions of each of the conductors 240a and 240b are aligned with parts of end portions of each of the oxides 230a and 230b. Therefore, the conductors 240a and 240b can be formed concurrently with the oxides 230a and 230b or the opening in the insulator 280. Therefore, the conductors 240a and 240b can be formed concurrently with the oxide 230 or the opening in the insulator 280. This leads to a reduction in the number of masks and steps. In addition, yield and productivity can be improved.

The conductor 240a, the conductor 240b, and the oxide 230b are in contact with the insulator 280 having the excess-oxygen region with an oxide 230d positioned therebetween. Thus, the oxide 230d, which is provided between the insulator 280 and the oxide 230b including the region where the channel is formed, can prevent impurities such as hydrogen, water, and halogen from diffusing from the insulator 280 into the oxide 230b.

In addition, since a high-resistance offset region is not formed in the transistor 200 illustrated in FIGS. 38A to 38C, the on-state current of the transistor 200 can be increased.

<Method for Manufacturing Semiconductor Device>

An example of a method for manufacturing the semiconductor device illustrated in FIGS. 30A to 30C is described below with reference to FIG. 39A to FIG. 42B.

First, a substrate is prepared (not illustrated). Although there is no particular limitation on the substrate, it preferably has heat resistance high enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate of silicon, silicon carbide, or the like; a compound semiconductor substrate of silicon germanium, gallium arsenide, indium arsenide, or indium gallium arsenide; an SOI (Silicon On Insulator) substrate; a GOI (Germanium On Insulator) substrate; or the like can be used. Further alternatively, any of these substrates provided with a semiconductor element may be used as the substrate.

Further alternatively, a flexible substrate may be used as the substrate to manufacture the semiconductor device. To manufacture a flexible semiconductor device, a transistor may be directly formed over a flexible substrate; alternatively, a transistor may be formed over a manufacturing substrate and then separated from the manufacturing substrate and transferred to a flexible substrate. In order that the transistor be separated from the manufacturing substrate to be transferred to the flexible substrate, it is preferable to provide a separation layer between the manufacturing substrate and the transistor including an oxide semiconductor.

Figure 39A:
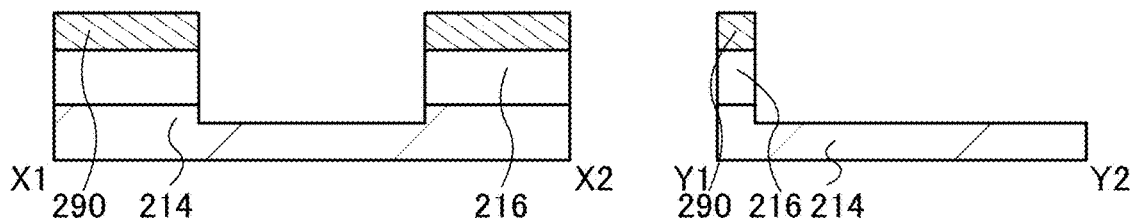

Next, an insulator 214 and an insulator 216 are formed. Then, a resist mask 290 is formed over the insulator 216 by a lithography process or the like to remove unnecessary portions of the insulators 214 and 216 (FIG. 39A). After that, the resist mask 290 is removed; thus, an opening can be formed.

Here, a method for processing a film is described. To process a film finely, a variety of fine processing techniques can be used. For example, it is possible to use a method in which a resist mask formed by a lithography process or the like is subjected to slimming treatment. Alternatively, a dummy pattern is formed by a lithography process or the like, the dummy pattern is provided with a sidewall and is then removed, and a film is etched using the remaining sidewall as a resist mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for exposure, extreme ultraviolet light (EUV: Extreme Ultra-violet) or X-rays may also be used. Instead of the light for exposure, an electron beam can be used. It is preferable to use EUV, X-rays, or an electron beam because extremely minute processing can be performed. Note that a photomask is not needed when exposure is performed by scanning with a beam such as an electron beam.

An organic resin film having a function of improving the adhesion between a film and a resist film may be formed before the resist film serving as a resist mask is formed. The organic resin film can be formed to provide a flat surface by covering a step under the film by a spin coating method or the like, and thus can reduce variation in thickness of the resist mask over the organic resin film. In the case of fine processing, in particular, a material serving as a film preventing reflection of light for the exposure is preferably used for the organic resin film. Examples of the organic resin film having such a function include a BARC (Bottom Anti-Reflection Coating) film. The organic resin film may be removed at the same time as the resist mask or after the resist mask is removed.

Figure 39B:
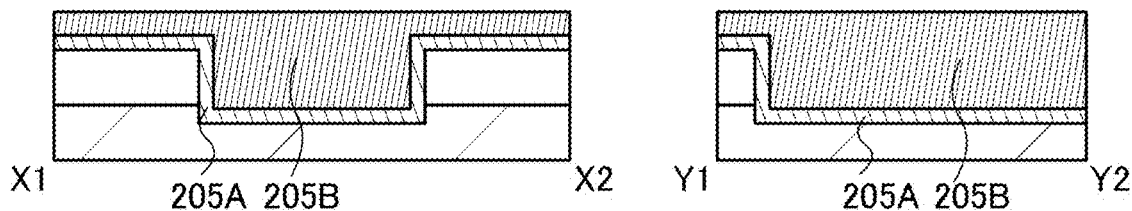

Next, a conductor 205A and a conductor 205B are deposited over the insulator 214 and the insulator 216. The conductor 205A and the conductor 205B can be deposited by, for example, a sputtering method, an evaporation method, or a CVD method (including a thermal CVD method, an MOCVD method, a PECVD method, and the like). It is preferable to use a thermal CVD method, an MOCVD method, or an ALD method in order to reduce plasma damage (FIG. 39B).

Figure 39C:
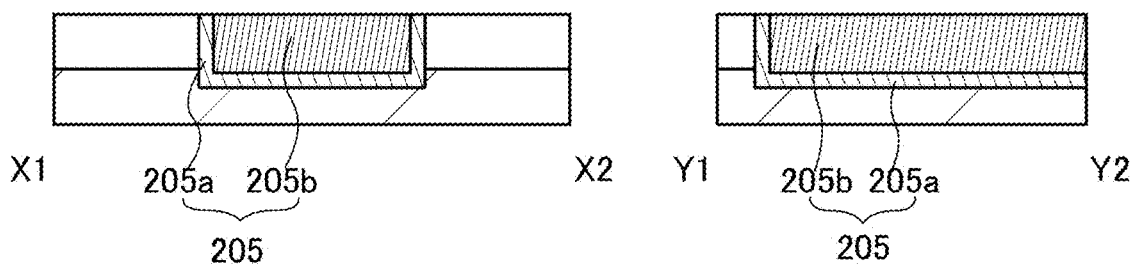

Then, unnecessary portions of the conductors 205A and 205B are removed. For example, part of the conductor 205A and part of the conductor 205B are removed by etch-back process, a chemical mechanical polishing (CMP: Chemical Mechanical Polishing) process, or the like until the insulator 216 is exposed, whereby the conductor 205 is formed (FIG. 39C). At this time, the insulator 216 can be used as a stopper layer, and the thickness of the insulator 216 is reduced in some cases.

The CMP processing is processing for planarizing a surface of an object to be processed by a combination of chemical and mechanical actions. More specifically, a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing between the object to be processed and the polishing cloth.

Note that the CMP processing may be performed only once or a plurality of times. When the CMP processing is performed a plurality of times, it is preferable that first polishing be performed at a high polishing rate and final polishing be performed at a low polishing rate. In this manner, polishing processes using different polishing rates may be used in combination.

Figure 39D:
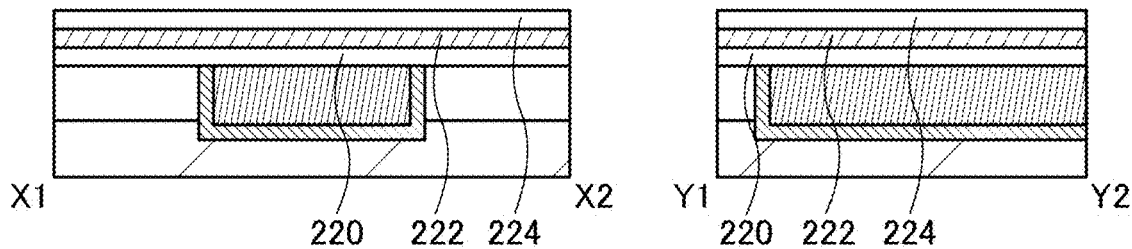
Figure 39E:
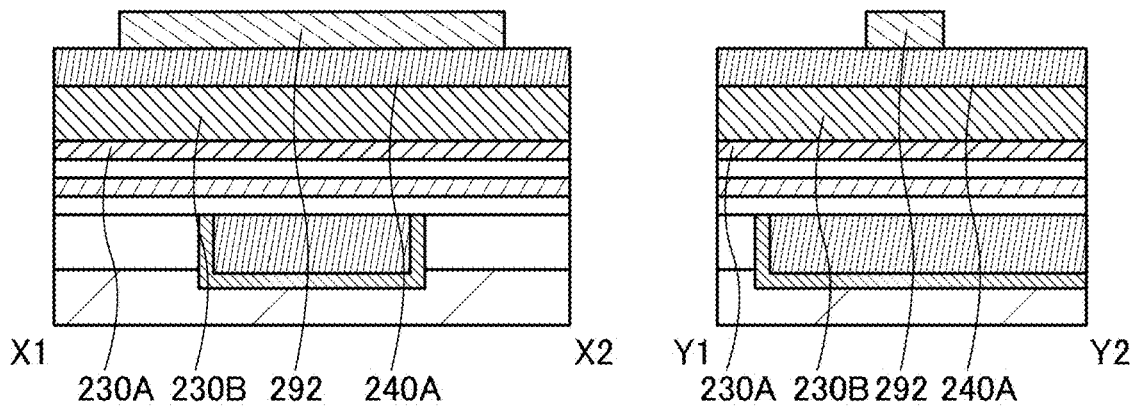

Then, the insulator 220, the insulator 222, and the insulator 224 are formed (FIG. 39D).

The insulator 220, the insulator 222, and the insulator 224 can be formed using the above-described materials or the material that can be used for the insulator 320. It is particularly preferable to use a high-k material such as hafnium oxide as the insulator 222.

The insulator 220, the insulator 222, and the insulator 224 can be formed using a sputtering method, a chemical vapor deposition (CVD: Chemical Vapor Deposition) method, (including a thermal CVD method, a metal organic CVD (MOCVD: Metal Organic Chemical Vapor Deposition) method, a plasma-enhanced CVD (PECVD: Plasma Enhanced Chemical Vapor Deposition) method, and the like), a molecular beam epitaxy (MBE: Molecular Beam Epitaxy) method, an atomic layer deposition (ALD: Atomic Layer Deposition) method, a pulsed laser deposition (PLD: Pulsed Laser Deposition) method, or the like. In particular, it is preferable that the insulators be deposited by a CVD method, further preferably an ALD method or the like, because coverage can be further improved. It is preferable to use a thermal CVD method, an MOCVD method, or an ALD method in order to reduce plasma damage. The insulators can also be formed using a silicon oxide film capable of providing high step coverage that is formed by reacting tetraethyl orthosilicate (TEOS: Tetra-Ethyl-Ortho-Silicate), silane, or the like with oxygen, nitrous oxide, or the like.

Note that the insulators 220, 222, and 224 are preferably deposited successively. By successive deposition, impurities do not attach to the interfaces between the insulators 220 and 222 and between the insulators 222 and 224, resulting in high reliability of the insulators.

Then, an oxide 230A to be the oxide 230a and an oxide 230B to be the oxide 230b are sequentially deposited. The oxide 230A and the oxide 230B can be formed by referring to the description of a metal oxide in the above embodiment. The oxides are preferably deposited successively without exposure to the air.

It is suitable to form the oxide 230A and the oxide 230B by a sputtering method because the film density can be high. In the case where the oxide 230A and the oxide 230B are formed by a sputtering method, a rare gas (argon, as a typical example), oxygen, or a mixed gas of a rare gas and oxygen is used as a sputtering gas, as appropriate. Increasing the purity of a sputtering gas is preferred. For example, as a sputtering gas, an oxygen gas or an argon gas that is highly purified to have a dew point of −60° C. or lower, preferably −100° C. or lower, is used, whereby entry of moisture or the like into the oxide semiconductor film 108 can be minimized.

When the oxide 230A and the oxide 230B are formed by a sputtering method, each chamber of a sputtering apparatus is preferably evacuated to a high vacuum (to the degree of approximately $5 \times 10^{-7}$ Pa to $1 \times 10^{-4}$ Pa) by an adsorption vacuum pump such as a cryopump so that water and the like acting as impurities for the oxide semiconductor can be removed as much as possible. In particular, the partial pressure of gas molecules corresponding to $H_2O$ (gas molecules corresponding to m/z=18) in the chamber of the sputtering apparatus in the standby mode is preferably lower than or equal to $1 \times 10^{-4}$ Pa, further preferably $5 \times 10^{-5}$ Pa.

Then, a conductive film 240A to be the conductors 240a and 240b is formed over the oxide 230A. As the conductive film 240A, a material which has a barrier property against hydrogen or oxygen and has a high oxidation resistance is preferably used. Although the drawing illustrates a single-layer structure, a structure of two or more stacked layers can be used. Then, a resist mask 292 is formed by a method similar to that described above (FIG. 39E).

Figure 40A:
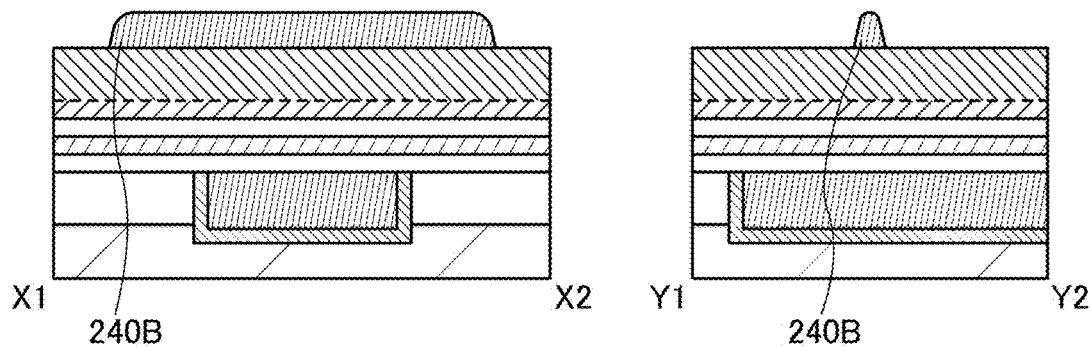

An unnecessary portion of the conductive film 240A is removed by etching using the resist mask 292 to form a conductive layer 240B having an island shape (FIG. 40A). After that, unnecessary portions of the oxides 230a and 230b are removed by etching using the conductive layer 240B as a mask.

At that time, the insulator 224 may also be processed into an island shape. For example, even when the total thickness of the insulators 220, 222, and 224 is small, the use of the insulator 222 with a barrier property as an etching stopper film can prevent over-etching of the wiring layer positioned below the insulators. In addition, when the total thickness of the insulators 220, 222, and 224 is small, a voltage is efficiently applied from the conductor 205; therefore, the transistor with low power consumption can be obtained.

Figure 40B:
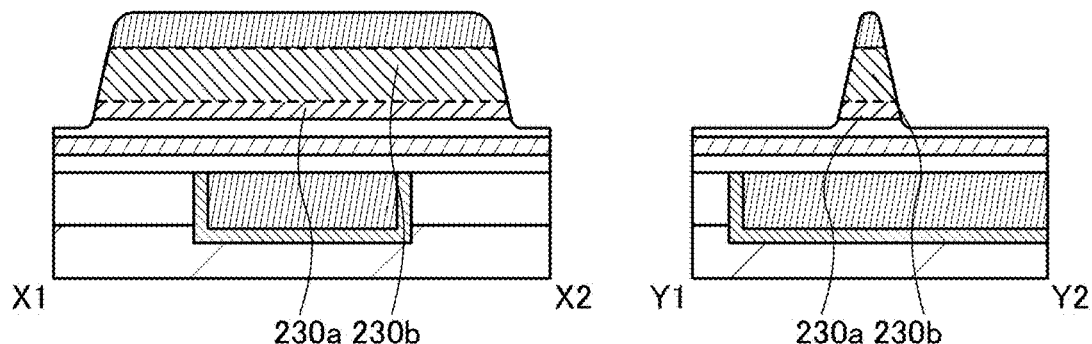

Then, the resist mask is removed, whereby a stacked-layer structure of the island-shaped oxide 230a, the island-shaped oxide 230b, and the island-shaped conductive layer 240B can be formed (FIG. 40B).

Figure 40C:
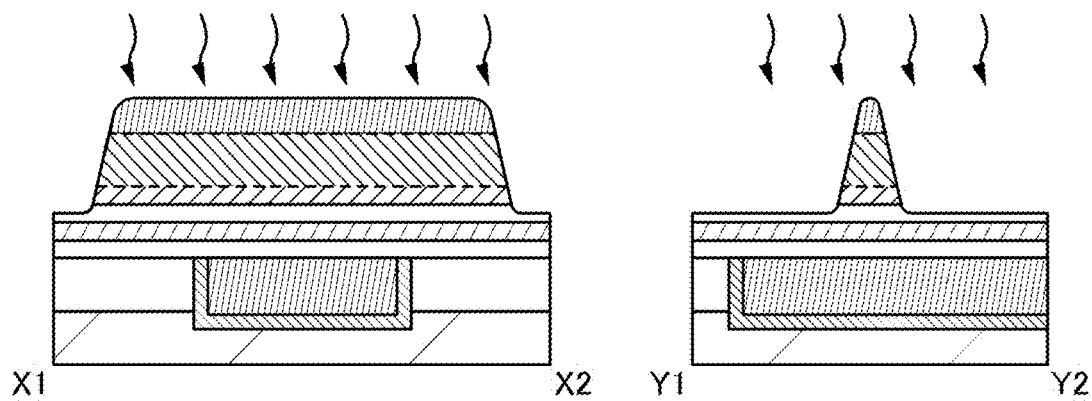
Figure 40D:
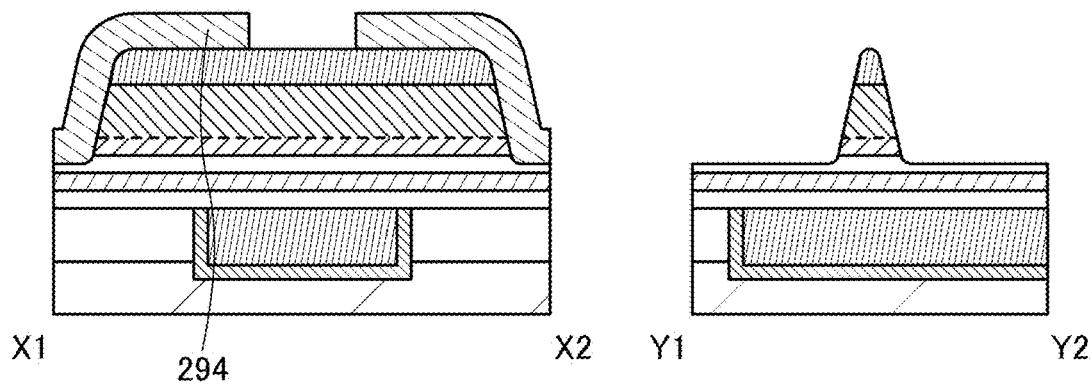

Next, heat treatment is preferably performed (arrows in FIG. 40C denote the heat treatment). The heat treatment may be performed at a temperature higher than or equal to 250° C. and lower than or equal to 400° C., preferably higher than or equal to 320° C. and lower than or equal to 380° C., in an inert gas atmosphere, in an atmosphere containing an oxidizing gas at 10 ppm or more, or under reduced pressure. Alternatively, the heat treatment may be performed in such a manner that heat treatment is performed in an inert gas atmosphere, and then another heat treatment is performed in an atmosphere containing an oxidizing gas at 10 ppm or more in order to compensate for desorbed oxygen. The heat treatment can remove hydrogen or water that is an impurity for the oxides 230a and 230b. In addition, oxygen is supplied from the insulator formed below the oxide 230a to the oxides 230a and 230b, so that oxygen vacancies in the oxides can be reduced.

Figure 41A:
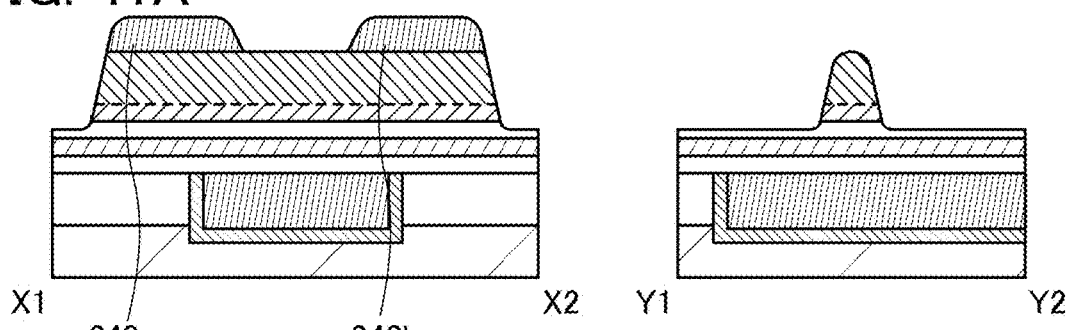

Next, a resist mask 294 is formed over the island-shaped conductive layer 240B by a method similar to that described above (FIG. 40D). Then, an unnecessary portion of a conductive film is removed by etching, and then the resist mask 294 is removed, whereby the conductor 240a and the conductor 240b are formed (FIG. 41A). At that time, the insulator 224 or the insulator 222 may be over-etched to obtain an s-channel structure.

Figure 41B:
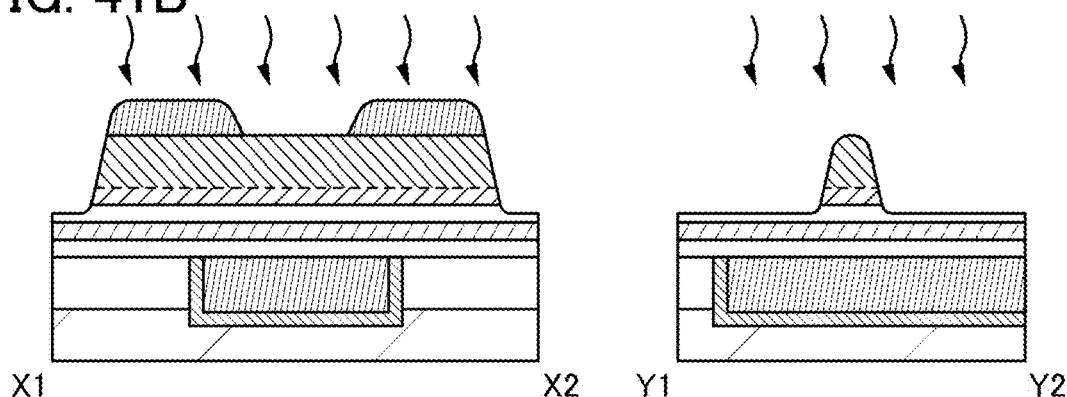
Figure 41C:
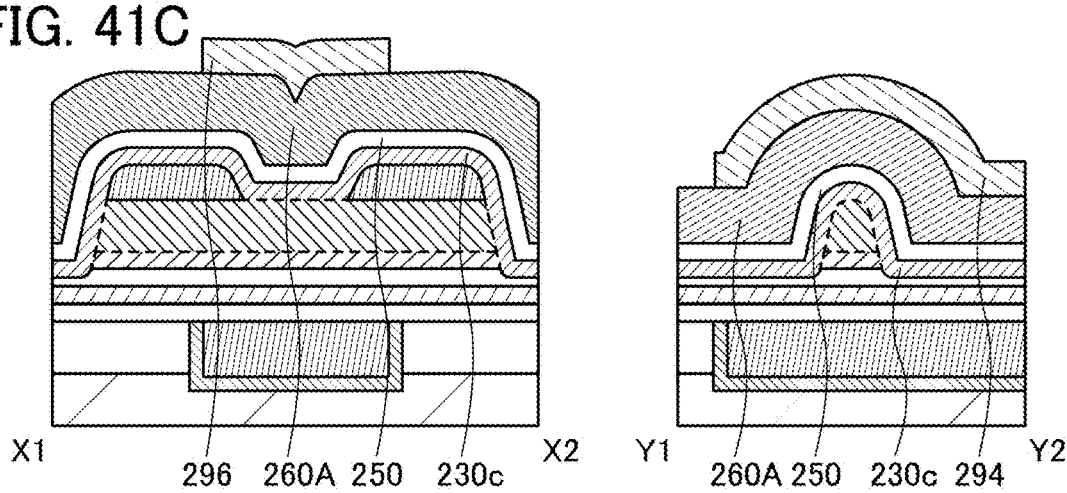

Next, heat treatment is preferably performed (arrows in FIG. 41B denote the heat treatment). The heat treatment may be performed at a temperature higher than or equal to 250° C. and lower than or equal to 400° C., preferably higher than or equal to 320° C. and lower than or equal to 380° C., in an inert gas atmosphere, in an atmosphere containing an oxidizing gas at 10 ppm or more, or under reduced pressure. Alternatively, the heat treatment may be performed in such a manner that heat treatment is performed in an inert gas atmosphere, and then another heat treatment is performed in an atmosphere containing an oxidizing gas at 10 ppm or more in order to compensate for desorbed oxygen. The heat treatment can remove hydrogen or water that is an impurity for the oxides 230a and 230b. In addition, oxygen is supplied from the insulator formed below the oxide 230a to the oxides 230a and 230b, so that oxygen vacancies in the oxides can be reduced. In the case where the heat treatment is performed using an oxidizing gas, an oxidizing gas is in direct contact with the region where the channel is formed, whereby oxygen vacancies included in the region where the channel is formed can be reduced efficiently.

Then, the oxide 230c, the insulator 250, and a conductive film 260A to be the conductor 260 are sequentially formed. For the formation of the oxide 230c, the description of a metal oxide in the above embodiment can be referred to. As the conductive film 260A, a material which has a barrier property against hydrogen or oxygen and has a high oxidation resistance is preferably used. Although the single-layer structure is illustrated in the drawing, a structure of two or more stacked layers may be used.

For example, the stacked two layers may be formed of the same material. A first conductive film is formed by a thermal CVD method, an MOCVD method, or an ALD method, for example. In particular, an ALD method is preferably used for the formation. By employing the ALD method or the like, damage to the insulator 250 at the time of the deposition can be reduced. In addition, the coverage can be improved, which is preferable. Thus, the transistor 200 having high reliability can be provided.

Then, a second conductive film is formed by a sputtering method. At that time, since the first conductive film is provided over the insulator 250, damage caused during deposition of the second conductive film can be prevented from affecting the insulator 250. Since the deposition rate in a sputtering method is higher than that in an ALD method, the productivity can be improved with a high yield. Note that it is preferable to use a deposition gas which does not contain chlorine in deposition of the conductive film 260A.

Figure 41D:
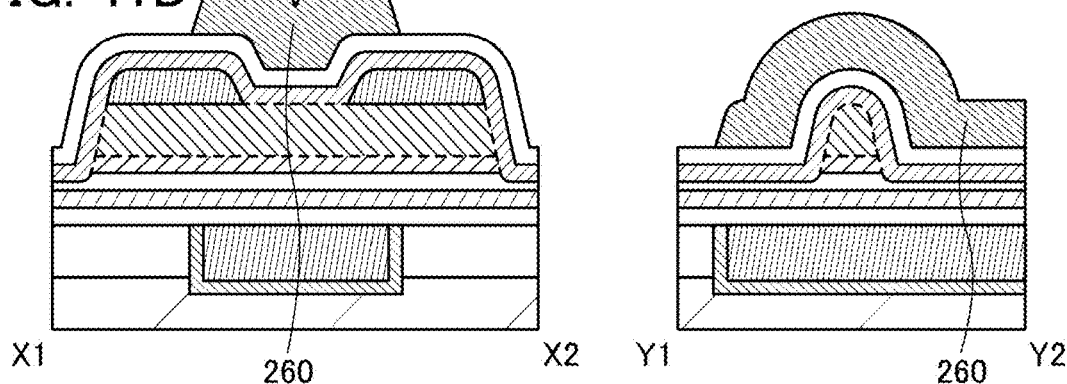

Next, a resist mask 296 is formed over the conductive film 260A by a method similar to that described above (FIG. 41C). Then, an unnecessary portion of the conductive film 260A is removed by etching to form the conductor 260. After that, the resist mask 296 is removed (FIG. 41D).

Subsequently, the insulator 280 is formed over the conductor 260. The insulator 280 is an insulator containing oxygen, such as a silicon oxide film or a silicon oxynitride film. As the insulator containing excess oxygen, a silicon oxide film or a silicon oxynitride film containing a large amount of oxygen can be formed by a CVD method or a sputtering method under the conditions that are set as appropriate. After the silicon oxide film or the silicon oxynitride film is formed, oxygen may be added by an ion implantation method, an ion doping method, or plasma treatment.

Figure 42A:
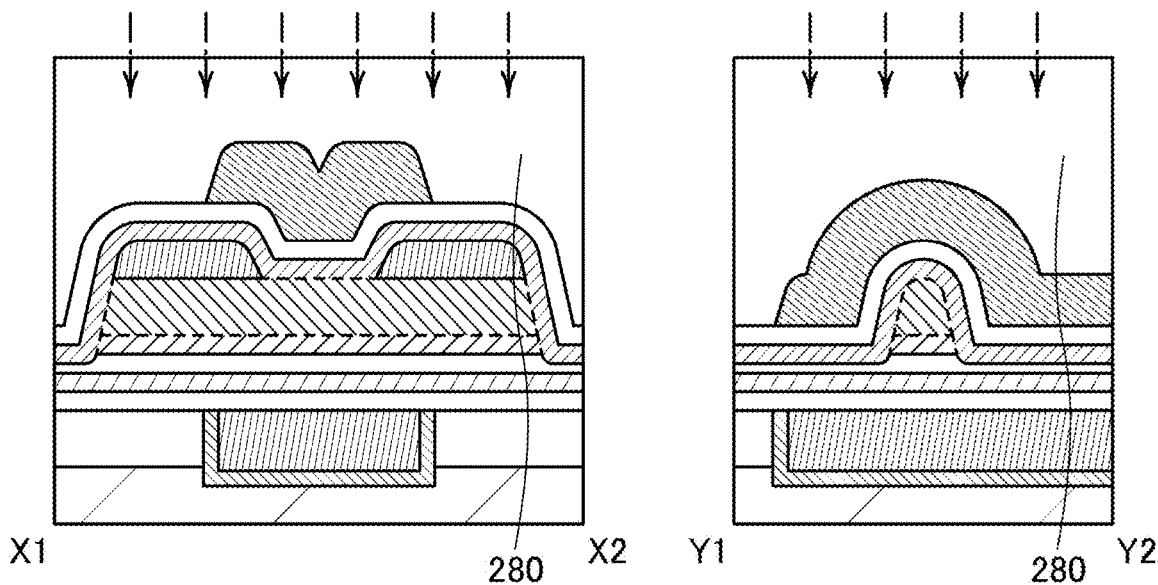
Figure 42B:
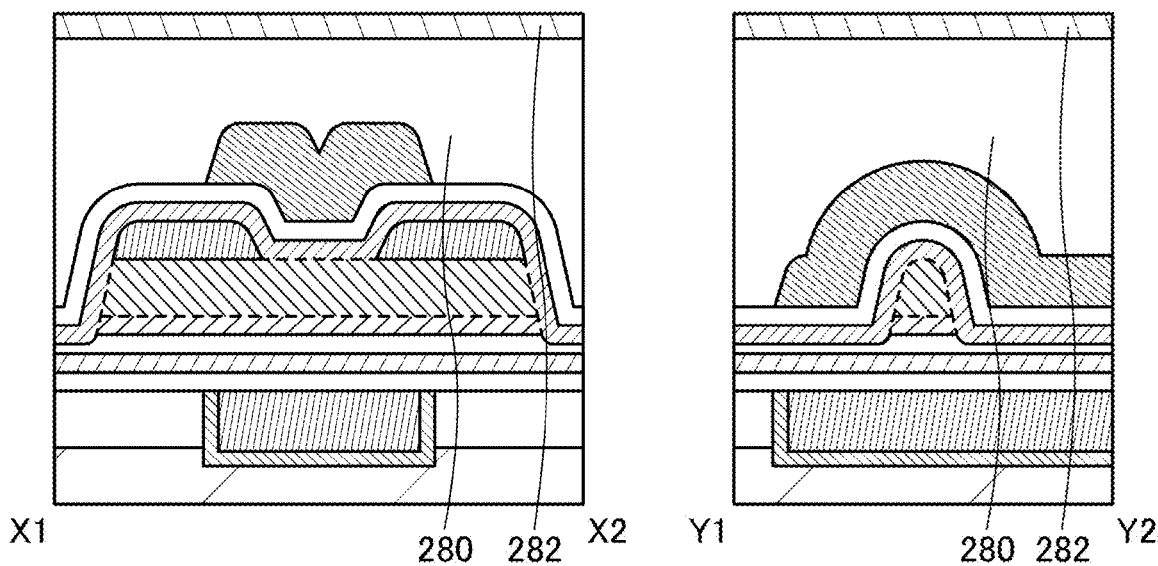

In particular, oxygen plasma treatment is preferably performed (arrows in FIG. 42A denote the plasma treatment). In typical oxygen plasma treatment, the surface of an oxide semiconductor is processed by radicals generated from an oxygen gas by glow discharge plasma. However, as a gas from which plasma is generated, a mixed gas of an oxygen gas and a rare gas may be used, as well as oxygen. For example, oxygen plasma treatment may be performed at a temperature higher than or equal to 250° C. and lower than or equal to 400° C., preferably higher than or equal to 300° C. and lower than or equal to 400° C., in an atmosphere containing an oxidizing gas or under reduced pressure.

The oxygen plasma treatment dehydrates or dehydrogenates the insulator 280 and the oxide 230 and introduces excess oxygen to the insulator 280; as a result, an excess-oxygen region can be formed. In addition, oxygen vacancies are generated in the dehydrated or dehydrogenated oxide 230 and the resistance of the oxide 230 is reduced. Meanwhile, the excess oxygen of the insulator 280 fills oxygen vacancies of the oxide 230. Thus, by the oxygen plasma treatment, hydrogen and water that serve as impurities can be removed from the oxide 230 while oxygen vacancies in the insulator 280 and the oxide 230 are compensated. Thus, the electrical characteristics of the transistor 200 can be improved and variation in the electrical characteristics thereof can be reduced.

Then, the insulator 282 is formed over the insulator 280. The insulator 282 is preferably formed with a sputtering apparatus. By using a sputtering method, an excess-oxygen region can be formed easily in the insulator 280 positioned under the insulator 282.

During deposition by a sputtering method, ions and sputtered particles exist between a target and a substrate. For example, a potential $E_0$ is supplied to the target, to which a power source is connected. A potential $E_1$ such as a ground potential is supplied to the substrate. Note that the substrate may be electrically floating. In addition, there is a region at a potential $E_2$ between the target and the substrate. The potential relationship is $E_2 > E_1 > E_0$.

The ions in plasma are accelerated by a potential difference $(E_2 - E_0)$ and collide with the target; accordingly, the sputtered particles are ejected from the target. These sputtered particles are attached to a deposition surface and deposited thereover; as a result, a film is formed. Some ions recoil by the target and might be taken, as recoil ions, into the insulator 280 positioned below the formed film, through the formed film. The ions in the plasma are accelerated by a potential difference $(E_2 - E_1)$ and collide with the deposition surface. Some ions reach the inside of the insulator 280. The ions are taken into the insulator 280; accordingly, a region into which the ions are taken is formed in the insulator 280. That is, an excess-oxygen region is formed in the insulator 280 in the case where the ions include oxygen.

Introduction of excess oxygen to the insulator 280 can form an excess-oxygen region. Through heat treatment at a temperature of about higher than or equal to 200° C. and lower than or equal to 450° C., preferably higher than or equal to 320° C. and lower than or equal to 380° C., for example, the excess oxygen in the insulator 280 is supplied to the oxide 230 and can fill oxygen vacancies in the oxide 230. For example, when the insulator 282 is formed by a sputtering method with the substrate heated at the above temperature, oxygen can be supplied to the oxide 230 without another overheating after the film formation.

As described above, the oxide 230c has high oxygen permeability, so that oxygen can be easily diffused from the insulator 280 to the oxide 230b.

At this time, in the oxide 230, excess oxygen (active oxygen) is bonded to the side surface of a crystal part having orientation. In addition, metal such as In, M, or Zn is bonded to the bonded active oxygen. It can be assumed that the repetitive bonding between active oxygen and metal such as In, M, or Zn in this manner leads to solid-phase growth in a lateral direction from the side surface of a crystal part having orientation. Furthermore, as shown in FIG. 40C and FIG. 41B, the oxide 230a and the oxide 230b are subjected to heat treatment for dehydration treatment and dehydrogenation treatment in advance, whereby impurities such as water or hydrogen contained in the oxide 230 can be reduced. This reduces a hindrance to oxygen diffusion by the impurities such as water or hydrogen contained in the oxide 230, so that oxygen can be supplied to the oxide 230 more efficiently.

Here, in the case where a conductor with a high oxidation resistance is used as each of the conductor 260 in contact with the insulator 280, the conductor 240a, and the conductor 240b, excess oxygen in the insulator 280 is not absorbed by the conductor 260, the conductor 240a, and the conductor 240b and can be efficiently supplied to the oxide 230. Thus, in the transistor 200, electrical characteristics can be improved, on-state current can be improved, the subthreshold swing value can be lowered, the reliability can be improved, and variation in the electrical characteristics can be reduced.

Through the above steps, the transistor 200 of one embodiment of the present invention can be manufactured.

<Structure Example of Semiconductor Device>

Figure 43A:
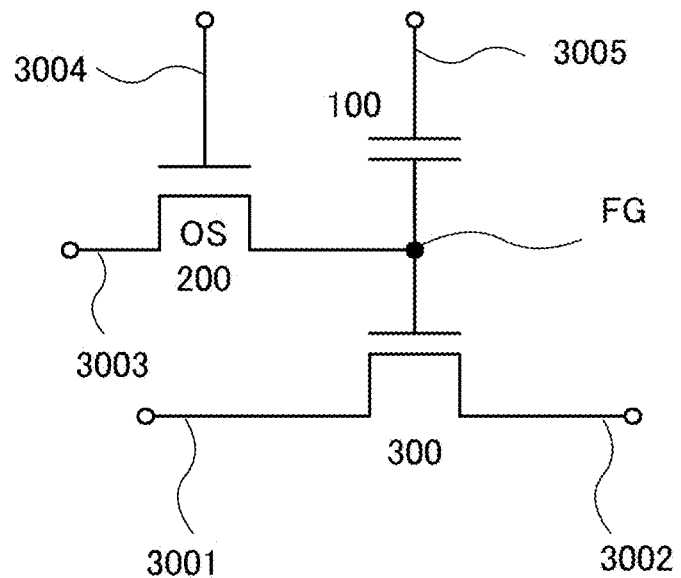

Examples of a semiconductor device (memory device) including a capacitor of one embodiment of the present invention are illustrated in FIG. 43A to FIG. 49B. Note that FIG. 43A is a circuit diagram corresponding to each of FIG. 44 of FIG. 47 and FIG. 49A to FIG. 51. FIGS. 48A and 48B and FIGS. 49A and 49B show end portions of regions where semiconductor devices shown in FIG. 49A to FIG. 51 are formed.

<Circuit Configuration of Semiconductor Device>

Semiconductor devices illustrated in FIG. 43A and FIG. 44 to FIG. 47 each include a transistor 300, a transistor 200, and a capacitor 100.

The transistor 200 is a transistor whose channel is formed in a semiconductor layer containing an oxide semiconductor. Since the off-state current of the transistor 200 is small, by using the transistor 200 in a semiconductor device (memory device), stored data can be retained for a long time. In other words, it is possible to obtain a semiconductor device (memory device) which does not require refresh operation or has an extremely low frequency of the refresh operation, which leads to a sufficient reduction in power consumption.

In FIG. 43A, a wiring 3001 is electrically connected to a source of the transistor 300, and a wiring 3002 is electrically connected to a drain of the transistor 300. A wiring 3003 is electrically connected to one of a source and a drain of the transistor 200. A wiring 3004 is electrically connected to a gate of the transistor 200. A gate of the transistor 300 and the other of the source and the drain of the transistor 200 are electrically connected to one electrode of the capacitor 100. A wiring 3005 is electrically connected to the other electrode of the capacitor 100.

The semiconductor device illustrated in FIG. 43A has a feature that the potential of the gate of the transistor 300 can be retained and thus enables writing, retaining, and reading of data as follows.

Writing and holding of data will be described. First, the potential of the fourth wiring 3004 is set to a potential at which the transistor 200 is turned on, so that the transistor 200 is turned on. Accordingly, the potential of the third wiring 3003 is supplied to a node FG where the gate of the transistor 300 and the one electrode of the capacitor 100 are electrically connected to each other. That is, a predetermined charge is supplied to the gate of the transistor 300 (writing). Here, one of two kinds of charges providing different potential levels (hereinafter referred to as a Low-level charge and a High-level charge) is supplied. After that, the potential of the fourth wiring 3004 is set to a potential at which the transistor 200 is turned off, so that the transistor 200 is turned off. Thus, the charge is retained at the node FG (retaining).

In the case where the off-state current of the transistor 200 is low, the charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 300, an apparent threshold voltage $V_{th\_H}$ at the time when a High-level charge is given to the gate of the transistor 300 is lower than an apparent threshold voltage $V_{th\_L}$ at the time when a low-level charge is given to the gate of the transistor 300. Here, an apparent threshold voltage refers to the potential of the fifth wiring 3005 which is needed to make the transistor 300 be in an on state. Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 300 is brought into an on state. On the other hand, in the case where the Low-level charge is supplied to the node FG in writing, even when the potential of the fifth wiring 3005 is $V_0$ ($<V_{th\_L}$), the transistor 300 remains in the off state. Thus, the data retained in the node FG can be read by determining the potential of the second wiring 3002.

By arranging semiconductor devices each having the structure illustrated in FIG. 43A in a matrix, a memory device (memory cell array) can be formed.

Note that in the case where memory cells are arrayed, it is necessary that data of a desired memory cell is read in read operation. A configuration in which only data of a desired memory cell can be read by supplying a potential at which the transistor 300 is turned off regardless of the charge supplied to the node FG, that is, a potential lower than $V_{th\_H}$ is supplied to the fifth wiring 3005 of memory cells from which data is not read may be employed. Alternatively, a configuration in which only data of a desired memory cell can be read by supplying a potential at which the transistor 300 is turned on regardless of the charge supplied to the node FG, that is, a potential higher than $V_{th\_L}$ is supplied to the fifth wiring 3005 of memory cells from which data is not read may be employed.

<Circuit Configuration 2 of Semiconductor Device>

Figure 43B:
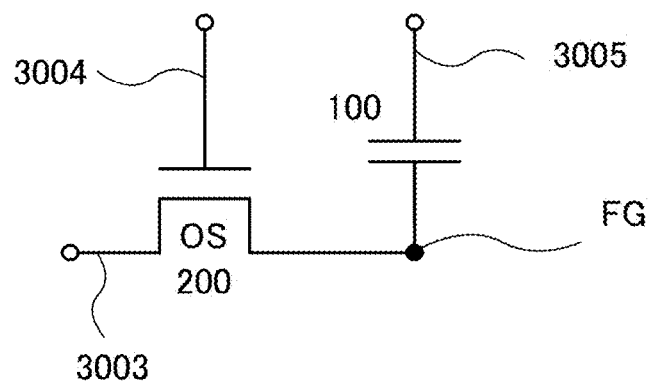

A semiconductor device in FIG. 43B is different from the semiconductor device in FIG. 43A in that the transistor 300 is not provided. Also in this case, data can be written and retained in a manner similar to that of the semiconductor device in FIG. 43A.

Reading of data in the semiconductor device in FIG. 43B is described. When the transistor 200 is brought into an on state, the third wiring 3003 which is in a floating state and the capacitor 100 are brought into conduction, and the charge is redistributed between the third wiring 3003 and the capacitor 100. As a result, the potential of the third wiring 3003 is changed. The amount of change in the potential of the third wiring 3003 varies depending on the potential of the one electrode of the capacitor 100 (or the charge accumulated in the capacitor 100).

For example, the potential of the third wiring 3003 after the charge redistribution is $(C_B \times V_{B0} + C \times V)/(C_B + C)$, where V is the potential of the one electrode of the capacitor 100, C is the capacitance of the capacitor 100, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 100 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 200.

When including a transistor using an oxide semiconductor and having a low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, unlike a conventional nonvolatile memory, the semiconductor device of one embodiment of the present invention does not have a limit on the number of times data can be rewritten, and the reliability thereof is drastically improved. Furthermore, data is written depending on the on/off state of the transistor, whereby high-speed operation can be easily achieved.

<Structure 1 of Semiconductor Device>

Figure 44:
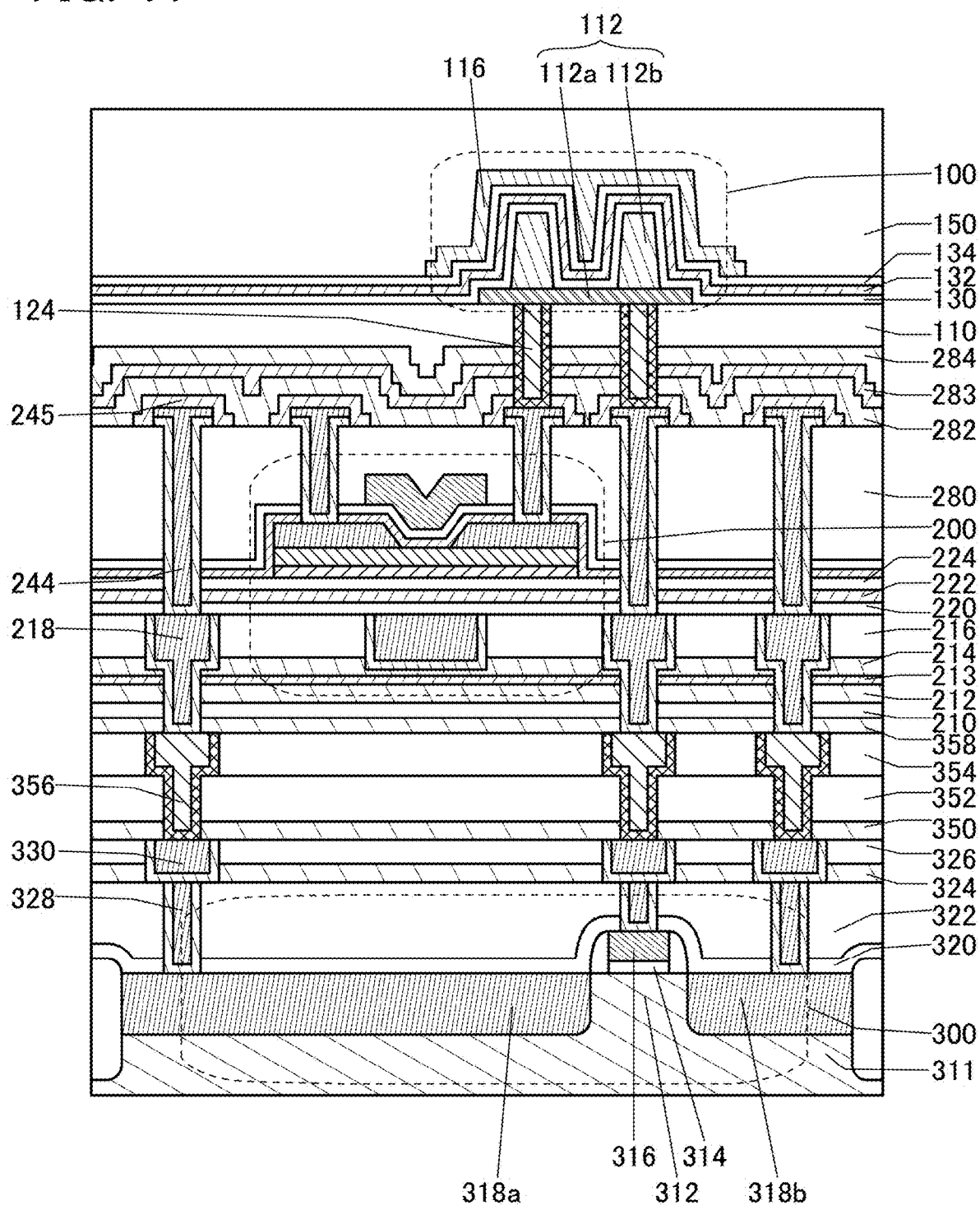

The semiconductor device of one embodiment of the present invention includes the transistor 300, the transistor 200, and the capacitor 100 as illustrated in FIG. 44. The transistor 200 is provided above the transistor 300, and the capacitor 100 is provided above the transistor 300 and the transistor 200.

The transistor 300 is provided over a substrate 311 and includes a conductor 316, an insulator 314, a semiconductor region 312 that is part of the substrate 311, and low-resistance regions 318a and 318b functioning as source and drain regions.

The transistor 300 may be a p-channel transistor or an n-channel transistor.

It is preferable that a region of the semiconductor region 312 where a channel is formed, a region in the vicinity thereof, the low-resistance regions 318a and 318b functioning as source and drain regions, and the like include a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a HEMT (High Electron Mobility Transistor) with GaAs and GaAlAs or the like.

The low-resistance regions 318a and 318b include an element that imparts n-type conductivity, such as arsenic or phosphorus, or an element that imparts p-type conductivity, such as boron, in addition to a semiconductor material used for the semiconductor region 312.

The conductor 316 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that the work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

In the transistor 300 shown in FIG. 44, the semiconductor region 312 (part of the substrate 311) in which a channel is formed includes a protruding portion. Furthermore, the conductor 316 is provided so as to cover the top and side surfaces of the semiconductor region 312 with the insulator 314 therebetween. Note that the conductor 316 may be formed using a material for adjusting the work function. The transistor 300 having such a structure is also referred to as a FIN transistor because the protruding portion of the semiconductor substrate is utilized. An insulator serving as a mask for forming the protruding portion may be provided in contact with a top surface of the protruding portion. Although the case where the protruding portion is formed by processing part of the semiconductor substrate is described here, a semiconductor film having a protruding shape may be formed by processing an SOI substrate.

Note that the transistor 300 illustrated in FIG. 44 is just an example and is not limited to the structure illustrated therein; an appropriate transistor may be used in accordance with a circuit configuration or a driving method. For example, the transistor 300 may be a planar transistor as shown in FIG. 34A to FIG. 34C. In the case of using the circuit configuration shown in FIG. 43B, the transistor 300 may be omitted.

An insulator 320, an insulator 322, an insulator 324, and an insulator 326 are stacked sequentially to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 functions as a planarization film for eliminating a level difference caused by the transistor 300 or the like underlying the insulator 322. A top surface of the insulator 322 may be planarized by planarization treatment using a CMP treatment or the like to increase the level of planarity.

The insulator 324 is preferably formed using, for example, a film having a barrier property that prevents hydrogen or impurities from diffusing from the substrate 311, the transistor 300, or the like into a region where the transistor 200 is formed.

As an example of the film having a barrier property against hydrogen, silicon nitride formed by a CVD method can be given. Here, diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

The released amount of hydrogen can be measured by TDS analysis, for example. The amount of hydrogen released from the insulator 324 that is converted into hydrogen atoms per unit area of the insulator 324 is less than or equal to $10\times10^{15}$ atoms/cm$^2$, preferably less than or equal to $5\times10^{15}$ atoms/cm$^2$ in the TDS analysis in the range of 50° C. to 500° C., for example.

Note that the dielectric constant of the insulator 326 is preferably lower than that of the insulator 324. For example, the dielectric constant of the insulator 326 is preferably lower than 4, more preferably lower than 3. For example, the relative dielectric constant of the insulator 324 is preferably 0.7 times or less that of the insulator 326, more preferably 0.6 times or less that of the insulator 326. In the case where a material with a low dielectric constant is used as an interlayer film, the parasitic capacitance between wirings can be reduced.

A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 44, an insulator 350, an insulator 352, and an insulator 354 are stacked in this order. Furthermore, a conductor 356 is formed in the insulator 350, the insulator 352, and the insulator 354. The conductor 356 functions as a plug or a wiring. Note that the conductor 356 can be formed using a material similar to that used for forming the conductor 328 and the conductor 330.

Note that for example, the insulator 350 is preferably formed using an insulator having a barrier property with respect to hydrogen, like the insulator 324. Furthermore, the conductor 356 preferably includes a conductor having a barrier property against hydrogen. The conductor having a barrier property with respect to hydrogen is formed particularly in an opening portion of the insulator 350 having a barrier property with respect to hydrogen. In such a structure, the transistor 300 can be separated from the transistor 200 by a barrier layer, so that the diffusion of hydrogen from the transistor 300 into the transistor 200 can be inhibited.

Note that as the conductor having a barrier property against hydrogen, tantalum nitride may be used, for example. By stacking tantalum nitride and tungsten, which has high conductivity, diffusion of hydrogen from the transistor 300 can be prevented while the conductivity of a wiring is ensured. In this case, a tantalum nitride layer having a barrier property with respect to hydrogen is preferably in contact with the insulator 350 having a barrier property with respect to hydrogen.

An insulator 358, an insulator 210, an insulator 212, an insulator 213, an insulator 214, and an insulator 216 are stacked sequentially over the insulator 354. A material having a barrier property against oxygen or hydrogen is preferably used for one or all of the insulators 358, 210, 212, 213, 214, and 216.

The insulator 358 and the insulator 212 are preferably formed using, for example, a film having a barrier property that prevents hydrogen and impurities from diffusing from the substrate 311, a region where the transistor 300 is formed, or the like into a region where the transistor 200 is formed. Therefore, the insulator 214 can be formed using a material similar to that used for forming the insulator 324.

For the film having a barrier property against hydrogen, silicon nitride formed by a CVD method can be used, for example. Here, diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

As the insulator 213 and the insulator 214, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from the oxide in the transistor 200 can be prevented. Therefore, aluminum oxide is suitably used as a protective film for the transistor 200.

For example, the insulator 210 and the insulator 216 can be formed using a material similar to that for the insulator 320. For example, a silicon oxide film, a silicon oxynitride film, or the like can be used as the insulator 216.

A conductor 218, a conductor (the conductor 205) included in the transistor 200, and the like are embedded in the insulators 358, 210, 212, 213, 214, and 216. Note that the conductor 218 functions as a plug or a wiring that is electrically connected to the capacitor 100 or the transistor 300. The conductor 218 can be formed using a material similar to that used for forming the conductor 328 and the conductor 330.

In particular, the conductor 218 in a region in contact with the insulators 358, 212, 213, and 214 is preferably a conductor having a barrier property against oxygen, hydrogen, and water. In such a structure, the transistor 300 and the transistor 200 can be completely separated by a layer having a barrier property with respect to oxygen, hydrogen, and water, so that diffusion of hydrogen from the transistor 300 into the transistor 200 can be prevented.

The transistor 200 is provided over the insulator 216. Note that any of the transistor structures described in the above-described embodiment can be used as the structure of the transistor 200. Note that the transistor 200 shown in FIG. 44 is just an example and is not limited to the structure shown therein; an appropriate transistor may be used in accordance with a circuit configuration or a driving method.

An insulator 280 is provided over the transistor 200. As the insulator 280, it is particularly preferable to use insulators containing excess oxygen (containing oxygen in excess of that in the stoichiometric composition). That is, the insulator 280 preferably has a region containing oxygen in excess of that in the stoichiometric composition (hereinafter also referred to as an excess-oxygen region). In particular, in the case of using an oxide semiconductor in the transistor 200, when an insulator including an excess-oxygen region is provided as an interlayer film or the like in the vicinity of the transistor 200, oxygen vacancies in the transistor 200 are reduced, whereby the reliability can be improved.

As the insulator including the excess-oxygen region, specifically, an oxide material that releases part of oxygen by heating is preferably used. Oxide that releases part of oxygen by heating is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, silicon oxynitride refers to a material that contains oxygen at a higher proportion than nitrogen, and silicon nitride oxide refers to a material that contains nitrogen at a higher proportion than oxygen.

The insulator 280 covering the transistor 200 may function as a planarization film that covers a roughness thereunder. A conductor 244 and the like are embedded in the insulator 280.

Note that the conductor 244 functions as a plug or a wiring that is electrically connected to the capacitor 100, the transistor 200, or the transistor 300. The conductor 244 can be formed using a material similar to that used for forming the conductor 328 and the conductor 330.

For example, when the conductor 244 is formed to have a stacked-layer structure, the conductor 244 preferably includes a conductor with high oxidation resistance. In particular, a conductor with high oxidation resistance is preferably provided in a region in contact with the insulator 280 including the excess-oxygen region. Such a structure can prevent the conductor 244 from absorbing excess oxygen from the insulator 280. Furthermore, the conductor 244 preferably includes a conductor having a barrier property against hydrogen. In particular, a conductor having a barrier property against an impurity such as hydrogen is provided in a region in contact with the insulator 280 including the excess-oxygen region, whereby diffusion of the impurity of the conductor 244, diffusion of part of the conductor 244, and diffusion of an impurity from the outside through the conductor 244 can be prevented.

A barrier layer 245 may be provided over the conductor 244. The barrier layer 245 can prevent diffusion of impurities contained the conductor 244 and diffusion of part of the component of the conductor 244.

Metal oxide such as aluminum oxide, hafnium oxide, or tantalum oxide, metal nitride such as tantalum nitride, or the like is preferably used as the barrier layer 245. In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor.

The insulator 282, an insulator 283, an insulator 284, and an insulator 110 are stacked sequentially over the barrier layer 245 and the insulator 280. A conductor 124 and the like are embedded in the insulators 282, 283, 284, and 110. Note that the conductor 124 functions as a plug or a wiring that is electrically connected to the capacitor 100, the transistor 200, or the transistor 300. The conductor 124 can be formed using a material similar to that used for forming the conductor 356.

A substance having a barrier property against oxygen or hydrogen is preferably used for one or all of the insulators 282, 283, 284, and 110. Thus, the insulator 282 can be formed using a material similar to that used for forming the insulator 214. The insulator 283 can be formed using a material similar to that used for forming the insulator 213. The insulator 284 can be formed using an insulator similar to that used for forming the insulator 212. The insulator 110 can be formed using a material similar to that used for forming the insulator 216.

As the insulator 282 and the insulator 283, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from the oxide in the transistor 200 can be prevented. Therefore, aluminum oxide is suitably used as a protective film for the transistor 200.

The insulator 284 is preferably formed using, for example, a film having a barrier property that prevents hydrogen or impurities from diffusing from a region where the capacitor 100 is formed into a region where the transistor 200 is formed. Therefore, the insulator 214 can be formed using a material similar to that used for forming the insulator 324.

As an example of the film having a barrier property against hydrogen, silicon nitride formed by a CVD method can be given. Here, diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

Therefore, the transistor 200 and the insulator 280 including the excess-oxygen region can be positioned between a stacked-layer structure of the insulators 212, 213, and 214 and a stacked-layer structure of the insulators 282, 283, and 284. The insulators 212, 213, 214, 282, 283, and 284 each have a barrier property that prevents diffusion of oxygen or impurities such as hydrogen and water.

In the above-described structure, oxygen released from the insulator 280 and the transistor 200 can be prevented from diffusing into a layer where the capacitor 100 is formed or a layer where the transistor 300 is formed. Furthermore, impurities such as hydrogen and water can be prevented from diffusing from a layer above the insulator 282 and a layer below the insulator 214 into the transistor 200.

That is, oxygen can be efficiently supplied from the excess-oxygen region of the insulator 280 to the oxide where the channel is formed in the transistor 200, so that oxygen vacancies can be reduced. Moreover, oxygen vacancies can be prevented from being formed by impurities in the oxide where the channel is formed in the transistor 200. Thus, the oxide where a channel is formed in the transistor 200 can be an oxide semiconductor with a low density of defect states and stable characteristics. That is, a change in electrical characteristics of the transistor 200 can be prevented and the reliability can be improved.

Figure 48A:
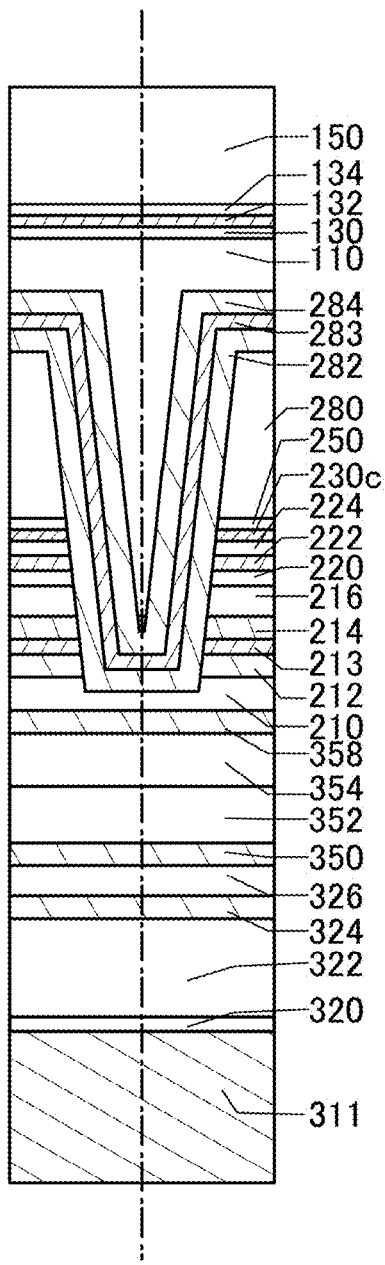
Figure 48B:
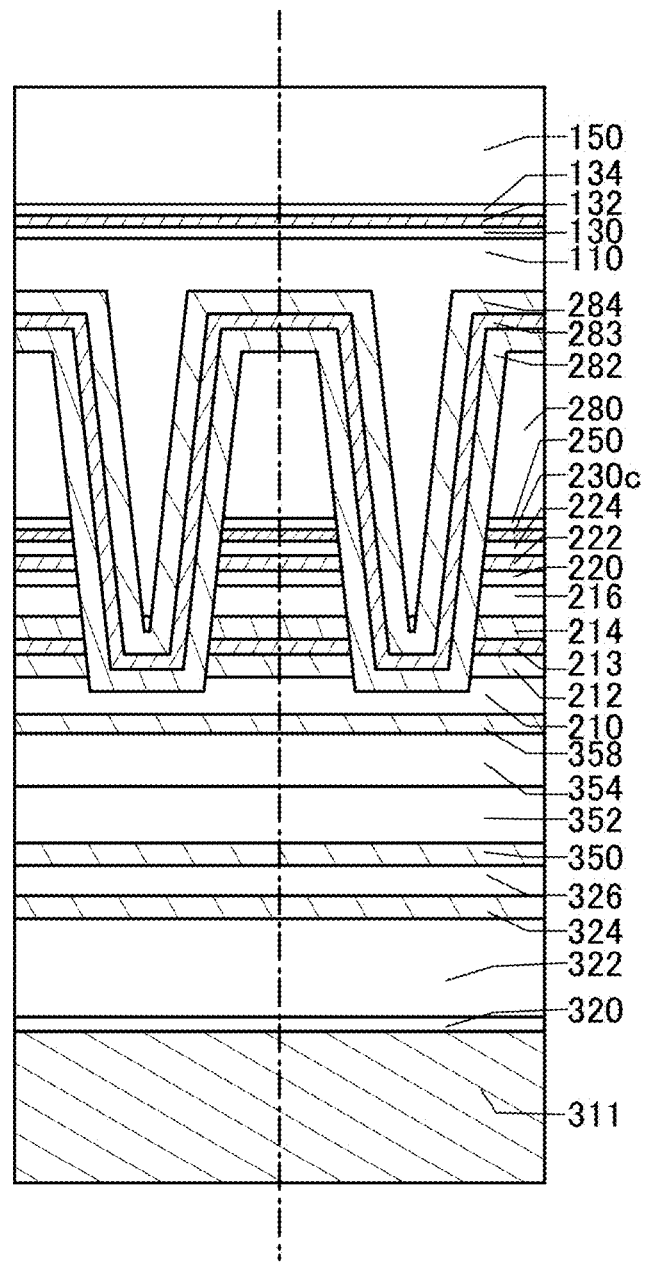

FIGS. 48A and 48B are each a cross-sectional view in the vicinity of a scribe line.

For example, as illustrated in FIG. 48A, an opening is provided in the insulator 212, the insulator 213, the insulator 214, the insulator 216, an insulator 220, an insulator 222, an insulator 224, and the insulator 280 in the vicinity of a region overlapping with the scribe line (shown by a dashed-dotted line in the drawing) formed in an edge of a memory cell including the transistor 200. In addition, the insulators 282, 283, and 284 are provided to cover the side surfaces of the insulators 212, 213, 214, 216, 220, 222, 224, and 280.

Accordingly, the insulator 212, the insulator 213, and the insulator 214 are in contact with the insulator 282 in the opening. The insulators 283 and 284 are stacked over the insulator 282. At that time, at least one of the insulators 212, 213, and 214 is formed using the same material and method as those used for forming the insulator 282, whereby adhesion therebetween can be improved.

In the structure, the insulator 280 and the transistor 200 can be enclosed with the insulators 212, 213, 214, 282, 283, and 284. Since the insulators 212, 213, 214, 282, 283, and 284 each have a function of preventing diffusion of oxygen, hydrogen, and water, entry and diffusion of hydrogen or water from the side surfaces of the insulators 220, 222, 224, and 280 into the transistor 200 can be prevented even when the semiconductor device described in this embodiment is subjected to scribing.

Furthermore, in the structure, excess oxygen in the insulator 280 can be prevented from diffusing into the outside of the insulators 282 and 214. Accordingly, excess oxygen in the insulator 280 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, a change in electrical characteristics of the transistor 200 can be prevented and the reliability can be improved.

As another example, as illustrated in FIG. 48B, openings may be provided in the insulator 212, the insulator 213, the insulator 214, the insulator 216, the insulator 220, the insulator 222, the insulator 224, and the insulator 280 on both sides of the scribe line (shown by the dashed-dotted line in FIG. 7B). Note that the number of the openings in the figure is two. A plurality of openings may be provided as appropriate.

Since the insulator 212, the insulator 213, and the insulator 214 are in contact with the insulator 282 in at least two regions in the openings provided on both sides of the scribe line, higher adhesion is obtained. Note that also in that case, when at least one of the insulators 212, 213, and 214 is formed using the same material and method as those used for forming the insulator 282, the adhesion therebetween can be improved.

Since the plurality of openings are provided, the insulator 282 can be in contact with the insulator 212, the insulator 213, and the insulator 214 in a plurality of regions. In addition, when impurities passing through the scribe line diffuse into a region which is included in the region where the insulator 214 is in contact with the insulator 282 and is the nearest to the transistor 200, a diffusion path of the impurities can be lengthened.

In such a structure, the transistor 200 and the insulator 280 can be enclosed tightly. Thus, the oxide where the channel is formed in the transistor 200 can be an oxide semiconductor with a low density of defect states and stable characteristics. That is, a change in electrical characteristics of the transistor 200 can be prevented and the reliability can be improved.

Next, the insulator 110, the capacitor 100, and a conductor 124 are provided over the insulator 284. The capacitor 100 is provided over the insulator 110 and includes a conductor 112 (a conductor 112a and a conductor 112b), an insulator 130, an insulator 132, an insulator 134, and a conductor 116. Note that the conductor 124 functions as a plug or a wiring that is electrically connected to the capacitor 100, the transistor 200, or the transistor 300.

Note that the conductor 124 can be formed using a material similar to that used for forming the conductors 356.

The conductor 112 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 112 is formed concurrently with another component such as a conductor, Cu (copper), Al (aluminum), or the like which is a low-resistance metal material may be used.

The insulators 130, 132, and 134 are provided over the conductor 112. The insulators 130, 132, and 134 can each be formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like. Although the three-layer structure is illustrated in the drawing, a single-layer structure, a stacked-layer structure of two layers, or a stacked-layer structure of four or more layers may be employed.

For example, a material with high dielectric strength, such as silicon oxynitride, is preferably used for the insulators 130 and 134, and a high dielectric constant (high-k) material, such as aluminum oxide, is preferably used for the insulator 132. In the capacitor 100 having the structure, a sufficient capacitance can be provided because of the high dielectric constant (high-k) insulator, and the dielectric strength can be increased and the electrostatic breakdown of the capacitor 100 can be prevented because of the insulator with high dielectric strength.

The conductor 116 is provided over the conductor 112 with the insulator 134 therebetween. Note that the conductor 116 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 116 is formed concurrently with another component such as a conductor, Cu (copper), Al (aluminum), or the like which is a low-resistance metal material may be used.

For example, as illustrated in FIG. 44, when the conductor 112, which functions as one electrode, includes a projecting structure body like the conductor 112b, the capacitance of the capacitor per projected area can be increased. Thus, the semiconductor device can be reduced in area, highly integrated, and miniaturized.

An insulator 150 is provided over the conductor 116 and the insulator 134. The insulators 110 and 150 can be formed using a material similar to that used for forming the insulator 320. The insulator 110 that is provided under the capacitor 100 and the insulator 150 that covers the capacitor 100 may function as planarization films which cover the roughness below the insulators 110 and 150.

The above is the description of the structure example. With the use of the structure, a change in electrical characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

<Modification Example 1>

Figure 45:
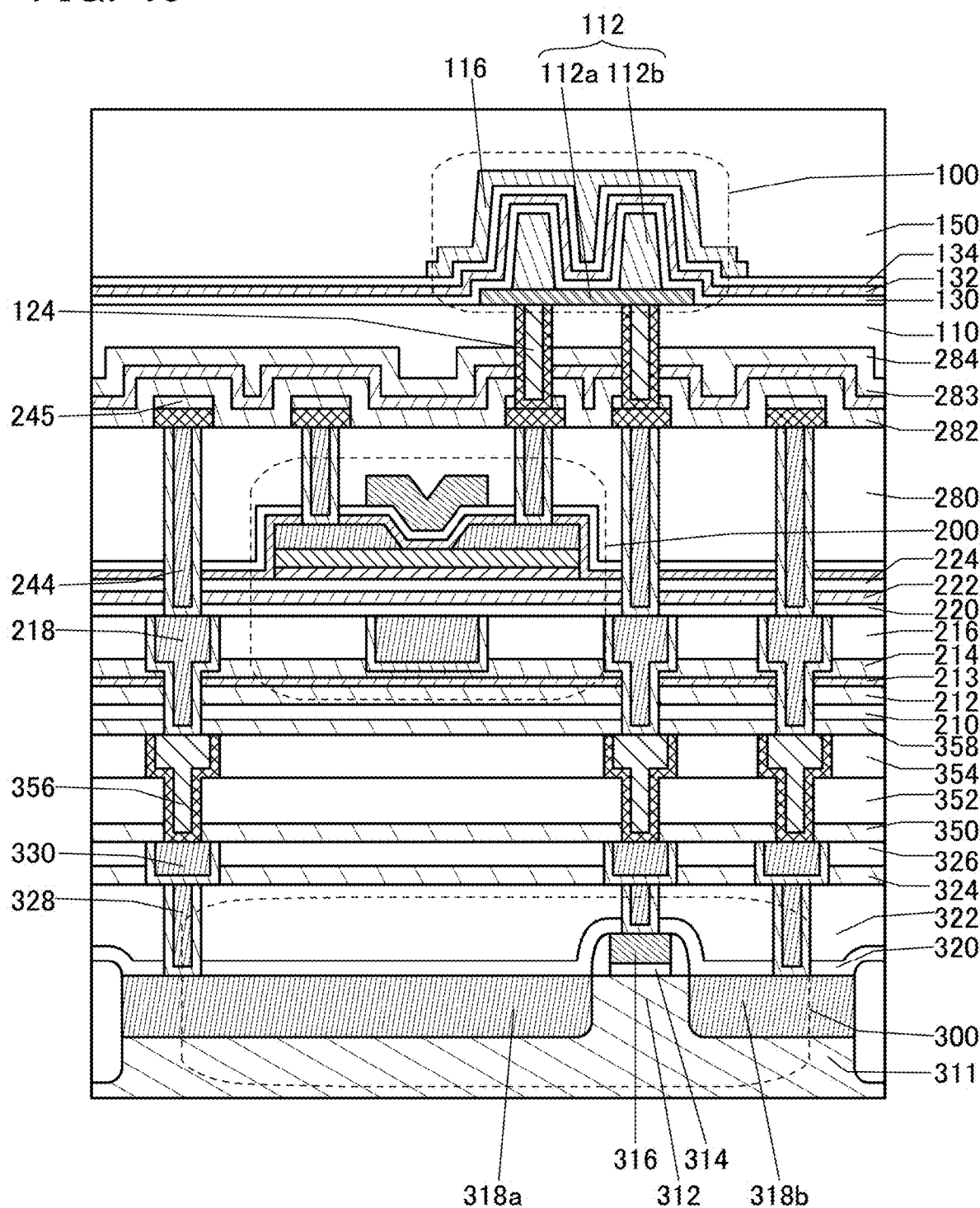

As a modification example of this embodiment, the conductor 244 may be formed as illustrated in FIG. 45. That is, a plug may be embedded in the insulator 282, and a stacked-layer structure including a conductor serving as a wiring and the barrier layer 245 may be provided over the plug. In that case, a conductor which functions as a wiring and is included in the conductor forming the conductor 244 is preferably a conductor with high oxidation resistance.

<Modification Example 2>

As another modification example of this embodiment, the conductor 122 is not necessarily provided in the capacitor 100.

Figure 46:
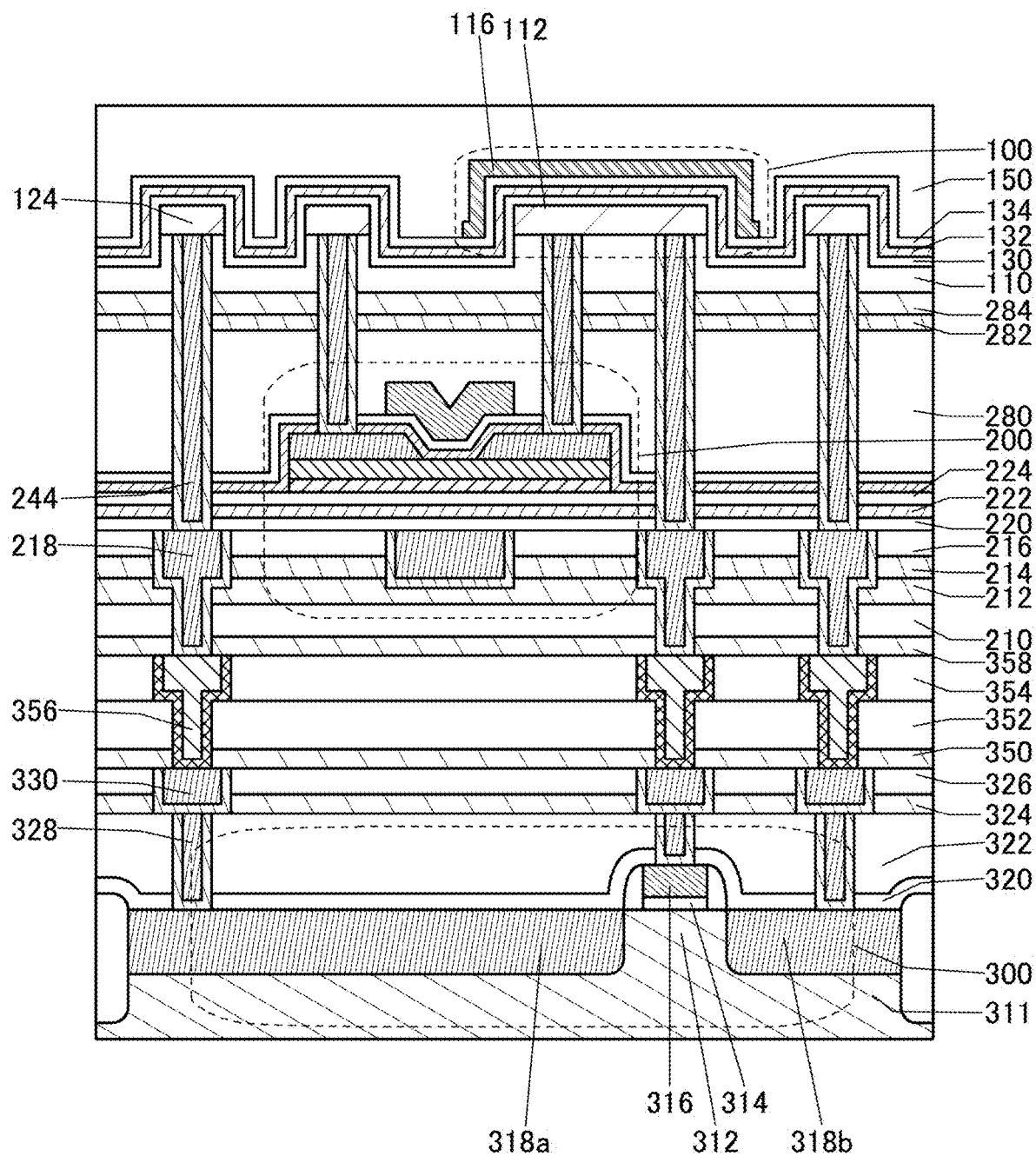

In the structure illustrated in FIG. 46, the conductor 244 is formed after formation of the insulators 280, 282, 284, and 110, for example. Therefore, the conductor 124 can be formed concurrently with the conductor 112 serving as one electrode of the capacitor 100. This enables production with a smaller number of processes, which can reduce production cost and increase the productivity.

A conductor 116 is provided over a conductor 112 with insulators 130, 132, and 134 positioned therebetween. Note that the conductor 116 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor is formed concurrently with another component such as a conductor, Cu (copper), Al (aluminum), or the like which is a low-resistance metal material may be used.

As illustrated in FIG. 46, the conductor 116 is provided to cover the top and side surfaces of the conductor 112 with the insulators 130, 132, and 134 positioned therebetween. That is, a capacitance is formed also on the side surface of the conductor 112, so that a capacitance per projected area of a capacitor can be increased. Thus, the semiconductor device can be reduced in area, highly integrated, and miniaturized.

Note that in this structure, when the conductor 112 is formed, it is preferable to remove the top surface of the insulator 110 so that the depth of the removed part is greater than the total thickness of the insulators 130, 132, and 134. For example, by performing over-etching treatment, part of the insulator 110 can be removed concurrently. Furthermore, by forming the conductor 112 or the like by over-etching treatment, etching can be performed without leaving an etching residue.

By changing the kind of etching gas in the etching treatment, part of the insulator 110 can be removed efficiently.

After the conductor 112 and the conductor 124 are formed, part of the insulator 110 may be removed using the conductor 112 as a hard mask, for example.

After the conductor 112 is formed, a surface of the conductor 112 may be subjected to cleaning treatment. By the cleaning treatment, an etching residue or the like can be removed.

As illustrated in FIG. 46, a structure where the insulators 213 and 283 are not provided may be employed. Also in this structure, the transistor 200 and the insulator 280 including the excess-oxygen region can be positioned between a stacked-layer structure of the insulators 212 and 214 and a stacked-layer structure of the insulators 282 and 284. The insulator 212, the insulator 214, the insulator 282, and the insulator 284 have a barrier property that prevents diffusion of oxygen or impurities such as hydrogen and water.

Thus, oxygen released from the insulator 280 and the transistor 200 can be prevented from diffusing into the layer where the capacitor 100 is formed or the layer where the transistor 300 is formed. Furthermore, impurities such as hydrogen and water can be prevented from diffusing from a layer above the insulator 282 and a layer below the insulator 214 into the transistor 200.

That is, oxygen can be efficiently supplied from the excess-oxygen region of the insulator 280 to the oxide where the channel is formed in the transistor 200, so that oxygen vacancies can be reduced. Moreover, oxygen vacancies can be prevented from being formed by impurities in the oxide where the channel is formed in the transistor 200. Thus, the oxide where a channel is formed in the transistor 200 can be an oxide semiconductor with a low density of defect states and stable characteristics. That is, a change in electrical characteristics of the transistor 200 can be prevented and the reliability can be improved.

FIGS. 49A and 49B are each a cross-sectional view in the vicinity of a scribe line in this modification example.

For example, as shown in FIG. 49A, in the vicinity of a region overlapping with a scribe line (shown by a dashed-dotted line in the drawing), the insulator 214 and the insulator 282 are in contact with each other and a stacked-layer structure of the insulator 212, the insulator 214, the insulator 282, and the insulator 284 is obtained. At this time, in the case where the insulator 214 and the insulator 282 are formed using the same material and the same method, adhesion therebetween in the stacked-layer structure is increased.

In the structure, the insulator 216, the insulator 220, the insulator 222, the insulator 224, and the insulator 280 can be enclosed with the insulator 212, the insulator 214, the insulator 282, and the insulator 284. The insulator 212, the insulator 214, the insulator 282, and the insulator 284 have a function of preventing diffusion of oxygen, hydrogen, and water, and therefore, entry and diffusion of hydrogen or water from the side surfaces of the insulator 216, the insulator 220, the insulator 222, the insulator 224, and the insulator 280 into the transistor 200 can be prevented even when the semiconductor device described in this embodiment is subjected to scribing.

Furthermore, in the structure, excess oxygen in the insulator 280 can be prevented from diffusing into the outside of the insulators 282 and 214. Accordingly, excess oxygen in the insulator 280 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, a change in electrical characteristics of the transistor 200 can be prevented and the reliability can be improved.

As another example, as shown in FIG. 49B, an opening is provided in the insulators 214, 216, 220, 222, 224, and 280 in the vicinity of a region overlapping with the scribe line (shown by the dashed-dotted line in the drawing). The insulator 282 is provided to cover the side surfaces of the insulators 214, 216, 220, 222, 224, and 280. In addition, an opening is formed in the insulators 212 and 282, and the insulator 284 is provided to cover side surfaces of the insulators 212 and 282 and an exposed top surface of the insulator 210.

That is, in the opening, the insulator 214 and the insulator 282 are in contact with each other. Furthermore, on the side outer than that, the insulator 212 and the insulator 282 are in contact with each other. At this time, in the case where the insulator 214 and the insulator 282 are formed using the same material and the same method, adhesion therebetween in the stacked-layer structure is increased. Furthermore, in the case where the insulator 212 and the insulator 284 are formed using the same material and the same method, adhesion therebetween in the stacked-layer structure is increased.

In such a structure, the transistor 200 and the insulator 280 can be enclosed tightly. Thus, the oxide where the channel is formed in the transistor 200 can be an oxide semiconductor with a low density of defect states and stable characteristics. That is, a change in electrical characteristics of the transistor 200 can be prevented and the reliability can be improved.

<Modification Example 3>

Figure 47:
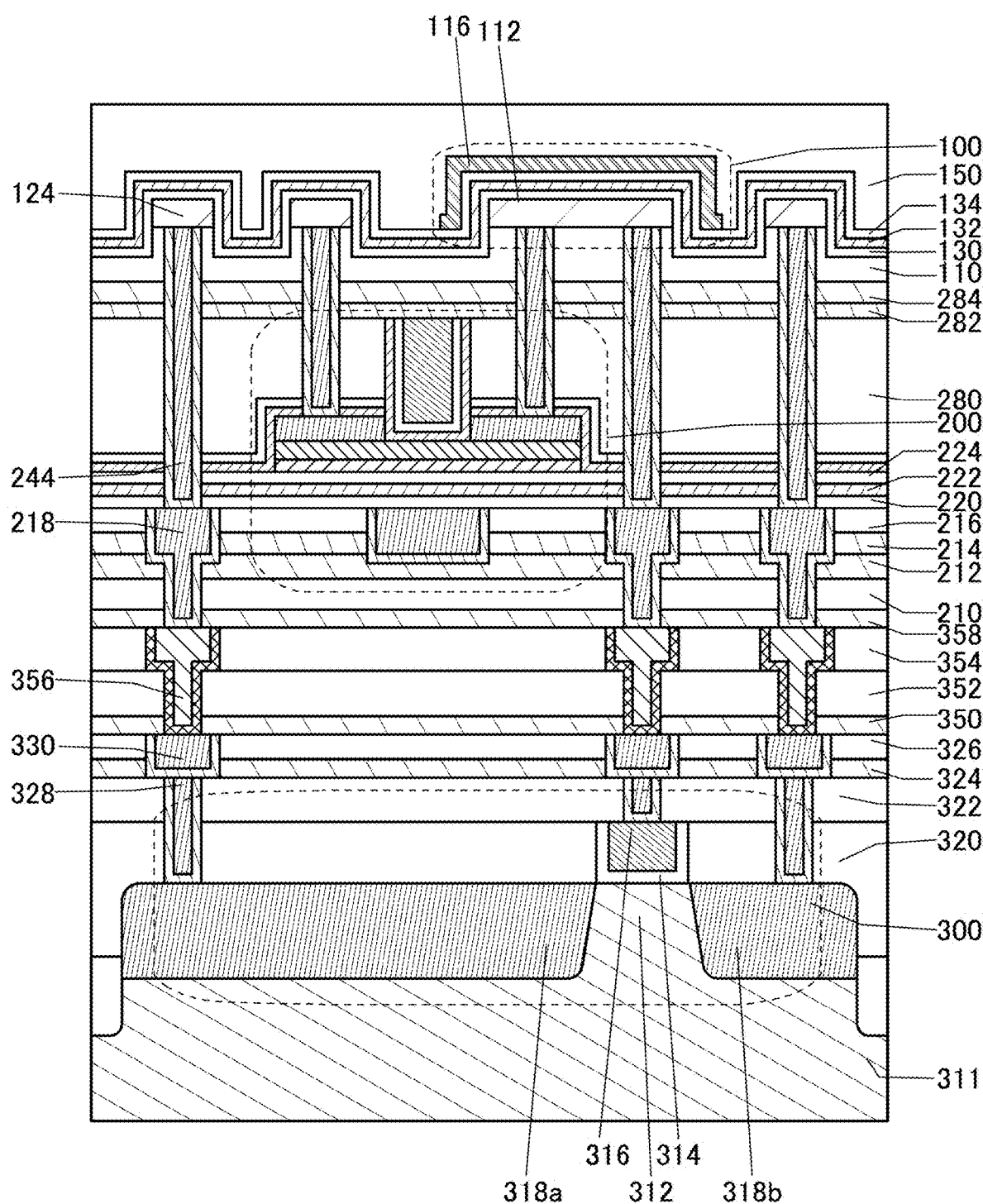

FIG. 47 illustrates a modification example of this embodiment. FIG. 47 is different from FIG. 46 in the structures of the transistor 300 and the transistor 200.

In the transistor 300 illustrated in FIG. 47, the semiconductor region 312 (part of the substrate 311) in which the channel is formed has a protruding portion. Furthermore, the conductor 316 is provided so as to cover the top and side surfaces of the semiconductor region 312 with the insulator 314 therebetween. Note that the conductor 316 may be formed using a material for adjusting the work function. The transistor 300 having such a structure is also referred to as a FIN transistor because the protruding portion of the semiconductor substrate is utilized. An insulator serving as a mask for forming the protruding portion may be provided in contact with a top surface of the protruding portion. Although the case where the protruding portion is formed by processing part of the semiconductor substrate is described here, a semiconductor film having a protruding shape may be formed by processing an SOI substrate.

The structure of the transistor 200 in FIG. 47 is the same as that described in FIGS. 36A to 36C and FIGS. 37A to 37C. The oxide 230c, the insulator 250, and the conductor 260 are formed in an opening formed in the insulator 280. Furthermore, one end portion of each of the conductors 240a and 240b is aligned with an end portion of the opening formed in the insulator 280. Furthermore, three end portions of each of the conductors 240a and 240b are aligned with part of an end portion of the oxide 230. Therefore, the conductors 240a and 240b can be formed concurrently with the oxide 230 or the opening in the insulator 280. This leads to a reduction in the number of masks and steps. In addition, yield and productivity can be improved.

Since the transistor 200 illustrated in FIGS. 41A to 41D has a structure in which the conductors 240a and 240b hardly overlap with the conductor 260, the parasitic capacitance added to the conductor 260 can be reduced. Thus, the transistor 200 with a high operation frequency can be provided.

<Modification Example 4>

Figure 50B:
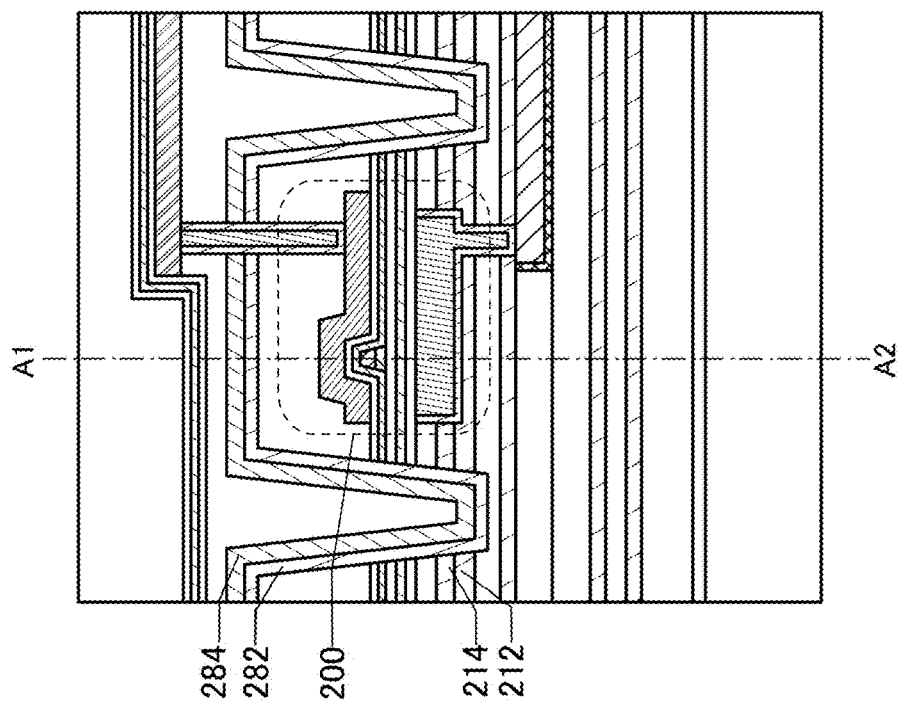
Figure 50A:
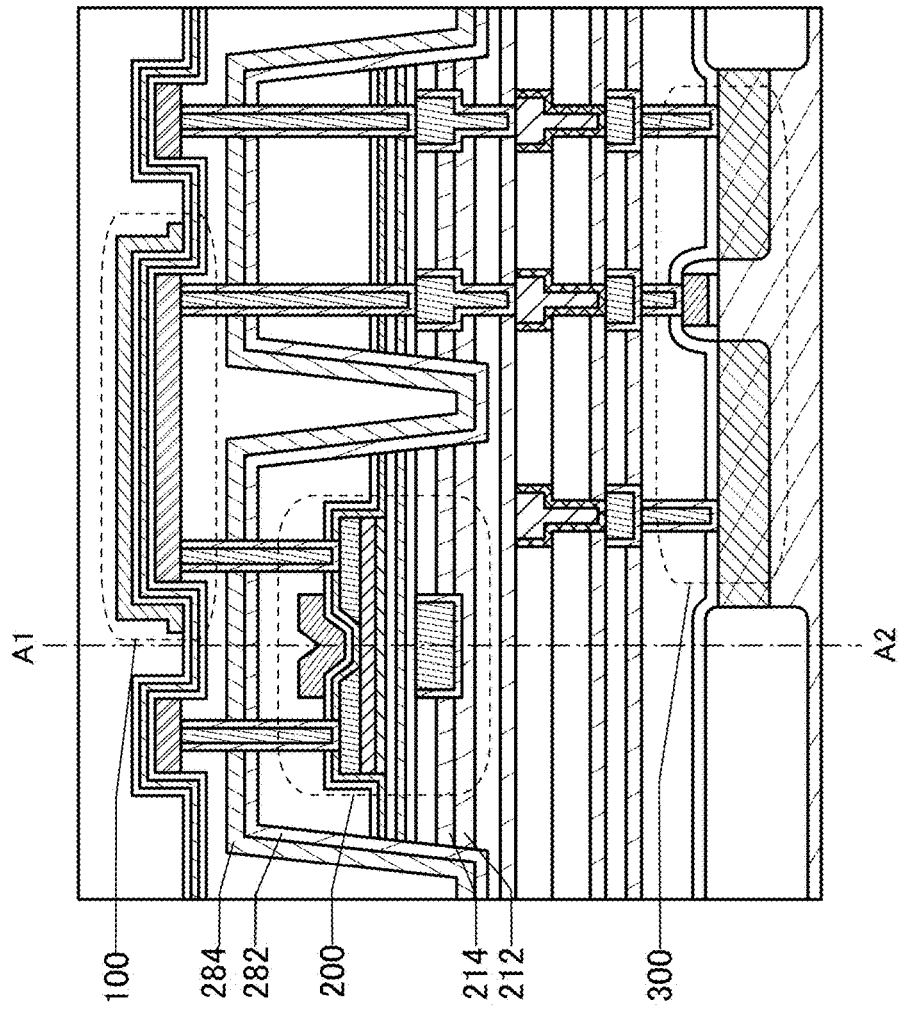

FIGS. 50A and 50B illustrate another modification example of this embodiment. FIGS. 50A and 50B are cross-sectional views of the transistor 200 in the channel length direction and in the channel width direction, respectively, with the dashed dotted line A1-A2 serving as an axis.

As illustrated in FIGS. 50A and 50B, the transistor 200 and the insulator 280 including the excess-oxygen region may be enclosed with a stacked-layer structure of the insulators 212 and 214 and a stacked-layer structure of the insulators 282 and 284. At that time, in a region between the transistor 200 and a through electrode which connects the transistor 300 and the capacitor 100, the stacked-layer structure of the insulators 212 and 214 is preferably in contact with the stacked-layer structure of the insulators 282 and 284.

Thus, oxygen released from the insulator 280 and the transistor 200 can be prevented from diffusing into the layer where the capacitor 100 is formed or the layer where the transistor 300 is formed. Furthermore, impurities such as hydrogen and water can be prevented from diffusing from a layer above the insulator 282 and a layer below the insulator 214 into the transistor 200.

That is, oxygen can be efficiently supplied from the excess-oxygen region of the insulator 280 to the oxide where the channel is formed in the transistor 200, so that oxygen vacancies can be reduced. Moreover, oxygen vacancies can be prevented from being formed by impurities in the oxide where the channel is formed in the transistor 200. Thus, the oxide where a channel is formed in the transistor 200 can be an oxide semiconductor with a low density of defect states and stable characteristics. That is, a change in electrical characteristics of the transistor 200 can be prevented and the reliability can be improved.

<Modification Example 5>

Figure 51:
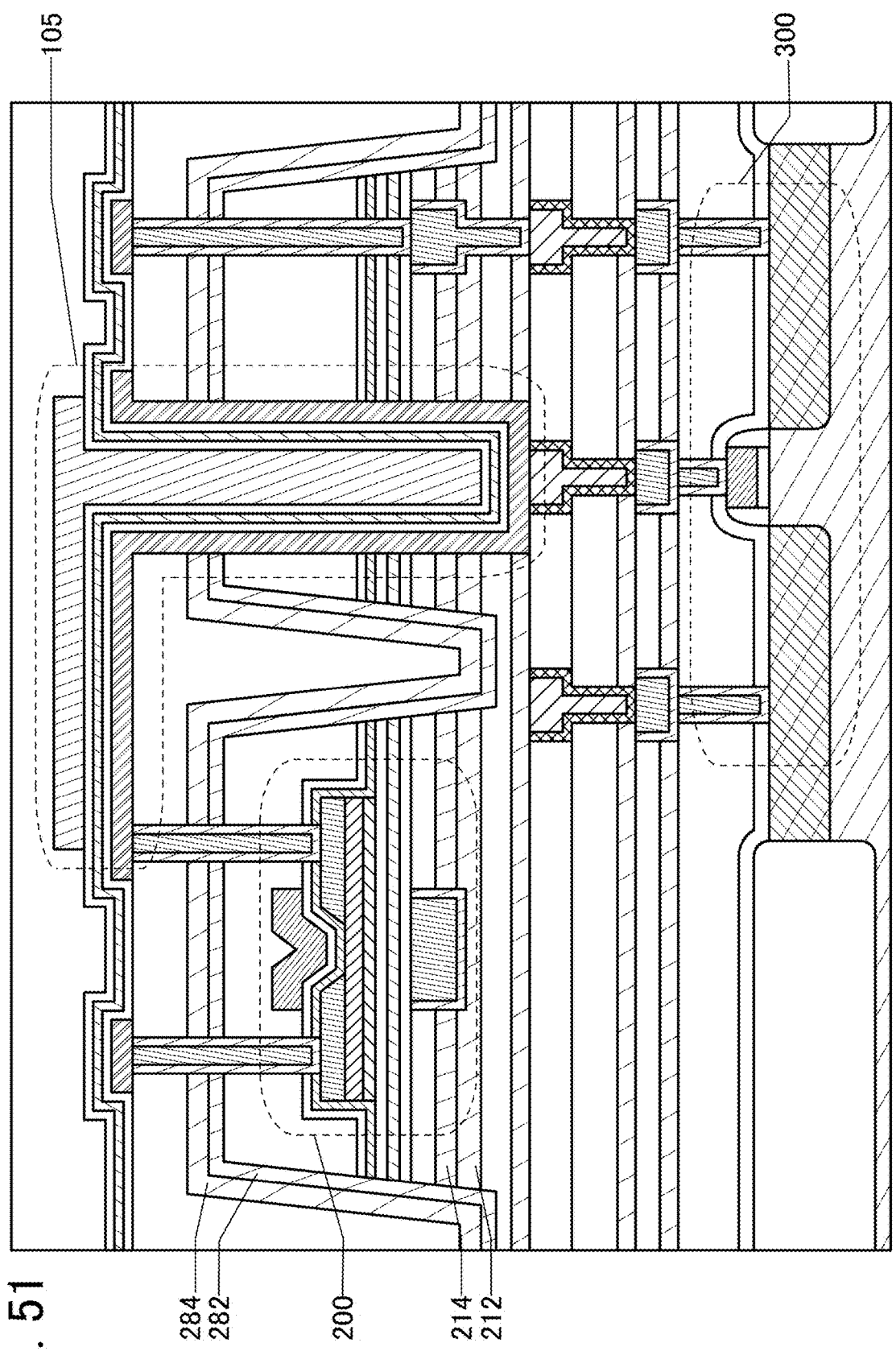

FIG. 51 illustrates another modification example of this embodiment. FIG. 51 is different from FIG. 47 in the structure of the capacitor.

A capacitor 105 may be formed as illustrated in FIG. 51. Part of a wiring connected to the transistor 300 also functions as part of the capacitor 105. This can increase the capacitance of the capacitor per projected area can be increased. Thus, the semiconductor device can be reduced in area, highly integrated, and miniaturized. A structure where the insulators 212 and 214 and the insulators 282 and 284 are stacked is preferably provided between the capacitor 105 and the transistor 200.

Thus, oxygen can be efficiently supplied from the excess-oxygen region of the insulator 280 to the oxide where the channel is formed in the transistor 200, so that oxygen vacancies can be reduced. Moreover, oxygen vacancies can be prevented from being formed by impurities in the oxide where the channel is formed in the transistor 200. Thus, the oxide where a channel is formed in the transistor 200 can be an oxide semiconductor with a low density of defect states and stable characteristics. That is, a change in electrical characteristics of the transistor 200 can be prevented and the reliability can be improved.

<Modification Example 6>

Figure 52A:
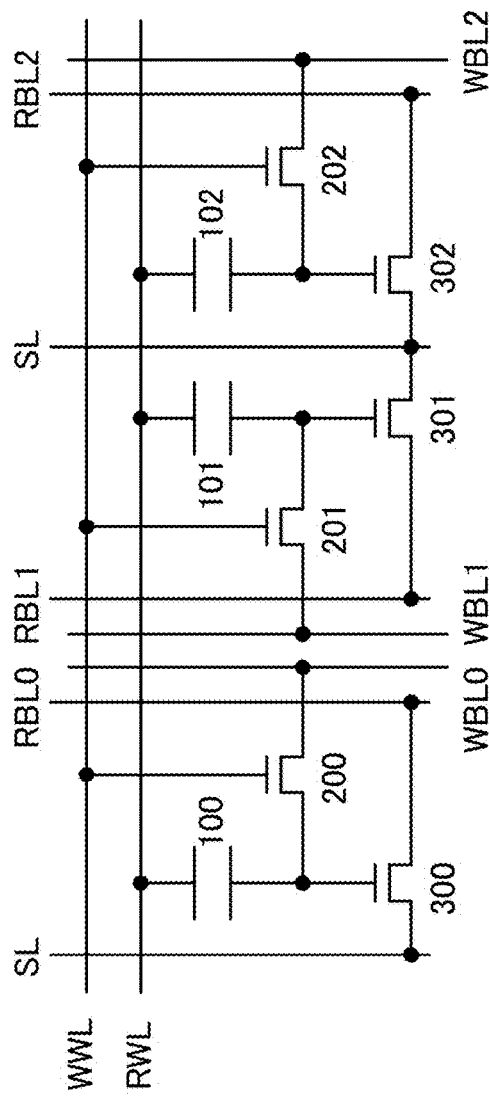
Figure 52B:
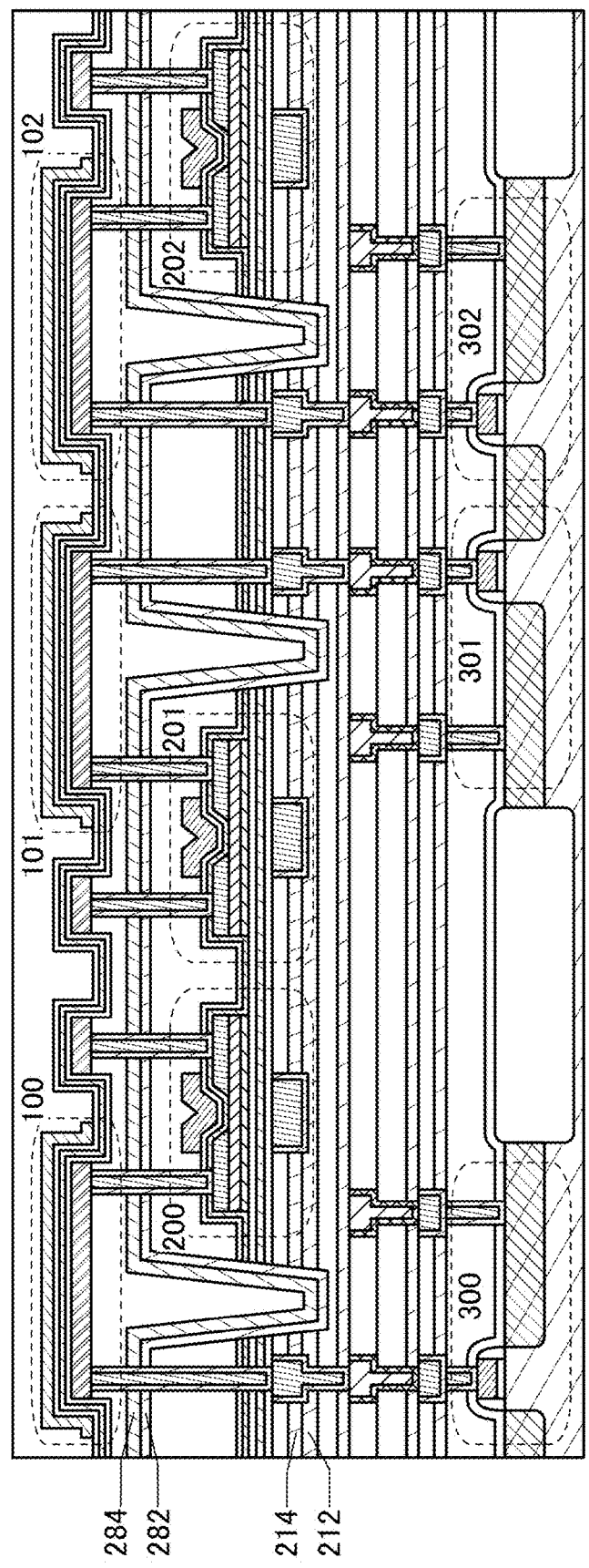

Another modification example of this embodiment is illustrated in FIGS. 52A and 52B. FIG. 52A is a circuit diagram which shows part of a row in which the semiconductor devices each of which is illustrated in FIG. 43A are arranged in a matrix. FIG. 52B is a cross-sectional view of the semiconductor devices which corresponds to FIG. 52A.

In FIGS. 52A and 52B, the semiconductor device which includes the transistor 300, the transistor 200, and the capacitor 100; the semiconductor which includes a transistor 301, a transistor 201, and a capacitor 101; and the semiconductor device which includes a transistor 302, a transistor 202, and a capacitor 102 are arranged in the same row.

As illustrated in FIG. 52B, a plurality of transistors (the transistors 200 and 201 in the drawing) and the insulator 280 including an excess-oxygen region may be enclosed with the stacked-layer structure of the insulators 212 and 214 and the stacked-layer structure of the insulators 282 and 284. At that time, a structure in which the insulators 212 and 214 and the insulators 282 and 284 are stacked is preferably formed between the transistor 200, 201, or 202 and a through electrode which connects the transistor 300, 301, or 302 and the capacitor 100, 101, or 102.

Thus, oxygen released from the insulator 280 and the transistor 200 can be prevented from diffusing into the layer where the capacitor 100 is formed or the layer where the transistor 300 is formed. Furthermore, impurities such as hydrogen and water can be prevented from diffusing from a layer above the insulator 282 and a layer below the insulator 214 into the transistor 200.

That is, oxygen can be efficiently supplied from the excess-oxygen region of the insulator 280 to the oxide where the channel is formed in the transistor 200, so that oxygen vacancies can be reduced. Moreover, oxygen vacancies can be prevented from being formed by impurities in the oxide where the channel is formed in the transistor 200. Thus, the oxide where a channel is formed in the transistor 200 can be an oxide semiconductor with a low density of defect states and stable characteristics. That is, a change in electrical characteristics of the transistor 200 can be prevented and the reliability can be improved.

<Modification Example 7>

Figure 53:
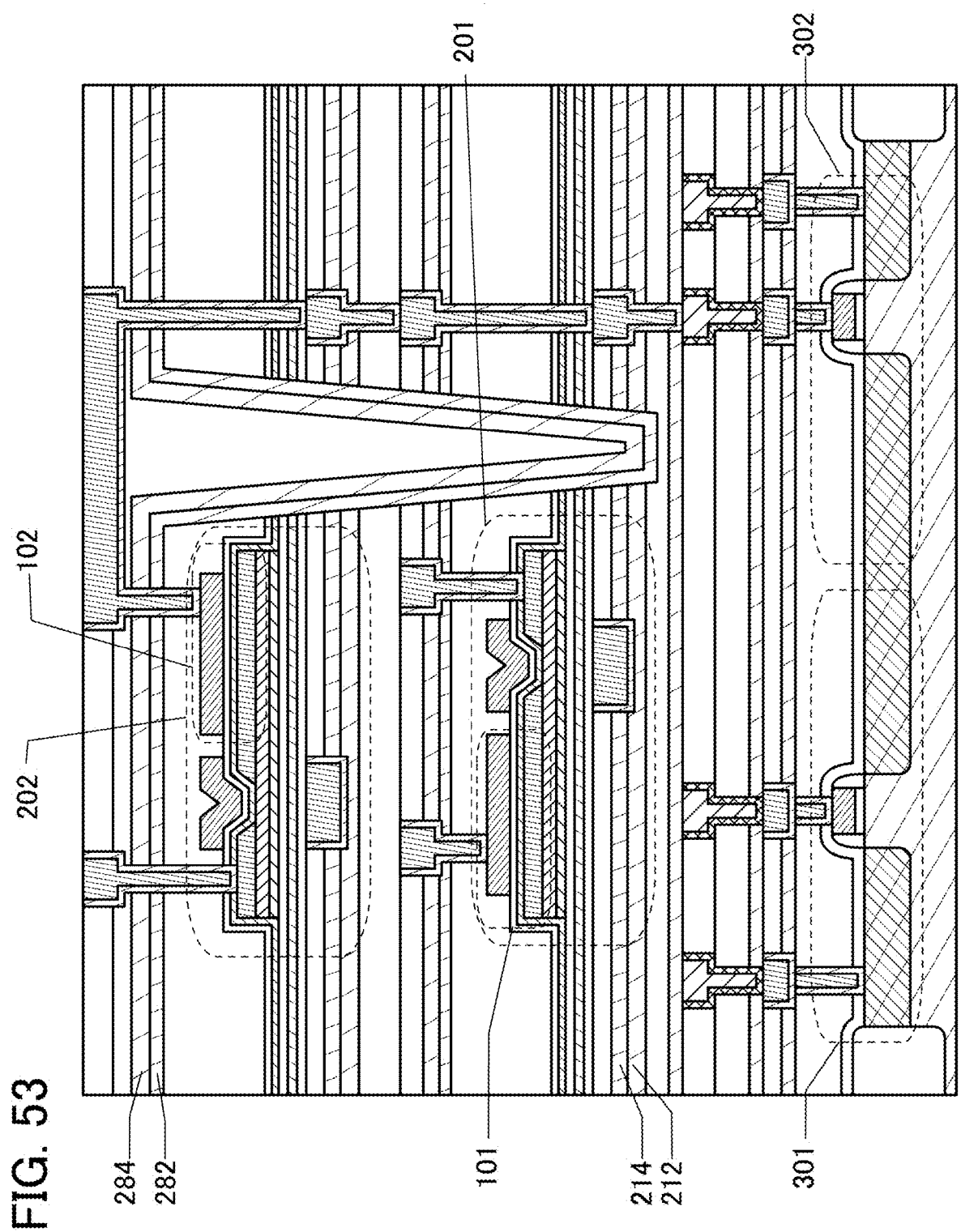

FIG. 53 illustrates another modification example of this embodiment. FIG. 53 is a cross-sectional view of the semiconductor devices illustrated in FIGS. 52A and 52B in which the transistor 201 and the transistor 202 are integrated.

As illustrated in FIG. 53, the conductor 112 serving as one electrode of the capacitor 101 may double as the conductor 240a serving as the source or the drain of the transistor 201. At that time, the oxide 230c of the transistor 201 and a region of the insulator 250 which extends over the conductor 240a and functions as the gate insulator of the transistor 201 function as insulators of the capacitor 101. Therefore, the conductor 116 serving as the other electrode of the capacitor 101 may be stacked over the conductor 240a with the insulator 250 and the oxide 230c positioned therebetween. This structure can lead to a reduction in area, higher integration, and miniaturization of the semiconductor device.

The transistor 201 and the transistor 202 may overlap with each other. This structure can lead to a reduction in area, higher integration, and miniaturization of the semiconductor device.

A plurality of transistors (the transistors 201 and 202 in the drawing) and the insulator 280 including an excess-oxygen region may be enclosed with the stacked-layer structure of the insulators 212 and 214 and the stacked-layer structure of the insulators 282 and 284. At that time, a structure in which the insulators 212 and 214 and the insulators 282 and 284 are stacked is preferably formed between the transistor 200, 201, or 202 and a through electrode which connects the transistor 300, 301, or 302 and the capacitor 100, 101, or 102.

Thus, oxygen released from the insulator 280 and the transistor 200 can be prevented from diffusing into the layer where the capacitor 100 is formed or the layer where the transistor 300 is formed. Furthermore, impurities such as hydrogen and water can be prevented from diffusing from a layer above the insulator 282 and a layer below the insulator 214 into the transistor 200.

That is, oxygen can be efficiently supplied from the excess-oxygen region of the insulator 280 to the oxide where the channel is formed in the transistor 200, so that oxygen vacancies can be reduced. Moreover, oxygen vacancies can be prevented from being formed by impurities in the oxide where the channel is formed in the transistor 200. Thus, the oxide where a channel is formed in the transistor 200 can be an oxide semiconductor with a low density of defect states and stable characteristics. That is, a change in electrical characteristics of the transistor 200 can be prevented and the reliability can be improved.

At least part of this embodiment can be implemented in combination with any of the other embodiments described in this specification as appropriate.

(Embodiment 4)

In this embodiment, an example of a circuit of a semiconductor device including the transistor or the like of one embodiment of the present invention will be described.

<Circuit>

An example of a circuit of a semiconductor device including a transistor or the like of one embodiment of the present invention is described below with reference to FIG. 54 and FIG. 55.

<Memory Device 1>

Figure 54:
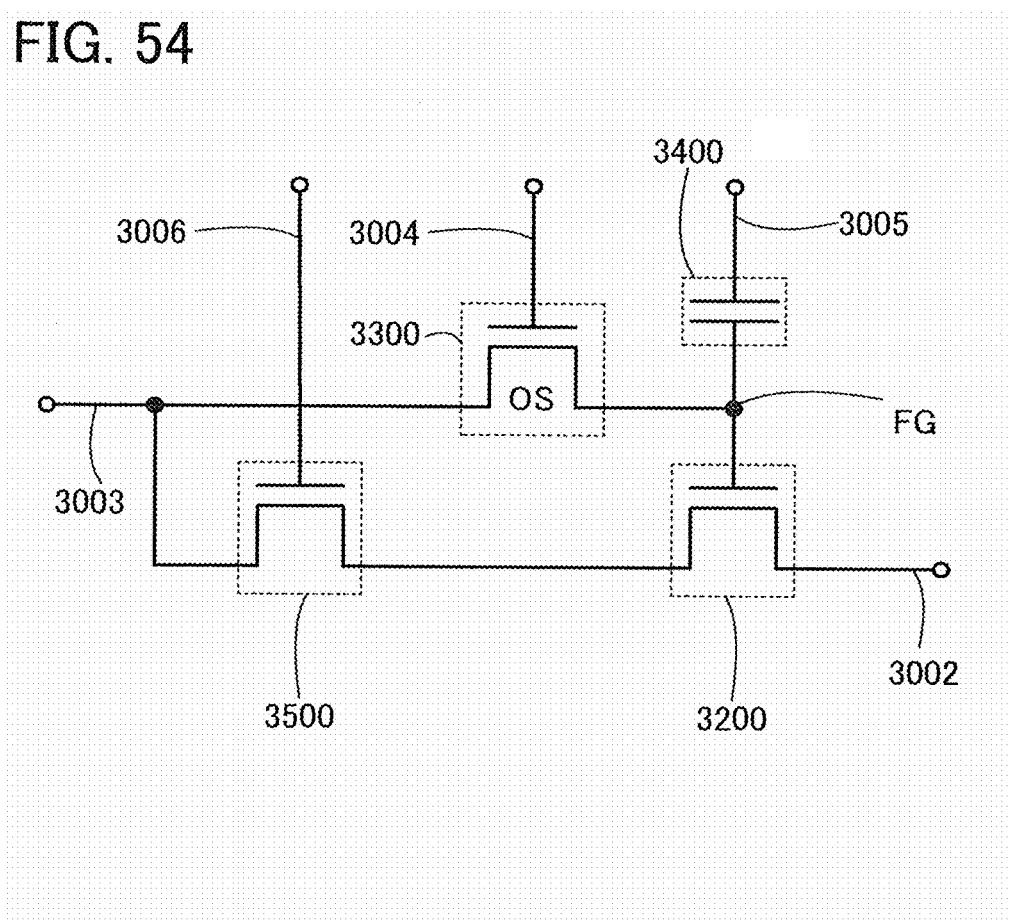

The semiconductor device in FIG. 54 is different from the semiconductor device described in the above embodiment in that a transistor 3500 and a sixth wiring 3006 are provided. Also in this case, data can be written and retained in a manner similar to that of the semiconductor device described in the above embodiment. A transistor similar to the above-described transistor 3200 can be used as the transistor 3500.

The sixth wiring 3006 is electrically connected to a gate of the transistor 3500, one of a source and a drain of the transistor 3500 is electrically connected to a drain of the transistor 3200, and the other of the source and the drain of the transistor 3500 is electrically connected to the third wiring 3003.

<Memory Device 2>

A modification example of the semiconductor device (memory device) is described with reference to a circuit diagram in FIG. 55.

Figure 55:
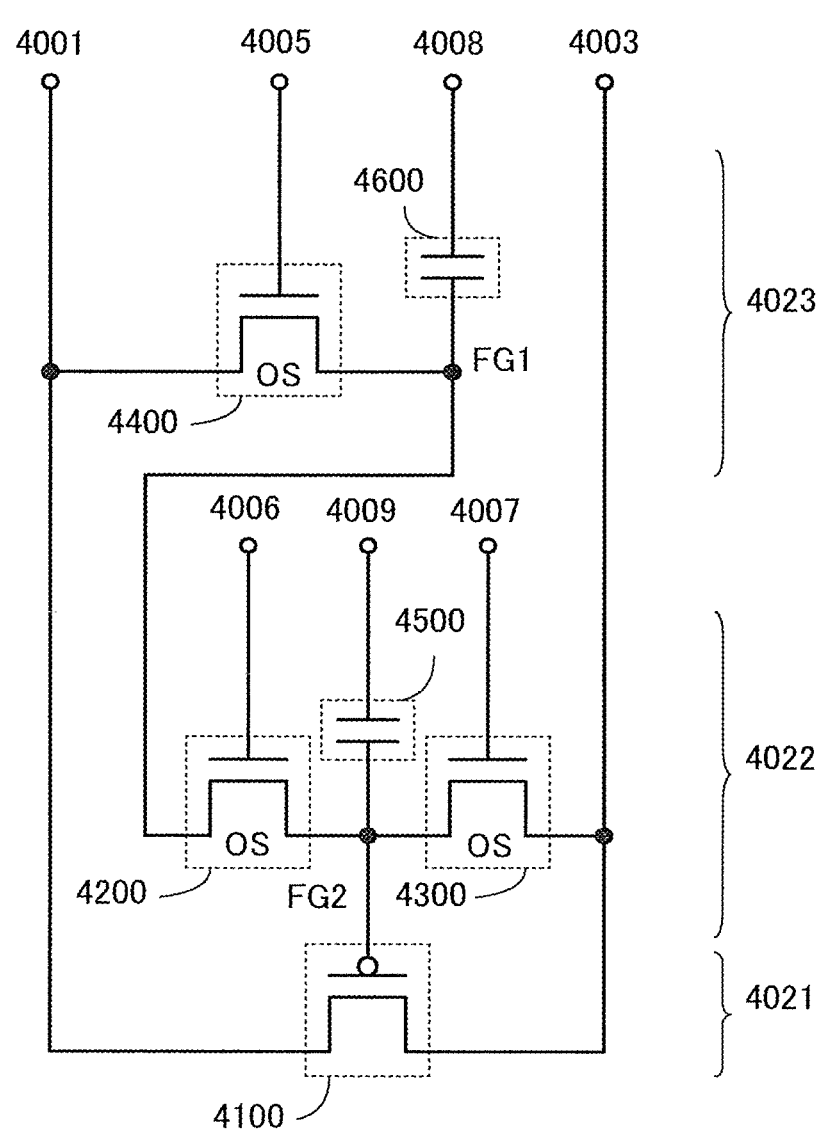

The semiconductor device illustrated in FIG. 55 includes a transistor 4100, a transistor 4200, a transistor 4300, a transistor 4400, a capacitor 4500, and a capacitor 4600. Here, a transistor similar to the above-described transistor 300 can be used as the transistor 4100, and transistors similar to the above-described transistor 200 can be used as the transistors 4200 to 4400. In addition, capacitors similar to the capacitor 100 can be used as the capacitor 4500 and the capacitor 4600. Although not illustrated in FIG. 55, a plurality of semiconductor devices in FIG. 55 are provided in a matrix. The semiconductor devices in FIG. 55 can control writing and reading of a data voltage in accordance with a signal or a potential supplied to a wiring 4001, a wiring 4003, wirings 4005 to 4009.

One of a source and a drain of the transistor 4100 is connected to the wiring 4003. The other of the source and the drain of the transistor 4100 is connected to the wiring 4001. Although the transistor 4100 is a p-channel transistor in FIG. 55, the transistor 4100 may be an n-channel transistor.

The semiconductor device in FIG. 55 includes two data retention portions. For example, a first data retention portion retains an electric charge between one of a source and a drain of the transistor 4400, one electrode of the capacitor 4600, and one of a source and a drain of the transistor 4200 which are connected to a node FG1. A second data retention portion retains an electric charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200 to 4400 each function as a switch for control of writing a data voltage and retaining an electric charge. Note that, as each of the transistors 4200 to 4400, it is preferable to use a transistor having a low current that flows between a source and a drain in an off state (low off-state current). As an example of the transistor with a low off-state current, a transistor including an oxide semiconductor in its channel formation region (an OS transistor) is preferably used. An OS transistor has a low off-state current and can be manufactured to overlap with a transistor including silicon, for example. Although the transistors 4200 to 4400 are n-channel transistors in FIG. 55, the transistor 4200 to 4400 may be p-channel transistors.

The transistor 4200 and the transistor 4300 are preferably provided in a layer different from the layer where the transistor 4400 is provided even when the transistor 4200, the transistor 4300, and the transistor 4400 are transistors including oxide semiconductors. In other words, in the semiconductor device in FIG. 55, the transistor 4100, the transistor 4200 and the transistor 4300, and the transistor 4400 are preferably stacked. A layer including a transistor is preferably stacked. That is, by integrating the transistors, the circuit area can be reduced, so that the size of the semiconductor device can be reduced.

Next, operation of writing data to the semiconductor device in FIG. 55 is described.

First, operation of writing a data voltage to the data retention portion connected to the node FG1 (hereinafter referred to as writing operation 1) is described. In the following description, a data voltage written to the data retention portion connected to the node FG1 is $V_{D1}$, and the threshold voltage of the transistor 4100 is $V_{th}$.

In the writing operation 1, the potential of the wiring 4003 is set at $V_{D1}$, and after the potential of the wiring 4001 is set at a ground potential, the wiring 4001 is brought into an electrically floating state. The wiring 4005 and the wiring 4006 are set at a high level. The wiring 4007 to 4009 are set at a low level. Then, the potential of the node FG2 in the electrically floating state is increased, so that current flows through the transistor 4100. By the current flow, the potential of the wiring 4001 is increased. The transistor 4400 and the transistor 4200 are turned on. Thus, as the potential of the wiring 4001 is increased, the potentials of the node FG1 and the node FG2 are increased. When the potential of the node FG2 is increased and a voltage ($V_{gs}$) between a gate and a source of the transistor 4100 reaches the threshold voltage $V_{th}$ of the transistor 4100, the current flowing through the transistor 4100 is decreased. Accordingly, the potentials of the wiring 4001, the node FG1, and the node FG2 stop increasing, so that the potentials of the nodes FG1 and FG2 are fixed at "$V_{D1}-V_{th}$" in which $V_{D1}$ is decreased by $V_{th}$.

When current flows through the transistor 4100, $V_{D1}$ supplied to the wiring 4003 is supplied to the wiring 4001, so that the potentials of the node FG1 and the node FG2 are increased. When the potential of the node FG2 becomes "$V_{D1}-V_{th}$" with the increase in the potentials, $V_{gs}$ of the transistor 4100 becomes $V_{th}$, so that the current flow is stopped.

Next, operation of writing a data voltage to the data retention portion connected to the node FG2 (hereinafter referred to as writing operation 2) is described. In the following description, a data voltage written to the data retention portion connected to the node FG2 is $V_{D2}$.

In the writing operation 2, the potential of the wiring 4001 is set at $V_{D2}$, and after the potential of the wiring 4003 is set at a ground potential, the wiring 4003 is brought into an electrically floating state. The wiring 4007 is set at the high level. The wiring 4005, the wiring 4006, the wiring 4008, and the wiring 4009 are set at the low level. The transistor 4300 is turned on, so that the wiring 4003 is set at the low level. Thus, the potential of the node FG2 is decreased to the low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and $V_{gs}$ of the transistor 4100 becomes $V_{th}$ of the transistor 4100, the current flowing through the transistor 4100 is decreased. Accordingly, an increase in the potentials of the wiring 4003 and the node FG2 is stopped, so that the potential of the node FG2 is fixed at "$V_{D2}-V_{th}$" in which $V_{D2}$ is decreased by $V_{th}$.

In other words, when current flows through the transistor 4100, $V_{D2}$ supplied to the wiring 4001 is supplied to the wiring 4003, so that the potential of the node FG2 is increased. When the potential of the node FG2 becomes "$V_{D2}-V_{th}$" with the increase in the potential, $V_{gs}$ of the transistor 4100 becomes $V_{th}$, so that the current flow is stopped. At this time, the transistor 4200 and the transistor 4400 are off and the potential of the node FG1 remains at "$V_{D1}-V_{th}$" written in the writing operation 1.

In the semiconductor device in FIG. 55, after data voltages are written to the plurality of data retention portions, the wiring 4009 is set at the high level, so that the potentials of the node FG1 and the node FG2 are increased. Then, the transistors are turned off to stop the movement of electric charge; thus, the written data voltages are retained.

By the above-described writing operation of the data voltages to the node FG1 and the node FG2, the data voltages can be retained in the plurality of data retention portions. Although examples where "$V_{D1}-V_{th}$" and "$V_{D2}-V_{th}$" are used as the written potentials are described, they are data voltages corresponding to multi-level data. Therefore, in the case where the data retention portions each retain 4-bit data, 16-level "$V_{D1}-V_{th}$" and 16-level "$V_{D2}-V_{th}$" can be obtained.

Next, operation of reading data from the semiconductor device in FIG. 55 is described.

First, operation of reading a data voltage to the data retention portion connected to the node FG2 (hereinafter referred to as reading operation 1) is described.

In the reading operation 1, after precharge is performed, the wiring 4003 in an electrically floating state is discharged. The wirings 4005 to 4008 are set low. When the wiring 4009 is set low, the potential of the node FG2 which is electrically floating is set at "$V_{D2}-V_{th}$". The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$" which is larger than the potential of the node FG2, "$V_{D2}-V_{th}$", by $V_{th}$. The potential of the wiring 4003 corresponds to the data voltage of the data retention portion connected to the node FG2. The data voltage of the read analog value is subjected to A/D conversion, so that data of the data retention portion connected to the node FG2 is obtained.

In other words, the wiring 4003 after precharge is brought into a floating state and the potential of the wiring 4009 is changed from high to low, whereby current flows through the transistor 4100. When the current flows, the potential of the wiring 4003 which is in a floating state is decreased to be "$V_{D2}$". In the transistor 4100, $V_{gs}$ between "$V_{D2}-V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}-V_{th}$" of the node FG2.

Then, the electric charges retained in the node FG1 are distributed between the node FG1 and the node FG2, a data voltage in the data retention portion connected to the node FG1 is transferred to the data retention portion connected to the node FG2. The wiring 4001 and the wiring 4003 are set low. The wiring 4006 is set high. The wiring 4005 and the wirings 4007 to 4009 are set low. When the transistor 4200 is turned on, the electric charges in the node FG1 are distributed between the node FG1 and the node FG2.

Here, the potential after the electric charge distribution is decreased from the written potential, "$V_{D1}-V_{th}$". Thus, the capacitance of the capacitor 4600 is preferably larger than the capacitance of the capacitor 4500. Alternatively, the potential written to the node FG1, "$V_{D1}-V_{th}$", is preferably larger than the potential corresponding to the same data, "$V_{D2}-V_{th}$". By changing the ratio of the capacitances and setting the written potential larger in advance as described above, a decrease in potential after the electric charge distribution can be suppressed. The change in potential due to the electric charge distribution is described later.

Next, operation of reading a data voltage to the data retention portion connected to the node FG1 (hereinafter referred to as reading operation 2) is described.

In the reading operation 2, the wiring 4003 which is brought into an electrically floating state after precharge is discharged. The wirings 4005 to 4008 are set low. The wiring 4009 is set high at the time of precharge and then, set low. When the wiring 4009 is set low, the potential of the node FG2 which is electrically floating is set at "$V_{D1}-V_{th}$". The potential of the node FG2 is decreased, so that current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$" which is larger than the potential of the node FG2, "$V_{D1}-V_{th}$", by $V_{th}$. The potential of the wiring 4003 corresponds to the data voltage of the data retention portion connected to the node FG1. The data voltage of the read analog value is subjected to A/D conversion, so that data of the data retention portion connected to the node FG1 is obtained. The above is the reading operation of the data voltage of the data retention portion connected to the node FG1.

In other words, the wiring 4003 after precharge is brought into a floating state and the potential of the wiring 4009 is changed from high to low, whereby current flows through the transistor 4100. When the current flows, the potential of the wiring 4003 which is in a floating state is decreased to be "$V_{D1}$". In the transistor 4100, $V_{gs}$ between "$V_{D1}-V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operation of data voltages from the node FG1 and the node FG2, the data voltages can be read from the plurality of data retention portions. For example, 4-bit (16-level) data is retained in each of the node FG1 and the node FG2, whereby 8-bit (256-level) data can be retained in total. Although a first layer 4021, a second layer 4033, and a third layer 4023 are provided in the structure illustrated in FIG. 55, the storage capacity can be increased by adding layers without increasing the area of the semiconductor device.

The read potential can be read as a voltage larger than the written data voltage by $V_{th}$. Therefore, $V_{th}$ of "$V_{D1}-V_{th}$" and $V_{th}$ of "$V_{D2}-V_{th}$" written in the writing operation can be canceled out in reading. As a result, the storage capacity per memory cell can be improved and read data can be close to accurate data; thus, the data reliability becomes excellent.

The structure described in this embodiment can be used in appropriate combination with the structure described in any of the other embodiments.

(Embodiment 5)

In this embodiment, circuit configuration examples to which the OS transistors described in the above embodiment can be used are described with reference to FIG. 56A to FIG. 59B.

Figure 56A:
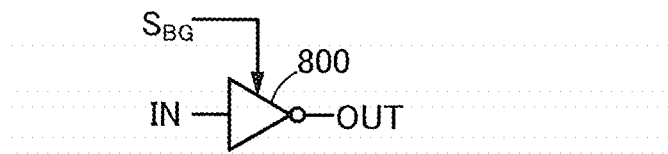

FIG. 56A is a circuit diagram of an inverter. An inverter 800 outputs a signal whose logic is inverted from the logic of an input terminal IN from an output terminal OUT. The inverter 800 includes a plurality of OS transistors. A signal SBG can switch electrical characteristics of the OS transistors.

Figure 56B:
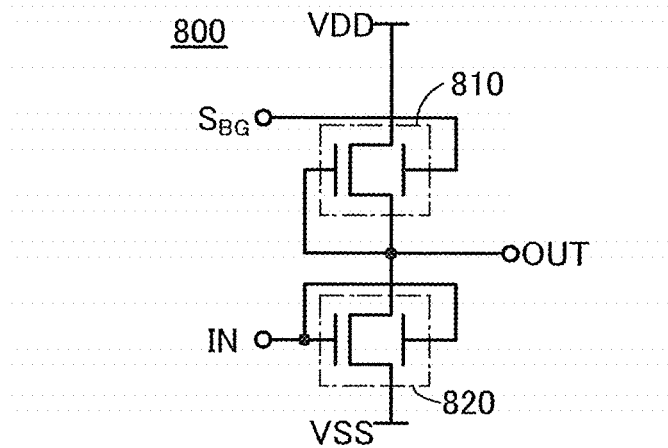

FIG. 56B illustrates an example of the inverter 800. The inverter 800 includes an OS transistor 810 and an OS transistor 820. The inverter 800 can be formed using only n-channel transistors; thus, the inverter 800 can be formed at lower cost than an inverter formed using a complementary metal oxide semiconductor (i.e., a CMOS inverter).

Note that the inverter 800 including the OS transistors can be provided over a CMOS circuit including Si transistors. Since the inverter 800 can be provided so as to overlap with the CMOS circuit, no additional area is required for the inverter 800, and thus, an increase in the circuit area can be suppressed.

Each of the OS transistors 810 and 820 includes a first gate functioning as a front gate, a second gate functioning as a back gate, a first terminal functioning as one of a source and a drain, and a second terminal functioning as the other of the source and the drain.

The first gate of the OS transistor 810 is connected to its second terminal. The second gate of the OS transistor 810 is connected to a wiring that supplies the signal SBG. The first terminal of the OS transistor 810 is connected to a wiring that supplies a voltage VDD. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring that supplies a voltage VSS.

Figure 56C:
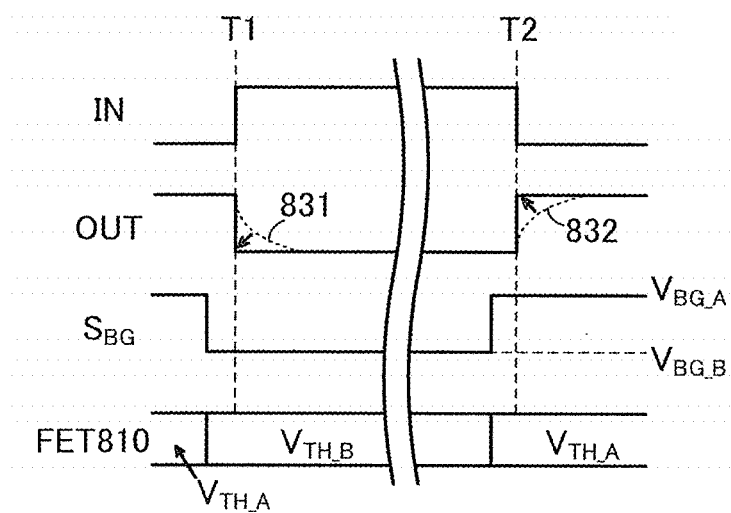

FIG. 56C is a timing chart illustrating the operation of the inverter 800. The timing chart in FIG. 56C illustrates changes of a signal waveform of the input terminal IN, a signal waveform of the output terminal OUT, a signal waveform of the signal $S_{BG}$, and the threshold voltage of the OS transistor 810 (FET 810).

The signal $S_{BG}$ can be supplied to the second gate of the OS transistor 810 to control the threshold voltage of the OS transistor 810.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 810 can be shifted in the negative direction to be a threshold voltage $V_{TH\_A}$ when the voltage $V_{BG\_A}$ is applied to the second gate. The threshold voltage of the OS transistor 810 can be shifted in the positive direction to be a threshold voltage $V_{TH\_B}$ when the voltage $V_{BG\_B}$ is applied to the second gate.

Figure 57A:
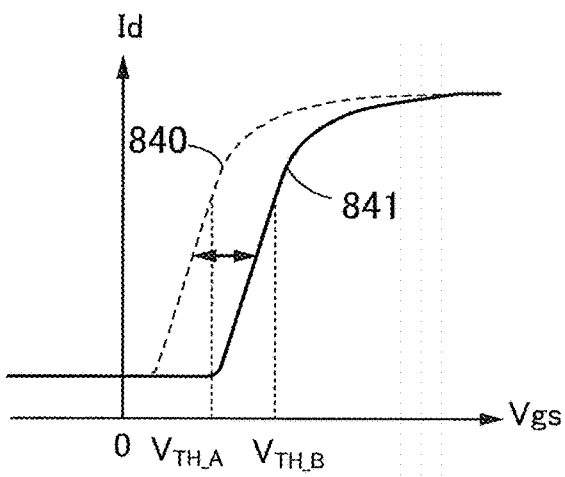

To visualize the above description, FIG. 57A shows a $V_g$-$I_d$ curve, which is one of indicators of the transistor's electrical characteristics.

When a high voltage such as the voltage $V_{BG\_A}$ is applied to the second gate, the electrical characteristics of the OS transistor 810 can be shifted to match a curve shown by a dashed line 840 in FIG. 57A. When a low voltage such as the voltage $V_{BG\_B}$ is applied to the second gate, the electrical characteristics of the OS transistor 810 can be shifted to match a curve shown by a solid line 841 in FIG. 57A. As shown in FIG. 57A, switching the signal $S_{BG}$ between the voltage $V_{BG\_A}$ and the voltage $V_{BG\_B}$ enables the threshold voltage of the OS transistor 810 to be shifted in the negative direction or the positive direction.

Figure 57B:
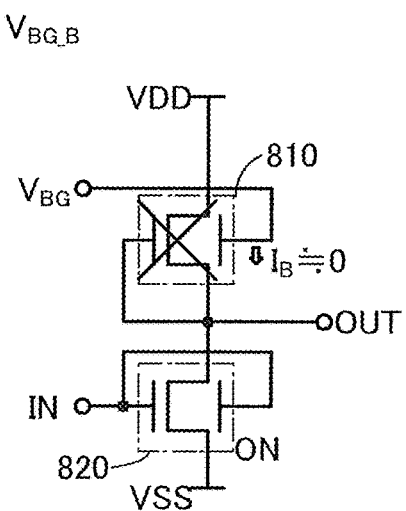

The shift of the threshold voltage in the positive direction toward the threshold voltage $V_{TH\_B}$ can make a current less likely to flow in the OS transistor 810. FIG. 57B visualizes the state. As illustrated in FIG. 57B, a current $I_B$ that flows in the OS transistor 810 can be extremely low. Thus, when a signal supplied to the input terminal IN is at a high level and the OS transistor 820 is on (ON), the voltage of the output terminal OUT can drop sharply.

Since a state in which a current is less likely to flow in the OS transistor 810 as illustrated in FIG. 57B can be obtained, a signal waveform 831 of the output terminal in the timing chart in FIG. 56C can be made steep. Shoot-through current between the wiring that supplies the voltage VDD and the wiring that supplies the voltage VSS can be low, leading to low-power operation.

Figure 57C:
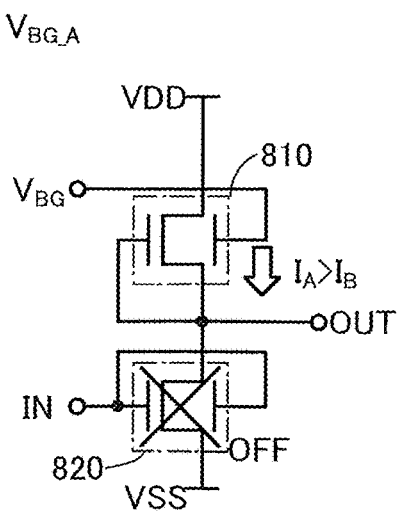

The shift of the threshold voltage in the negative direction toward the threshold voltage $V_{TH\_A}$ can make a current flow easily in the OS transistor 810. FIG. 57C visualizes the state. As illustrated in FIG. 57C, a current IA flowing at this time can be higher than at least the current $I_B$. Thus, when a signal supplied to the input terminal IN is at a low level and the OS transistor 820 is off (OFF), the voltage of the output terminal OUT can be increased sharply.

Since a state in which current is likely to flow in the OS transistor 810 as illustrated in FIG. 57C can be obtained, a signal waveform 832 of the output terminal in the timing chart in FIG. 56C can be made steep.

Note that the threshold voltage of the OS transistor 810 is preferably controlled by the signal $S_{BG}$ before the state of the OS transistor 820 is switched, i.e., before time Ti or time T2. For example, as in FIG. 56C, it is preferable that the threshold voltage of the OS transistor 810 be switched from the threshold voltage $V_{TH\_A}$ to the threshold voltage $V_{TH\_B}$ before time T1 at which the level of the signal supplied to the input terminal IN is switched to a high level. Moreover, as in FIG. 56C, it is preferable that the threshold voltage of the OS transistor 810 be switched from the threshold voltage $V_{TH\_B}$ to the threshold voltage $V_{TH\_A}$ before time T2 at which the level of the signal supplied to the input terminal IN is switched to a low level.

Figure 58A:
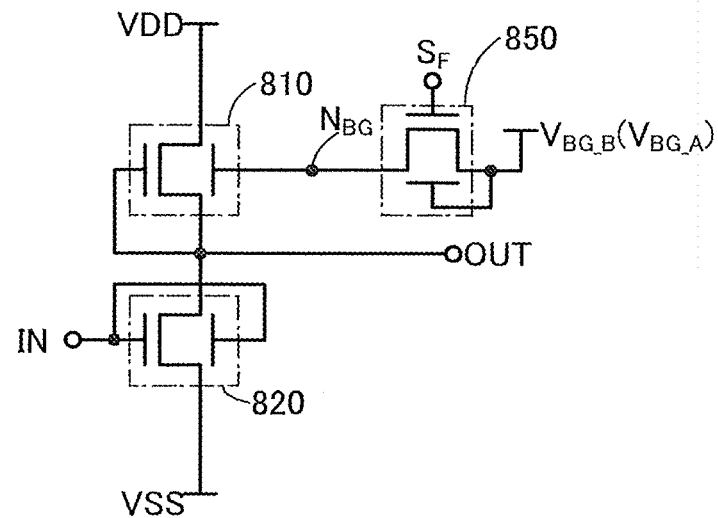

Although the timing chart in FIG. 56C illustrates the structure in which the level of the signal $S_{BG}$ is switched in accordance with the signal supplied to the input terminal IN, a different structure may be employed in which voltage for controlling the threshold voltage is held by the second gate of the OS transistor 810 in a floating state, for example. FIG. 58A illustrates an example of such a circuit configuration.

The circuit configuration in FIG. 58A is the same as that in FIG. 56B, except that an OS transistor 850 is added. A first terminal of the OS transistor 850 is connected to the second gate of the OS transistor 810. A second terminal of the OS transistor 850 is connected to a wiring that supplies the voltage $V_{BG\_B}$ (or the voltage $V_{BG\_A}$). A first gate of the OS transistor 850 is connected to a wiring that supplies a signal SF. A second gate of the OS transistor 850 is connected to the wiring that supplies the voltage $V_{BG\_B}$ (or the voltage $V_{BG\_A}$).

Figure 58B:
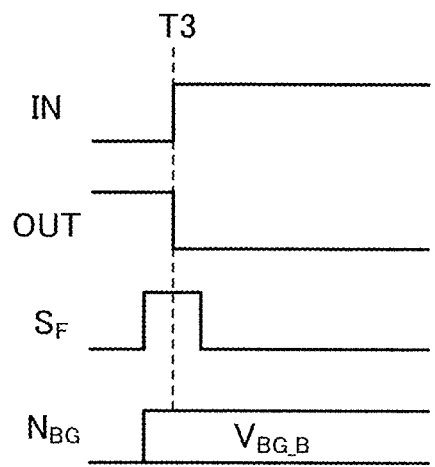

The operation with the circuit configuration in FIG. 58A is described with reference to a timing chart in FIG. 58B.

The voltage for controlling the threshold voltage of the OS transistor 810 is supplied to the second gate of the OS transistor 810 before time T3 at which the level of the signal supplied to the input 95 terminal IN is switched to a high level. The signal SF is set to a high level and the OS transistor 850 is turned on, so that the voltage $V_{BG\_B}$ for controlling the threshold voltage is supplied to a node $N_{BG}$.

The OS transistor 850 is turned off after the voltage of the node $N_{BG}$ becomes $V_{BG\_B}$. Since the off-state current of the OS transistor 850 is extremely low, the voltage $V_{BG\_B}$ held by the node $N_{BG}$ can be retained while the OS transistor 850 remains off and the node $N_{BG}$ is in a state that is very close to a floating state. Therefore, the number of times the voltage $V_{BG\_B}$ is supplied to the second gate of the OS transistor 850 can be reduced and accordingly, the power consumption for rewriting the voltage $V_{BG\_B}$ can be reduced.

Figure 59A:
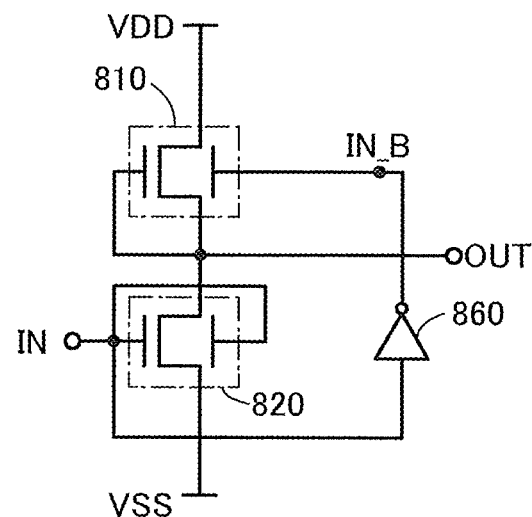

Although FIG. 56B and FIG. 58A each illustrate the case where the voltage is supplied to the second gate of the OS transistor 810 from the outside, a different structure may be employed in which voltage for controlling the threshold voltage is generated on the basis of the signal supplied to the input terminal IN and supplied to the second gate of the OS transistor 810, for example. FIG. 59A illustrates an example of such a circuit configuration.

The circuit configuration in FIG. 59A is the same as that in FIG. 56B, except that a CMOS inverter 860 is provided between the input terminal IN and the second gate of the OS transistor 810. An input terminal of the CMOS inverter 860 is connected to the input terminal IN. An output terminal of the CMOS inverter 860 is connected to the second gate of the OS transistor 810.

The operation with the circuit configuration in FIG. 59A is described with reference to a timing chart in FIG. 59B. The timing chart in FIG. 59B illustrates changes of a signal waveform of the input terminal IN, a signal waveform of the output terminal OUT, an output waveform IN_B of the CMOS inverter 860, and a threshold voltage of the OS transistor 810 (FET 810).

The output waveform IN_B which corresponds to a signal whose logic is inverted from the logic of the signal supplied to the input terminal IN can be used as a signal that controls the threshold voltage of the OS transistor 810. Thus, the threshold voltage of the OS transistor 810 can be controlled as described with reference to FIGS. 56A to 56C. For example, the signal supplied to the input terminal IN is at a high level and the OS transistor 820 is turned on at time T4 in FIG. 59B. At this time, the output waveform IN_B is at a low level. Accordingly, a current can be made less likely to flow in the OS transistor 810; thus, the voltage of the output terminal OUT can be sharply decreased.

Figure 59B:
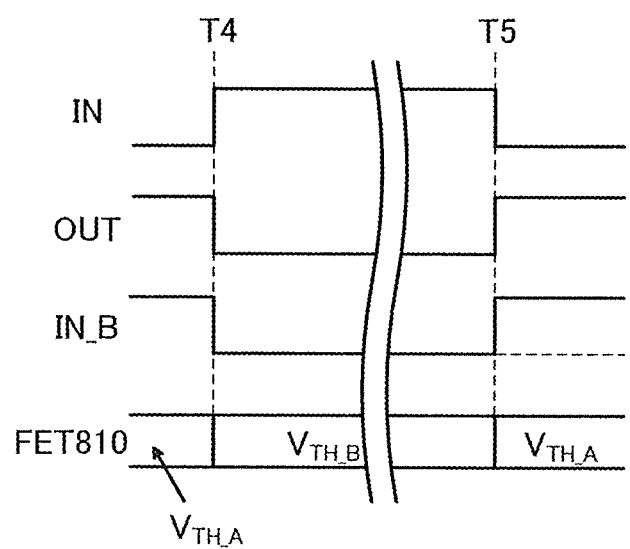

Moreover, the signal supplied to the input terminal IN is at a low level and the OS transistor 820 is turned off at time T5 in FIG. 59B. At this time, the output waveform IN_B is at a high level. Accordingly, a current can easily flow in the OS transistor 810; thus, a rise in the voltage of the output terminal OUT can be made steep.

As described above, in the configuration of the inverter including the OS transistor in this embodiment, the voltage of the back gate is switched in accordance with the logic of the signal supplied to the input terminal IN. In such a configuration, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

The structure described above in this embodiment can be combined with any of the structures described in the other embodiments as appropriate.

(Embodiment 6)

In this embodiment, examples of a semiconductor device which includes a plurality of circuits including OS transistors described in the above embodiment are described with reference to FIG. 60A to FIG. 66B.

Figure 60A:
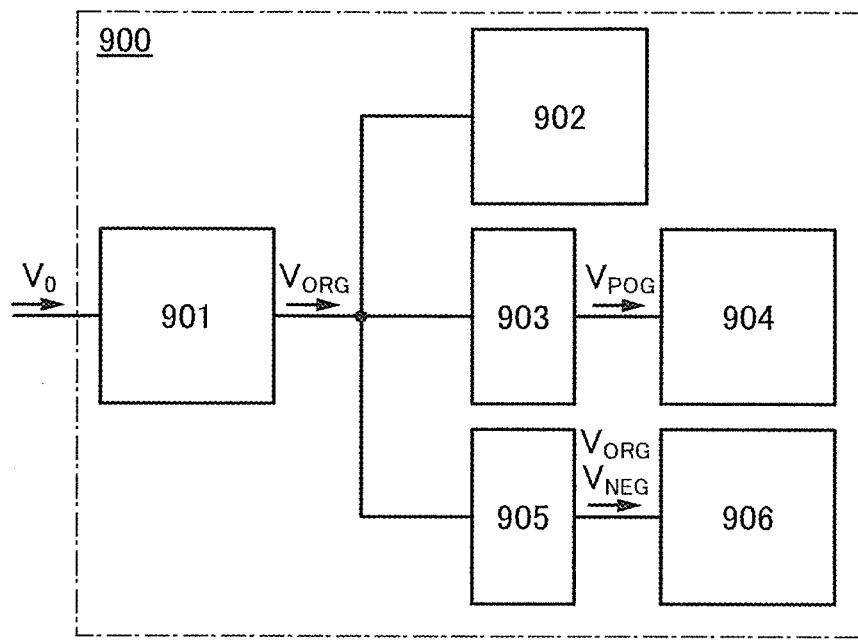

FIG. 60A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Thus, the semiconductor device 900 can operate without the supply of a plurality of power supply voltages from the outside.

The circuits 902, 904, and 906 operate with different power supply voltages. For example, the power supply voltage of the circuit 902 is applied on the basis of the voltage $V_{ORG}$ and the voltage $V_{SS}$ ($V_{ORG}>V_{SS}$). For example, the power supply voltage of the circuit 904 is applied on the basis of a voltage $V_{POG}$ and the voltage $V_{SS}$ ($V_{POG}>V_{ORG}$). For example, the power supply voltages of the circuit 906 are applied on the basis of the voltage $V_{ORG}$ and a voltage $V_{NEG}$ ($V_{ORG}>V_{SS}>V_{NEG}$). When the voltage $V_{SS}$ is equal to a ground potential (GND), the kinds of voltages generated in the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Thus, the semiconductor device 900 including the circuit 904 can operate on the basis of one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Thus, the semiconductor device 900 including the circuit 906 can operate on the basis of one power supply voltage supplied from the outside.

Figure 60B:
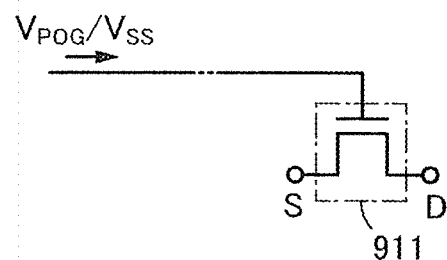
Figure 60C:
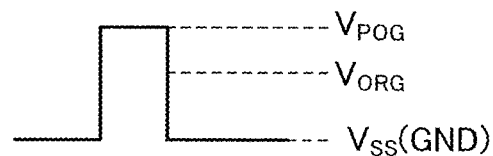

FIG. 60B illustrates an example of the circuit 904 that operates with the voltage $V_{POG}$ and FIG. 60C illustrates an example of a waveform of a signal for operating the circuit 904.

FIG. 60B illustrates a transistor 911. A signal supplied to a gate of the transistor 911 is generated on the basis of, for example, the voltage $V_{POG}$ and the voltage $V_{SS}$. The signal is generated on the basis of the voltage $V_{POG}$ at the time when the transistor 911 is turned on and on the basis of the voltage $V_{SS}$ at the time when the transistor 911 is turned off. As shown in FIG. 60C, the voltage $V_{POG}$ is higher than the voltage $V_{ORG}$. Thus, the operation for electrically connecting a source (S) and a drain (D) of the transistor 911 can be performed without fail. As a result, the frequency of malfunction of the circuit 904 can be reduced.

Figure 60D:
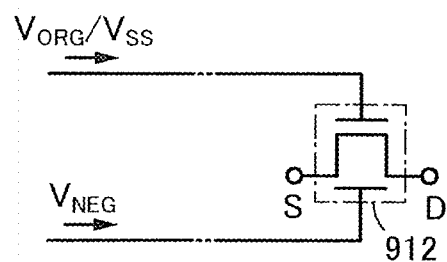
Figure 60E:
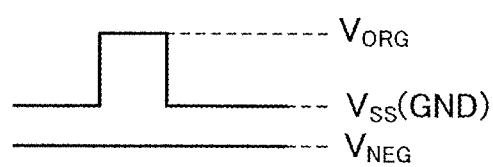

FIG. 60D illustrates an example of the circuit 906 that operates with the voltage $V_{ORG}$ and the voltage $V_{NEG}$ and FIG. 60E illustrates an example of a waveform of a signal for operating the circuit 906.

FIG. 60D illustrates a transistor 912 having a back gate. A signal supplied to a gate of the transistor 912 is generated on the basis of, for example, the voltage $V_{ORG}$ and the voltage $V_{SS}$. The signal has generated on the basis of the voltage $V_{ORG}$ at the time when the transistor 912 is turned on and on the basis of the voltage $V_{SS}$ at the time when the transistor 912 is turned off. A voltage supplied to the back gate of the transistor 912 is generated on the basis of the voltage $V_{NEG}$. As shown in FIG. 60E, the voltage $V_{NEG}$ is lower than the voltage $V_{SS}$ (GND). Therefore, the threshold voltage of the transistor 912 can be controlled so as to be shifted in the positive direction. Thus, the transistor 912 can be surely turned off and a current flowing between a source (S) and a drain (D) can be reduced. As a result, the frequency of malfunction of the circuit 906 can be reduced and power consumption thereof can be reduced.

The voltage $V_{NEG}$ may be directly supplied to the back gate of the transistor 912. Alternatively, a signal supplied to the gate of the transistor 912 may be generated on the basis of the voltage $V_{ORG}$ and the voltage $V_{NEG}$ and the generated signal may be supplied to the back gate of the transistor 912.

Figure 61A:
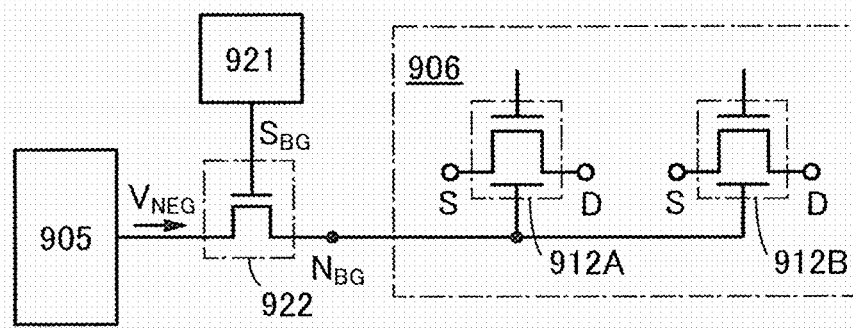
Figure 61B:
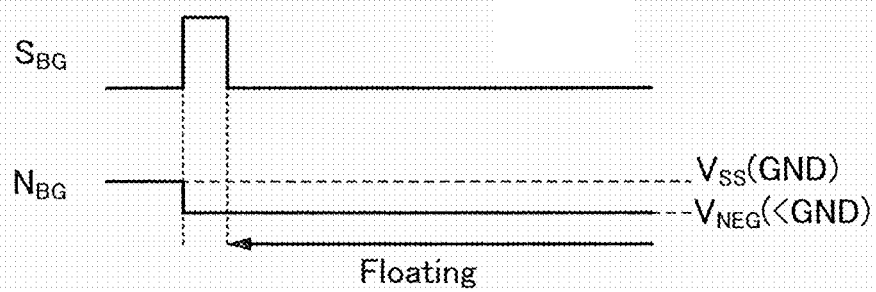

FIGS. 61A and 61B illustrate a modification example of FIGS. 60D and 60E.

In a circuit diagram illustrated in FIG. 61A, a transistor 922 whose conduction state can be controlled by a control circuit 921 is provided between the voltage generation circuit 905 and the circuit 906. The transistor 922 is an n-channel OS transistor. The control signal $S_{BG}$ output from the control circuit 921 is a signal for controlling the conduction state of the transistor 922. Transistors 912A and 912B included in the circuit 906 are the same OS transistors as the transistor 922.

A timing chart in FIG. 61B shows changes in a potential of the control signal $S_{BG}$ and a potential of the node $N_{BG}$. The potential of the node $N_{BG}$ indicates the states of potentials of back gates of the transistors 912A and 912B. When the control signal $S_{BG}$ is at a high level, the transistor 922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 922 is an OS transistor, its off-state current is small. Accordingly, even when the node $N_{BG}$ is in an electrically floating state, the voltage $V_{NEG}$ which has been supplied can be held.

Figure 62A:
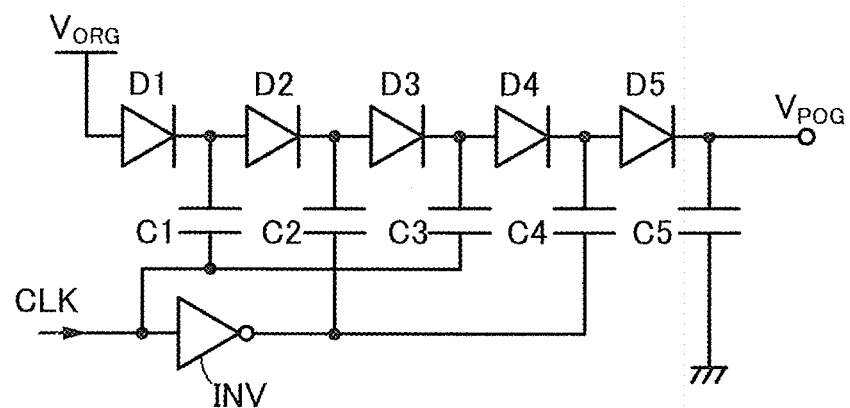

FIG. 62A illustrates an example of a circuit configuration applicable to the above-described voltage generation circuit 903. The voltage generation circuit 903 illustrated in FIG. 62A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{POG}$, which has been increased to a positive voltage having a positively quintupled value of the voltage $V_{ORG}$ by the clock signal CLK, can be obtained. Note that a forward voltage of the diodes D1 to D5 is 0 V. A desired voltage $V_{POG}$ can be obtained when the number of stages of the charge pump is changed.

Figure 62B:
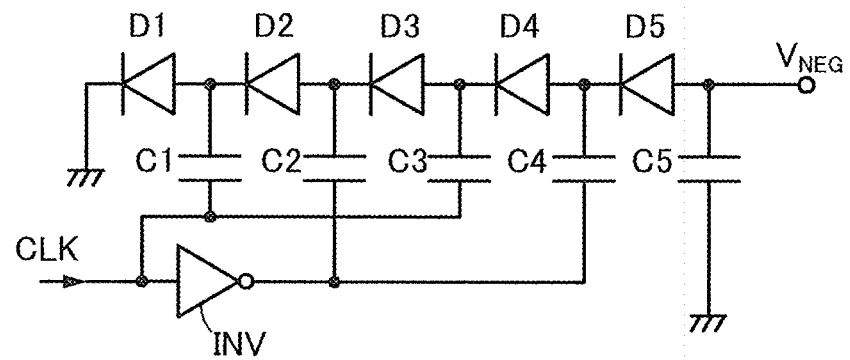

FIG. 62B illustrates an example of a circuit configuration applicable to the above-described voltage generation circuit 905. The voltage generation circuit 905 illustrated in FIG. 62B is a four-stage charge pump including the diodes D1 to D5, the capacitors C1 to C5, and the inverter INV. The clock signal CLK is supplied to the capacitors C1 to C5 directly or through the inverter INV. When a power supply voltage of the inverter INV is applied on the basis of the voltage $V_{ORG}$ and the voltage $V_{SS}$, the voltage $V_{NEG}$, which has been reduced from GND (i.e., the voltage $V_{SS}$) to a negative voltage having a negatively quadrupled value of the voltage $V_{ORG}$ by the clock signal CLK, can be obtained. Note that a forward voltage of the diodes D1 to D5 is 0 V. A desired voltage $V_{NEG}$ can be obtained when the number of stages of the charge pump is changed.

The circuit configuration of the voltage generation circuit 903 is not limited to the configuration of the circuit diagram illustrated in FIG. 62A. Modification examples of the voltage generation circuit 903 are shown in FIGS. 63A to 63C and FIGS. 64A and 64B.

Figure 63A:
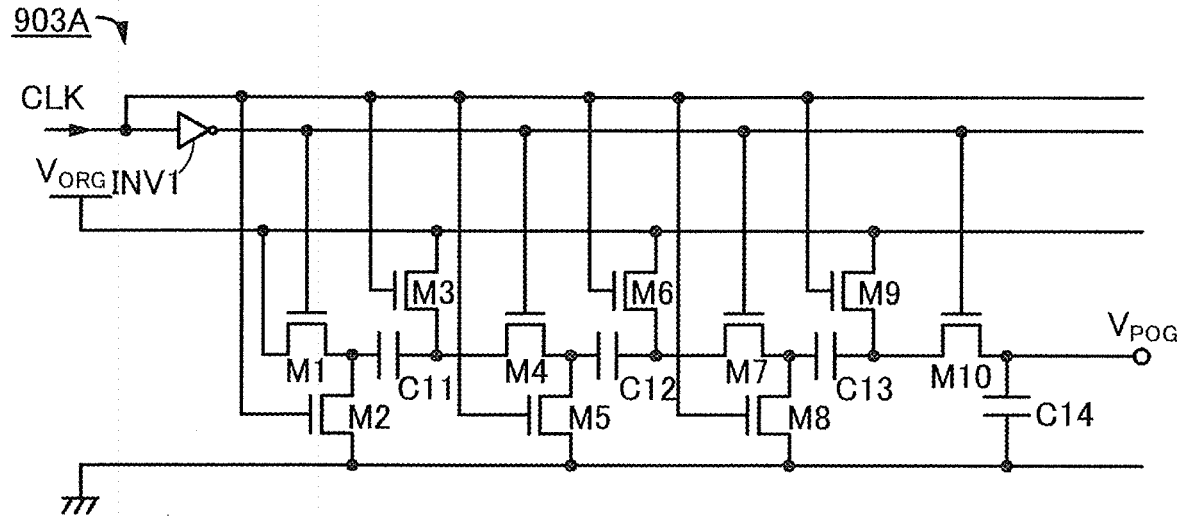

The voltage generation circuit 903A illustrated in FIG. 63A includes transistors M1 to M10, capacitors C11 to C14, and an inverter INV1. The clock signal CLK is supplied to gates of the transistors M1 to M10 directly or through the inverter INV1. By the clock signal CLK, the voltage $V_{POG}$, which has been increased to a positive voltage having a positively quadrupled value of the voltage $V_{ORG}$, can be obtained. A desired voltage $V_{POG}$ can be obtained when the number of stages is changed. In the voltage generation circuit 903A in FIG. 63A, off-state current of each of the transistors M1 to M10 can be low when the transistors M1 to M10 are OS transistors, and leakage of charge held in the capacitors C11 to C14 can be suppressed. Accordingly, raising from the voltage $V_{ORG}$ to the voltage $V_{POG}$ can be efficiently performed. In addition, since the OS transistor can have a large on-state current and a small subthreshold swing value, the operation speed can be improved.

Figure 63B:
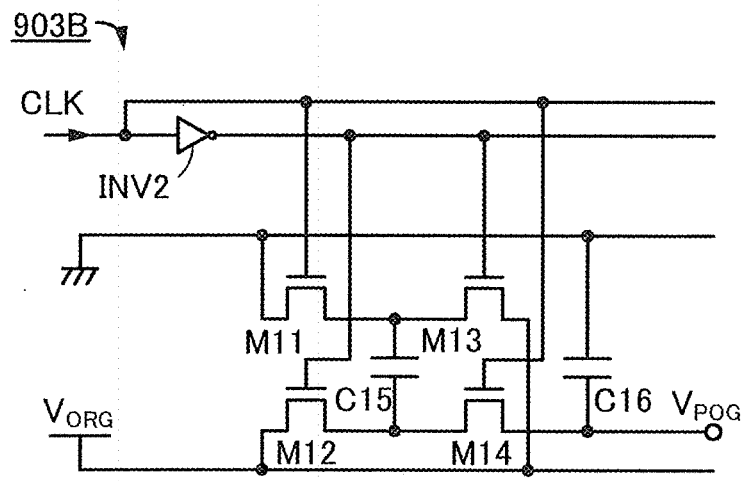

The voltage generation circuit 903B illustrated in FIG. 63B includes transistors M11 to M14, capacitors C15 and C16, and an inverter INV2. The clock signal CLK is supplied to gates of the transistors M11 to M14 directly or through the inverter INV2. By application of the clock signal CLK, the voltage $V_{POG}$, which has been increased to a positive voltage having a positively doubled value of the voltage $V_{ORG}$, can be obtained. In the voltage generation circuit 903B in FIG. 63B, off-state current of each of the transistors M11 to M14 can be low when the transistors M11 to M14 are OS transistors, and leakage of charge held in the capacitors C15 and C16 can be suppressed. Accordingly, raising from the voltage $V_{ORG}$ to the voltage $V_{POG}$ can be efficiently performed. In addition, since the OS transistor can have a large on-state current and a small subthreshold swing value, the operation speed can be improved.

Figure 63C:
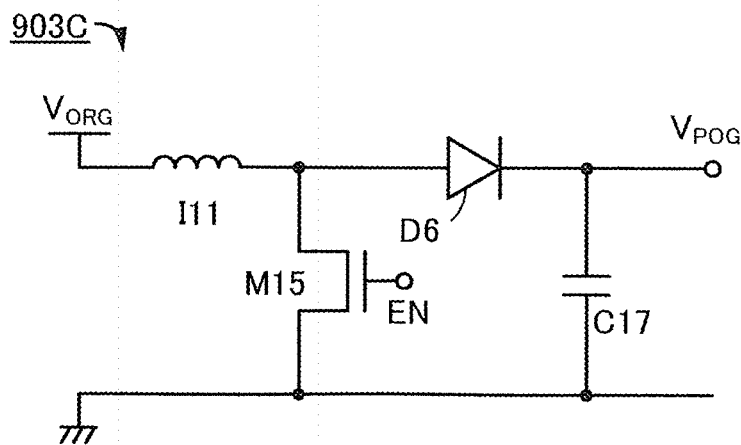

The voltage generation circuit 903C in FIG. 63C includes an inductor I11, a transistor M15, a diode D6, and a capacitor C17. The conduction state of the transistor M15 is controlled by a control signal EN. Owing to the control signal EN, the voltage $V_{POG}$ which is obtained by increasing the voltage $V_{ORG}$ can be obtained. Since the voltage generation circuit 903C in FIG. 63C increases the voltage using the inductor I11, the voltage can be increased efficiently.

Figure 64A:
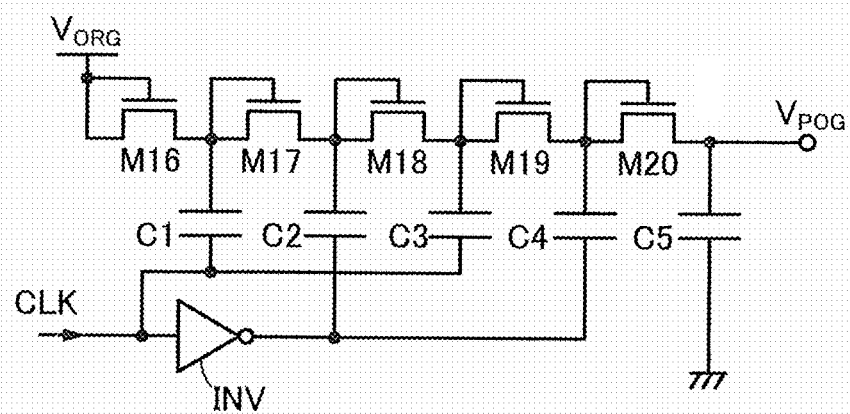

A voltage generation circuit 903D in FIG. 64A has a configuration in which the diodes D1 to D5 of the voltage generation circuit 903 in FIG. 62A are replaced with diode-connected transistors M16 to M20. In the voltage generation circuit 903D in FIG. 64A, when the OS transistors are used as the transistors M16 to M20, the off-state current can be reduced, so that leakage of charge held in the capacitors C1 to C5 can be inhibited. Thus, efficient voltage increase from the voltage $V_{ORG}$ to the voltage $V_{POG}$ is possible. In addition, since the OS transistor can have a large on-state current and a small subthreshold swing value, the operation speed can be improved.

Figure 64B:
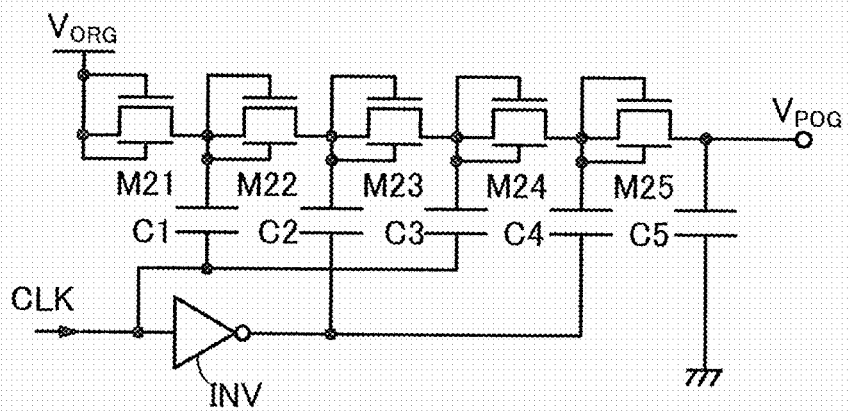
Figure 65A:
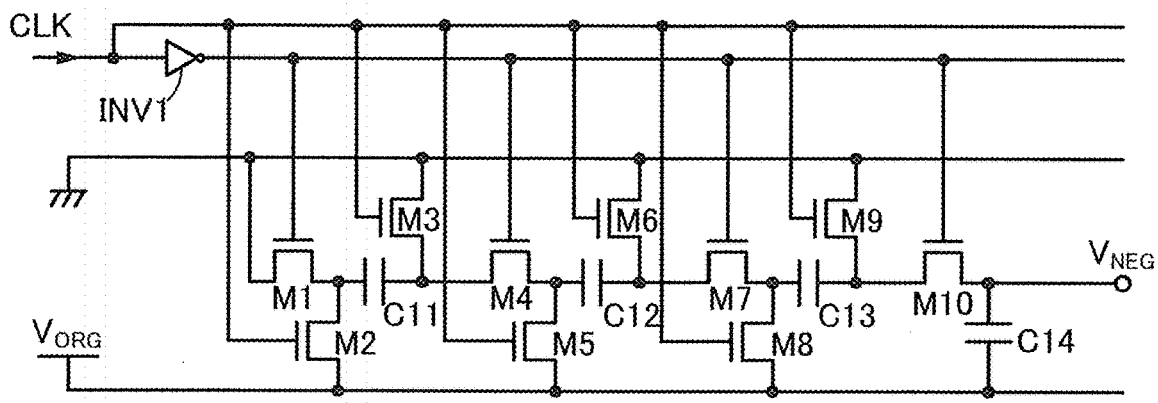
Figure 65B:
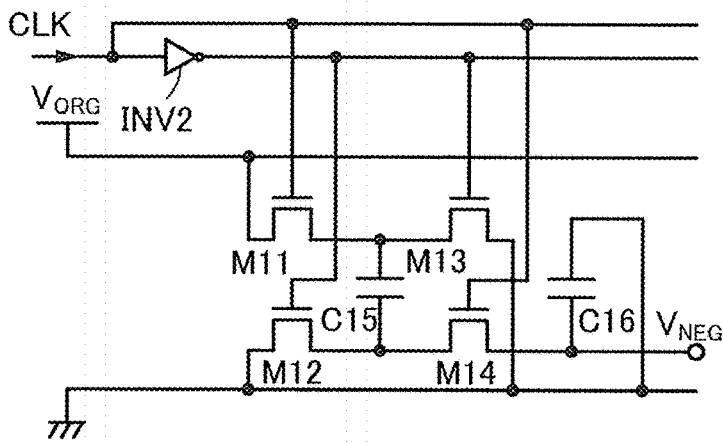
Figure 65C:
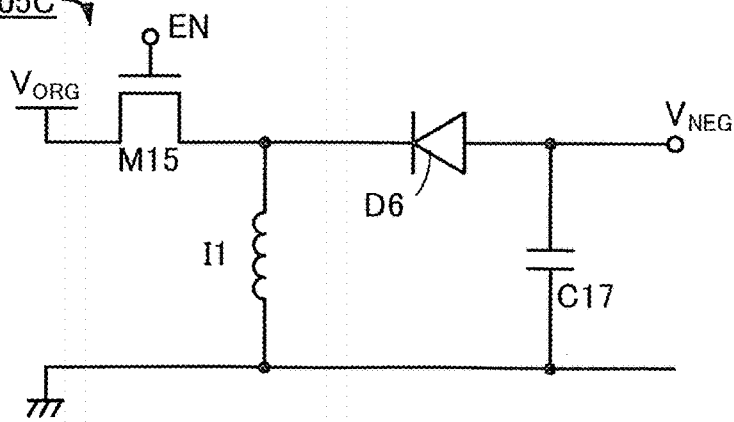
Figure 66A:
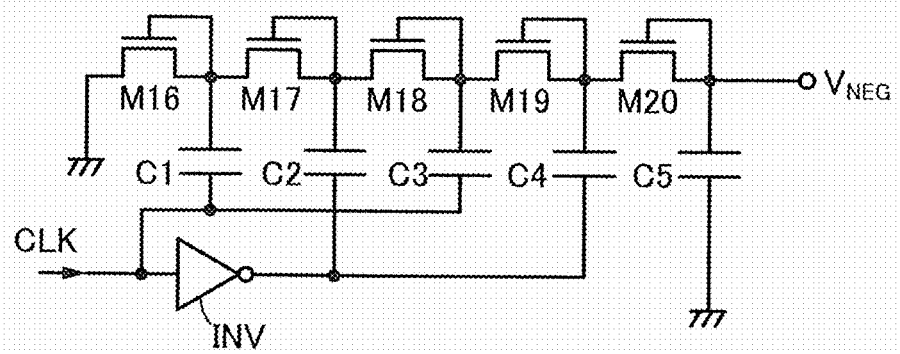
Figure 66B:
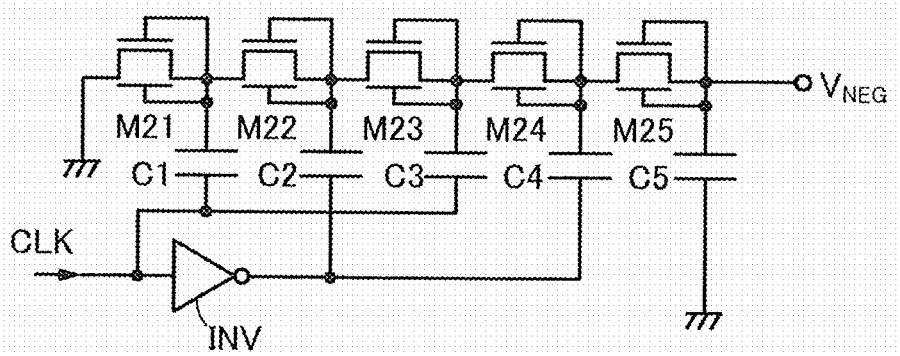

A voltage generation circuit 903E in FIG. 64B has a configuration in which the transistors M16 to M20 of the voltage generation circuit 903D in FIG. 64A are replaced with transistor M21 to M25 having back gates. In the voltage generation circuit 903E in FIG. 64B, the back gates can be supplied with voltages that are the same as those of the gates, so that the current flowing through the transistors can be increased. Thus, efficient voltage increase from the voltage $V_{ORG}$ to the voltage $V_{POG}$ is possible.

Note that the modification examples of the voltage generation circuit 903 can also be applied to the voltage generation circuit 905 in FIG. 62B. The configurations of a circuit diagram in this case are illustrated in FIGS. 65A to 65C and FIGS. 66A and 66B. In a voltage generation circuit 905A illustrated in FIG. 65A, the voltage $V_{NEG}$ which has been reduced from the voltage $V_{SS}$ to a negative voltage having a negatively tripled value of the voltage $V_{ORG}$ by the clock signal CLK, can be obtained. In a voltage generation circuit 905B illustrated in FIG. 65B, the voltage $V_{NEG}$ which has been reduced from the voltage $V_{SS}$ to a negative voltage having a negatively doubled value of the voltage $V_{ORG}$ by the clock signal CLK, can be obtained.

The voltage generation circuits 905A to 905E illustrated in FIGS. 65A to 65C and FIGS. 66A and 66B have configurations formed by changing the voltages applied to the wirings or the arrangement of the elements of the voltage generation circuits 903A to 903E illustrated in FIGS. 63A to 63C and FIGS. 64A and 64B. In the voltage generation circuits 905A to 905E illustrated in FIGS. 65A to 65C and FIGS. 66A and 66B, as in the voltage generation circuits 903A to 903E, an efficient voltage decrease from the voltage $V_{ORG}$ to the voltage $V_{NEG}$ is possible.

As described above, in any of the structures of this embodiment, a voltage required for circuits included in a semiconductor device can be internally generated. Thus, in the semiconductor device, the kinds of power supply voltages supplied from the outside can be reduced.

The structure described in this embodiment can be used as appropriate in combination with any of the structures described in the other embodiments.

(Embodiment 7)

In this embodiment, examples of CPUs including a semiconductor device such as the transistor of one embodiment of the present invention, the above-described memory device, and the like are described.

<Configuration of CPU>

Figure 67:
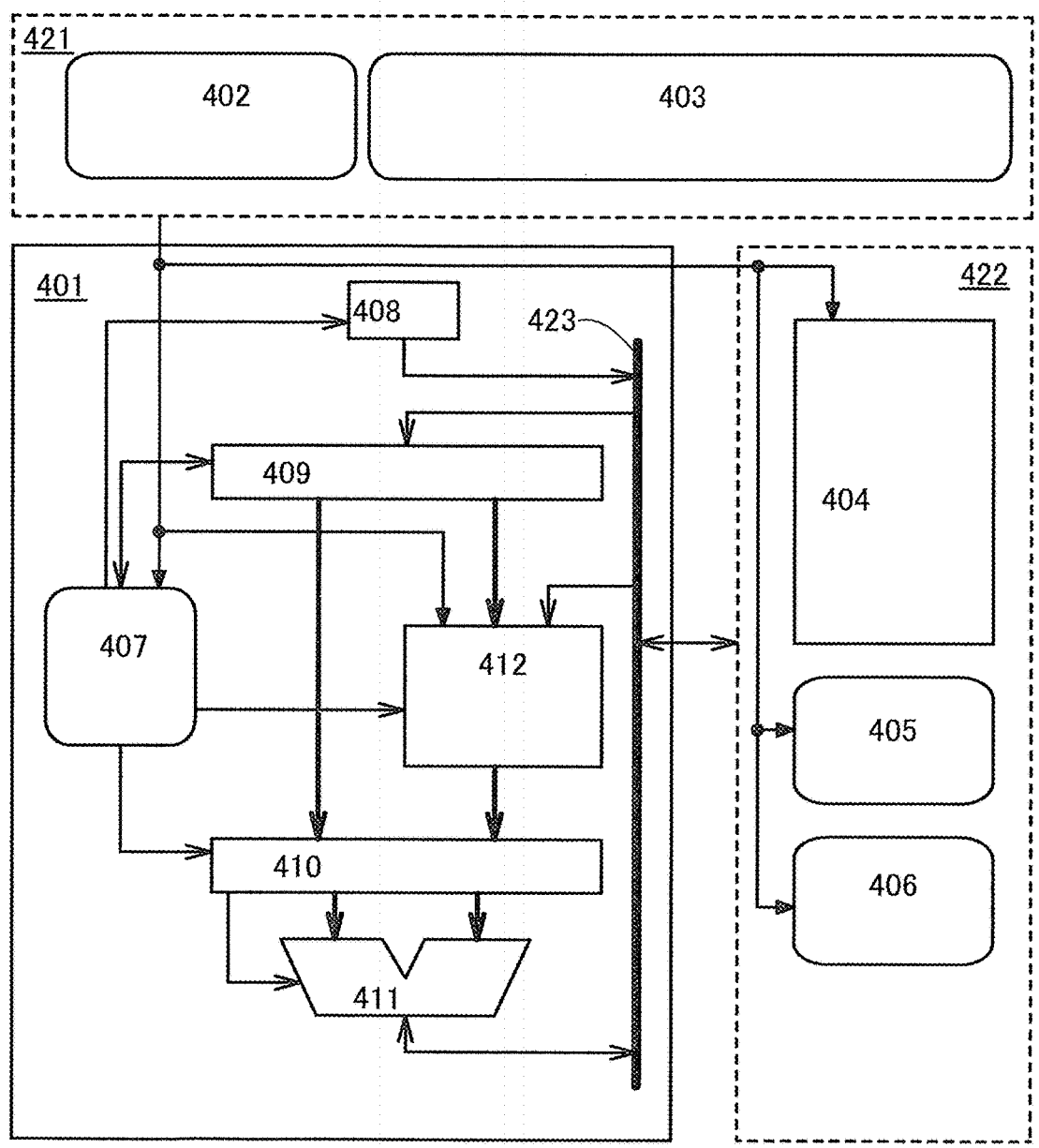

A semiconductor device 400 shown in FIG. 67 includes a CPU core 401, a power management unit 421, and a peripheral circuit 422. The power management unit 421 includes a power controller 402 and a power switch 403. The peripheral circuit 422 includes a cache 404 including cache memory, a bus interface (BUS I/F) 405, and a debug interface (Debug I/F) 406. The CPU core 401 includes a data bus 423, a control unit 407, a PC (program counter) 408, a pipeline register 409, a pipeline register 410, an ALU (arithmetic logic unit) 411, and a register file 412. Data is transmitted between the CPU core 401 and the peripheral circuit 422 such as the cache 404 via the data bus 423.

The semiconductor device (cell) can be used for many logic circuits typified by the power controller 402 and the control unit 407, particularly to all logic circuits that can be constituted using standard cells. Accordingly, the semiconductor device 400 can be small. The semiconductor device 400 can have reduced power consumption. The semiconductor device 400 can have a higher operating speed. The semiconductor device 400 can have a smaller power supply voltage variation.

When p-channel Si transistors and the transistor described in the above embodiment which includes an oxide semiconductor (preferably an oxide containing In, Ga, and Zn) in a channel formation region are used in the semiconductor device (cell) and the semiconductor device (cell) is used in the semiconductor device 400, the semiconductor device 400 can be small. The semiconductor device 400 can have reduced power consumption. The semiconductor device 400 can have a higher operating speed. Particularly when the Si transistors are only p-channel ones, the manufacturing cost can be reduced.

The control unit 407 has functions of totally controlling operations of the PC 408, the pipeline register 409, the pipeline register 410, the ALU 411, the register file 412, the cache 404, the bus interface 405, the debug interface 406, and the power controller 402 to decode and execute instructions contained in a program such as input applications.

The ALU 411 has a function of performing a variety of arithmetic operations such as four arithmetic operations and logic operations.

The cache 404 has a function of temporarily storing frequently-used data. The PC 408 is a register having a function of storing an address of an instruction to be executed next. Note that although not shown in FIG. 67, the cache 404 is provided with a cache controller for controlling the operation of the cache memory.

The pipeline register 409 has a function of temporarily storing instruction data.

The register file 412 includes a plurality of registers including a general purpose register and can store data that is read from the main memory, data obtained as a result of arithmetic operations in the ALU 411, or the like.

The pipeline register 410 has a function of temporarily storing data used for arithmetic operations of the ALU 411, data obtained as a result of arithmetic operations of the ALU 411, or the like.

The bus interface 405 has a function as a path for data between the semiconductor device 400 and various devices outside the semiconductor device 400. The debug interface 406 has a function as a path of a signal for inputting an instruction to control debugging to the semiconductor device 400.

The power switch 403 has a function of controlling supply of a power source voltage to various circuits included in the semiconductor device 400 other than the power controller 402. The above various circuits belong to several different power domains. The power switch 403 controls whether the power supply voltage is supplied to the various circuits in the same power domain. In addition, the power controller 402 has a function of controlling the operation of the power switch 403.

The semiconductor device 400 having the above structure is capable of performing power gating. A description will be given of an example of the power gating operation sequence.

First, by the CPU core 401, timing for stopping the supply of the power supply voltage is set in a register of the power controller 402. Then, an instruction of starting power gating is sent from the CPU core 401 to the power controller 402. Then, various registers and the cache 404 included in the semiconductor device 400 start data storing. Then, the power switch 403 stops the supply of a power supply voltage to the various circuits other than the power controller 402 included in the semiconductor device 400. Then, an interrupt signal is input to the power controller 402, whereby the supply of the power supply voltage to the various circuits included in the semiconductor device 400 is started. Note that a counter may be provided in the power controller 402 to be used to determine the timing of starting the supply of the power supply voltage regardless of input of an interrupt signal. Next, the various registers and the cache 404 start data recovery. Then, the instruction is resumed in the control unit 407.

Such power gating can be performed in the whole processor or one or a plurality of logic circuits forming the processor. Furthermore, power supply can be stopped even for a short time. Consequently, power gating can be performed finely in terms of a space or time.

In performing power gating, data held by the CPU core 401 or the peripheral circuit 422 is preferably restored in a short time. In that case, the power can be turned on or off in a short time, and an effect of saving power becomes significant.

In order that the data held by the CPU core 401 or the peripheral circuit 422 be restored in a short time, the data is preferably restored to a flip-flop circuit itself (referred to as a flip-flop circuit capable of backup operation). Furthermore, the data is preferably restored to an SRAM cell itself (referred to as an SRAM cell capable of backup operation). The flip-flop circuit and SRAM cell which are capable of backup operation preferably include transistors including an oxide semiconductor (preferably an oxide containing In, Ga, and Zn) in a channel formation region. Consequently, the transistor has a low off-state current; thus, the flip-flop circuit and SRAM cell which are capable of backup operation can retain data for a long time without power supply. When the transistor has a high switching speed, the flip-flop circuit and SRAM cell which are capable of backup operation can save and restore data in a short time in some cases.

Figure 68:
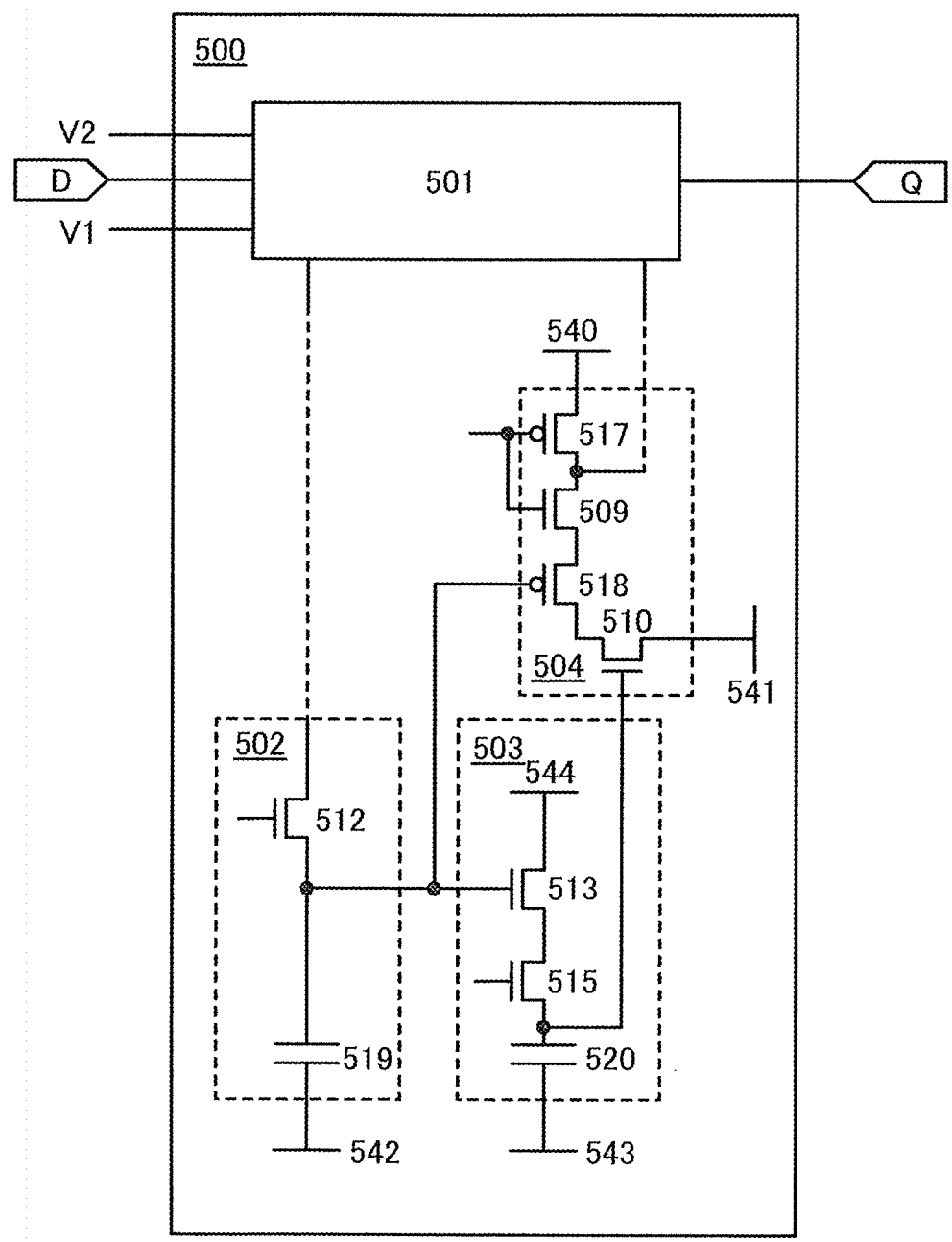

An example of the flip-flop circuit capable of backup operation is described using FIG. 68.

A semiconductor device 500 shown in FIG. 68 is an example of the flip-flop circuit capable of backup operation. The semiconductor device 500 includes a first memory circuit 501, a second memory circuit 502, a third memory circuit 503, and a read circuit 504. As a power supply voltage, a potential difference between a potential V1 and a potential V2 is supplied to the semiconductor device 500. One of the potential V1 and the potential V2 is at a high level, and the other is at a low level. An example of the structure of the semiconductor device 500 when the potential V1 is at a low level and the potential V2 is at a high level will be described below.

The first memory circuit 501 has a function of retaining data when a signal D including the data is input in a period during which the power supply voltage is supplied to the semiconductor device 500. Furthermore, the first memory circuit 501 outputs a signal Q including the retained data in the period during which the power supply voltage is supplied to the semiconductor device 500. On the other hand, the first memory circuit 501 cannot retain data in a period during which the power supply voltage is not supplied to the semiconductor device 500. That is, the first memory circuit 501 can be referred to as a volatile memory circuit.

The second memory circuit 502 has a function of reading the data held in the first memory circuit 501 to store (or restore) it. The third memory circuit 503 has a function of reading the data held in the second memory circuit 502 to store (or restore) it. The read circuit 504 has a function of reading the data held in the second memory circuit 502 or the third memory circuit 503 to store (or return) it in (to) the first memory circuit 501.

In particular, the third memory circuit 503 has a function of reading the data held in the second memory circuit 502 to store (or restore) it even in the period during which the power supply voltage is not supplied to the semiconductor device 500.

As shown in FIG. 68, the second memory circuit 502 includes a transistor 512 and a capacitor 519. The third memory circuit 503 includes a transistor 513, a transistor 515, and a capacitor 520. The read circuit 504 includes a transistor 510, a transistor 518, a transistor 509, and a transistor 517.

The transistor 512 has a function of charging and discharging the capacitor 519 in accordance with data held in the first memory circuit 501. The transistor 512 is desirably capable of charging and discharging the capacitor 519 at a high speed in accordance with data held in the first memory circuit 501. Specifically, the transistor 512 desirably contains crystalline silicon (preferably polycrystalline silicon, further preferably single crystal silicon) in a channel formation region.

The conduction state or the non-conduction state of the transistor 513 is determined in accordance with the charge held in the capacitor 519. The transistor 515 has a function of charging and discharging the capacitor 520 in accordance with the potential of a wiring 544 when the transistor 513 is in a conduction state. It is desirable that the off-state current of the transistor 515 be extremely low. Specifically, the transistor 515 desirably contains an oxide semiconductor (preferably an oxide containing In, Ga, and Zn) in a channel formation region.

Specific connection relations between the elements are described. One of a source electrode and a drain electrode of the transistor 512 is connected to the first memory circuit 501. The other of the source electrode and the drain electrode of the transistor 512 is connected to one electrode of the capacitor 519, a gate electrode of the transistor 513, and a gate electrode of the transistor 518. The other electrode of the capacitor 519 is connected to the wiring 542. One of a source electrode and a drain electrode of the transistor 513 is connected to the wiring 544. The other of the source electrode and the drain electrode of the transistor 513 is connected to one of a source electrode and a drain electrode of the transistor 515. The other of the source electrode and the drain electrode of the transistor 515 is connected to one electrode of the capacitor 520 and a gate electrode of the transistor 510. The other electrode of the capacitor 520 is connected to the wiring 543. One of a source electrode and a drain electrode of the transistor 510 is connected to a wiring 541. The other of the source electrode and the drain electrode of the transistor 510 is connected to one of a source electrode and a drain electrode of the transistor 518. The other of the source electrode and the drain electrode of the transistor 518 is connected to one of a source electrode and a drain electrode of the transistor 509. The other of the source electrode and the drain electrode of the transistor 509 is connected to one of a source electrode and a drain electrode of the transistor 517 and the first memory circuit 501. The other of the source electrode and the drain electrode of the transistor 517 is connected to a wiring 540. Furthermore, although a gate electrode of the transistor 509 is connected to a gate electrode of the transistor 517 in FIG. 68, the gate electrode of the transistor 509 is not necessarily connected to the gate electrode of the transistor 517.

The transistor described in the above embodiment as an example can be applied to the transistor 515. Because of the low off-state current of the transistor 515, the semiconductor device 500 can retain data for a long time without power supply. The favorable switching characteristics of the transistor 515 allow the semiconductor device 500 to perform high-speed backup and recovery.

The structure described in this embodiment can be used in appropriate combination with the structure described in any of the other embodiments.

(Embodiment 8)

In this embodiment, an example of an imaging device including the transistor or the like of one embodiment of the present invention will be described.

<Imaging Device>

An imaging device of one embodiment of the present invention is described below.

Figure 69A:
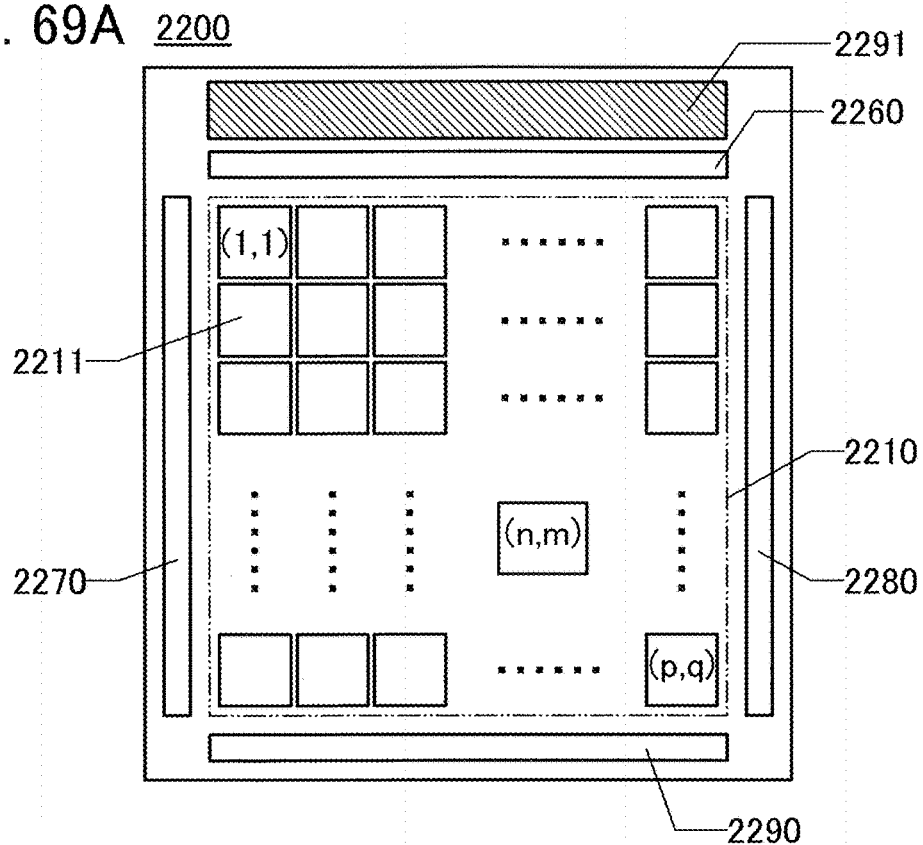

FIG. 69A is a plan view illustrating an example of an imaging device 2200 of one embodiment of the present invention. The imaging device 2200 includes a pixel portion 2210 and peripheral circuits for driving the pixel portion 2210 (a peripheral circuit 2260, a peripheral circuit 2270, a peripheral circuit 2280, and a peripheral circuit 2290). The pixel portion 2210 includes a plurality of pixels 2211 arranged in a matrix with p rows and q columns (p and q are each an integer of 2 or more). The peripheral circuit 2260, the peripheral circuit 2270, the peripheral circuit 2280, and the peripheral circuit 2290 are each connected to the plurality of pixels 2211, and a signal for driving the plurality of pixels 2211 is supplied. In this specification and the like, in some cases, a "peripheral circuit" or a "driver circuit" indicate all of the peripheral circuit 2260, the peripheral circuit 2270, the peripheral circuit 2280, and the peripheral circuit 2290. For example, the peripheral circuit 2260 can be regarded as part of the peripheral circuit.

The imaging device 2200 preferably includes a light source 2291. The light source 2291 can emit detection light P1.

The peripheral circuit includes at least one of a logic circuit, a switch, a buffer, an amplifier circuit, and a converter circuit. The peripheral circuit may be formed over a substrate where the pixel portion 2210 is formed. A semiconductor device such as an IC chip may be used as part or the whole of the peripheral circuit. Note that as the peripheral circuit, one or more of the peripheral circuit 2260, the peripheral circuit 2270, the peripheral circuit 2280, and the peripheral circuit 2290 may be omitted.

Figure 69B:
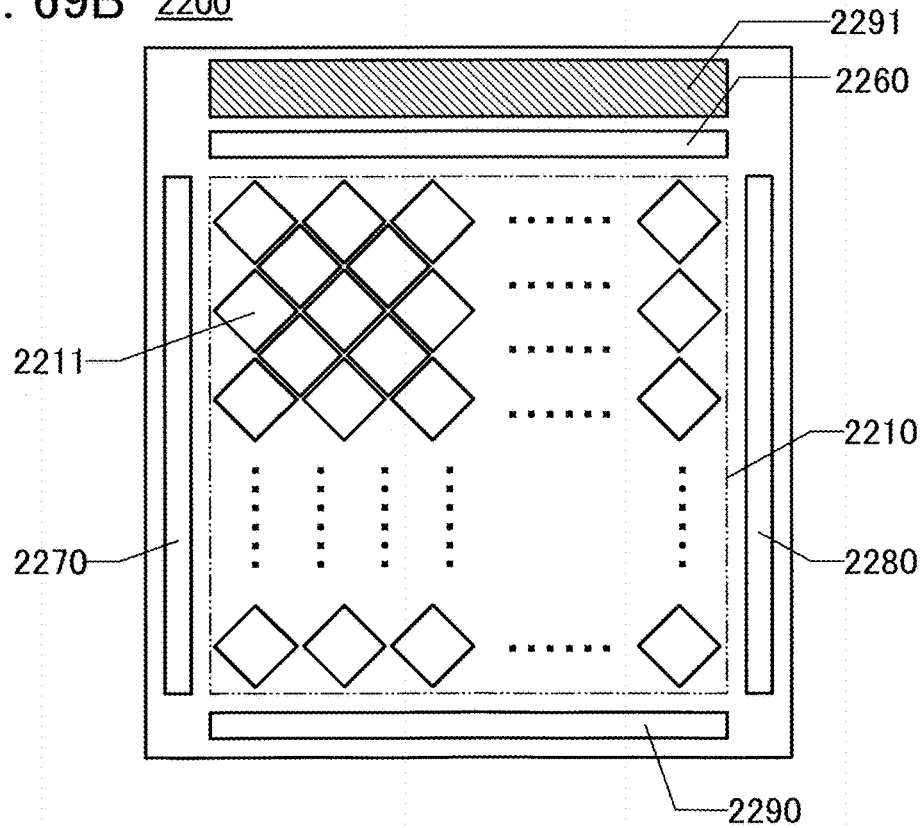

As illustrated in FIG. 69B, the pixels 2211 may be provided to be inclined in the pixel portion 2210 included in the imaging device 2200. When the pixels 2211 are obliquely arranged, the distance between pixels (pitch) can be shortened in the row direction and the column direction. Accordingly, the quality of an image taken with the imaging device 2200 can be improved.

<Configuration Example 1 of Pixel>

The pixel 2211 included in the imaging device 2200 is formed with a plurality of subpixels 2212, and each subpixel 2212 is combined with a filter (color filter) which transmits light in a specific wavelength band, whereby data for achieving color image display can be obtained.

Figure 70A:
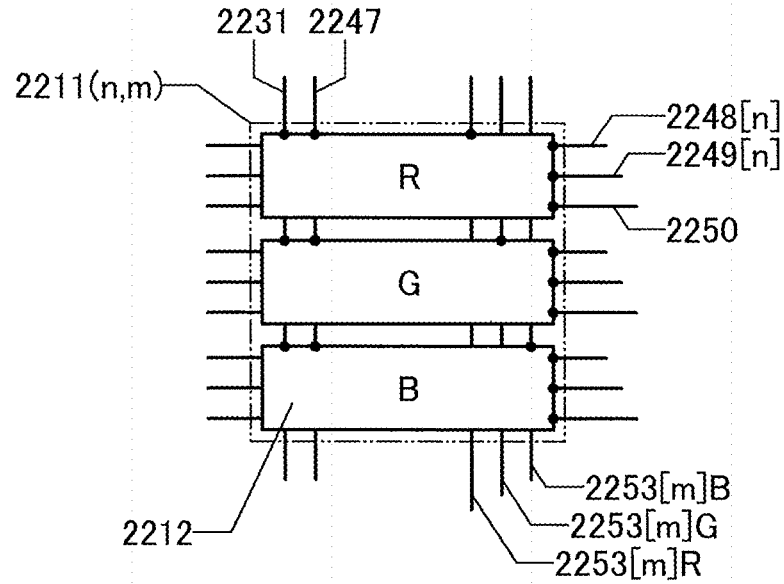

FIG. 70A is a plan view illustrating an example of the pixel 2211 with which a color image is obtained. The pixel 2211 illustrated in FIG. 70A includes a subpixel 2212 provided with a color filter that transmits light in a red (R) wavelength band (also referred to as a subpixel 2212R), a subpixel 2212 provided with a color filter that transmits light in a green (G) wavelength band (also referred to as a subpixel 2212G), and a subpixel 2212 provided with a color filter that transmits light in a blue (B) wavelength band (also referred to as a subpixel 2212B). The subpixel 2212 can function as a photosensor.

The subpixel 2212 (the subpixel 2212R, the subpixel 2212G, and the subpixel 2212B) is electrically connected to a wiring 2231, a wiring 2247, a wiring 2248, a wiring 2249, and a wiring 2250. In addition, the subpixel 2212R, the subpixel 2212G, and the subpixel 2212B are connected to respective wirings 2253 which are independently provided.

In this specification and the like, for example, the wiring 2248 and the wiring 2249 that are connected to the pixel 2211 in the n-th row are referred to as a wiring 2248[n] and a wiring 2249[n]. For example, the wiring 2253 connected to the pixel 2211 in the m-th column is referred to as a wiring 2253[m]. Note that in FIG. 70A, the wirings 2253 connected to the subpixel 2212R, the subpixel 2212G, and the subpixel 2212B in the pixel 2211 in the m-th column are referred to as a wiring 2253[m]R, a wiring 2253[m]G, and a wiring 2253[m]B. The subpixels 2212 are electrically connected to the peripheral circuit through the above wirings.

Figure 70B:
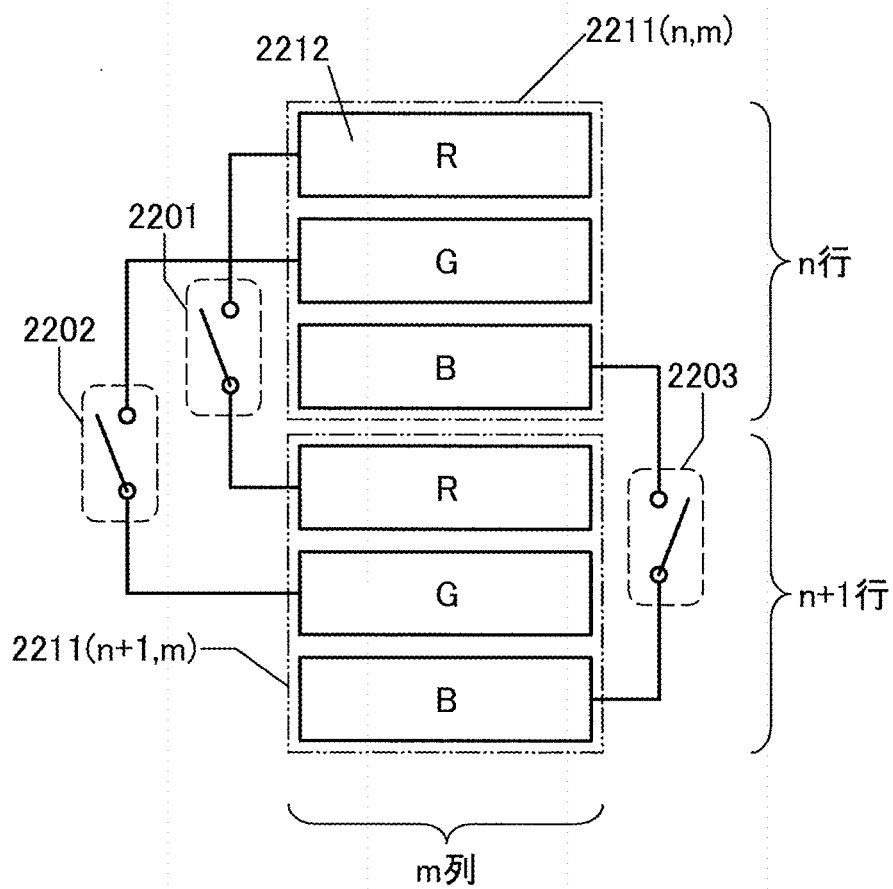

The imaging device 2200 has a structure in which the subpixel 2212 is electrically connected to the subpixel 2212 in an adjacent pixel 2211 which is provided with a color filter transmitting light in the same wavelength band as the subpixel 2212, via a switch. FIG. 70B illustrates a connection example of the subpixels 2212: the subpixel 2212 in the pixel 2211 arranged in the n-th (n is an integer greater than or equal to 1 and less than or equal to p) row and the m-th (m is an integer greater than or equal to 1 and less than or equal to q) column and the subpixel 2212 in the adjacent pixel 2211 arranged in an (n+1)-th row and the m-th column. In FIG. 70B, the subpixel 2212R arranged in the n-th row and the m-th column and the subpixel 2212R arranged in the (n+1)-th row and the m-th column are connected to each other via a switch 2201. The subpixel 2212G arranged in the n-th row and the m-th column and the subpixel 2212G arranged in the (n+1)-th row and the m-th column are connected to each other via a switch 2202. The subpixel 2212B arranged in the n-th row and the m-th column and the subpixel 2212B arranged in the (n+1)-th row and the m-th column are connected to each other via a switch 2203.

The color filter used in the subpixel 2212 is not limited to red (R), green (G), and blue (B) color filters, and color filters that transmit light of cyan (C), yellow (Y), and magenta (M) may be used. By provision of the subpixels 2212 that sense light in three different wavelength bands in one pixel 2211, a full-color image can be obtained.

The pixel 2211 including the subpixel 2212 provided with a color filter transmitting yellow (Y) light may be provided, in addition to the subpixels 2212 provided with the color filters transmitting red (R), green (G), and blue (B) light. The pixel 2211 including the subpixel 2212 provided with a color filter transmitting blue (B) light may be provided, in addition to the subpixels 2212 provided with the color filters transmitting cyan (C), yellow (Y), and magenta (M) light. When the subpixels 2212 sensing light in four different wavelength bands are provided in one pixel 2211, the reproducibility of colors of an obtained image can be increased.

For example, in FIG. 70A, in regard to the subpixel 2212 sensing light in a red wavelength band, the subpixel 2212 sensing light in a green wavelength band, and the subpixel 2212 sensing light in a blue wavelength band, the pixel number ratio (or the light receiving area ratio) thereof is not necessarily 1:1:1. For example, the Bayer arrangement in which the pixel number ratio (the light receiving area ratio) of red to green and blue is 1:2:1 may be employed. Alternatively, the pixel number ratio (the light receiving area ratio) of red and green to blue may be 1:6:1.

Although the number of subpixels 2212 provided in the pixel 2211 may be one, two or more subpixels are preferably provided. For example, when two or more subpixels 2212 sensing light in the same wavelength band are provided, the redundancy is increased, and the reliability of the imaging device 2200 can be increased.

When an IR (IR: Infrared) filter that transmits infrared light and absorbs or reflects visible light is used as the filter, the imaging device 2200 that senses infrared light can be achieved.

Furthermore, when an ND (ND: Neutral Density) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 2211 may be provided with a lens. An arrangement example of the pixel 2211, a filter 2254, and a lens 2255 is described with cross-sectional views in FIGS. 71A and 71B. With the lens 2255, the photoelectric conversion element can receive incident light efficiently. Specifically, as illustrated in FIG. 71A, light 2256 enters a photoelectric conversion element 2220 through the lens 2255, the filter 2254 (a filter 2254R, a filter 2254G, and a filter 2254B), a pixel circuit 2230, and the like which are provided in the pixel 2211.

As indicated by a region surrounded with dashed dotted lines, however, part of the light 2256 indicated by arrows might be blocked by some wirings 2257. Thus, a preferable structure is such that the lens 2255 and the filter 2254 are provided on the photoelectric conversion element 2220 side as illustrated in FIG. 71B, whereby the photoelectric conversion element 2220 can efficiently receive the light 2256. When the light 2256 enters the photoelectric conversion element 2220 from the photoelectric conversion element 2220 side, the imaging device 2200 with high sensitivity can be provided.

Figure 71A:
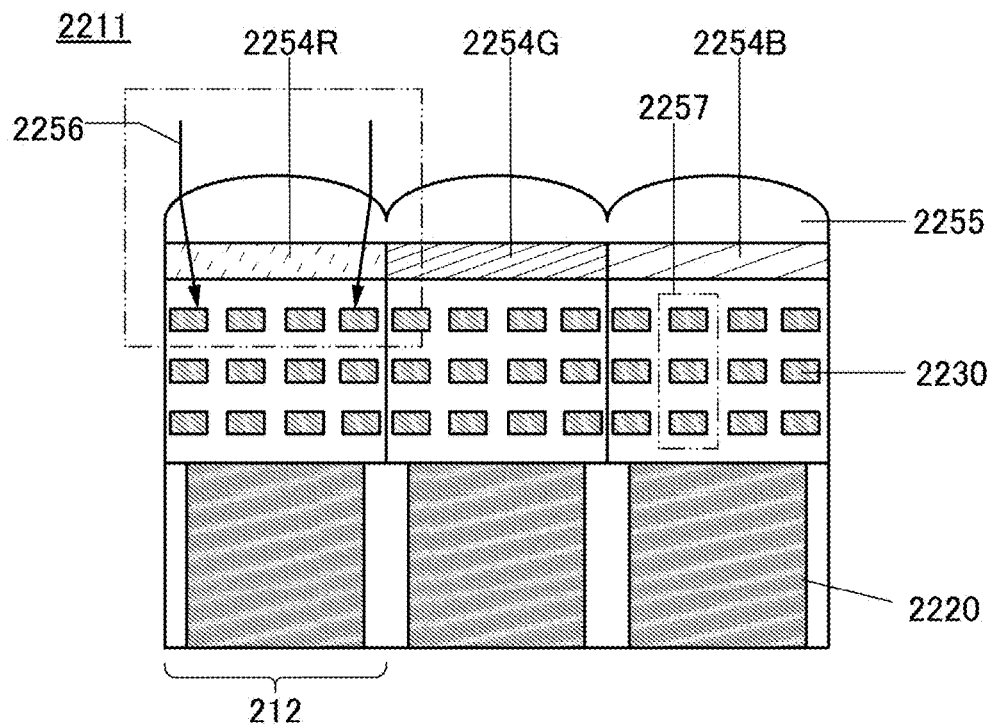
Figure 71B:
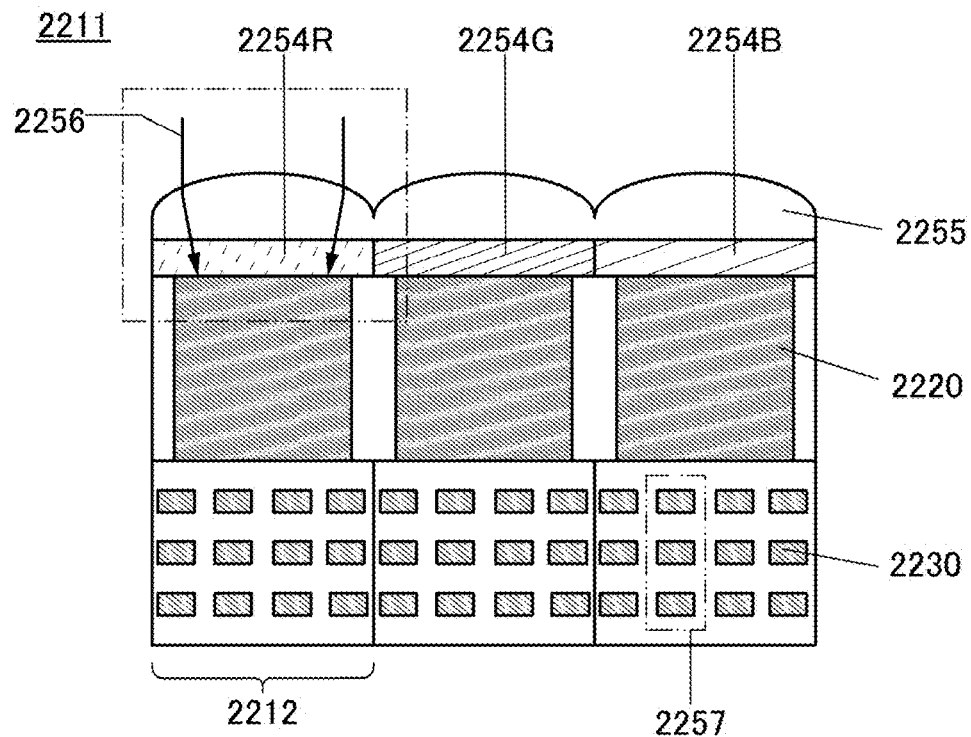

As the photoelectric conversion element 2220 illustrated in FIGS. 71A and 71B, a photoelectric conversion element in which a pn junction or a pin junction is formed may be used.

The photoelectric conversion element 2220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and a cadmium zinc alloy.

For example, when selenium is used for the photoelectric conversion element 2220, the photoelectric conversion element 2220 can have a light absorption coefficient in a wide wavelength band, such as visible light, ultraviolet light, infrared light, X-rays, and gamma rays.

One pixel 2211 included in the imaging device 2200 may include the subpixel 2212 with a first filter in addition to the subpixel 2212 illustrated in FIGS. 70A and 70B.

<Configuration Example 2 of Pixel>

An example of a pixel including a transistor including silicon and a transistor including an oxide semiconductor is described below. A transistor similar to any of the transistors described in the above embodiment can be used as each of the transistors.

Figure 72:
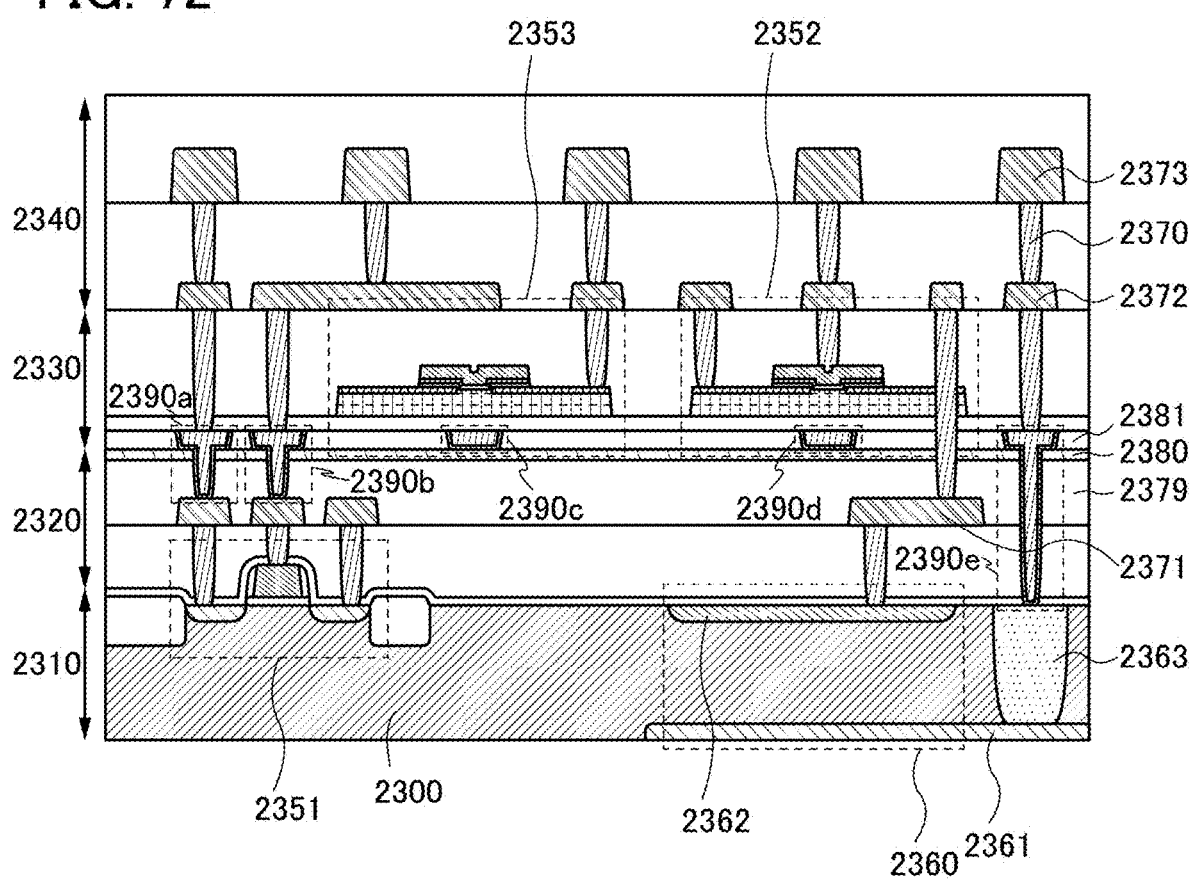

FIG. 72 is a cross-sectional view of an element included in an imaging device. The imaging device illustrated in FIG. 72 includes a transistor 2351 including silicon over a silicon substrate 2300, a transistor 2352 and a transistor 2353 which include an oxide semiconductor and are stacked over the transistor 2351, and a photodiode 2360 provided in the silicon substrate 2300. The transistors and the photodiode 2360 are electrically connected to various plugs 2370 and wirings 2371. In addition, an anode 2361 of the photodiode 2360 is electrically connected to the plug 2370 through a low-resistance region 2363.

The imaging device includes a layer 2310 including the transistor 2351 provided on the silicon substrate 2300 and the photodiode 2360 provided in the silicon substrate 2300, a layer 2320 which is in contact with the layer 2310 and includes the wirings 2371, a layer 2330 which is in contact with the layer 2320 and includes the transistor 2352 and the transistor 2353, and a layer 2340 which is in contact with the layer 2330 and includes wirings 2372 and wirings 2373.

In the example of the cross-sectional view in FIG. 72, a light-receiving surface of the photodiode 2360 is provided on the side opposite to a surface of the silicon substrate 2300 where the transistor 2351 is formed. With this structure, a light path can be secured without an influence of the transistors and the wirings. Thus, a pixel with a high aperture ratio can be formed. Note that the light-receiving surface of the photodiode 2360 can be the same as the surface where the transistor 2351 is formed.

In the case where a pixel is formed with use of only transistors including an oxide semiconductor, the layer 2310 may include the transistor including an oxide semiconductor. Alternatively, the layer 2310 may be omitted, and the pixel may include only transistors including an oxide semiconductor.

Note that the silicon substrate 2300 may be an SOI substrate. Furthermore, the silicon substrate 2300 can be replaced with a substrate made of germanium, silicon germanium, silicon carbide, gallium arsenide, aluminum gallium arsenide, indium phosphide, gallium nitride, or an organic semiconductor.

Here, an insulator 2380 is provided between the layer 2310 including the transistor 2351 and the photodiode 2360 and the layer 2330 including the transistor 2352 and the transistor 2353. However, there is no limitation on the position of the insulator 2380. An insulator 2379 is provided under the insulator 2380, and an insulator 2381 is provided over the insulator 2380.

A conductor 2390a, a conductor 2390b, a conductor 2390c, a conductor 2390d, and a conductor 2390e are provided in openings formed in the insulators 2379 to 2381. The conductor 2390a, the conductor 2390b, and the conductor 2390e function as plugs and wirings. The conductor 390c functions as a back gate of the transistor 2353. The conductor 2390d functions as a back gate of the transistor 2352.

Hydrogen in an insulator provided in the vicinity of a channel formation region of the transistor 2351 terminates dangling bonds of silicon; accordingly, the reliability of the transistor 2351 can be improved. In contrast, hydrogen in the insulator provided in the vicinity of the transistor 2352, the transistor 2353, and the like becomes one of factors generating a carrier in the oxide semiconductor. Thus, the hydrogen may cause a reduction of the reliability of the transistor 2352, the transistor 2353, and the like. For this reason, in the case where the transistor including an oxide semiconductor is provided over the transistor including a silicon-based semiconductor, it is preferable that the insulator 2380 having a function of blocking hydrogen be provided between the transistors. When the hydrogen is confined in layers below the insulator 2380, the reliability of the transistor 2351 can be improved. In addition, the hydrogen can be prevented from diffusing from the layers below the insulator 2380 to layers above the insulator 2380; thus, the reliability of the transistor 2352, the transistor 2353, and the like can be increased. The conductor 2390a, the conductor 2390b, and the conductor 2390e can prevent hydrogen from diffusing to the layers provided thereover through the via holes formed in the insulator 2380, resulting in improvement in the reliability of the transistor 2352, the transistor 2353, and the like.

In the cross-sectional view in FIG. 72, the photodiode 2360 in the layer 2310 and the transistor in the layer 2330 can be formed so as to overlap with each other. Thus, the degree of integration of pixels can be increased. In other words, the resolution of the imaging device can be increased.

Part or the whole of the imaging device may be bent. The bent imaging device enables the curvature of field and astigmatism to be reduced. Thus, the optical design of lens and the like, which is used in combination of the imaging device, can be facilitated. For example, the number of lenses used for aberration correction can be reduced; accordingly, a reduction in size or weight of electronic devices using the imaging device, and the like, can be achieved. In addition, the quality of a captured image can be improved.

The structure described in this embodiment can be used in appropriate combination with the structure described in any of the other embodiments.

(Embodiment 9)

In this embodiment, a semiconductor wafer and a chip each including the semiconductor device of one embodiment of the present invention and an electronic component including the chip are described.

<Semiconductor Wafer and Chip>

Figure 73A:
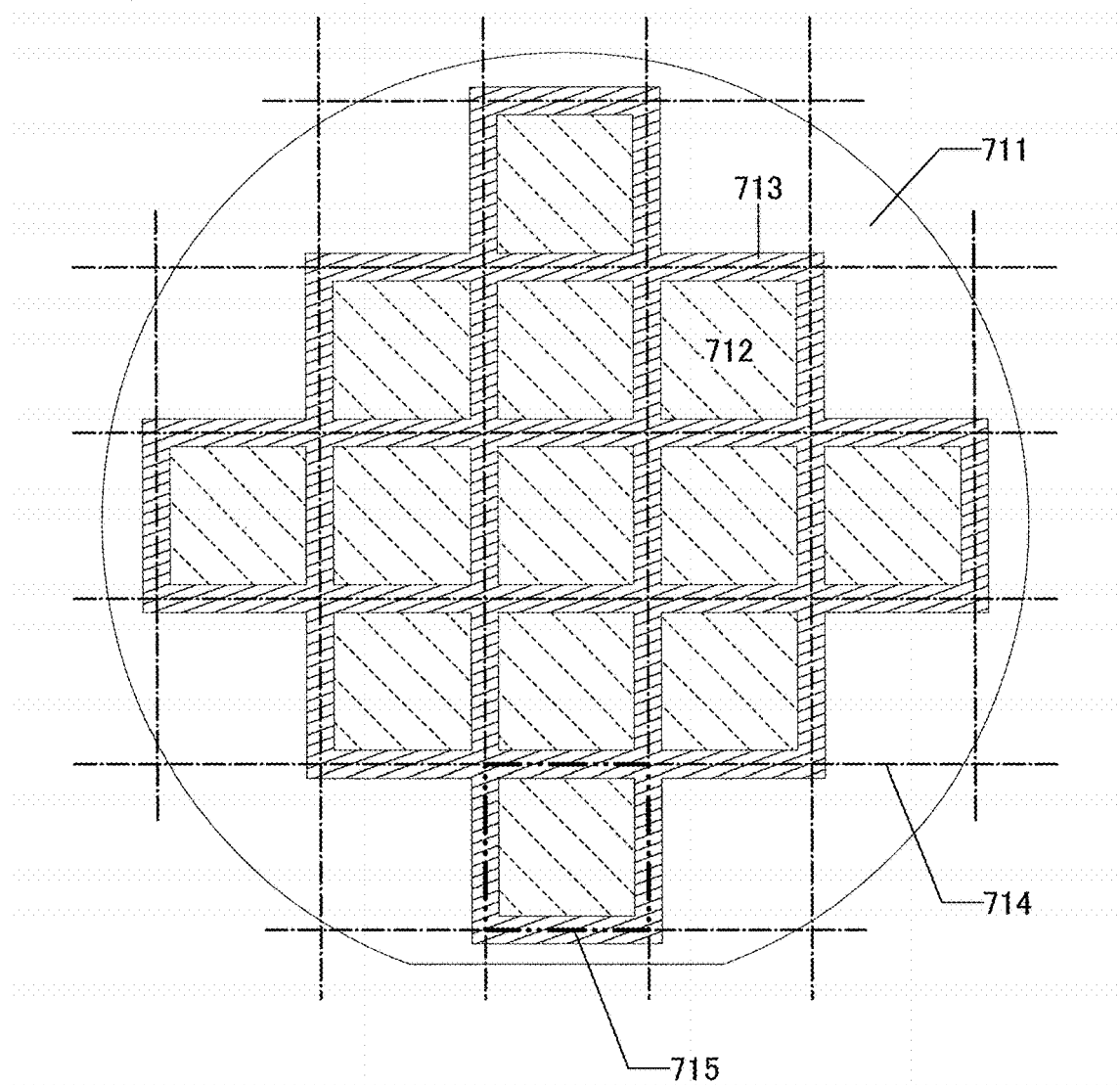

FIG. 73A is a top view illustrating a substrate 711 before dicing treatment. As the substrate 711, a semiconductor substrate (also referred to as a "semiconductor wafer") can be used, for example. A plurality of circuit regions 712 are provided over the substrate 711. The semiconductor device according to one embodiment of the present invention, a CPU, an RF tag, an image sensor, or the like can be provided in the circuit region 712.

Figure 73B:
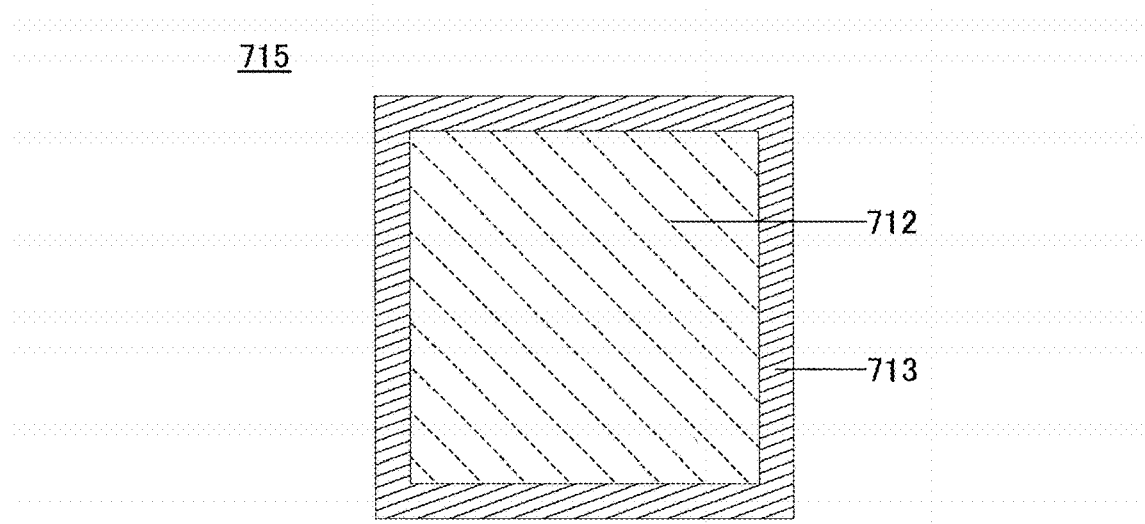

The plurality of circuit regions 712 are each surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 73B is an enlarged view of the chip 715.

A conductive layer or a semiconductor layer may be provided in the separation regions 713. Providing a conductive layer or a semiconductor layer in the separation regions 713 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 713 allows a reduction in the usage of the pure water. Therefore, the cost of manufacturing semiconductor devices can be reduced. Thus, semiconductor devices can be manufactured with improved productivity.

For a semiconductor layer provided in the separation regions 713, a material having a band gap greater than or equal to 2.5 eV and less than or equal to 4.2 eV, preferably greater than or equal to 2.7 eV and less than or equal to 3.5 eV is preferably used. The use of such a material allows accumulated charges to be released slowly; thus, the rapid move of charges due to ESD can be suppressed and electrostatic breakdown is less likely to occur.

<Electronic Component>

Figure 74A:
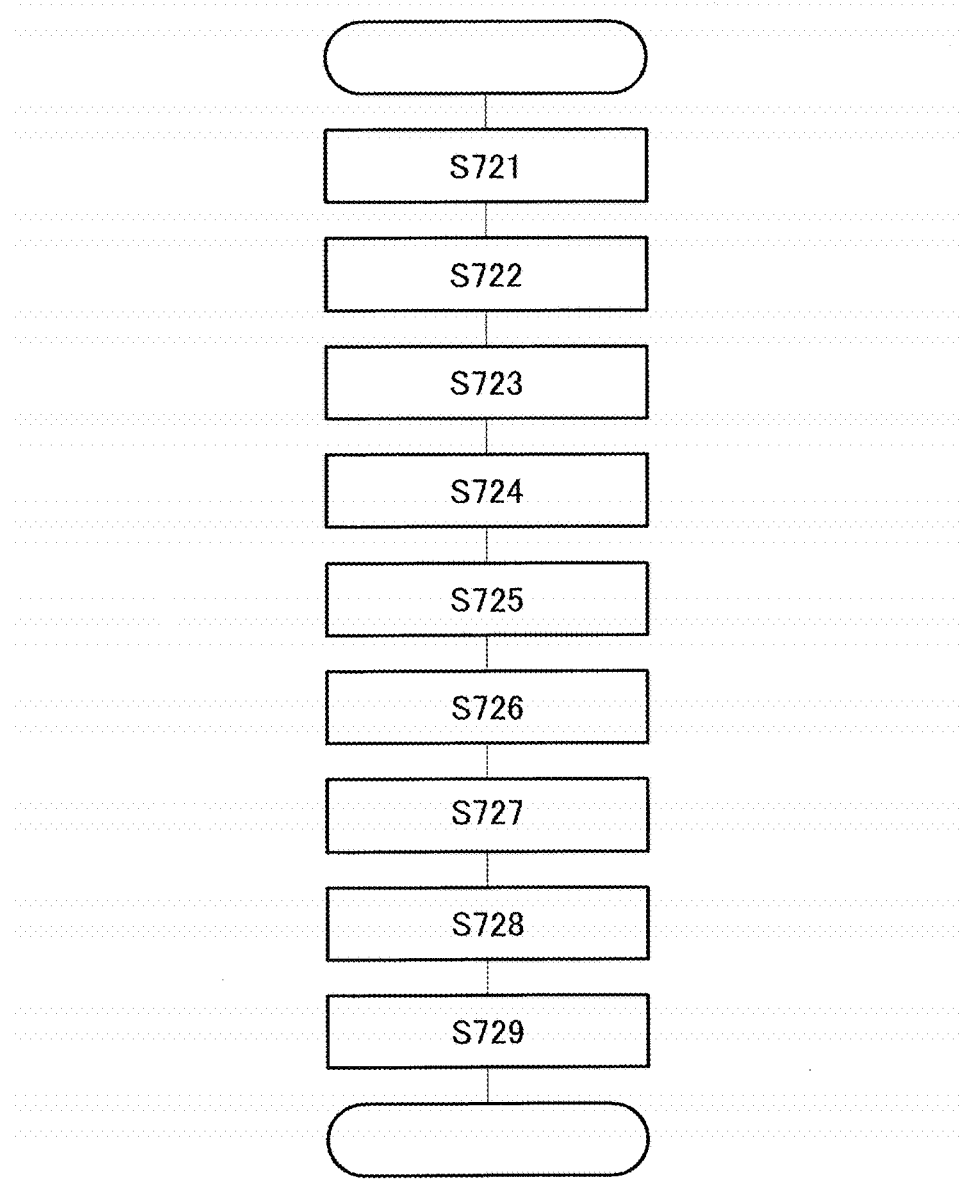
Figure 74B:
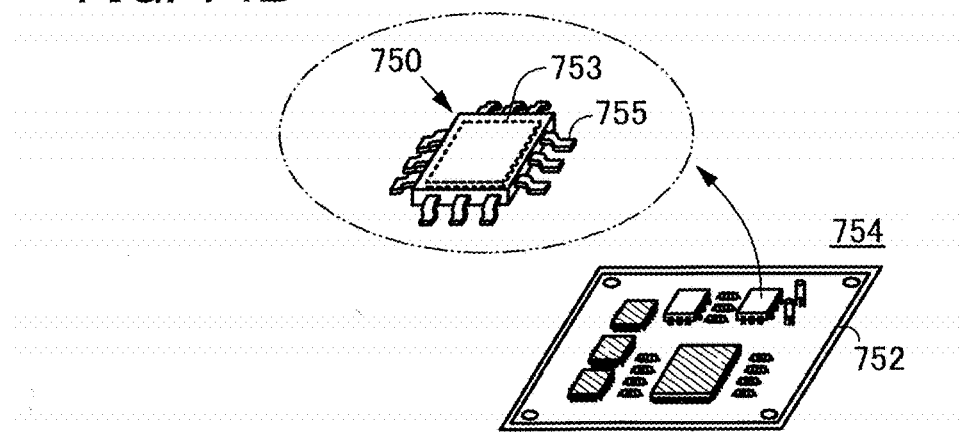

FIGS. 74A and 74B show an example where the chip 715 is used to make an electronic component. Note that the electronic component is also referred to as a semiconductor package or an IC package. This electronic component has a plurality of standards and names depending on a terminal extraction direction and a terminal shape.

The electronic component is completed when the semiconductor device described in any of the above embodiments is combined with components other than the semiconductor device in an assembly process (post-process).

The post-process will be described with reference to a flow chart in FIG. 74A. After an element substrate including the semiconductor device described in any of the above embodiments is completed in a pre-process, a back surface grinding step in which a back surface (a surface where a semiconductor device and the like are not formed) of the element substrate is ground is performed (Step S721). When the element substrate is thinned by grinding, warpage or the like of the element substrate is reduced, so that the size of the electronic component can be reduced.

Next, the element substrate is divided into a plurality of chips (chips 715) in a dicing step (Step S722). Then, the separated chips are individually picked up to be bonded to a lead frame in a die bonding step (Step S723). To bond a chip and a lead frame in the die bonding step, a method such as resin bonding or tape-automated bonding is selected as appropriate depending on products. Note that the chip may be bonded to an interposer substrate instead of the lead frame.

Next, a wire bonding step for electrically connecting a lead of the lead frame and an electrode on the chip through a metal wire is performed (Step S724). As the metal wire, a silver wire or a gold wire can be used. Ball bonding or wedge bonding can be used as the wire bonding.

The wire-bonded chip is subjected to a molding step of sealing the chip with an epoxy resin or the like (Step S725). Through the molding step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, the lead of the lead frame is plated in a lead plating step (Step S726). This plating process prevents rust of the lead and facilitates soldering at the time of mounting the chip on a printed circuit board in a later step. Then, the lead is cut and processed in a formation step (Step S727).

Next, a printing (marking) step is performed on a surface of the package (Step S728). After a testing step (Step S729) for checking whether an external shape is good and whether there is a malfunction, for example, the electronic component is completed.

FIG. 74B is a perspective schematic diagram of a completed electronic component. FIG. 74B is a perspective schematic diagram illustrating a quad flat package (QFP) as an example of the electronic component. An electronic component 750 in FIG. 74B includes a lead 755 and a semiconductor device 753. As the semiconductor device 753, the semiconductor device described in any of the above embodiments can be used.

The electronic component 750 in FIG. 74B is mounted on a printed circuit board 752, for example. A plurality of electronic components 750 are combined and electrically connected to each other over the printed circuit board 752; thus, a substrate on which the electronic components are mounted (a circuit board 754) is completed. The completed circuit board 754 is provided in an electronic device or the like.

The structure described in this embodiment can be used in appropriate combination with the structure described in any of the other embodiments.

(Embodiment 10)

In this embodiment, electronic devices including the transistor or the like of one embodiment of the present invention are described.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 75A to 75F illustrate specific examples of these electronic devices.

Figure 75A:
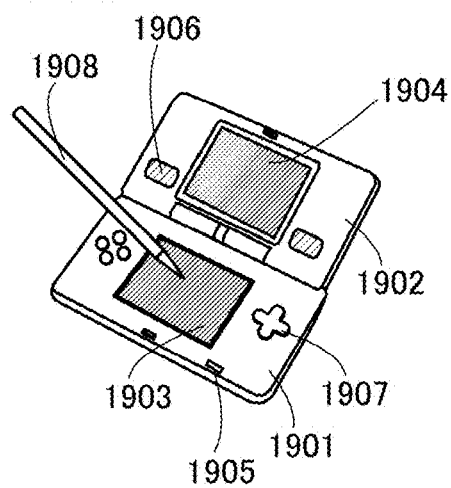

FIG. 75A illustrates a portable game machine, which includes a housing 1901, a housing 1902, a display portion 1903, a display portion 1904, a microphone 1905, a speaker 1906, an operation key 1907, a stylus 1908, and the like. Although the portable game machine in FIG. 75A has the two display portions 1903 and 1904, the number of display portions included in a portable game machine is not limited to this.

Figure 75B:
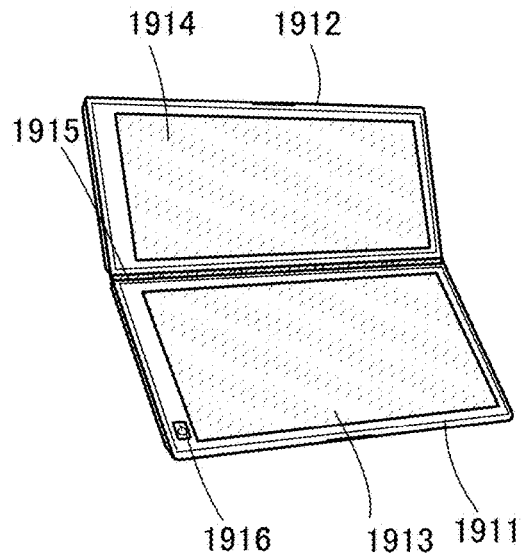

FIG. 75B illustrates a portable data terminal, which includes a first housing 1911, a second housing 1912, a first display portion 1913, a second display portion 1914, a joint 1915, an operation key 1916, and the like. The first display portion 1913 is provided in the first housing 1911, and the second display portion 1914 is provided in the second housing 1912. The first housing 1911 and the second housing 1912 are connected to each other with the joint 1915, and the angle between the first housing 1911 and the second housing 1912 can be changed with the joint 1915. Images displayed on the first display portion 1913 may be switched in accordance with the angle at the joint 1915 between the first housing 1911 and the second housing 1912. A display device with a position input function may be used as at least one of the first display portion 1913 and the second display portion 1914. Note that the position input function can be added by providing a touch panel in a display device. Alternatively, the position input function can be added by providing a photoelectric conversion element also called a photosensor in a pixel portion of a display device.

Figure 75C:
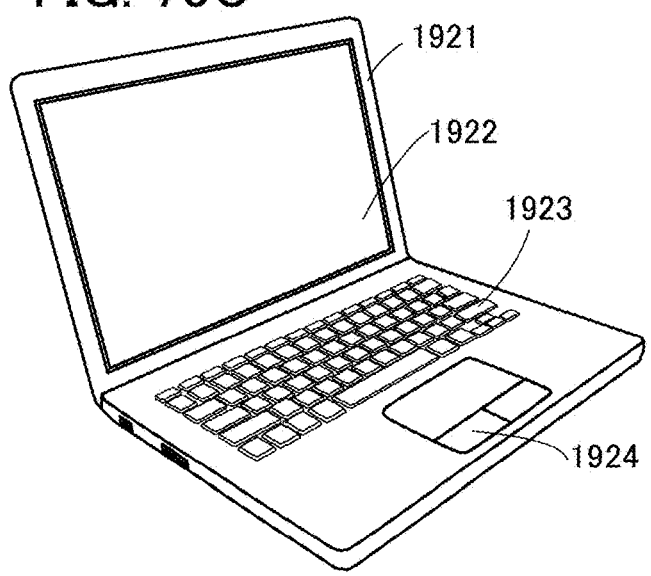

FIG. 75C illustrates a notebook personal computer, which includes a housing 1921, a display portion 1922, a keyboard 1923, a pointing device 1924, and the like.

Figure 75D:
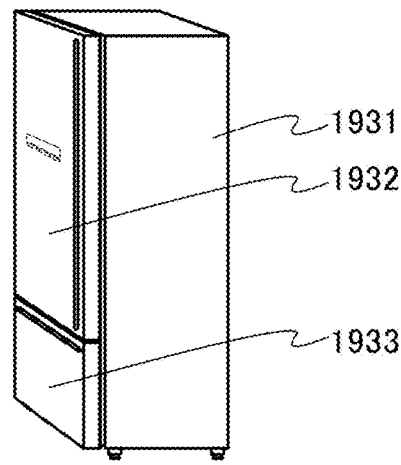

FIG. 75D illustrates an electric refrigerator-freezer, which includes a housing 1931, a door for a refrigerator 1932, a door for a freezer 1933, and the like.

Figure 75E:
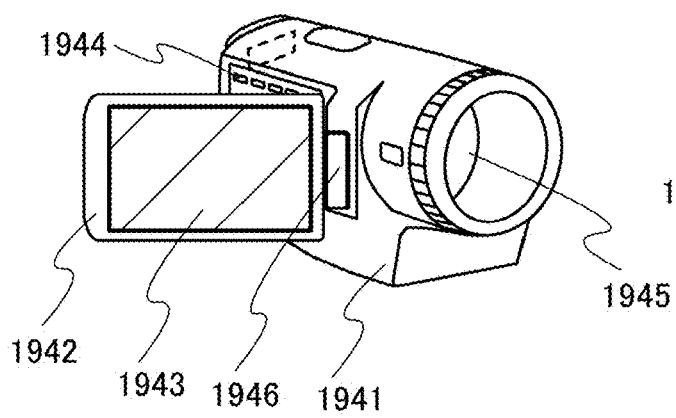

FIG. 75E illustrates a video camera, which includes a first housing 1941, a second housing 1942, a display portion 1943, operation keys 1944, a lens 1945, a joint 1946, and the like. The operation keys 1944 and the lens 1945 are provided for the first housing 1941, and the display portion 1943 is provided for the second housing 1942. The first housing 1941 and the second housing 1942 are connected to each other with the joint 1946, and the angle between the first housing 1941 and the second housing 1942 can be changed with the joint 1946. Images displayed on the display portion 1943 may be switched in accordance with the angle at the joint 1946 between the first housing 1941 and the second housing 1942.

Figure 75F:
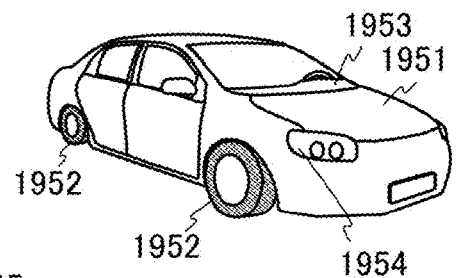

FIG. 75F illustrates a passenger car, which includes a car body 1951, wheels 1952, a dashboard 1953, lights 1954, and the like.

In this embodiment, one embodiment of the present invention has been described. Note that one embodiment of the present invention is not limited thereto. In other words, since various embodiments of the invention are described in this embodiment and the like, one embodiment of the present invention is not limited to a particular embodiment. For example, an example in which a channel formation region, source and drain regions, and the like of a transistor include an oxide semiconductor is described as one embodiment of the present invention; however, one embodiment of the present invention is not limited to this example. Alternatively, depending on circumstances or conditions, various semiconductors may be included in various transistors, a channel formation region of a transistor, source and drain regions of a transistor, or the like of one embodiment of the present invention. Depending on circumstances or conditions, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, source and drain regions of a transistor, or the like of one embodiment of the present invention. Alternatively, depending on circumstances or conditions, an oxide semiconductor is not necessarily included in various transistors, a channel formation region of a transistor, source and drain regions of a transistor, or the like of one embodiment of the present invention, for example.

The structures described in this embodiment can be combined with any of the structures described in the other embodiments as appropriate.

REFERENCE NUMERALS 20 nano cluster
22 lateral growth portion
23 particle
26 region
27 connection portion
32 substrate
100 capacitor
101 capacitor
102 capacitor
105 capacitor
110 insulator
112 conductor
112$a$ conductor
112$b$ conductor
114 insulator
116 conductor
122 conductor
124 conductor
130 insulator
132 insulator
134 insulator
150 insulator 200 transistor
201 transistor
202 transistor
205 conductor
205*a* conductor
205A conductor
205*b* conductor
205B conductor
205*c* conductor
210 insulator
212 insulator
213 insulator
214 insulator
216 insulator
218 conductor
220 insulator
222 insulator
224 insulator
230 oxide
230*a* oxide
230A oxide
230*b* oxide
230B oxide
230*c* oxide
230*d* oxide
240*a* conductor
240A conductive film
240*b* conductor
240B conductive layer
241*a* conductor
241*b* conductor
243*a* insulator
243*b* insulator
244 conductor
245 barrier layer
250 insulator
260 conductor
260*a* conductor
260A conductive film
260*b* conductor
260*c* conductor
270 insulator
280 insulator
282 insulator
283 insulator
284 insulator
285 insulator
286 insulator
290 resist mask
292 resist mask
294 resist mask
296 resist mask
300 transistor
301 transistor
302 transistor
311 substrate
312 semiconductor region
314 insulator
316 conductor
318*a* low-resistance region
318*b* low-resistance region
320 insulator
322 insulator
324 insulator
326 insulator
328 conductor
330 conductor
350 insulator
352 insulator
354 insulator
356 conductor
358 insulator
400 semiconductor device
401 CPU core
402 power controller
403 power switch
404 cache
405 bus interface
406 debug interface
407 control unit
408 PC
409 pipeline register
410 pipeline register
411 ALU
412 register file
421 power management unit
422 peripheral circuit
423 data bus
500 semiconductor device
501 memory circuit
502 memory circuit
503 memory circuit
504 circuit
509 transistor
510 transistor
512 transistor
513 transistor
515 transistor
517 transistor
518 transistor
519 capacitor
520 capacitor
540 wiring
541 wiring
542 wiring
543 wiring
544 wiring
711 substrate
712 circuit region
713 separation region
714 separation line
715 chip
750 electronic component
752 printed circuit board
753 semiconductor device
754 completed circuit board
755 lead
800 inverter
810 OS transistor
820 OS transistor
831 signal waveform
832 signal waveform
840 dashed line
841 solid line
850 OS transistor
860 CMOS inverter
900 semiconductor device
901 power supply circuit
902 circuit
903 voltage generation circuit
903A voltage generation circuit
903B voltage generation circuit
903C voltage generation circuit
903D voltage generation circuit 903E voltage generation circuit
904 circuit
905 voltage generation circuit
905A voltage generation circuit
905B voltage generation circuit
905E voltage generation circuit
906 circuit
911 transistor
912 transistor
912A transistor
912B transistor
921 control circuit
922 transistor
1901 housing
1902 housing
1903 display portion
1904 display portion
1905 microphone
1906 speaker
1907 operation key
1908 stylus
1911 housing
1912 housing
1913 display portion
1914 display portion
1915 connection portion
1916 operation key
1921 housing
1922 display portion
1923 keyboard
1924 pointing device
1931 housing
1932 refrigerator door
1933 freezer door
1941 housing
1942 housing
1943 display portion
1944 operation key
1945 lens
1946 connection portion
1951 car body
1952 wheel
1953 dashboard
1954 light
2200 imaging device
2201 switch
2202 switch
2203 switch
2210 pixel portion
2211 pixel
2212 subpixel
2212B subpixel
2212G subpixel
2212R subpixel
2220 photoelectric conversion element
2230 pixel circuit
2231 wiring
2247 wiring
2248 wiring
2249 wiring
2250 wiring
2253 wiring
2254 filter
2254B filter
2254G filter
2254R filter
2255 lens
2256 light
2257 wiring
2260 peripheral circuit
2270 peripheral circuit
2280 peripheral circuit
2290 peripheral circuit
2291 light source
2300 silicon substrate
2310 layer
2320 layer
2330 layer
2340 layer
2351 transistor
2352 transistor
2353 transistor
2360 photodiode
2361 anode
2363 low-resistance region
2370 plug
2371 wiring
2372 wiring
2373 wiring
2379 insulator
2380 insulator
2381 insulator
2390a conductor
2390b conductor
2390c conductor
2390d conductor
2390e conductor
3001 wiring
3002 wiring
3003 wiring
3004 wiring
3005 wiring
3006 wiring
3200 transistor
3500 transistor
4001 wiring
4003 wiring
4005 wiring
4006 wiring
4007 wiring
4008 wiring
4009 wiring
4021 layer
4023 layer
4100 transistor
4200 transistor
4300 transistor
4400 transistor
4500 capacitor
4600 capacitor

The invention claimed is:
1. A semiconductor device comprising:
a first insulator;
a first conductor formed over the first insulator;
a second insulator formed over the first conductor;
an oxide formed over the second insulator;
a third insulator formed over the oxide;
a second conductor formed over the third insulator;
a fourth insulator formed over the third insulator and the second conductor; and
a fifth insulator formed over the fourth insulator,
wherein the oxide contains In, M (M is Al, Ga, Y, or Sn), and Zn, wherein an atomic ratio between the In, the M, and the Zn is In:M:Zn=4:2:3 and a neighborhood thereof,
wherein an atomic ratio of the M is, when an atomic ratio of the In to a total sum of the In, M, and Zn atoms is 4, higher than or equal to 1.5 and lower than or equal to 2.5 and an atomic ratio of the Zn is higher than or equal to 2 and lower than or equal to 4,
wherein the oxide comprises a first crystal part and a second crystal part,
wherein the first crystal part has c-axis alignment,
wherein the second crystal part does not have c-axis alignment,
wherein the second insulator, the third insulator, and the fourth insulator contain oxygen and silicon, and
wherein the first insulator and the fifth insulator contain oxygen and aluminum.

2. The semiconductor device according to claim 1,
wherein an electron diffraction pattern of a cross section of the oxide subjected to electron diffraction measurement includes a first region including a diffraction spot derived from the first crystal part and a second region including a diffraction spot derived from the second crystal part, and
wherein an integrated intensity of luminance of the first region is larger than an integrated intensity of luminance of the second region.

3. The semiconductor device according to claim 2, wherein the integrated intensity of luminance of the first region is more than 1 time and less than or equal to 3 times the integrated intensity of luminance of the second region.

4. The semiconductor device according to claim 1, wherein the oxide includes a region where a peak value of density of shallow defect states is less than $2.5 \times 10^{12}$ $cm^{-2}eV^{-1}$.

5. The semiconductor device according to claim 1, further comprising a second oxide between the oxide and the third insulator,
wherein the second oxide contains In, M (M is Al, Ga, Y, or Sn), and Zn,
wherein the oxide includes a first crystal part and a second crystal part,
wherein the first crystal part has c-axis alignment,
wherein the second crystal part does not have c-axis alignment,
wherein an electron diffraction pattern of a cross section of the oxide subjected to electron diffraction measurement includes a first region including a diffraction spot derived from the first crystal part and a second region including a diffraction spot derived from the second crystal part, and
wherein an integrated intensity of luminance of the first region is more than 1 time and less than or equal to 10 times an integrated intensity of luminance of the second region.

6. A semiconductor device comprising:
a first insulator;
a first conductor formed over the first insulator;
a second insulator formed over the first conductor;
a metal oxide formed over the second insulator;
a third insulator formed over the metal oxide;
a second conductor formed over the third insulator;
a fourth insulator formed over the third insulator and the second conductor; and
a fifth insulator formed over the fourth insulator,
wherein the metal oxide comprises a first crystal part and a second crystal part,
wherein the first crystal part has c-axis alignment in a direction perpendicular or substantially perpendicular to a top surface of the metal oxide,
wherein the second crystal part does not have c-axis alignment in the direction perpendicular or substantially perpendicular to the top surface of the metal oxide,
wherein a third region and a fourth region are mixed together in the metal oxide,
wherein each of the third region and the fourth region contains In, M (M is Al, Ga, Y, or Sn), Zn, and O,
wherein atomic ratio of In with respect to atomic ratio of M in the third region is higher than that of the fourth region, and
wherein the second insulator, the third insulator, and the fourth insulator contain oxygen and silicon.

7. The semiconductor device according to claim 6, wherein the metal oxide includes a region where a peak value of density of shallow defect states is less than $2.5 \times 10^{12}$ $cm^{-2}eV^{-1}$.

8. The semiconductor device according to claim 6, wherein an atomic ratio of the M is, when an atomic ratio of the In to a total sum of the In, M, and Zn atoms is 4, higher than or equal to 1.5 and lower than or equal to 2.5 and an atomic ratio of the Zn is higher than or equal to 2 and lower than or equal to 4.

9. The semiconductor device according to claim 6, wherein the first insulator and the fifth insulator contain oxygen and aluminum.

10. The semiconductor device according to claim 6, wherein the semiconductor device includes the metal oxide as a channel formation region of a transistor in a pixel region.

11. The semiconductor device according to claim 6, wherein the semiconductor device includes the metal oxide as a channel formation region of a transistor in a driver circuit.

12. A semiconductor device comprising:
a first insulator;
a first conductor formed over the first insulator;
a second insulator formed over the first conductor;
a metal oxide formed over the second insulator;
a third insulator formed over the metal oxide;
a second conductor formed over the third insulator;
a fourth insulator formed over the third insulator and the second conductor; and
a fifth insulator formed over the fourth insulator,
wherein the metal oxide comprises a first crystal part and a second crystal part,
wherein the first crystal part has c-axis alignment in a direction perpendicular or substantially perpendicular to a top surface of the metal oxide,
wherein the second crystal part does not have c-axis alignment in the direction perpendicular or substantially perpendicular to the top surface of the metal oxide,
wherein a third region and a fourth region are mixed together in the metal oxide,
wherein each of the third region and the fourth region contains In, M (M is Al, Ga, Y, or Sn), Zn, and O,
wherein atomic ratio of In with respect to atomic of M in the third region is higher than that of the fourth region,
wherein the second insulator, the third insulator, and the fourth insulator contain oxygen and silicon, and
wherein an electron diffraction pattern of a cross section of the metal oxide subjected to electron diffraction measurement includes a first region including a diffraction spot derived from the first crystal part and a second region including a diffraction spot derived from the second crystal part, and that an integrated intensity of luminance of the first region is larger than an integrated intensity of luminance of the second region.

13. The semiconductor device according to claim 12, wherein the integrated intensity of luminance of the first region is more than 1 time and less than or equal to 3 times the integrated intensity of luminance of the second region.

14. The semiconductor device according to claim 12, wherein the metal oxide includes a region where a peak value of density of shallow defect states is less than $2.5 \times 10^{12}$ $cm^{-2}eV^{-1}$.

15. The semiconductor device according to claim 12, wherein an atomic ratio of the M is, when an atomic ratio of the In to a total sum of the In, M, and Zn atoms is 4, higher than or equal to 1.5 and lower than or equal to 2.5 and an atomic ratio of the Zn is higher than or equal to 2 and lower than or equal to 4.

16. The semiconductor device according to claim 12, wherein the first insulator and the fifth insulator contain oxygen and aluminum.

17. The semiconductor device according to claim 12, wherein the semiconductor device includes the metal oxide as a channel formation region of a transistor in a pixel region.

18. The semiconductor device according to claim 12, wherein the semiconductor device includes the metal oxide as a channel formation region of a transistor in a driver circuit.

* * * * *

UNITED STATES PATENT AND TRADEMARK OFFICE
CERTIFICATE OF CORRECTION

| | |
|---|---|
| PATENT NO. | : 10,546,960 B2 |
| APPLICATION NO. | : 16/072019 |
| DATED | : January 28, 2020 |
| INVENTOR(S) | : Shunpei Yamazaki |

It is certified that error appears in the above-identified patent and that said Letters Patent is hereby corrected as shown below:

In the Specification

At Column 41, Line 23, "89A" should be --77A--;

At Column 41, Line 26, "89B" should be --77B--;

At Column 41, Line 39, "89A" should be --77A--;

At Column 41, Line 45, "89C" should be --77C--;

At Column 41, Line 46, "89D" should be --77D--;

At Column 41, Line 47, "89E shows the results of the black dot a3; FIG. 89F" should be --77E shows the results of the black dot a3; FIG. 77F--;

At Column 41, Line 48, "89G" should be --77G--;

At Column 41, Lines 50-51, "In FIG. 89C, FIG. 89D, FIG. 89E, FIG 89F, and FIG. 89G" should be --In FIG. 77C, FIG. 77D, FIG. 77E, FIG. 77F, and FIG. 77G--;

At Column 41, Line 57, "89B" should be --77B--;

At Column 41, Line 59, "89H" should be --77H--;

At Column 41, Line 60, "89I" should be --77I--;

At Column 41, Line 61, "89J" should be --77J--;

At Column 41, Line 62, "FIG. 89K shows the results of the black dot b4; FIG. 89L" should be --FIG. 77K shows the results of the black dot b4; FIG. 77L--;

Signed and Sealed this
Twenty-fourth Day of November, 2020

Andrei Iancu
*Director of the United States Patent and Trademark Office*

At Column 41, Line 64, "In FIG. 89H, FIG. 89I, FIG. 89J, FIG. 89K, and FIG. 89L," should be --In FIG. 77H, FIG. 77I, FIG. 77J, FIG. 77K, and FIG. 77L--.